US012717237B2

(12) United States Patent
Namba et al.

(10) Patent No.: US 12,717,237 B2
(45) Date of Patent: Aug. 25, 2026

(54) ON-PRESS DEVELOPMENT TYPE LITHOGRAPHIC PRINTING PLATE PRECURSOR, METHOD OF PREPARING LITHOGRAPHIC PRINTING PLATE, AND LITHOGRAPHIC PRINTING METHOD

(71) Applicant: FUJIFILM Corporation, Tokyo (JP)

(72) Inventors: Yusuke Namba, Shizuoka (JP); Kazuaki Enomoto, Shizuoka (JP); Ichiro Koyama, Shizuoka (JP); Akira Sakaguchi, Shizuoka (JP); Akira Yamamoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 849 days.

(21) Appl. No.: 18/156,462

(22) Filed: Jan. 19, 2023

(65) Prior Publication Data

US 2023/0150254 A1 May 18, 2023

Related U.S. Application Data

(63) Continuation of application No. PCT/JP2021/026683, filed on Jul. 15, 2021.

(30) Foreign Application Priority Data

Jul. 21, 2020 (JP) ................................ 2020-124466
Jan. 8, 2021 (JP) ................................ 2021-002134
Mar. 31, 2021 (JP) ................................ 2021-061163

(51) Int. Cl.
*G03F 7/30* (2006.01)
*B41C 1/10* (2006.01)

(52) U.S. Cl.
CPC .......... *G03F 7/3035* (2013.01); *B41C 1/1016* (2013.01); *B41C 2201/02* (2013.01);
(Continued)

(58) Field of Classification Search
CPC .................................................... G03F 7/3035
See application file for complete search history.

(56) References Cited

U.S. PATENT DOCUMENTS 4,923,781 A 5/1990 Fujikura et al.
2005/0153239 A1 7/2005 Hoshi et al.
(Continued)

FOREIGN PATENT DOCUMENTS

CN 1637599 A 7/2005
CN 105190436 A 12/2015
(Continued)

OTHER PUBLICATIONS

Office Action issued Aug. 1, 2024 in Chinese Application No. 202180059485.X.

(Continued)

*Primary Examiner* — Amanda C. Walke
(74) *Attorney, Agent, or Firm* — Sughrue Mion, PLLC

(57) ABSTRACT

Provided is an on-press development type lithographic printing plate precursor having two or more maximal absorption wavelengths in a wavelength range of 760 nm to 900 nm, in which in a case where the on-press development type lithographic printing plate precursor is subjected to exposure to infrared having a wavelength of 830 nm at an energy density of 110 mJ/cm$^2$, in a portion subjected to the exposure, a brightness change ΔL before the exposure and after storage subsequent to the exposure for 24 hours under conditions of 25° C. and 70% RH is 3.0 or more. Also provided are a method of preparing a lithographic printing plate and a lithographic printing method in which the on-press development type lithographic printing plate precursor is used.

23 Claims, 2 Drawing Sheets

(52) U.S. Cl.
CPC ...... *B41C 2201/12* (2013.01); *B41C 2210/04* (2013.01); *B41C 2210/22* (2013.01)

(56) References Cited

U.S. PATENT DOCUMENTS

| | | | | |
|---|---|---|---|---|
| 2009/0269699 | A1 | 10/2009 | Munnelly et al. | |
| 2012/0094233 | A1 | 4/2012 | Savariar-Hauck et al. | |
| 2013/0101938 | A1 | 4/2013 | Hayashi et al. | |
| 2015/0360498 | A1 | 12/2015 | Minzuno et al. | |
| 2017/0123315 | A1* | 5/2017 | Mizuno | G03F 7/20 |
| 2018/0207925 | A1 | 7/2018 | Desmet | |
| 2018/0356730 | A1 | 12/2018 | Inasaki et al. | |
| 2019/0143666 | A1 | 5/2019 | Nakamura et al. | |
| 2019/0232703 | A1 | 8/2019 | Kudo | |
| 2020/0041899 | A1 | 2/2020 | Ishiji et al. | |
| 2020/0110336 | A1 | 4/2020 | Nozaki et al. | |
| 2020/0353741 | A1 | 11/2020 | Araki | |
| 2021/0260864 | A1* | 8/2021 | Billiet | B41C 1/1016 |
| 2022/0118753 | A1* | 4/2022 | Yokokawa | B41C 1/1008 |
| 2023/0120465 | A1* | 4/2023 | Aizu | G03F 7/029 101/463.1 |
| 2023/0127702 | A1* | 4/2023 | Enomoto | G03F 7/0045 |
| 2023/0219336 | A1* | 7/2023 | Enomoto | B41C 1/1016 430/269 |
| 2023/0266667 | A1* | 8/2023 | Billiet | B41C 1/1016 430/281.1 |
| 2023/0359121 | A1* | 11/2023 | Sakaguchi | B41C 1/1008 |

FOREIGN PATENT DOCUMENTS

| | | | | |
|---|---|---|---|---|
| CN | 109996683 A | 7/2019 | | |
| CN | 113655690 A | * 11/2021 | G03F 7/027 | |
| CN | 114096914 A | 2/2022 | | |
| EP | 1359008 A1 | * 11/2003 | B41C 1/1008 | |
| EP | 3 875 282 A1 | 9/2021 | | |
| EP | 3 991 989 A1 | 5/2022 | | |
| EP | 4 039 489 A1 | 8/2022 | | |
| JP | 63-137226 A | 6/1988 | | |
| JP | 2012-501878 A | 1/2012 | | |
| JP | 6461447 B1 | 1/2019 | | |
| JP | 2020-069790 A | 5/2020 | | |
| JP | 2020-093518 A | 6/2020 | | |
| WO | 2010/027415 A1 | 3/2010 | | |
| WO | 2016/027886 A1 | 2/2016 | | |
| WO | 2017/141882 A1 | 8/2017 | | |
| WO | 2018/230412 A1 | 12/2018 | | |
| WO | 2019/013268 A1 | 1/2019 | | |
| WO | 2019/150788 A1 | 8/2019 | | |
| WO | 2020/090996 A1 | 5/2020 | | |
| WO | WO-2020262694 A1 | * 12/2020 | B41C 1/1016 | |
| WO | 2021/259648 A1 | 12/2021 | | |
| WO | 2021/259650 A1 | 12/2021 | | |
| WO | WO-2021256341 A1 | * 12/2021 | B41C 1/1008 | |

OTHER PUBLICATIONS

Communication dated Oct. 10, 2023 issued by the Japanese Patent Office in application No. 2022-537966.

International Search Report dated Sep. 28, 2021 in International Application No. PCT/JP2021/026683.

International Preliminary Report on Patentability dated Jan. 24, 2023 with translation of the Written Opinion of International Searching Authority in Application No. PCT/JP2021/026683.

Written Opinion dated Sep. 28, 2021 in International Application No. PCT/JP2021/026683.

Office Action issued Apr. 9, 2024 in Japanese Application No. 2022-537966.

Communication dated May 1, 2025, issued in Chinese Application No. 202180059485.X.

Extended European Search Report issued Nov. 9, 2023 in European Application No. 21846380.0.

* cited by examiner

ON-PRESS DEVELOPMENT TYPE LITHOGRAPHIC PRINTING PLATE PRECURSOR, METHOD OF PREPARING LITHOGRAPHIC PRINTING PLATE, AND LITHOGRAPHIC PRINTING METHOD

CROSS-REFERENCE TO RELATED APPLICATIONS

This application is a continuation application of International Application No. PCT/JP2021/026683, filed Jul. 15, 2021, the disclosure of which is incorporated herein by reference in its entirety. Further, this application claims priority from Japanese Patent Application No. 2020-124466, filed Jul. 21, 2020, Japanese Patent Application No. 2021-002134, filed Jan. 8, 2021, and Japanese Patent Application No. 2021-061163, filed Mar. 31, 2021, the disclosure of each of which is incorporated herein by reference in its entirety.

BACKGROUND OF THE INVENTION

1. Field of the Invention

The present disclosure relates to an on-press development type lithographic printing plate precursor, a method of preparing a lithographic printing plate, and a lithographic printing method.

2. Description of the Related Art

Generally, a lithographic printing plate consists of a lipophilic image area that receives ink in a printing process and a hydrophilic non-image area that receives dampening water. Lithographic printing is a method exploiting the mutual repulsion of water and oil-based ink, in which the lipophilic image area and the hydrophilic non-image area of a lithographic printing plate are used as an ink-receiving portion and a dampening water-receiving portion (non-ink-receiving portion) respectively, the adhesiveness of ink is varied within the surface of the lithographic printing plate such that only the image area receives the ink, and then printing is performed by the transfer of the ink to a printing substrate such as paper.

In the related art, in order to prepare this lithographic printing plate, a lithographic printing plate precursor (PS plate) has been widely used which is obtained by providing a lipophilic photosensitive resin layer (image-recording layer) on a hydrophilic support. Generally, a lithographic printing plate is obtained by a plate making method of exposing a lithographic printing plate precursor through an original picture such as a lith film, then keeping a portion of an image-recording layer that will be an image area while removing other unnecessary portions of the image-recording layer by dissolving such portions in an alkaline developer or an organic solvent, and forming a non-image area by exposing the hydrophilic surface of a support.

In response to the intensifying interest in the global environment, an environmental issue of waste liquid generated by wet treatments such as a development treatment has gathered more attention.

Regarding the environmental issue described above, an attempt is made to simplify development or plate making or to remove treatments. As one of simple preparation methods, a method called "on-press development" is being carried out. That is, on-press development is a method of exposing a lithographic printing plate precursor, then immediately mounting the precursor on a printer without performing development of the related art, and removing an unnecessary portion of the image-recording layer at an early stage of the ordinary printing step.

In the present disclosure, a lithographic printing plate precursor that can be used for such on-press development is called "on-press development type lithographic printing plate precursor"

Examples of the lithographic printing plate precursors in the related art include those described in WO2017/141882A or US2009/0269699A.

WO2017/141882A describes a lithographic printing plate precursor having an image-recording layer containing a color-developing compound represented by Formula (1).

(1)

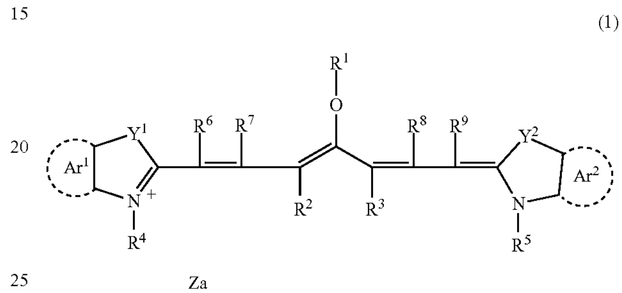

Za

In Formula (1), $R^1$ represents a group that cleaves an $R^1$—O bond by heat or exposure to infrared. $R^2$ and $R^3$ each independently represent a hydrogen atom or an alkyl group, or may be linked to each other to form a ring. $Ar^1$ and $Ar^2$ each independently represent a group forming a benzene ring or a naphthalene ring. $Y^1$ and $Y^2$ each independently represent an oxygen atom, a sulfur atom, —$NR^0$—, or a dialkylmethylene group. $R^4$ and $R^5$ each independently represent an alkyl group or a group represented by Formulas (2) to (4). $R^6$ to $R^9$ each independently represent a hydrogen atom or an alkyl group. $R^0$ represents a hydrogen atom, an alkyl group, or an aryl group. Za represents a counterion for neutralizing charge. Here, the compound represented by Formula (1) has at least one of the groups represented by Formulas (2) to (4), as $R^4$ or $R^5$ or in $R^1$, $Ar^1$, or $Ar^2$.

(2)

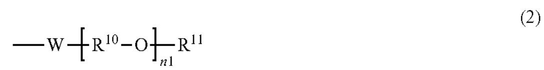

(3)

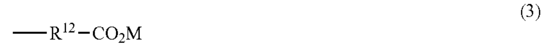

(4)

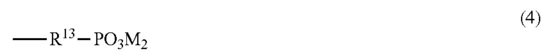

In Formulas (2) to (4), $R^{10}$ represents an alkylene group having 2 to 6 carbon atoms. W represents a single bond or an oxygen atom. n1 represents an integer of 1 to 45. $R^{11}$ represents an alkyl group having 1 to 12 carbon atoms or —C(=O)—$R^{14}$. $R^{14}$ represents an alkyl group having 1 to 12 carbon atoms. $R^{12}$ and $R^{13}$ each independently represent a single bond or an alkylene group having 1 to 12 carbon atoms. M represents a hydrogen atom, a Na atom, a K atom, or an onium group.

US2009/0269699A describes a negative tone lithographic printing plate precursor having an image-recording layer containing an acid color-developing agent.

SUMMARY OF THE INVENTION

An object of an embodiment of the present disclosure is to provide an on-press development type lithographic printing plate precursor that is excellent in visibility of an exposed portion after a lapse of time and is excellent in storage stability.

An object of another embodiment of the present disclosure is to provide a method of preparing a lithographic printing plate and a lithographic printing method in which the on-press development type lithographic printing plate precursor is used.

Means for achieving the above objects include the following aspects.

<1> An on-press development type lithographic printing plate precursor having two or more maximal absorption wavelengths in a wavelength range of 760 nm to 900 nm, in which in a case where the on-press development type lithographic printing plate precursor is subjected to exposure to infrared having a wavelength of 830 nm at an energy density of 110 $mJ/cm^2$, in a portion subjected to the exposure, a brightness change $\Delta L$ before the exposure and after storage subsequent to the exposure for 24 hours under conditions of 25° C. and 70% RH is 3.0 or more.

<2> An on-press development type lithographic printing plate precursor containing an infrared absorber A and an infrared absorber B, in which a maximum absorption wavelength of the infrared absorber A is different from a maximum absorption wavelength of the infrared absorber B, and in a case where the on-press development type lithographic printing plate precursor is subjected to exposure to infrared having a wavelength of 830 nm at an energy density of 110 $mJ/cm^2$, in a portion subjected to the exposure, a brightness change $\Delta L$ before the exposure and after storage subsequent to the exposure for 24 hours under conditions of 25° C. and 70% RH is 3.0 or more.

<3> The on-press development type lithographic printing plate precursor described in <2>, including an image-recording layer on a support, in which the image-recording layer contains the infrared absorber A and the infrared absorber B.

<4> The on-press development type lithographic printing plate precursor described in <2>, including a support, an image-recording layer, and an outermost layer in this order, in which the image-recording layer contains the infrared absorber A, and the outermost layer contains the infrared absorber B.

<5> The on-press development type lithographic printing plate precursor described in any one of <2> to <4>, in which the maximum absorption wavelength of the infrared absorber A is more than 830 nm.

<6> The on-press development type lithographic printing plate precursor described in any one of <2> to <5>, in which the maximum absorption wavelength of the infrared absorber B is 830 nm or less.

<7> The on-press development type lithographic printing plate precursor described in any one of <2> to <6>, in which a difference between the maximum absorption wavelength of the infrared absorber A and the maximum absorption wavelength of the infrared absorber B is 5 nm to 50 nm.

<8> The on-press development type lithographic printing plate precursor described in any one of <2> to <7>, in which the infrared absorber B is a decomposition-type infrared absorber that decomposes due to exposure to infrared.

<9> The on-press development type lithographic printing plate precursor described in <8>, in which the decomposition-type infrared absorber is a compound represented by Formula 1-1.

Formula 1-1

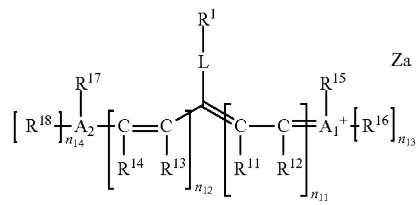

In Formula 1-1, $R^1$ represents a group that is represented by any of Formula 2-1 to Formula 4-1, $R^{11}$ to $R^{18}$ each independently represent a hydrogen atom, a halogen atom, $—R^a$, $—OR^b$, $—SR^c$, or $—NR^dR^e$, $R^a$ to $R^e$ each independently represent a hydrocarbon group, $A_1$, $A_2$, and a plurality of $R^{11}$ to $R^{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, a sum of $n_{11}$ and $n_{12}$ is 2 or more, $n_{13}$ and $n_{14}$ each independently represent 0 or 1, L represents an oxygen atom, a sulfur atom, or $—N(R^{10})—R^{10}$ represents a hydrogen atom, an alkyl group, or an aryl group, and Za represents a counterion that neutralizes charge.

Formula 2-1

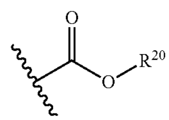

Formula 3-1

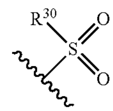

Formula 4-1

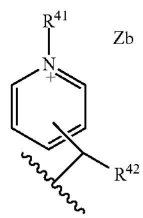

In Formula 2-1 to Formula 4-1, $R^{20}$, $R^{30}$, $R^{41}$, and $R^{42}$ each independently represent an alkyl group or an aryl group, Zb represents a counterion that neutralizes charge, a wavy line represents a bonding site with a group represented by L in Formula 1-1.

<10> The on-press development type lithographic printing plate precursor described in <9>, in which the decomposition-type infrared absorber is a compound represented by Formula 1-2.

Formula 1-2

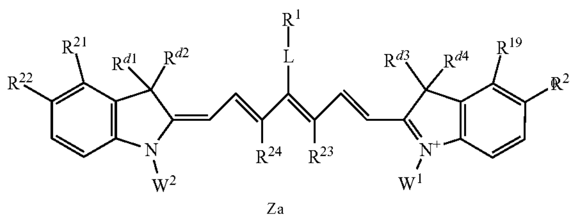

In Formula 1-2, $R^1$ represents a group that is represented by any of Formula 2-1 to Formula 4-1, $R^{19}$ to $R^{22}$ each independently represent a hydrogen atom, a halogen atom, —$R^a$, —$OR^b$, —CN, —$SR^c$, or —$NR^dR^e$, $R^{23}$ and $R^{24}$ each independently represent —$R^a$, $R^a$ to $R^e$ each independently represent a hydrocarbon group, $R^{19}$ and $R^{20}$, $R^{21}$ and $R^{22}$, or $R^{23}$ and $R^{24}$ may be linked to each other to form a monocyclic or polycyclic ring, L represents an oxygen atom, a sulfur atom, or —$N(R^{10})$—, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

<11> The on-press development type lithographic printing plate precursor described in <9> or <10>, in which the decomposition-type infrared absorber is a compound represented by any of Formula 1-3 to Formula 1-7.

Formula 1-3

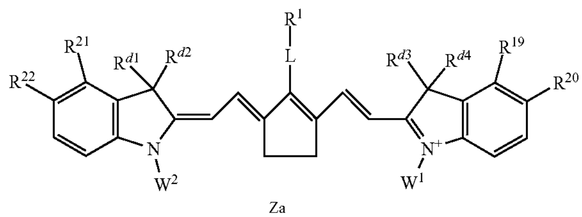

Formula 1-4

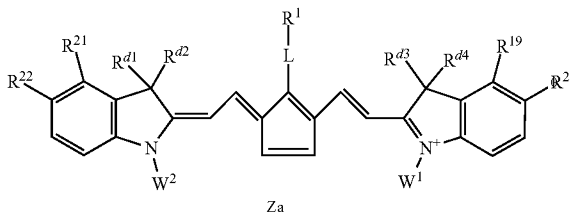

Formula 1-5

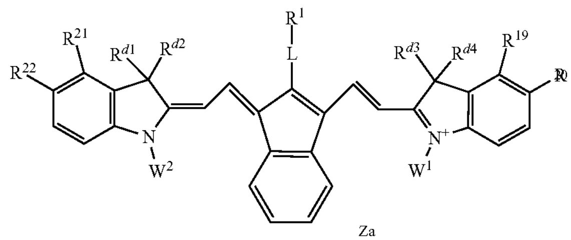

-continued

Formula 1-6

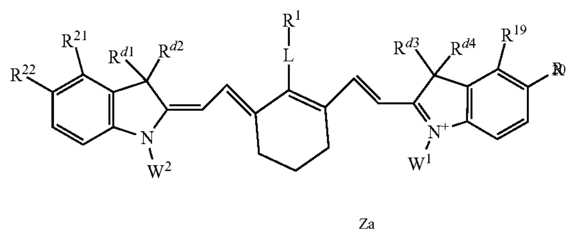

Formula 1-7

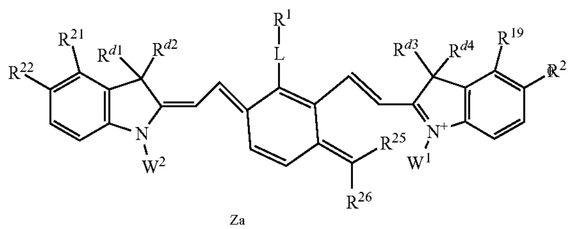

In Formula 1-3 to Formula 1-7, $R^1$ represents a group that is represented by any of Formula 2-1 to Formula 4-1, $R^{19}$ to $R^{22}$ each independently represent a hydrogen atom, a halogen atom, —$R^a$, —$OR^b$, —CN, —$SR^c$, or —$NR^dR^e$, $R^{25}$ and $R^{26}$ each independently represent a hydrogen atom, a halogen atom, or —$R^a$, $R^a$ to $R^e$ each independently represent a hydrocarbon group, $R^{19}$ and $R^{20}$, $R^{21}$ and $R^{22}$, or $R^{25}$ and $R^{26}$ may be linked to each other to form a monocyclic or polycyclic ring, L represents an oxygen atom, a sulfur atom, or —$N(R_{10})$—, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

<12> The on-press development type lithographic printing plate precursor described in <10> or <11>, in which $W^1$ and $W^2$ in Formula 1-2 to Formula 1-7 each independently represent an alkyl group having a substituent and have at least —$OCH_2CH_2$—, a sulfo group, a salt of a sulfo group, a carboxy group, or a salt of a carboxy group as the substituent.

<13> The on-press development type lithographic printing plate precursor described in <3>, or <4>, in which the image-recording layer contains an electron-donating polymerization initiator.

<14> The on-press development type lithographic printing plate precursor described in <13>, in which HOMO of the infrared absorber A-HOMO of the electron-donating polymerization initiator is 0.60 eV or less.

<15> The on-press development type lithographic printing plate precursor described in any one of <2> to <14>, in which HOMO of the infrared absorber A is −5.30 eV or less.

<16> The on-press development type lithographic printing plate precursor described in any one of <2> to <15>, in which the infrared absorber A includes a compound represented by Formula 1.

Formula 1

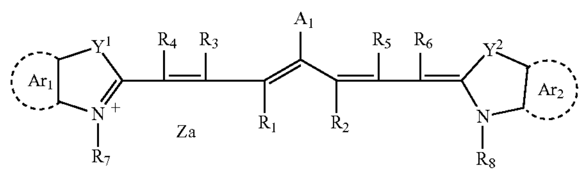

In Formula 1, $R_1$ and $R_2$ each independently represent a hydrogen atom or an alkyl group, $R_1$ and $R_2$ may be linked to each other to form a ring, $R_3$ to $R_6$ each independently represent a hydrogen atom or an alkyl group, $R_7$ and $R_8$ each independently represent an alkyl group or an aryl group, $Y_1$ and $Y_2$ each independently represent an oxygen atom, a sulfur atom, —$NR_0$—, or a dialkylmethylene group, $R_0$ represents a hydrogen atom, an alkyl group, or an aryl group, $Ar_1$ and $Ar_2$ each independently represent a group forming a benzene ring or a naphthalene ring which may have a group represented by Formula 2 that will be described later, $A_1$ represents —$NR_9R_{10}$, —$X_1$-$L_1$, or a group represented by Formula 2 that will be described later, $R_9$ and $R_{10}$ each independently represent an alkyl group, an aryl group, an alkoxycarbonyl group, or an arylsulfonyl group, $X_1$ represents an oxygen atom or a sulfur atom, $L_1$ represents a hydrocarbon group, a heteroaryl group, or a group that undergoes bond cleavage from $X_1$ by heat or exposure to infrared, Za represents a counterion that neutralizes charge, and at least one of $Ar_1$ or $Ar_2$ has a group represented by Formula 2.

—X Formula 2

In Formula 2, X represents a halogen atom, —C(═O)—$X_2$—$R_{11}$, —C(═O)—$NR_{12}R_{13}$, —O—C(═O)—$R_{14}$, —CN, —$SO_2NR_{15}R_{16}$, or a perfluoroalkyl group, $X_2$ represents a single bond or an oxygen atom, $R_{11}$ and $R_{14}$ each independently represent an alkyl group or an aryl group, and $R_{12}$, $R_{13}$, $R_{15}$, and $R_{16}$ each independently represent a hydrogen atom, an alkyl group, or an aryl group.

<17> The on-press development type lithographic printing plate precursor described in <16>, in which X in Formula 2 is a fluorine atom, a chlorine atom, a bromine atom, or —C(═O)$OR_{17}$ where $R_{17}$ represents an alkyl group or an aryl group.

<18> The on-press development type lithographic printing plate precursor described in <16> or <17>, in which at least one of $Ar_1$ or $Ar_2$ in Formula 1 has a bromine atom.

<19> The on-press development type lithographic printing plate precursor described in <13> or <14>, in which HOMO of the electron-donating polymerization initiator is more than −5.90 eV.

<20> The on-press development type lithographic printing plate precursor described in <3>, or <4>, in which the image-recording layer contains an electron-accepting polymerization initiator.

<21> The on-press development type lithographic printing plate precursor described in <20>, in which the electron-accepting polymerization initiator is an onium salt compound.

<22> The on-press development type lithographic printing plate precursor described in <20> or <21>, in which the electron-accepting polymerization initiator includes a compound represented by Formula (II).

(II)

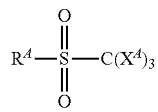

In Formula (II), $X^A$ represents a halogen atom, and $R^A$ represents an aryl group.

<23> The on-press development type lithographic printing plate precursor described in <3>, or <4>, in which the image-recording layer contains an acid color developing agent.

<24> The on-press development type lithographic printing plate precursor described in <23>, in which the acid color developing agent includes a compound represented by Formula (Le-8).

(Le-8)

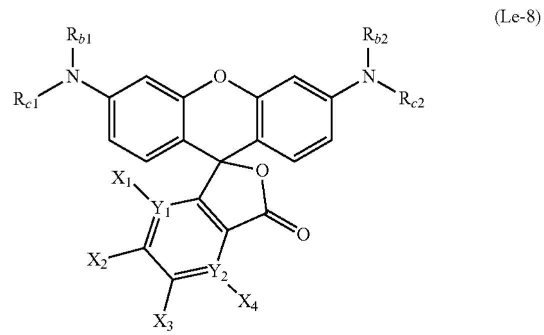

In Formula (Le-8), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Rb_1$ and $Rb_2$ each independently represent a hydrogen atom, an alkyl group, an aryl group, or a heteroaryl group, and $Rc_1$ and $Rc_2$ each independently represent an aryl group or a heteroaryl group.

<25> The on-press development type lithographic printing plate precursor described in <24>, in which $Rc_1$ and $Rc_2$ each independently represent a phenyl group that has a substituent at at least one ortho position and an electron-donating group at a para position.

<26> The on-press development type lithographic printing plate precursor described in <23>, in which the acid color developing agent includes a compound represented by Formula (Le-10).

(Le-10)

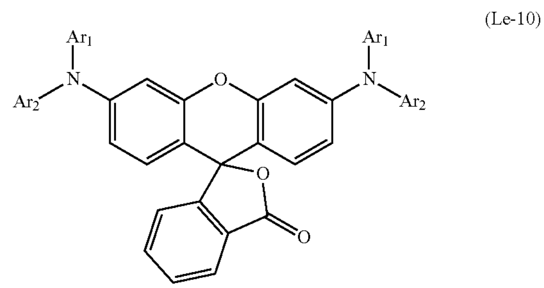

In Formula (Le-10), $Ar_1$ each independently represent an aryl group or a heteroaryl group, and $Ar_2$ each independently represent an aryl group having a substituent at at least one ortho position or a heteroaryl group having a substituent at at least one ortho position.

<27> The on-press development type lithographic printing plate precursor described in <26>, in which $Ar_1$ each independently represent an aryl group having an electron-donating group or a heteroaryl group having an electron-donating group, and $Ar_2$ each independently represent a phenyl group having a substituent at at least one ortho position and an electron-donating group at a para position.

<28> The on-press development type lithographic printing plate precursor described in <23>, in which the acid color developing agent includes a compound represented by Formula (Le-11).

(Le-11)

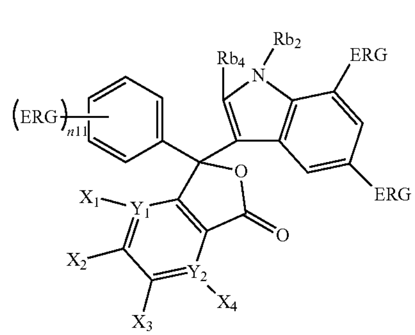

In Formula (Le-11), ERG each independently represent an electron-donating group, n11 represents an integer of 1 to 5, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_2$ and $Rb_4$ each independently represent a hydrogen atom, an alkyl group, an aryl group, or a heteroaryl group.

<29> The on-press development type lithographic printing plate precursor described in <4>, in which the image-recording layer further contains an infrared absorber C, and the maximum absorption wavelength of the infrared absorber A, the maximum absorption wavelength of the infrared absorber B, and a maximum absorption wavelength of the infrared absorber C are different from each other.

<30> The on-press development type lithographic printing plate precursor described in any one of <3>, <4>, and <23> to <29>, in which the image-recording layer contains a polymerizable compound.

<31> The on-press development type lithographic printing plate precursor described in <30>, in which the polymerizable compound includes a polymerizable compound having functionalities of 2 or less.

<32> The on-press development type lithographic printing plate precursor described in <30> or <31>, in which the polymerizable compound includes a polymerizable compound having functionalities of 7 or more.

<33> The on-press development type lithographic printing plate precursor described in <3>, including the support, the image-recording layer, and an outermost layer in this order.

<34> The on-press development type lithographic printing plate precursor described in <4>, <29>, or <33>, in which the outermost layer contains a hydrophobic polymer.

<35> The on-press development type lithographic printing plate precursor described in <34>, in which the hydrophobic polymer is hydrophobic polymer particles.

<36> The on-press development type lithographic printing plate precursor described in <3> or <4>, in which the support has an aluminum plate and an anodic oxide film of aluminum disposed on the aluminum plate, the anodic oxide film is at a position closer to a side of the image-recording layer than the aluminum plate and has micropores extending in a depth direction from a surface of the anodic oxide film on the side of the image-recording layer, and an average diameter of the micropores within the surface of the anodic oxide film is more than 10 nm and 100 nm or less.

<37> The on-press development type lithographic printing plate precursor described in <36>, in which the micropores are each composed of a large diameter portion that extends to a position at a depth of 10 nm to 1,000 nm from the surface of the anodic oxide film and a small diameter portion that is in communication with a bottom portion of the large diameter portion and extends to a position at a depth of 20 nm to 2,000 nm from a communicate position, an average diameter of the large diameter portion within the surface of the anodic oxide film is 15 nm to 100 nm, and an average diameter of the small diameter portion at the communicate position is 13 nm or less.

<38> A method of preparing a lithographic printing plate, including a step of exposing the on-press development type lithographic printing plate precursor described in any one of <1> to <37> in a shape of an image, and a step of supplying at least one material selected from the group consisting of a printing ink and dampening water on a printer to remove an image-recording layer in a non-image area.

<39> A lithographic printing method including a step of exposing the on-press development type lithographic printing plate precursor described in any one of <1> to <37> in a shape of an image, a step of supplying at least one material selected from the group consisting of a printing ink and dampening water on a printer to remove an image-recording layer in a non-image area and to prepare a lithographic printing plate, and a step of performing printing by using the obtained lithographic printing plate.

According to an embodiment of the present disclosure, it is possible to provide an on-press development type lithographic printing plate precursor that is excellent in visibility of an exposed portion after a lapse of time and is excellent in storage stability.

According to another embodiment of the present disclosure, it is possible to provide a method of preparing a lithographic printing plate and a printing method in which the on-press development type lithographic printing plate precursor is used.

DESCRIPTION OF THE PREFERRED EMBODIMENTS

Figure 1:
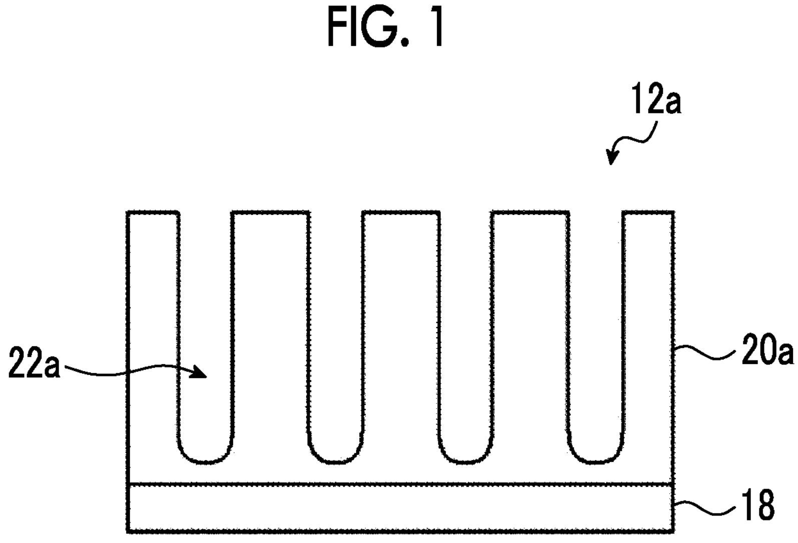
FIG. 1 is a schematic cross-sectional view of an embodiment of a support.

Hereinafter, the contents of the present disclosure will be specifically described. The following configuration requirements will be described on the basis of typical embodiments of the present disclosure, but the present disclosure is not limited to such embodiments.

In the present specification, a numerical range expressed using "to" includes numerical values listed before and after "to" as the lower limit and the upper limit.

In addition, in the present specification, in a case where there is no description regarding whether a group (atomic group) is substituted or unsubstituted, such a group includes both a group having no substituent and a group having a substituent. For example, "alkyl group" includes not only an alkyl group having no substituent (unsubstituted alkyl group) but also an alkyl group having a substituent (substituted alkyl group).

In the present specification, "(meth)acryl" is a term used to explain a concept including both the acryl and methacryl, and "(meth)acryloyl" is a term used to explain a concept including both the acryloyl and methacryloyl.

In addition, the term "step" in the present specification means not only an independent step but also a step that cannot be clearly differentiated from other steps as long as the intended goal of the step is achieved. In the present disclosure, "% by mass" has the same definition as "% by weight", and "part by mass" has the same definition as "part by weight".

In the present disclosure, unless otherwise specified, as each component contained in a composition or each constitutional unit contained in a polymer, one kind of component or one kind of constitutional unit may be used alone, or two or more kinds of components or two or more kinds of constitutional units may be used in combination.

Furthermore, in the present disclosure, in a case where there is a plurality of substances corresponding to each component in a composition, or in a case where there is a plurality of constitutional units corresponding to each constitutional unit in a polymer, unless otherwise specified, the amount of each component in the composition or the amount of each constitutional unit in the polymer means the total amount of the plurality of corresponding substances present in the composition or the total amount of the plurality of corresponding constitutional units present in the polymer.

In the present disclosure, a combination of two or more preferred aspects is a more preferred aspect.

In addition, in the present disclosure, unless otherwise specified, each of the weight-average molecular weight (Mw) and number-average molecular weight (Mn) is a molecular weight that is detected using a gel permeation chromatography (GPC) analysis device using TSKgel GMHxL, TSKgel G4000HxL, and TSKgel G2000HxL (trade names, manufactured by Tosoh Corporation) as columns, tetrahydrofuran (THF) as a solvent, and a differential refractometer, and expressed in terms of polystyrene as a standard substance.

In the present disclosure, the term "lithographic printing plate precursor" refers not only to a lithographic printing plate precursor but also to a key plate precursor. In addition, the term "lithographic printing plate" refers not only to a lithographic printing plate prepared by performing operations such as exposure and development as necessary on a lithographic printing plate precursor but also to a key plate. The key plate precursor is not necessarily subjected to the operations such as exposure and development. The key plate refers to a lithographic printing plate precursor to be mounted on a plate cylinder that is not used, in a case where monochromatic or dichromatic printing is carried out on a part of paper during, for example, color newspaper printing.

In the present disclosure, "*" in a chemical structural formula represents a bonding position with other structures.

Hereinafter, the present disclosure will be specifically described.

(On-Press Development Type Lithographic Printing Plate Precursor)

A first embodiment of the on-press development type lithographic printing plate precursor according to the present disclosure (hereinafter, also simply called "lithographic printing plate precursor") according to the present disclosure has two or more maximal absorption wavelengths in a wavelength range of 760 nm to 900 nm, in which in a case where the lithographic printing plate precursor is subjected to exposure to infrared having a wavelength of 830 nm at an energy density of 110 mJ/cm$^2$, in a portion subjected to the exposure, a brightness change ΔL before the exposure and after storage subsequent to the exposure for 24 hours under conditions of 25° C. and 70% RH is 3.0 or more.

A second embodiment of the on-press development type lithographic printing plate precursor according to the present disclosure contains an infrared absorber A and an infrared absorber B, in which a maximum absorption wavelength of the infrared absorber A is different from a maximum absorption wavelength of the infrared absorber B, and in a case where the lithographic printing plate precursor is subjected to exposure to infrared having a wavelength of 830 nm at an energy density of 110 mJ/cm$^2$, in a portion subjected to the exposure, a brightness change ΔL before the exposure and after storage subsequent to the exposure for 24 hours under conditions of 25° C. and 70% RH is 3.0 or more.

In a case where a term such as "on-press development type lithographic printing plate precursor according to the present disclosure" or "lithographic printing plate precursor according to the present disclosure" is simply mentioned in the present specification, unless otherwise specified, the term refers to both the first embodiment and the second embodiment. Furthermore, in a case where a term such as "image-recording layer" is simply mentioned, unless otherwise specified, the term refers to the image-recording layer of both the first embodiment and the second embodiment, or the like.

In addition, the on-press development type lithographic printing plate precursor according to the present disclosure is preferably a negative tone lithographic printing plate precursor.

The inventors of the present invention have found that in the negative tone lithographic printing plate precursor of the related art described in WO2017/141882A and US2009/0269699A, it is difficult to simultaneously achieve the visibility of an exposed portion after a lapse of time and the storage stability.

As a result of intensive studies, the inventors of the present invention have found that it is possible to provide a lithographic printing plate precursor that remains excellent in visibility of an exposed portion after a lapse of time (also simply described as "temporal visibility") and is excellent in storage stability.

The detailed mechanism that brings about the aforementioned effect is unclear, but is assumed to be as below.

Presumably, in a case where the lithographic printing plate precursor has two or more maximal absorption wavelengths in a wavelength range of 760 nm to 900 nm or contains the infrared absorber A and the infrared absorber B having different maximum absorption wavelengths, the absorption at the maximal or maximum absorption wavelengths of the infrared absorbers may suppress dark polymerization and inhibit color development that occurs during exposure from deteriorating with the lapse of time, which may allow the lithographic printing plate precursor to remain excellent in visibility of an exposed portion after the lapse of time and be excellent in storage stability.

The on-press development type lithographic printing plate precursor according to the present disclosure is also excellent in UV printing durability, although the detailed mechanism thereof is unclear.

A lithographic printing plate with which printing can be performed on a large number of sheets is described as "excellent in printing durability". Hereinafter, the printing durability exhibited in a case where an ultraviolet-curable ink (UV ink) is used will be also called "UV printing durability".

Hereinafter, each of the configuration requirements in the lithographic printing plate precursor according to the present disclosure will be specifically described.

In a case where the on-press development type lithographic printing plate precursor according to the present disclosure is subjected to exposure to infrared having a wavelength of 830 nm at an energy density of 110 mJ/cm$^2$, in a portion subjected to the exposure, a brightness change $\Delta L$ before the exposure and after storage subsequent to the exposure for 24 hours under conditions of 25° C. and 70% RH is 3.0 or more. In a case where $\Delta L$ is within the above range, temporal visibility, storage stability, and UV printing durability of the on-press development type lithographic printing plate precursor are excellent.

From the viewpoint of temporal visibility, storage stability, and UV printing durability, the brightness change $\Delta L$ in the on-press development type lithographic printing plate precursor according to the present disclosure is preferably 5.0 or more, and particularly preferably 5.0 to 20.0.

The following method is used to measure the brightness change $\Delta L$ before exposure and after storage subsequent to the exposure for 24 hours under conditions of 25° C. and 70% RH in a portion subjected to exposure, the brightness change being obtained in a case where the on-press development type lithographic printing plate precursor is subjected to exposure to infrared having a wavelength of 830 nm at an energy density of 110 mJ/cm$^2$.

In Luxel PLATESETTER T-9800 manufactured by FUJIFILM Graphic Systems that is equipped with an infrared semiconductor laser with a wavelength of 830 nm, the lithographic printing plate precursor is exposed under the conditions of output of 99.5%, outer drum rotation speed of 220 rpm, and resolution of 2,400 dots per inch (dpi, 1 inch=25.4 mm (energy density of 110 mJ/cm$^2$)). The exposure is performed in an environment of 25° C. and 50% RH.

The exposed lithographic printing plate precursor is stored for 24 hours under the conditions of 25° C. and 70% RH, and the brightness change of the lithographic printing plate precursor before and after the storage is measured. The brightness change is measured using a spectrocolorimeter eXact manufactured by X-Rite, Incorporated. By using the L* value (brightness) in the L*a*b* color system, the absolute value of a difference between the L* value of an exposed portion after exposure and the L*value of the exposed portion before exposure is adopted as the brightness change $\Delta L$.

The first embodiment of the on-press development type lithographic printing plate precursor according to the present disclosure has two or more maximal absorption wavelengths in a wavelength range of 760 nm to 900 nm. From the viewpoint of temporal visibility, storage stability, and UV printing durability, the first embodiment preferably has three or more maximal absorption wavelengths in a wavelength range of 760 nm to 900 nm, and more preferably has three or more and ten or less maximal absorption wavelengths in a wavelength range of 760 nm to 900 nm.

From the viewpoint of temporal visibility, storage stability, and UV printing durability, the second embodiment of the on-press development type lithographic printing plate precursor according to the present disclosure preferably has two or more maximal absorption wavelengths in a wavelength range of 760 nm to 900 nm, more preferably has three or more maximal absorption wavelengths in a wavelength range of 760 nm to 900 nm, and even more preferably has three or more and ten or less maximal absorption wavelengths in a wavelength range of 760 nm to 900 nm.

In addition, from the viewpoint of temporal visibility, storage stability, and UV printing durability, the on-press development type lithographic printing plate precursor according to the present disclosure preferably contains two or more kinds of infrared absorbers having a maximal absorption wavelength in a wavelength range of 760 nm to 900 nm, more preferably contains two or more and four or less kinds of infrared absorbers having a maximal absorption wavelength in a wavelength range of 760 nm to 900 nm, even more preferably contains two or three kinds of infrared absorbers having a maximal absorption wavelength in a wavelength range of 760 nm to 900 nm, and particularly preferably contains three or more kinds of infrared absorbers having a maximal absorption wavelength in a wavelength range of 760 nm to 900 nm. From the viewpoint of temporal visibility, storage stability, and UV printing durability, the maximal absorption wavelength of the infrared absorbers is preferably maximum absorption wavelength ($\lambda$max).

To measure the maximal absorption wavelength and maximum absorption wavelength described above, 20 mg of a compound is precisely weighed in a 100 mL volumetric flask, 80 mL of methanol for spectroscopic analysis is added thereto, and the mixture is gently shaken. After it is visually confirmed that the compound has completely dissolved, methanol is added thereto to increase the volume up to 100 mL. By a transfer pipette, the liquid obtained as above is taken out in an amount of 2 mL and put in another 100 mL volumetric flask, and methanol is added thereto to increase the volume. The liquid prepared in this way is measured using an ultraviolet-visible spectrophotometer (UV-1800, manufactured by Shimadzu Corporation.).

The second embodiment of the on-press development type lithographic printing plate precursor according to the present disclosure contains the infrared absorber A and the infrared absorber B, in which the maximum absorption wavelength of the infrared absorber A is different from the maximum absorption wavelength of the infrared absorber B.

From the viewpoint of temporal visibility, storage stability, and UV printing durability, the first embodiment of the on-press development type lithographic printing plate precursor according to the present disclosure preferably contains the infrared absorber A and the infrared absorber B. From the same viewpoint, it is more preferable that the maximum absorption wavelength of the infrared absorber Abe different from the maximum absorption wavelength of the infrared absorber B.

In the on-press development type lithographic printing plate precursor according to the present disclosure, the infrared absorber A and the infrared absorber B may be contained in any layer or may be contained in each of different layers. From the viewpoint of temporal visibility, storage stability, and UV printing durability, it is preferable that the on-press development type lithographic printing plate precursor according to the present disclosure have an image-recording layer on a support and the image-recording layer contain the infrared absorber A and the infrared absorber B, or it is preferable that the on-press development type lithographic printing plate precursor according to the present disclosure have a support, an image-recording layer, and an outermost layer in this order, the image-recording layer contain the infrared absorber A, and the outermost layer contain the infrared absorber B.

In addition, from the viewpoint of UV printing durability, it is more preferable that the on-press development type lithographic printing plate precursor according to the present disclosure have an image-recording layer on a support and the image-recording layer contain the infrared absorber A and the infrared absorber B. From the viewpoint of storage stability, it is more preferable that the on-press development type lithographic printing plate precursor according to the present disclosure have a support, an image-recording layer, and an outermost layer in this order, the image-recording layer contain the infrared absorber A, and the outermost layer contain the infrared absorber B.

Furthermore, from the viewpoint of temporal visibility, storage stability, and UV printing durability, it is preferable that the image-recording layer in the on-press development type lithographic printing plate precursor according to the present disclosure further contain an infrared absorber C, and the maximum absorption wavelength of the infrared absorber A, the maximum absorption wavelength of the infrared absorber B, and the maximum absorption wavelength of the infrared absorber C be different from each other; and it is particularly preferable that the on-press development type lithographic printing plate precursor according to the present disclosure have a support, an image-recording layer, and an outermost layer in this order, the image-recording layer contain the infrared absorber A and the infrared absorber B, and the outermost layer contain the infrared absorber C.

From the viewpoint of temporal visibility, storage stability, and UV printing durability, the image-recording layer preferably contains at least one kind of infrared absorber that decomposes due to exposure to infrared ("decomposition-type infrared absorber"), and particularly preferably contains two or more kinds of infrared absorbers and at least one kind of decomposition-type infrared absorber.

In addition, from the viewpoint of temporal visibility, storage stability, and UV printing durability, the outermost layer preferably contains at least one kind of decomposition-type infrared absorber.

Furthermore, the decomposition-type infrared absorber is preferably a decomposition and color development-type infrared absorber that develops color by the decomposition described above.

In the present disclosure, "color development" regarding an infrared absorber means that the absorption in a visible light region (wavelength region of 400 nm or more and less than 750 nm) further increases after exposure to infrared than before the exposure to infrared. For example, "color development" regarding an infrared absorber also includes a phenomenon where the infrared absorber that absorbs wavelengths shorter than the wavelengths in a visible light region before exposure to infrared comes to absorb longer wavelengths, the wavelengths being in a visible light region, after exposure to infrared.

From the viewpoint of temporal visibility, storage stability, and UV printing durability, the infrared absorber B is preferably a decomposition-type infrared absorber that decomposes due to exposure to infrared.

Furthermore, from the viewpoint of temporal visibility, storage stability, and UV printing durability, it is preferable that the infrared absorber A be a non-decomposition-type infrared absorber or a decomposition-type infrared absorber, and the infrared absorber B be a decomposition-type infrared absorber; and it is more preferable that the infrared absorber A be a non-decomposition-type infrared absorber, and the infrared absorber B be a decomposition-type infrared absorber.

In a case where the outermost layer contains an infrared absorber, the infrared absorber contained in the outermost layer is preferably a decomposition-type infrared absorber.

From the viewpoint of temporal visibility, storage stability, and UV printing durability, the maximum absorption wavelength of the infrared absorber A is preferably more than 820 nm, more preferably more than 830 nm, even more preferably more than 830 nm and 900 nm or less, and particularly preferably 840 nm to 900 nm.

From the viewpoint of temporal visibility, storage stability, and UV printing durability, the maximum absorption wavelength of the infrared absorber B is preferably 830 nm or less, ore preferably 760 nm to 830 nm, even more preferably 760 nm to 820 nm, and particularly preferably 765 nm to 810 nm.

From the viewpoint of temporal visibility, storage stability, and UV printing durability, a difference between the maximum absorption wavelength of the infrared absorber A and the maximum absorption wavelength of the infrared absorber B is preferably 5 nm or more, more preferably 5 nm to 50 nm, even more preferably 10 nm to 50 nm, and particularly preferably 20 nm to 50 nm.

From the viewpoint of printing durability and visibility, the highest occupied molecular orbital (HOMO) of the infrared absorber A is preferably −5.250 eV or less, more preferably −5.30 eV or less, even more preferably −5.80 eV or more and −5.35 eV or less, and particularly preferably −5.65 eV or more and −5.40 eV or less.

In the present disclosure, the energy of molecular orbital (MO) such as highest occupied molecular orbital (HOMO) and the lowest unoccupied molecular orbital (LUMO) is calculated by the following methods.

First, free counterions in the compound as a calculation object are excluded from the calculation object. For example, for a cationic electron-accepting polymerization initiator and a cationic infrared absorber, counteranions are excluded from the calculation object, and for an anionic electron-donating polymerization initiator, countercations are excluded from the calculation object. "Free" mentioned herein means that the compound as an object and the counterions thereof are not covalently linked to each other.

The structural optimization is carried out by DFT (B3LYP/6-31G(d)) using quantum chemical calculation software Gaussian 09.

The molecular orbital (MO) energy is calculated by DFT (B3LYP/6-31+G(d,p)/CPCM (solvent=methanol)) using the structure obtained by the structural optimization.

By the following formula, the MO energy Ebare (unit: hartree) obtained by the above MO energy calculation is converted into Escaled (unit: eV) used as the values of HOMO and LUMO in the present disclosure.

$$Escaled=0.823168\times27.2114\times Ebare-1.07634$$

27.2114 is simply a coefficient for converting hartree into eV, and 0.823168 and −1.07634 are adjustment coefficients. These are determined such that the calculated values of HOMO and LUMO of the compound as a calculation object match the measured values.

<Image-Recording Layer>

It is preferable that the lithographic printing plate precursor according to the present disclosure have an image-recording layer formed on a support.

The on-press development type lithographic printing plate precursor according to the present disclosure preferably contains a polymerizable compound, a polymerization initiator, and an infrared absorber (for example, the on-press development type lithographic printing plate precursor preferably contains either or both of the infrared absorber A and the infrared absorber B).

The image-recording layer used in the present disclosure is preferably a negative tone image-recording layer and more preferably a water-soluble or water-dispersible negative tone image-recording layer.

In the lithographic printing plate precursor according to the present disclosure, from the viewpoint of on-press developability, a non-exposed portion of the image-recording layer is preferably removable by at least any of dampening water or printing ink.

Hereinafter, each of the components to be incorporated into the image-recording layer will be specifically described.

[Infrared Absorber]

In the on-press development type lithographic printing plate precursor according to the present disclosure, it is preferable that the image-recording layer contain at least one of the infrared absorber A or the infrared absorber B.

The image-recording layer may further contain other infrared absorbers such as an infrared absorber C and an infrared absorber D, in addition to the infrared absorber A and the infrared absorber B.

In the present specification, in a case where the term "infrared absorber" is simply mentioned, unless otherwise specified, the term collectively refers to the infrared absorber A, the infrared absorber B, the infrared absorber C, the infrared absorber D, and the like.

The infrared absorber is not particularly limited, and examples thereof include pigments and dyes.

As the dye that is used as the infrared absorber, it is possible to use commercially available dyes and known dyes described in publications, for example, "Dye Handbooks" (edited by the Society of Synthetic Organic Chemistry, Japan, 1970). Specific examples thereof include dyes such as an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium colorant, a pyrylium salt, and a metal thiolate complex.

Examples of particularly preferred dyes among the above include a cyanine dye, a squarylium colorant, a pyrylium salt, a nickel thiolate complex, and an indolenine cyanine dye. Furthermore, for example, a cyanine dye or an indolenine cyanine dye is preferable. Among these, a cyanine dye is particularly preferable.

The infrared absorber is preferably a cationic polymethine colorant having an oxygen or nitrogen atom at the meso-position. Preferred examples of the cationic polymethine colorant include a cyanine dye, a pyrylium colorant, a thiopyrylium colorant, an azulenium colorant, and the like. From the viewpoint of ease of availability, solubility in a solvent during an introduction reaction, and the like, a cyanine dye is preferable.

Specific examples of the cyanine dye include the compounds described in paragraphs "0017" to "0019" of JP2001-133969A and the compounds described in paragraphs "0016" to "0021" of JP2002-023360A and paragraphs "0012" to "0037" of JP2002-040638A. As the cyanine dye, for example, the compounds described in paragraphs "0034" to "0041" of JP2002-278057A and paragraphs "0080" to "0086" of JP2008-195018A are preferable, and the compounds described in paragraphs "0035" to "0043" of JP2007-90850A and the compounds described in paragraphs "0105" to "0113" of JP2012-206495A are particularly preferable.

Furthermore, the compounds described in paragraphs "0008" and "0009" of JP1993-5005A (JP-H5-5005A) and paragraphs "0022" to "0025" of JP2001-222101A can also be preferably used.

As pigments, the compounds described in paragraphs "0072" and "0076" of JP2008-195018A are preferable.

The aforementioned infrared absorber preferably includes, for example, as the infrared absorber A and the infrared absorber B, an infrared absorber that decomposes due to exposure to infrared (decomposition-type infrared absorber), and more preferably includes a decomposition and color development-type infrared absorber.

Presumably, in a case where a decomposition-type infrared absorber is used as the aforementioned infrared absorber, the infrared absorber or a decomposition product thereof may promote polymerization, and the decomposition product of the infrared absorber and the polymerizable compound may interact with each other, which may result in excellent UV printing durability.

The decomposition-type infrared absorber is preferably an infrared absorber that performs a function of developing color by absorbing infrared and decomposing by exposure to infrared.

Hereinafter, a color-developing compound formed as a result of infrared absorption and decomposition of the decomposition-type infrared absorber by exposure to infrared will be also called "color developing substance of the decomposition-type infrared absorber".

Furthermore, it is preferable that the decomposition-type infrared absorber have a function of absorbing infrared by exposure to infrared and converting the absorbed infrared into heat.

The decomposition-type infrared absorber may be an infrared absorber that decomposes by absorbing at least a part of light in the infrared wavelength region (wavelength of 750 nm to 1 mm). The decomposition-type infrared absorber is preferably an infrared absorber having a maximal absorption wavelength in a wavelength region of 750 nm to 1,400 nm, and more preferably an infrared absorber having a maximal absorption wavelength in a wavelength region of 760 nm to 900 nm.

More specifically, the decomposition-type infrared absorber is preferably a compound that decomposes due to the exposure to infrared and generates a compound having maximal absorption wavelength in a wavelength region of 500 nm to 600 nm.

The decomposition-type infrared absorber is preferably an infrared absorber that decomposes by either or both of heat and electron migration resulting from exposure to infrared, and more preferably an infrared absorber that decomposes by electron migration resulting from exposure to infrared. "Decomposes by electron migration" mentioned herein means that electrons excited to the lowest unoccupied molecular orbital (LUMO) from the highest occupied molecular orbital (HOMO) of the decomposition-type infrared absorber by exposure to infrared move to electron accepting groups (groups having potential close to LUMO) in a molecule by means of intramolecular electron migration and thus result in decomposition.

The infrared absorber preferably includes a compound represented by Formula 1, and more preferably includes a compound represented by Formula 1 as the infrared absorber A.

Formula 1

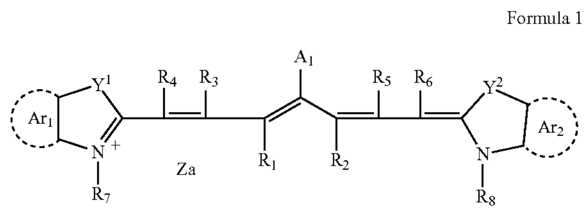

In Formula 1, $R_1$ and $R_2$ each independently represent a hydrogen atom or an alkyl group, $R_1$ and $R_2$ may be linked to each other to form a ring, $R_3$ to $R_6$ each independently represent a hydrogen atom or an alkyl group, $R_7$ and $R_8$ each independently represent an alkyl group or an aryl group, $Y_1$ and $Y_2$ each independently represent an oxygen atom, a sulfur atom, —$NR_0$—, or a dialkylmethylene group, $R_0$ represents a hydrogen atom, an alkyl group, or an aryl group, $Ar_1$ and $Ar_2$ each independently represent a group forming a benzene ring or a naphthalene ring which may have a group represented by Formula 2 that will be described later, $A_1$ represents —$NR_9R_{10}$, —$X_1$-$L_1$, or a group represented by Formula 2 that will be described later, $R_9$ and $R_{10}$ each independently represent an alkyl group, an aryl group, an alkoxycarbonyl group, or an arylsulfonyl group, $X_1$ represents an oxygen atom or a sulfur atom, $L_1$ represents a hydrocarbon group, a heteroaryl group, or a group that undergoes bond cleavage from $X_1$ by heat or exposure to infrared, Za represents a counterion that neutralizes charge, and at least one of $Ar_1$ or $Ar_2$ has a group represented by Formula 2.

—X    Formula 2

In Formula 2, X represents a halogen atom, —C(═O)—$X_2$—$R_{11}$, —C(═O)—$NR_{12}R_{13}$, —O—C(═O)—$R_{14}$, —CN, —$SO_2NR_{15}R_{16}$, or a perfluoroalkyl group, $X_2$ represents a single bond or an oxygen atom, $R_{11}$ and $R_{14}$ each independently represent an alkyl group or an aryl group, and $R_{12}$, $R_{13}$, $R_{15}$, and $R_{16}$ each independently represent a hydrogen atom, an alkyl group, or an aryl group.

$Ar_1$ and $Ar_2$ each independently represent a group forming a benzene ring or a naphthalene ring. The benzene ring and the naphthalene ring may have a substituent other than —X. Examples of the substituent include an alkyl group, an alkoxy group, an aryloxy group, an amino group, an alkylthio group, an arylthio group, a carboxy group, a carboxylate group, a sulfo group, a sulfonate group, groups obtained by combining these, and the like. Among these, an alkyl group is preferable.

In Formula 1, at least one of $Ar_1$ or $Ar_2$ has a group represented by Formula 2. From the viewpoint of printing durability and visibility, it is preferable that both of $Ar_1$ and $Ar_2$ have a group represented by Formula 2.

X in Formula 2 represents a halogen atom, —C(═O)—$X_2$—$R_{11}$, —C(═O)—$NR_{12}R_{13}$, —O—C(═O)—$R_{14}$, —CN, —$SO_2NR_{15}R_{16}$, or a perfluoroalkyl group. From the viewpoint of printing durability, visibility, and temporal stability, X is preferably a halogen atom, —C(═O)—$X_2$—$R_{11}$, —C(═O)—$NR_{12}R_{13}$, —O—C(═O)—$R_{14}$, CN, or —$SO_2NR_{15}R_{16}$, more preferably a halogen atom, —C(═O)—O—$R_{11}$, —C(═O)—$NR_{12}R_{13}$, or —O—C(═O)—$R_{14}$, even more preferably a halogen atom, —C(═O)—O—$R_{11}$ or —O—C(═O)—$R_{14}$, particularly preferably a fluorine atom, a chlorine atom, a bromine atom, or —C(═O)$OR_{17}$, and most preferably a chlorine atom or a bromine atom.

$X_2$ represents a single bond or an oxygen atom, and is preferably an oxygen atom.

$R_{11}$ and $R_{14}$ each independently represent an alkyl group or an aryl group, preferably each independently represent an alkyl group having 1 to 12 carbon atoms or an aryl group having 6 to 12 carbon atoms, and more preferably each independently represent an alkyl group having 1 to 12 carbon atoms.

$R_{12}$, $R_{13}$, $R_{15}$, and $R_{16}$ each independently represent a hydrogen atom, an alkyl group, or an aryl group, preferably each independently represent a hydrogen atom, an alkyl group having 1 to 12 carbon atoms, or an aryl group having 6 to 12 carbon atoms, more preferably each independently represent a hydrogen atom or an alkyl group having 1 to 12 carbon atoms, and even more preferably each independently represent an alkyl group having 1 to 12 carbon atoms.

$R_{17}$ represents an alkyl group or an aryl group, preferably represents an alkyl group having 1 to 12 carbon atoms or an aryl group having 6 to 12 carbon atoms, and more preferably represents an alkyl group having 1 to 12 carbon atoms.

$A_1$ represents —$NR_9R_{10}$, —$X_1$-$L_1$, or —X. From the viewpoint of printing durability, visibility, and temporal stability, $A_1$ is preferably —$NR_9R_{10}$ or —$X_1$-$L_1$, and more preferably —$NR_{18}R_{19}$ or —S—$R_{20}$.

Furthermore, from the viewpoint of UV plate missing suppressiveness, GLV suitability, and UV printing durability, $A_1$ is preferably —X, more preferably a halogen atom, even more preferably a chlorine atom or a bromine atom, and particularly preferably a chlorine atom.

$R_9$ and $R_{10}$ each independently represent an alkyl group, an aryl group, an alkoxycarbonyl group, or an arylsulfonyl group, preferably each independently represent an alkyl group having 1 to 12 carbon atoms or an aryl group having 6 to 12 carbon atoms, and more preferably each independently represent an alkyl group having 1 to 12 carbon atoms.

$X_1$ represents an oxygen atom or a sulfur atom. In a case where $L_1$ is a hydrocarbon group or a heteroaryl group, $X_1$ is preferably a sulfur atom. $L_1$ is preferably a group that undergoes bond cleavage from $X_1$ by heat or exposure to infrared.

$L_1$ represents a hydrocarbon group, a heteroaryl group, or a group that undergoes bond cleavage from $X_1$ by heat or exposure to infrared. From the viewpoint of printing durability, $L_1$ is preferably a hydrocarbon group or a heteroaryl group, more preferably an aryl group or a heteroaryl group, and even more preferably a heteroaryl group.

Furthermore, from the viewpoint of visibility and suppressing fading over time, $L_1$ is preferably a group that undergoes bond cleavage from $X_1$ by heat or exposure to infrared. The group that undergoes bond cleavage from $X_1$ by heat or exposure to infrared will be described later.

$R_{18}$ and $R_{19}$ each independently represent an aryl group, preferably each independently represent an aryl group having 6 to 20 carbon atoms, and more preferably each independently represent a phenyl group.

$R_{20}$ represents a hydrocarbon group or a heteroaryl group, preferably represents an aryl group or a heteroaryl group, and more preferably represents a heteroaryl group.

Preferred examples of the heteroaryl group represented by $L_1$ and $R_{20}$ include the following groups.

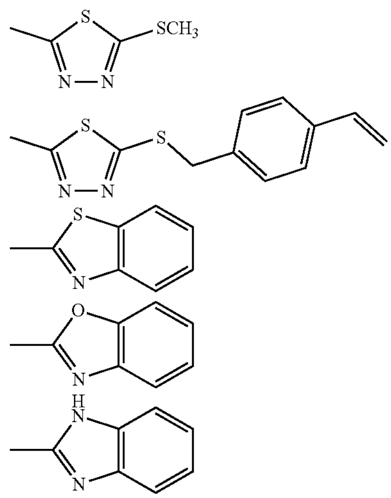

The alkyl group represented by $R_1$ to $R_{10}$ and $R_0$ is preferably an alkyl group having 1 to 30 carbon atoms, more preferably an alkyl group having 1 to 15 carbon atoms, and even more preferably an alkyl group having 1 to 10 carbon atoms. The alkyl group may be linear or branched, or may have a ring structure.

Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, or a butyl group is particularly preferable.

The above alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and groups obtained by combining these, and the like.

The aryl group represented by $R_9$, $R_{10}$, $R_{18}$, $R_{19}$, and $R_{20}$ is preferably an aryl group having 6 to 30 carbon atoms, more preferably an aryl group having 6 to 20 carbon atoms, and even more preferably an aryl group having 6 to 12 carbon atoms.

The aryl group may further have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and groups obtained by combining these, and the like.

Specific examples of the aryl group include a phenyl group, a naphthyl group, a p-tolyl group, a p-chlorophenyl group, a p-fluorophenyl group, a p-methoxyphenyl group, a p-dimethylaminophenyl group, a p-methylthiophenyl group, a p-phenylthiophenyl group, and the like.

Among these aryl groups, a phenyl group, a p-methoxyphenyl group, a p-dimethylaminophenyl group, or a naphthyl group is preferable.

It is preferable that $R_1$ and $R_2$ be linked to each other to form a ring.

In a case where $R_1$ and $R_2$ are linked to each other to form a ring, the formed ring is preferably a 5- or a 6-membered ring and more preferably a 6-membered ring. Furthermore, the ring formed of $R_1$ and $R_2$ linked to each other is preferably a hydrocarbon ring which may have an ethylenically unsaturated bond.

$Y_1$ and $Y_2$ each independently represent an oxygen atom, a sulfur atom, —$NR_0$—, or a dialkylmethylene group. Among these, —$NR_0$— or a dialkylmethylene group is preferable, and a dialkylmethylene group is more preferable.

$R_0$ represents a hydrogen atom, an alkyl group, or an aryl group. $R_0$ is preferably an alkyl group.

It is preferable that $R_7$ and $R_8$ be the same group.

$R_7$ and $R_8$ preferably each independently represent a linear alkyl group or an alkyl group having a sulfonate group on a terminal, and more preferably each independently represent a methyl group, an ethyl group, or a butyl group having a sulfonate group on a terminal.

The countercation of the aforementioned sulfonate group may be a cation on a nitrogen atom in Formula 1 or may be an alkali metal cation or an alkaline earth metal cation.

From the viewpoint of improving water solubility of the compound represented by Formula 1, $R_7$ and $R_8$ preferably each independently represent an alkyl group having an anion structure, more preferably each independently represent an alkyl group having a carboxylate group or a sulfonate group, and even more preferably each independently represent an alkyl group having a sulfonate group on a terminal.

From the viewpoint of increasing the maximal absorption wavelength of the compound represented by Formula 1 and from the viewpoint of visibility and printing durability of the lithographic printing plate, $R_7$ and $R_8$ preferably each independently represent an alkyl group having an aromatic ring, more preferably each independently represent an alkyl group having an aromatic ring on a terminal, and particularly preferably each independently represent a 2-phenylethyl group, a 2-naphthalenylethyl group, or a 2-(9-anthracenyl) ethyl group.

$R_3$ to $R_6$ each independently represent a hydrogen atom or an alkyl group, and preferably each independently represent a hydrogen atom.

From the viewpoint of temporal stability, UV plate missing suppressiveness, GLV suitability, and UV printing durability, the compound represented by Formula 1 preferably has one or more halogen atoms, more preferably has one or more halogen atoms in at least one group selected from the group consisting of $A_1$, $Ar_1$, and $Ar_2$, and particularly preferably has one or more halogen atoms in each of $A_1$, $Ar_1$, and $Ar_2$.

Furthermore, from the viewpoint of temporal stability, UV plate missing suppressiveness, GLV suitability, and UV printing durability, the compound represented by Formula 1 more preferably has two or more halogen atoms, even more preferably has three or more halogen atoms, and particularly preferably has three or more and six or less halogen atoms.

Preferred examples of the aforementioned halogen atoms include a chlorine atom and a bromine atom.

From the viewpoint of temporal stability, UV plate missing suppressiveness, GLV suitability, and UV printing durability, the compound represented by Formula 1 preferably has halogen atoms in at least one of $Ar_1$ or $Ar_2$, more preferably has chlorine atoms or bromine atoms in at least one of $Ar_1$ or $Ar_2$, and particularly preferably has bromine atoms in at least one of $Ar_1$ or $Ar_2$.

Za represents a counterion that neutralizes charge. In a case where Za represents anionic species, examples thereof include a sulfonate ion, a carboxylate ion, a tetrafluoroborate ion, a hexafluorophosphate ion, a perchlorate ion, a sulfonamide anion, a sulfonimide anion, and the like. In a case where Za represents cationic species, an alkali metal ion, an alkaline earth metal ion, an ammonium ion, a pyridinium ion, or a sulfonium ion is preferable, a sodium ion, a potassium ion, an ammonium ion, a pyridinium ion, or a sulfonium ion is more preferable, a sodium ion, a potassium ion, or an ammonium ion is even more preferable, and a sodium ion, a potassium ion, or a trialkylammonium ion is particularly preferable.

As Za, among the above, from the viewpoint of printing durability and visibility, an organic anion having a carbon atom is preferable, a sulfonate ion, a carboxylate ion, a sulfonamide anion, or a sulfonimide anion is more preferable, a sulfonamide anion or a sulfonimide anion is even more preferable, and a sulfonimide anion is particularly preferable.

$R_1$ to $R_8$, $R_0$, $A_1$, $Ar_1$, $Ar_2$, $Y_1$, and $Y_2$ may have an anion structure or a cation structure. In a case where all of $R_1$ to $R_8$, $R_0$, $A_1$, $Ar_1$, $Ar_2$, $Y_1$, and $Y_2$ represent a group having neutral charge, Za represents a monovalent counteranion. However, for example, in a case where two or more among $R_1$ to $R_8$, $R_0$, $A_1$, $Ar_1$, $Ar_2$, $Y_1$, and $Y_2$ have an anion structure, Za can be a countercation.

In Formula 1, in a case where portions other than Za have neutral charge, Formula 1 may not have Za.

As the sulfonamide anion, an aryl sulfonamide anion is preferable.

As the sulfonimide anion, a bisaryl sulfonimide anion is preferable.

Specific examples of the sulfonamide anion or the sulfonimide anion will be shown below, but the present disclosure is not limited thereto. In the following specific examples, Ph represents a phenyl group, Me represents a methyl group, and Et represents an ethyl group.

I-1

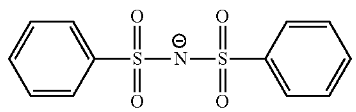

I-2

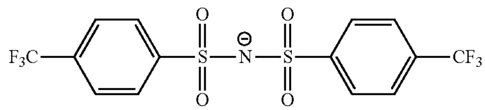

I-3

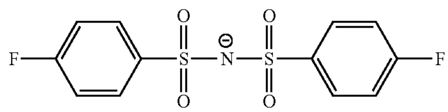

I-4

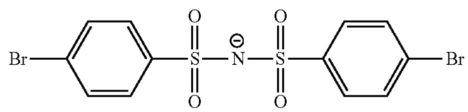

-continued

I-5

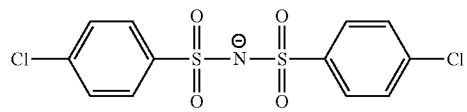

I-6

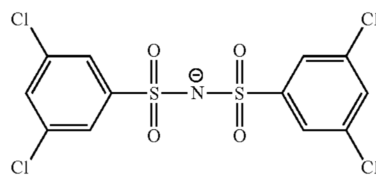

I-7

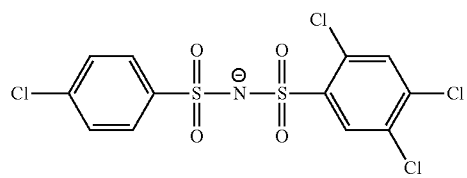

I-8

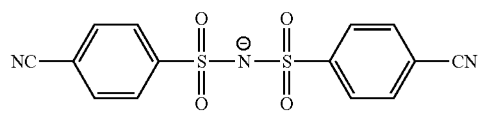

I-9

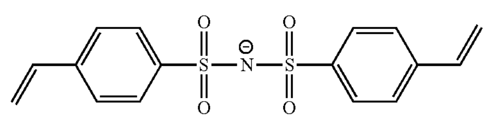

I-10

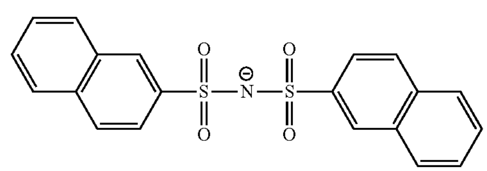

I-11

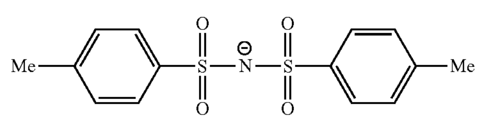

I-12

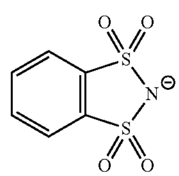

I-13

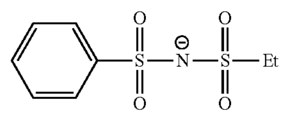

I-14

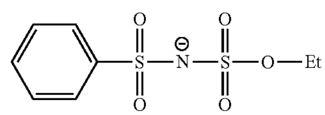

I-15

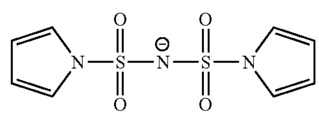

-continued

I-16

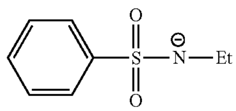

I-17

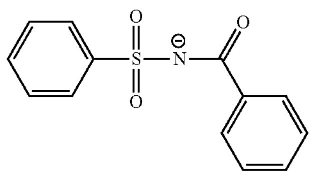

I-18

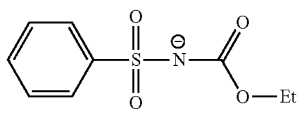

I-19

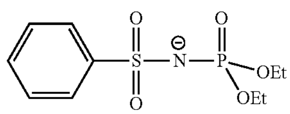

I-20

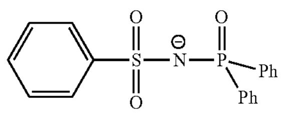

I-21

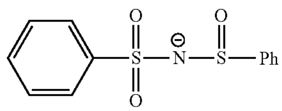

I-22

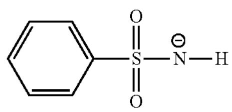

I-23

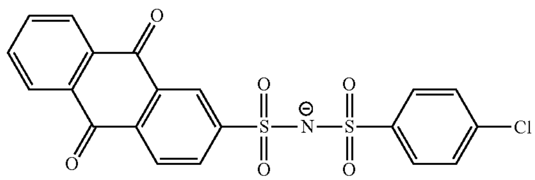

I-24

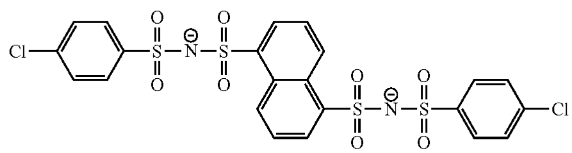

I-25

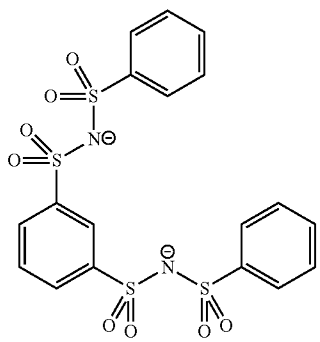

-continued

I-26

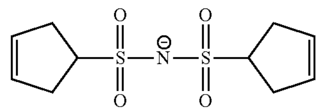

From the viewpoint of visibility, the group that undergoes bond cleavage from $X_1$ by heat or exposure to infrared is preferably a group represented by any of Formulas (1-1) to (1-7), and more preferably a group represented by any of Formulas (1-1) to (1-3).

(1-1)

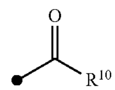

(1-2)

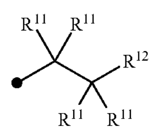

(1-3)

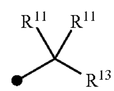

(1-4)

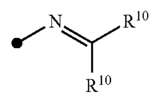

(1-5)

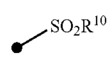

(1-6)

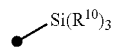

(1-7)

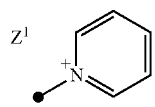

In Formulas (1-1) to (1-7), ● represents a bonding site with $X_1$ in Formula 1, $R^{10}$ each independently represent a hydrogen atom, an alkyl group, an alkenyl group, an aryl group, —$OR^{14}$, —$NR^{15}R^{16}$, or —$SR^{17}$, $R^{11}$ each independently represent a hydrogen atom, an alkyl group, or an aryl group, $R^{12}$ represents an aryl group, —$OR^{14}$, —$NR^{15}R^{16}$, —$SR^{17}$, —C(═O)$R^{18}$, —OC(═O)$R^{18}$, or a halogen atom, $R^{13}$ represents an aryl group, an alkenyl group, an alkoxy group, or an onium group, $R^{14}$ to $R^{17}$ each independently represent a hydrogen atom, an alkyl group, or an aryl group, $R^{18}$ each independently represent an alkyl group, an aryl group, —$OR^{14}$, —$NR^{15}R^{16}$, or —$SR^{17}$, and $Z^1$ represents a counterion that neutralizes charge.

In a case where $R^{10}$, $R^{11}$, and $R^{14}$ to $R^{18}$ each represent an alkyl group, preferred aspects of the alkyl group are the same as preferred aspects of the alkyl group represented by $R^2$ to $R^9$ and $R^0$.

The number of carbon atoms in the alkenyl group represented by $R^{10}$ and $R^{13}$ is preferably 1 to 30, more preferably 1 to 15, and even more preferably 1 to 10.

In a case where $R^{10}$ to $R^{18}$ each represent an aryl group, preferred aspects of the aryl group are the same as preferred aspects of the aryl group represented by $R^0$.

From the viewpoint of visibility, $R^{10}$ in Formula (1-1) is preferably an alkyl group, an alkenyl group, an aryl group, —$OR^{14}$, —$NR^{15}R^{16}$, or —$SR^{17}$, more preferably an alkyl group, —$OR^{14}$, —$NR^{15}R^{16}$, or —$SR^{17}$, even more preferably an alkyl group or —$OR^{14}$, and particularly preferably —$OR^{14}$.

In a case where $R^{10}$ in Formula (1-1) is an alkyl group, the alkyl group is preferably an alkyl group having an arylthio group or an alkyloxycarbonyl group at the α-position.

In a case where $R^{10}$ in Formula (1-1) represents —$OR^{14}$, $R^{14}$ is preferably an alkyl group, more preferably an alkyl group having 1 to 8 carbon atoms, even more preferably an isopropyl group or a t-butyl group, and particularly preferably a t-butyl group.

From the viewpoint of visibility, $R^{11}$ in Formula (1-2) is preferably a hydrogen atom.

Furthermore, from the viewpoint of visibility, $R^{12}$ in Formula (1-2) is preferably —C(═O)$OR^{14}$, —OC(═O)$OR^{14}$, or a halogen atom, and more preferably —C(═O)$OR^{14}$ or —OC(═O)$OR^{14}$. In a case where $R^{12}$ in Formula (1-2) is —C(═O)$OR^{14}$ or —OC(═O)$OR^{14}$, $R^{14}$ is preferably an alkyl group.

From the viewpoint of visibility, $R^{11}$ in Formula (1-3) preferably each independently represent a hydrogen atom or an alkyl group. It is more preferable that at least one of $R^{11}$'s in Formula (1-3) be an alkyl group.

The alkyl group represented by $R^{11}$ is preferably an alkyl group having 1 to 10 carbon atoms, and more preferably an alkyl group having 3 to 10 carbon atoms.

Furthermore, the alkyl group represented by $R^{11}$ is preferably an alkyl group having a branch or a cycloalkyl group, more preferably a secondary or tertiary alkyl group or a cycloalkyl group, and even more preferably an isopropyl group, a cyclopentyl group, a cyclohexyl group, or a t-butyl group.

From the viewpoint of visibility, $R^{13}$ in Formula (1-3) is preferably an aryl group, an alkoxy group, or an onium group, more preferably a p-dimethylaminophenyl group or a pyridinium group, and even more preferably a pyridinium group.

Examples of the onium group represented by $R^{13}$ include a pyridinium group, an ammonium group, a sulfonium group, and the like. The onium group may have a substituent.

Examples of the substituent include an alkyl group, an alkoxy group, an aryloxy group, an amino group, an alkylthio group, an arylthio group, a halogen atom, a carboxy group, a sulfo group, an alkyloxycarbonyl group, an aryloxycarbonyl group, groups obtained by combining these, and the like. Among these, an alkyl group, an aryl group, and groups obtained by combining these are preferable.

Among these, a pyridinium group is preferable, a N-alkyl-3-pyridinium group, a N-benzyl-3-pyridinium group, a N-(alkoxypolyalkyleneoxyalkyl)-3-pyridinium group, a N-alkoxycarbonylmethyl-3-pyridinium group, a N-alkyl-4-pyridinium group, a N-benzyl-4-pyridinium group, a N-(alkoxypolyalkyleneoxyalkyl)-4-pyridinium group, a N-alkoxycarbonylmethyl-4-pyridinium group, or a N-alkyl-3,5-dimethyl-4-pyridinium group is more preferable, a N-alkyl-3-pyridinium group or a N-alkyl-4-pyridinium group is even more preferable, a N-methyl-3-pyridinium group, a N-octyl-3-pyridinium group, a N-methyl-4-pyridinium group, or a N-octyl-4-pyridinium group is particularly preferable, and a N-octyl-3-pyridinium group or a N-octyl-4-pyridinium group is most preferable.

In a case where $R^{13}$ is a pyridinium group, examples of the counteranion include a sulfonate ion, a carboxylate ion, a tetrafluoroborate ion, a hexafluorophosphate ion, a p-toluenesulfonate ion, a perchlorate ion, and the like. Among these, a p-toluenesulfonate ion or a hexafluorophosphate ion is preferable.

From the viewpoint of visibility, $R^{10}$ in Formula (1-4) is preferably an alkyl group or an aryl group. It is more preferable that one of two $R^{10}$'s be an alkyl group and the other be an aryl group.

From the viewpoint of visibility, $R^{10}$ in Formula (1-5) is preferably an alkyl group or an aryl group, more preferably an aryl group, and even more preferably a p-methylphenyl group. From the viewpoint of visibility, $R^{10}$ in Formula (1-6) preferably each independently represent an alkyl group or an aryl group, and more preferably each independently represent a methyl group or a phenyl group.

From the viewpoint of visibility, $Z^1$ in Formula (1-7) may be a counterion that neutralizes charge, and may be included in Za in the entirety of the compound.

$Z^1$ is preferably a sulfonate ion, a carboxylate ion, a tetrafluoroborate ion, a hexafluorophosphate ion, a p-toluenesulfonate ion, or a perchlorate ion, and more preferably a p-toluenesulfonate ion or a hexafluorophosphate ion.

The group that undergoes bond cleavage from $X_1$ by heat or exposure to infrared is particularly preferably a group represented by Formula (1-8).

(1-8)

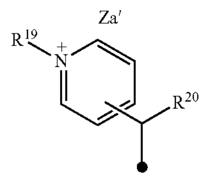

In Formula (1-8), ● represents a bonding site with $X_1$ in formula 1, $R^{19}$ and $R^{20}$ each independently represent an alkyl group, and Za' represents a counterion that neutralizes charge.

In Formula (1-8), the bonding position of a pyridinium ring and a hydrocarbon group having $R^{20}$ is preferably the 3-position or 4-position of the pyridinium ring, and more preferably the 4-position of the pyridinium ring.

The alkyl group represented by $R^{19}$ and $R^{20}$ may be linear or branched, or may have a ring structure.

Furthermore, the above alkyl group may have a substituent, and preferred examples of the substituent include an alkoxy group and a terminal alkoxypolyalkyleneoxy group.

$R^{19}$ is preferably an alkyl group having 1 to 12 carbon atoms, more preferably a linear alkyl group having 1 to 12 carbon atoms, even more preferably a linear alkyl group having 1 to 8 carbon atoms, and particularly preferably a methyl group or a n-octyl group.

$R^{20}$ is preferably an alkyl group having 1 to 8 carbon atoms, more preferably a branched alkyl group having 3 to 8 carbon atoms, even more preferably an isopropyl group or a t-butyl group, and particularly preferably an isopropyl group.

Za' may be a counterion that neutralizes charge, and may be included in Za in the entirety of the compound.

Za' is preferably a sulfonate ion, a carboxylate ion, a tetrafluoroborate ion, a hexafluorophosphate ion, a p-toluenesulfonate ion, or a perchlorate ion, and more preferably a p-toluenesulfonate ion or a hexafluorophosphate ion.

From the viewpoint of improving visibility of exposed portions, the decomposition-type infrared absorber is preferably a cyanine dye having a group that decomposes by exposure to infrared (specifically, $R^1$ in Formulas 1-1 to 1-7).

From the viewpoint of improving visibility of exposed portions, the decomposition-type infrared absorber is more preferably a compound represented by Formula 1-1.

Formula 1-1

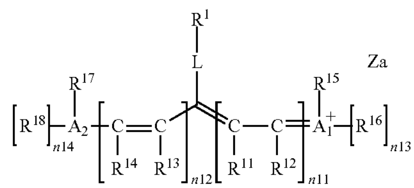

In Formula 1-1, $R^1$ represents a group that is represented by any of Formula 2-1 to Formula 4-1, $R^{11}$ to $R^{18}$ each independently represent a hydrogen atom, a halogen atom, $—R^a$, $—OR^b$, $—SR^c$, or $—NR^dR^e$, $R^a$ to $R^e$ each independently represent a hydrocarbon group, $A_1$, $A_2$, and a plurality of $R_{11}$ to $R_{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, the sum of $n_{11}$ and $n_{12}$ is 2 or more, $n_{13}$ and $n_{14}$ each independently represent 0 or 1, L represents an oxygen atom, a sulfur atom, or $—NR^{10}—$, $R^{10}$ represents a hydrogen atom, an alkyl group, or an aryl group, and Za represents a counterion that neutralizes charge.

Formula 2-1

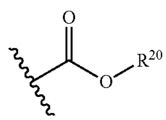

Formula 3-1

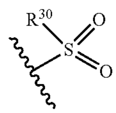

Formula 4-1

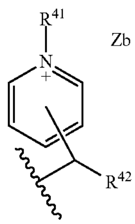

In Formula 2-1 to Formula 4-1, $R^{20}$, $R^{30}$, $R^{41}$, and $R^{42}$ each independently represent an alkyl group or an aryl group, Zb represents a counterion that neutralizes charge, a wavy line represents a bonding site with a group represented by L in Formula 1-1.

In a case where the compound represented by Formula 1-1 is exposed to infrared, the $R^1$-L bond is cleaved, L turns into $=O$, $=S$, or $=NR^{10}$, and the compound is discolored.

In Formula 1-1, $R^1$ represents a group represented by any of Formula 2-1 to Formula 4-1.

Hereinafter, each of the group represented by Formula 2-1, the group represented by Formula 3-1, and the group represented by Formula 4-1 will be described.

In Formula 2-1, $R^{20}$ represents an alkyl group or an aryl group, and the portion of the wavy line represents a bonding site with the group represented by L in Formula 1-1.

As the alkyl group represented by $R^{20}$, an alkyl group having 1 to 30 carbon atoms is preferable, an alkyl group having 1 to 15 carbon atoms is more preferable, and an alkyl group having 1 to 10 carbon atoms is even more preferable.

The alkyl group may be linear or branched, or may have a ring structure.

The aryl group represented by $R^{20}$ is preferably an aryl group having 6 to 30 carbon atoms, more preferably an aryl group having 6 to 20 carbon atoms, and even more preferably an aryl group having 6 to 12 carbon atoms.

From the viewpoint of visibility, $R^{20}$ is preferably an alkyl group.

From the viewpoint of decomposition properties and visibility, the alkyl group represented by $R^{20}$ is preferably a secondary alkyl group or a tertiary alkyl group, and more preferably a tertiary alkyl group.

Furthermore, from the viewpoint of decomposition properties and visibility, the alkyl group represented by $R^{20}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

Specific examples of the group represented by Formula 2-1 will be shown below. However, the present disclosure is not limited thereto. In the following structural formulas, ● represents a bonding site with the group represented by L in Formula 1-1.

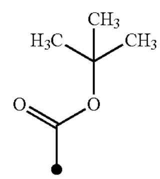

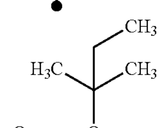

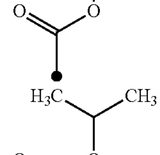

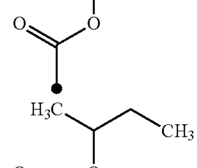

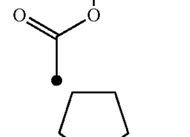

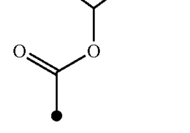

In Formula 3-1, $R^{30}$ represents an alkyl group or an aryl group, and the portion of the wavy line represents a bonding site with the group represented by L in Formula 1-1.

The alkyl group and aryl group represented by $R^{30}$ are the same as the alkyl group and aryl group represented by $R^{20}$ in Formula 2-1, and the preferred aspects thereof are also the same.

From the viewpoint of decomposition properties and visibility, the alkyl group represented by $R^{30}$ is preferably a secondary alkyl group or a tertiary alkyl group, and preferably a tertiary alkyl group.

Furthermore, from the viewpoint of decomposition properties and visibility, the alkyl group represented by $R^{30}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

In addition, from the viewpoint of decomposition properties and visibility, the alkyl group represented by $R^{30}$ is preferably a substituted alkyl group, more preferably a fluoro-substituted alkyl group, even more preferably a perfluoroalkyl group, and particularly preferably a trifluoromethyl group.

From the viewpoint of decomposition properties and visibility, the aryl group represented by $R^{30}$ is preferably a substituted aryl group. Examples of the substituent include an alkyl group (preferably an alkyl group having 1 to 4 carbon atoms), an alkoxy group (preferably an alkoxy group having 1 to 4 carbon atoms), and the like.

Specific examples of the group represented by Formula 3-1 will be shown below. However, the present disclosure is not limited thereto. In the following structural formulas, ● represents a bonding site with the group represented by L in Formula 1-1.

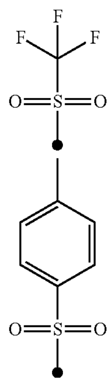

In Formula 4-1, $R^{41}$ and $R^{42}$ each independently represent an alkyl group or an aryl group, Zb represents a counterion that neutralizes charge, and the portion of the wavy line represents a bonding site with the group represented by L in Formula 1-1.

The alkyl group and aryl group represented by $R^{41}$ or $R^{42}$ are the same as the alkyl group and aryl group represented by $R^{20}$ in Formula 2-1, and preferred aspects thereof are also the same.

From the viewpoint of decomposition properties and visibility, $R^{41}$ is preferably an alkyl group.

From the viewpoint of decomposition properties and visibility, $R^{42}$ is preferably an alkyl group.

From the viewpoint of decomposition properties and visibility, the alkyl group represented by $R^{41}$ is preferably an alkyl group having 1 to 8 carbon atoms, more preferably an alkyl group having 1 to 4 carbon atoms, and particularly preferably a methyl group.

From the viewpoint of decomposition properties and visibility, the alkyl group represented by $R^{42}$ is preferably a secondary alkyl group or a tertiary alkyl group, and preferably a tertiary alkyl group.

Furthermore, from the viewpoint of decomposition properties and visibility, the alkyl group represented by $R^{42}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

Zb in Formula 4-1 may be a counterion that neutralizes charge, and may be included in Za in Formula 1-1 in the entirety of the compound.

Zb is preferably a sulfonate ion, a carboxylate ion, a tetrafluoroborate ion, a hexafluorophosphate ion, a p-toluenesulfonate ion, or a perchlorate ion, and more preferably a tetrafluoroborate ion.

Specific examples of the group represented by Formula 4-1 will be shown below. However, the present disclosure is not limited thereto. In the following structural formulas, ● represents a bonding site with the group represented by L in Formula 1-1.

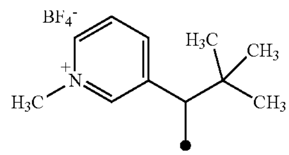

L in Formula 1-1 is preferably an oxygen atom or $—NR^{10}—$, and particularly preferably an oxygen atom.

Furthermore, $R^{10}$ in $—NR^{10}—$ is preferably an alkyl group. The alkyl group represented by $R^{10}$ is preferably an alkyl group having 1 to 10 carbon atoms. The alkyl group represented by $R^{10}$ may be linear or branched, or may have a ring structure.

Among the alkyl groups, a methyl group or a cyclohexyl group is preferable.

In a case where $R^{10}$ in $—NR^{10}—$ represents an aryl group, the aryl group is preferably an aryl group having 6 to 30 carbon atoms, more preferably an aryl group having 6 to 20 carbon atoms, and even more preferably an aryl group having 6 to 12 carbon atoms. These aryl groups may have a substituent.

In Formula 1-1, $R^{11}$ to $R^{18}$ preferably each independently represent a hydrogen atom, $—R^a$, $—OR^b$, $—SR^c$, or $—NR^dR^e$.

The hydrocarbon group represented by $R^a$ to $R^e$ is preferably a hydrocarbon group having 1 to 30 carbon atoms, more preferably a hydrocarbon group having 1 to 15 carbon atoms, and even more preferably a hydrocarbon group having 1 to 10 carbon atoms.

The hydrocarbon group may be linear or branched or may have a ring structure.

As the hydrocarbon group, an alkyl group is particularly preferable.

The aforementioned alkyl group is preferably an alkyl group having 1 to 30 carbon atoms, more preferably an alkyl group having 1 to 15 carbon atoms, and even more preferably an alkyl group having 1 to 10 carbon atoms.

The alkyl group may be linear or branched, or may have a ring structure.

Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, or a butyl group is preferable.

The above alkyl group may have a substituent.

Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, groups obtained by combining these, and the like.

$R^{11}$ to $R^{14}$ in Formula 1-1 preferably each independently represent a hydrogen atom or —$R^a$ (that is, a hydrocarbon group), more preferably each independently represent a hydrogen atom or an alkyl group, and even more preferably each independently represent a hydrogen atom except in the cases described below.

Particularly, each of $R^{11}$ and $R^{13}$ bonded to the carbon atom that is bonded to the carbon atom to which L is bonded is preferably an alkyl group. It is more preferable that $R^{11}$ and $R^{13}$ be linked to each other to form a ring. The ring to be formed in this way may be a monocyclic or polycyclic ring. Specifically, examples of the ring to be formed include a monocyclic ring such as a cyclopentene ring, a cyclopentadiene ring, a cyclohexene ring, or a cyclohexadiene ring, and a polycyclic ring such as an indene ring or an indole ring.

Furthermore, it is preferable that $R^{12}$ bonded to the carbon atom to which $A_1$+ is bonded be linked to $R^{15}$ or $R^{16}$ (preferably $R^{16}$) to form a ring, and $R^{14}$ bonded to the carbon atom to which $A_2$ is bonded be linked to $R^{17}$ or $R^{18}$ (preferably $R^{18}$) to form a ring.

In Formula 1-1, $n_{13}$ is preferably 1, and $R^{16}$ is preferably —$R^a$ (that is, a hydrocarbon group).

Furthermore, it is preferable that $R^{16}$ be linked to $R^{12}$ bonded to the carbon atom to which $A_1$+ is bonded, so as to form a ring. As the ring to be formed, an indolium ring, a pyrylium ring, a thiopyrylium ring, a benzoxazoline ring, or a benzimidazoline ring is preferable, and an indolium ring is more preferable from the viewpoint of improving visibility of exposed portions. These rings may further have a substituent.

In Formula 1-1, $n_{14}$ is preferably 1, and $R^{18}$ is preferably —$R^a$ (that is, a hydrocarbon group).

Furthermore, it is preferable that $R^{18}$ be linked to $R^{14}$ bonded to the carbon atom to which $A_2$ is bonded, so as to form a ring. As the ring to be formed, an indole ring, a pyran ring, a thiopyran ring, a benzoxazole ring, or a benzimidazole ring is preferable, and an indole ring is more preferable from the viewpoint of improving visibility of exposed portions. These rings may further have a substituent.

It is preferable that $R^{16}$ and $R^{18}$ in Formula 1-1 be the same group. In a case where $R^{16}$ and $R^{18}$ each form a ring, it is preferable that the formed rings have the same structure except for $A_1$+ and $A_2$.

It is preferable that $R^{15}$ and $R^{17}$ in Formula 1-1 be the same group. Furthermore, $R^{15}$ and $R^{17}$ are preferably —$R^a$ (that is, a hydrocarbon group), more preferably an alkyl group, and even more preferably a substituted alkyl group.

From the viewpoint of improving water solubility, $R^{15}$ and $R^{17}$ in the compound represented by Formula 1-1 are preferably a substituted alkyl group.

Examples of the substituted alkyl group represented by $R^{15}$ or $R^{17}$ include a group represented by any of Formula (a1) to Formula (a4).

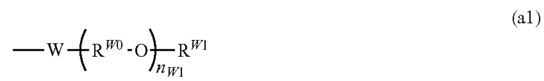
(a1)

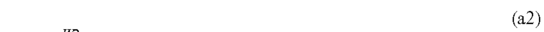
(a2)

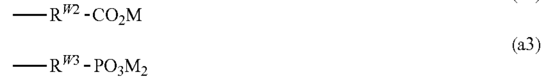
(a3)

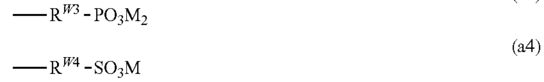
(a4)

In Formula (a1) to Formula (a4), $R^{W0}$ represents an alkylene group having 2 to 6 carbon atoms, W represents a single bond or an oxygen atom, and $n_{W1}$ represents an integer of 1 to 45, $R^{W1}$ represents an alkyl group having 1 to 12 carbon atoms or —C(═O)—$R_{W5}$, $R^{W5}$ represents an alkyl group having 1 to 12 carbon atoms, $R^{W2}$ to $R^{W4}$ each independently represent a single bond or an alkylene group having 1 to 12 carbon atoms, and M represents a hydrogen atom, a sodium atom, a potassium atom, or an onium group.

Specific examples of the alkylene group represented by $R^{W0}$ in Formula (a1) include an ethylene group, a n-propylene group, an isopropylene group, a n-butylene group, an isobutylene group, a n-pentylene group, an isopentylene group, a n-hexyl group, an isohexyl group, and the like. Among these, an ethylene group, a n-propylene group, an isopropylene group, or a n-butylene group is preferable, and a n-propylene group is particularly preferable.

$n_{W1}$ is preferably 1 to 10, more preferably 1 to 5, and particularly preferably 1 to 3.

Specific examples of the alkyl group represented by $R^{W1}$ include a methyl group, an ethyl group, a n-propyl group, an isopropyl group, a n-butyl group, an isobutyl group, a tert-butyl group, a n-pentyl group, an isopentyl group, a neopentyl group, a n-hexyl group, a n-octyl group, a n-dodecyl group, and the like. Among these, a methyl group, an ethyl group, a n-propyl group, an isopropyl group, a n-butyl group, or a tert-butyl group is preferable, a methyl group or an ethyl group is more preferable, and a methyl group is particularly preferable.

The alkyl group represented by $R^{W5}$ is the same as the alkyl group represented by $R^{W1}$. Preferred aspects of the alkyl group represented by $R^{W5}$ are the same as preferred aspects of the alkyl group represented by $R^{W1}$.

Specific examples of the group represented by Formula (a1) will be shown below. However, the present disclosure is not limited thereto. In the following structural formulas, Me represents a methyl group, Et represents an ethyl group, and ● represents a bonding site.

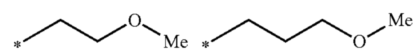

-continued

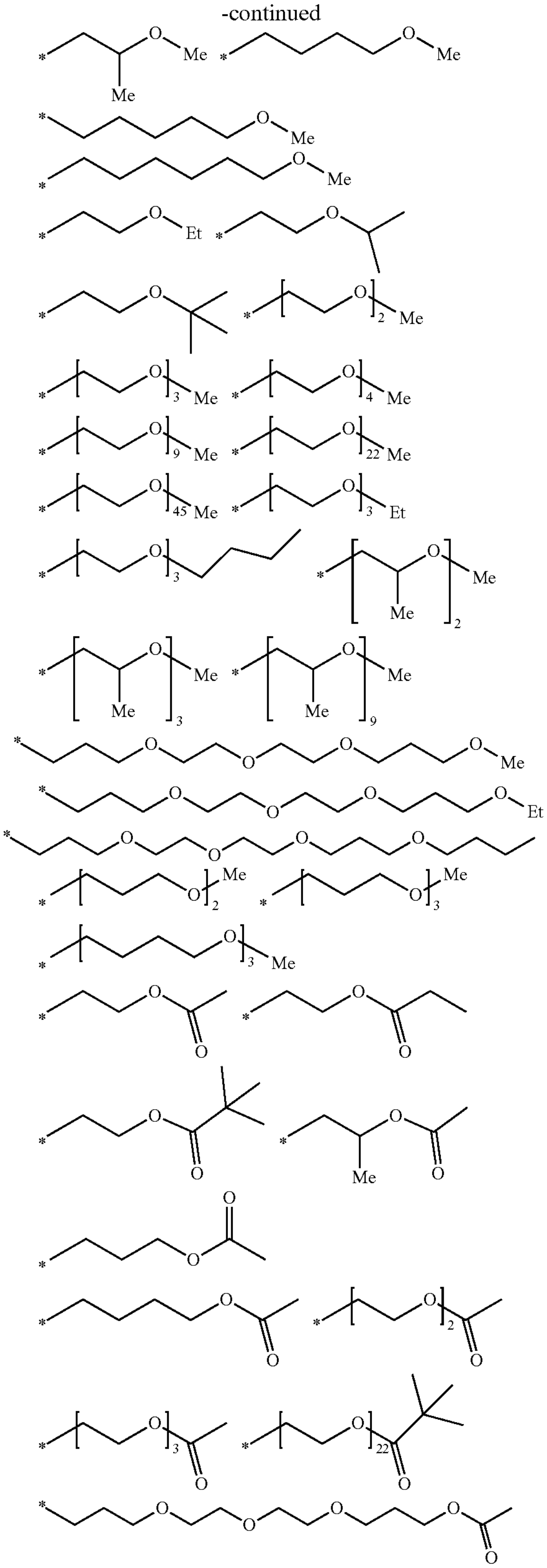

Specific examples of the alkylene group represented by $R^{W2}$ to $R^{W4}$ in Formula (a2) to Formula (a4) include a methylene group, an ethylene group, a n-propylene group, an isopropylene group, a n-butylene group, an isobutylene group, a n-pentylene group, an isopentylene group, a n-hexyl group, an isohexyl group, a n-octylene group, a n-dodecylene group, and the like. Among these, an ethylene group, a n-propylene group, an isopropylene group, or a n-butylene group is preferable, and an ethylene group or a n-propylene group is particularly preferable.

In Formula (a3), two Ms may be the same as or different from each other.

Examples of the onium group represented by M in Formula (a2) to Formula (a4) include an ammonium group, an iodonium group, a phosphonium group, a sulfonium group, and the like.

All of $CO_2M$ in Formula (a2), $PO_3M_2$ in Formula (a2), and $SO_3M$ in Formula (a4) may have an anion structure from which M is dissociated. The countercation of the anion structure may be $A_1$+ or a cation that can be contained in $R^1$-L in Formula 1-1.

Among the groups represented by Formula (a1) to Formula (a4), the group represented by Formula (a1), Formula (a2), or Formula (a4) is preferable.

$n_{11}$ and $n_{12}$ in Formula 1-1 are preferably the same as each other, and preferably both represent an integer of 1 to 5, more preferably both represent an integer of 1 to 3, even more preferably both represent 1 or 2, and particularly preferably both represent 2.

$A_1$ and $A_2$ in Formula 1-1 each independently represent an oxygen atom, a sulfur atom, or a nitrogen atom. Among these, a nitrogen atom is preferable.

$A_1$ and $A_2$ in Formula 1-1 are preferably the same atoms.

Za in Formula 1-1 represents a counterion that neutralizes charge.

In a case where all of $R^{11}$ to $R^{18}$ and $R^1$-L are groups having a neutral charge, Za is a monovalent counteranion. Here, $R^{11}$ to $R^{18}$ and $R^1$-L may have an anion structure or a cation structure. For example, in a case where two or more among $R^{11}$ to $R^{18}$ and $R^1$-L have an anion structure, Za can also be a countercation.

In a case where the cyanine dye represented by Formula 1-1 has such a structure that the overall charge of the compound is neutral except for Za, Za is unnecessary.

In a case where Za is a counteranion, examples thereof include a sulfonate ion, a carboxylate ion, a tetrafluoroborate ion, a hexafluorophosphate ion, a p-toluenesulfonate ion, a perchlorate ion, and the like. Among these, a tetrafluoroborate ion is preferable.

In a case where Za is a countercation, examples thereof include an alkali metal ion, an alkaline earth metal ion, an ammonium ion, a pyridinium ion, a sulfonium ion, and the like. Among these, a sodium ion, a potassium ion, an ammonium ion, a pyridinium ion, or a sulfonium ion is preferable, and a sodium ion, a potassium ion, or an ammonium ion is more preferable.

From the viewpoint of improving visibility of exposed portions, the decomposition-type infrared absorber is more preferably a compound represented by Formula 1-2 (that is, a cyanine dye).

Formula 1-2

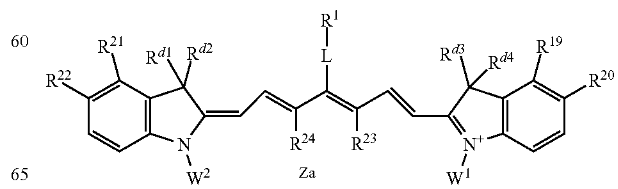

In Formula 1-2, $R^1$ represents a group that is represented by any of Formula 2-1 to Formula 4-1, $R^{19}$ to $R^{22}$ each independently represent a hydrogen atom, a halogen atom, —$R^a$, —$OR^b$, —CN, —$SR^c$, or —$NR^dR^e$, $R^{23}$ and $R^{24}$ each independently represent a hydrogen atom or —$R^a$, $R^a$ to $R^e$ each independently represent a hydrocarbon group, $R^{19}$ and $R^{20}$, $R^{21}$ and $R^{22}$, or $R^{23}$ and $R^{24}$ may be linked to each other to form a monocyclic or polycyclic ring, L represents an oxygen atom, a sulfur atom, or —$NR^{10}$—, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

$R^1$ in Formula 1-2 has the same definition as $R^1$ in Formula 1-1, and preferred aspects thereof are also the same.

In Formula 1-2, $R^{19}$ to $R^{22}$ preferably each independently represent a hydrogen atom, a halogen atom, —$R^a$, —$OR^b$, or —CN.

More specifically, $R^{19}$ and $R^{21}$ are preferably a hydrogen atom or —$R^a$.

Furthermore, $R^{20}$ and $R^{22}$ are preferably a hydrogen atom, —$R^a$, —$OR^b$, or —CN.

—$R^a$ represented by $R^{19}$ to $R^{22}$ is preferably an alkyl group or an alkenyl group.

In a case where all of $R^{19}$ to $R^{22}$ are —$R^a$, it is preferable that $R^{19}$ and $R^{20}$ and $R^{21}$ and $R^{22}$ be linked to each other to form a monocyclic or polycyclic ring.

Examples of the ring formed of $R^{19}$ and $R^{20}$ or $R^{21}$ and $R^{22}$ linked to each other include a benzene ring, a naphthalene ring, and the like.

$R^{23}$ and $R^{24}$ in Formula 1-2 are preferably linked to each other to form a monocyclic or polycyclic ring.

The ring formed of $R^{23}$ and $R^{24}$ linked to each other may be a monocyclic or polycyclic ring. Specifically, examples of the ring to be formed include a monocyclic ring such as a cyclopentene ring, a cyclopentadiene ring, a cyclohexene ring, or a cyclohexadiene ring, and a polycyclic ring such as an indene ring.

$R^{d1}$ to $R^{d4}$ in Formula 1-2 are preferably an unsubstituted alkyl group. Furthermore, all of $R^{d1}$ to $R^{d4}$ are preferably the same group.

Examples of the unsubstituted alkyl group include unsubstituted alkyl groups having 1 to 4 carbon atoms. Among these, a methyl group is preferable.

From the viewpoint of improving water solubility of the compound represented by Formula 1-2, $W^1$ and $W^2$ in Formula 1-2 preferably each independently represent a substituted alkyl group.

Examples of the substituted alkyl group represented by $W^1$ and $W^2$ include a group represented by any of Formula (a1) to Formula (a4) in Formula 1-1, and preferred aspects thereof are also the same.

From the viewpoint of on-press developability, $W^1$ and $W^2$ preferably each independently represent an alkyl group having a substituent. The alkyl group preferably has at least —$OCH_2CH_2$—, a sulfo group, a salt of a sulfo group, a carboxy group, or a salt of a carboxy group, as the substituent.

Za represents a counterion that neutralizes charge in the molecule.

In a case where all of $R^{19}$ to $R^{22}$, $R^{23}$ and $R^{24}$, $R^{d1}$ to $R^{d4}$, $W^1$, $W^2$, and $R^1$-L are groups having a neutral charge, Za is a monovalent counteranion. Here, $R^{19}$ to $R^{22}$, $R^{23}$ and $R^{24}$, $R^{d1}$ to $R^{d4}$, $W^1$, $W^2$, and $R^1$-L may have an anion structure or a cation structure. For example, in a case where two or more among $R^{19}$ to $R^{22}$, $R^{23}$ and $R^{24}$, $R^{d1}$ to $R^{d4}$, $W^1$, $W^2$, and $R^1$-L have an anion structure, Za can be a countercation.

In a case where the compound represented by Formula 1-2 has such a structure that the overall charge of the compound is neutral except for Za, Za is unnecessary.

Examples of the case where Za is a counteranion are the same as such examples of Za in Formula 1-1, and preferred aspects thereof are also the same. Furthermore, examples of the case where Za is a countercation are the same as such examples of Za in Formula 1-1, and preferred aspects thereof are also the same.

From the viewpoint of decomposition properties and visibility, the cyanine dye as a decomposition-type infrared absorber is even more preferably a compound represented by any of Formula 1-3 to Formula 1-7.

Particularly, from the viewpoint of decomposition properties and visibility, the cyanine dye is preferably a compound represented by any of Formula 1-3, Formula 1-5, and Formula 1-6.

Formula 1-3

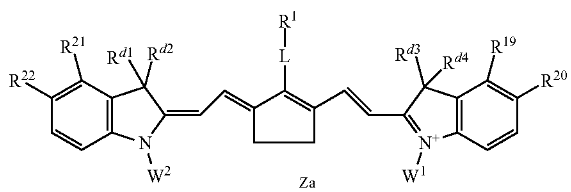

Formula 1-4

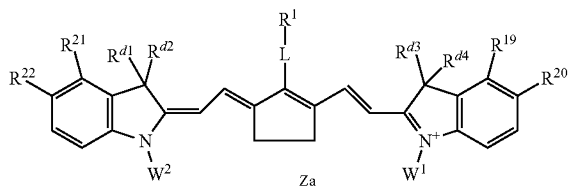

Formula 1-5

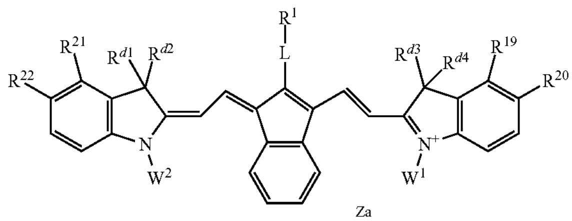

Formula 1-6

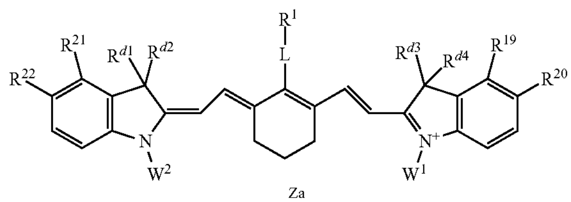

Formula 1-7

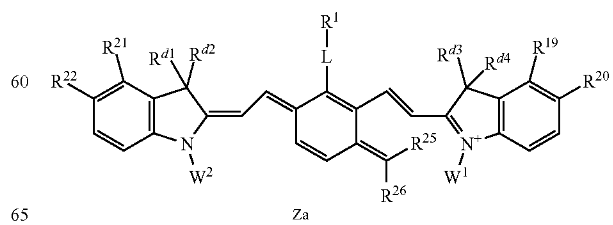

In Formula 1-3 to Formula 1-7, $R^1$ represents a group that is represented by any of Formula 2-1 to Formula 4-1, $R^{19}$ to $R^{22}$ each independently represent a hydrogen atom, a halogen atom, $—R^a$, $—OR^b$, —CN, $—SR^c$, or $—NR^dR^e$, $R^{25}$ and $R^{26}$ each independently represent a hydrogen atom, a halogen atom, or $—R^a$, $R^a$ to $R^e$ each independently represent a hydrocarbon group, $R^{19}$ and $R^{20}$, $R^{21}$ and $R^{22}$, or $R^{25}$ and $R^{26}$ may be linked to each other to form a monocyclic or polycyclic ring, L represents an oxygen atom, a sulfur atom, or $—NR^{10}—$, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

$R^1$, $R^{19}$ to $R^{22}$, $R^{d1}$ to $R^{d4}$, $W^1$, $W^2$, and L in Formula 1-3 to Formula 1-7 have the same definitions as $R^1$, $R^{19}$ to $R^{22}$, $R^{d1}$ to $R^{d4}$, $W^1$, $W^2$, and L in Formula 1-2, and preferred aspects thereof are also the same.

$R^{25}$ and $R^{26}$ in Formula 1-7 preferably each independently represent a hydrogen atom or an alkyl group, more preferably each independently represent an alkyl group, and particularly preferably each independently represent a methyl group.

Specific examples of the cyanine dye as a decomposition-type infrared absorber will be shown below. However, the present disclosure is not limited thereto.

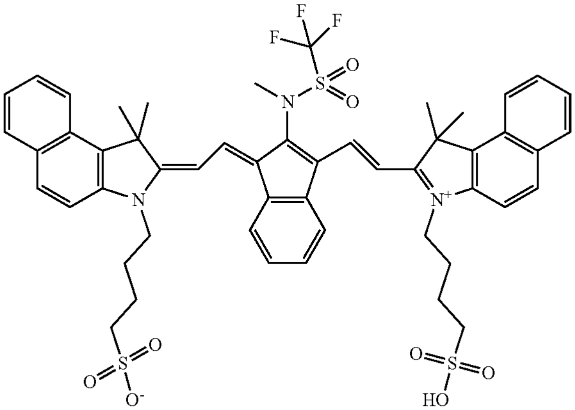

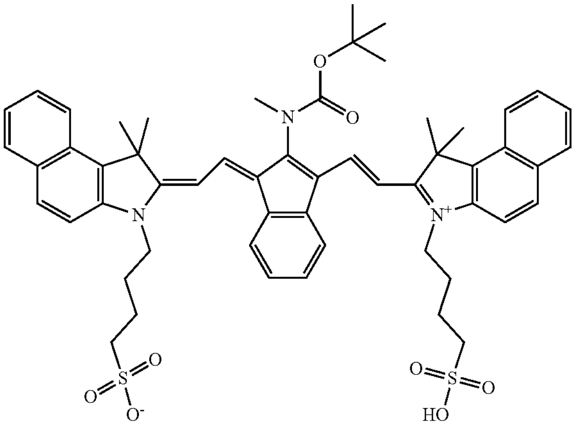

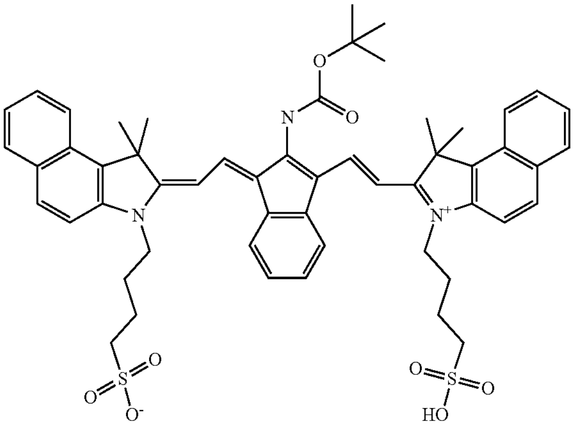

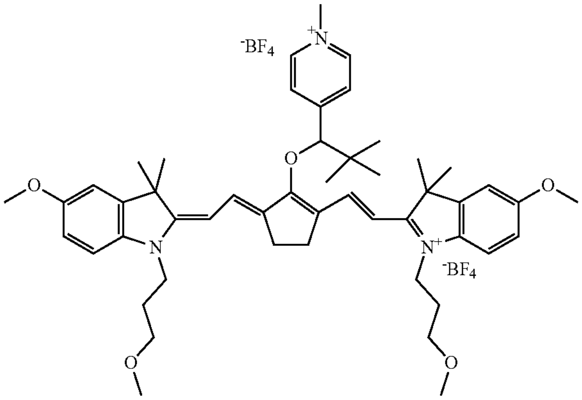

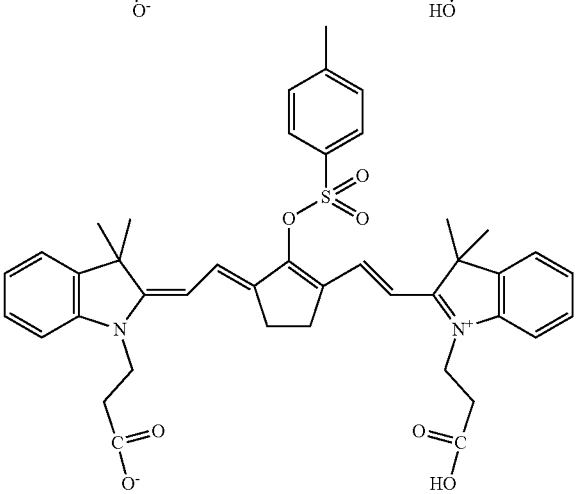

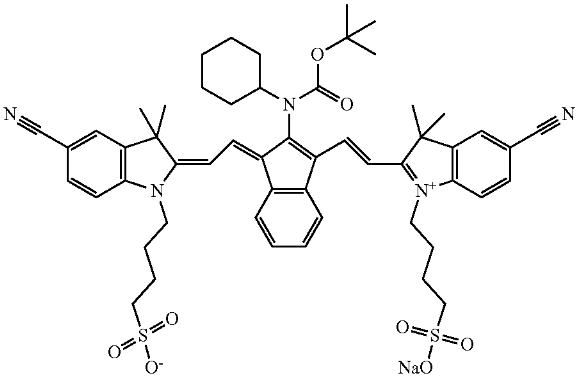

As the infrared absorber that decomposes by exposure to infrared, those described in JP2008-544322A or WO2016/027886A can also be suitably used.

Furthermore, as the cyanine dye which is a decomposition-type infrared absorber, the infrared absorbing compounds described in WO2019/219560A can be suitably used.

One kind of infrared absorber may be used alone, or two or more kinds of infrared absorbers may be used in combination. In addition, as the infrared absorber, a pigment and a dye may be used in combination.

The total content of the infrared absorber in the image-recording layer with respect to the total mass of the image-recording layer is preferably 0.1% by mass to 10.0% by mass, and more preferably 0.5% by mass to 5.0% by mass.

In a case where the image-recording layer contains the infrared absorber A and the infrared absorber B, the content of each of the infrared absorber A and the infrared absorber B in the image-recording layer with respect to the total mass of the image-recording layer is preferably independently 0.1% by mass to 8.0% by mass, and more preferably independently 0.5% by mass to 4.5% by mass.

In addition, in a case where the image-recording layer contains the infrared absorber A and the infrared absorber B, from the viewpoint of temporal visibility, storage stability, and UV printing durability, the content of the infrared absorber A in the image-recording layer is preferably equal to or higher than the content of the infrared absorber B, more preferably higher than the content of the infrared absorber B, and particularly preferably 1.2 times to 2.5 times the content of the infrared absorber B based on mass.

Furthermore, in a case where the outermost layer contains an infrared absorber, from the viewpoint of temporal visibility, storage stability, and UV printing durability, the total content of the infrared absorber in the image-recording layer is preferably equal to or higher than the total content of the infrared absorber in the outermost layer, and more preferably higher than the total content of the infrared absorber in the outermost layer.

[Polymerizable Compound]

It is preferable that the image-recording layer in the present disclosure contain a polymerizable compound.

In the present disclosure, a polymerizable compound refers to a compound having a polymerizable group.

The polymerizable group is not particularly limited and may be a known polymerizable group. As the polymerizable group, an ethylenically unsaturated group is preferable. The polymerizable group may be a radically polymerizable group or a cationically polymerizable group. The polymerizable group is preferably a radically polymerizable group.

Examples of the radically polymerizable group include a (meth)acryloyl group, an allyl group, a vinylphenyl group, a vinyl group, and the like. From the viewpoint of reactivity, a (meth)acryloyl group is preferable.

The molecular weight of the polymerizable compound (weight-average molecular weight in a case where the polymerizable compound has molecular weight distribution) is preferably 50 or more and less than 2,500.

The polymerizable compound used in the present disclosure may be, for example, a radically polymerizable compound or a cationically polymerizable compound. As the polymerizable compound, an addition polymerizable compound having at least one ethylenically unsaturated bond (ethylenically unsaturated compound) is preferable.

The ethylenically unsaturated compound is preferably a compound having at least one ethylenically unsaturated bond on a terminal, and more preferably a compound having two or more ethylenically unsaturated bonds on a terminal. The chemical form of the polymerizable compound is, for example, a monomer, a prepolymer which is in other words a dimer, a trimer, or an oligomer, a mixture of these, or the like.

Particularly, from the viewpoint of UV printing durability, the aforementioned polymerizable compound preferably includes a polymerizable compound having functionalities of 3 or more, more preferably includes a polymerizable compound having functionalities of 7 or more, and even more preferably includes a polymerizable compound having functionalities of 10 or more. Particularly, from the viewpoint of UV printing durability of the lithographic printing plate to be obtained, the aforementioned polymerizable compound preferably includes an ethylenically unsaturated compound having functionalities of 3 or more (preferably having functionalities of 7 or more and more preferably having functionalities of 10 or more), and more preferably includes a (meth)acrylate compound having functionalities of 3 or more (preferably having functionalities of 7 or more and more preferably having functionalities of 10 or more).

From the viewpoint of on-press developability and contamination suppressiveness, the aforementioned polymerizable compound preferably includes a polymerizable compound having functionalities of 2 or less, more preferably includes a difunctional polymerizable compound, and particularly preferably includes a difunctional (meth)acrylate compound.

From the viewpoint of printing durability, on-press developability, and contamination suppressiveness, the content of the polymerizable compound having functionalities of 2 or less (preferably a difunctional polymerizable compound) with respect to the total mass of polymerizable compounds in the image-recording layer is preferably 5% by mass to 100% by mass, more preferably 10% by mass to 100% by mass, and even more preferably 15% by mass to 100% by mass.

<<Oligomer>>

As the polymerizable compound to be incorporated into the image-recording layer, a polymerizable compound which is an oligomer (hereinafter, also simply called "oligomer") is preferable.

In the present disclosure, an oligomer represents a polymerizable compound which has a molecular weight (weight-average molecular weight in a case where the compound has molecular weight distribution) of 600 or more and 10,000 or less and at least one polymerizable group.

From the viewpoint of excellent chemical resistance and excellent UV printing durability, the molecular weight of the oligomer is preferably 1,000 or more and 5,000 or less.

Furthermore, from the viewpoint of improving UV printing durability, the number of polymerizable groups in one molecule of the oligomer is preferably 2 or more, more preferably 3 or more, even more preferably 6 or more, and particularly preferably 10 or more.

The upper limit of the number of polymerizable groups in the oligomer is not particularly limited. The number of polymerizable groups is preferably 20 or less.

From the viewpoint of UV printing durability and on-press developability, an oligomer having 7 or more polymerizable groups and a molecular weight of 1,000 or more and 10,000 or less is preferable, and an oligomer having 7 or more and 20 or less polymerizable groups and a molecular weight of 1,000 or more and 5,000 or less is more preferable.

The oligomer may contain a polymer component which is likely to be generated in the process of manufacturing the oligomer.

From the viewpoint of UV printing durability, visibility, and on-press developability, the oligomer preferably has at least one kind of compound selected from the group consisting of a compound having a urethane bond, a compound having an ester bond, and a compound having an epoxy residue, and preferably has a compound having a urethane bond.

In the present disclosure, an epoxy residue refers to a structure formed of an epoxy group. For example, the epoxy residue means a structure similar to a structure established by the reaction between an acid group (carboxylic acid group or the like) and an epoxy group.

As the compound having a urethane bond, which is an example of the oligomer, for example, a compound having at least a group represented by Formula (Ac-1) or Formula (Ac-2) is preferable, and a compound having at least a group represented by Formula (Ac-1) is more preferable.

(Ac-1)

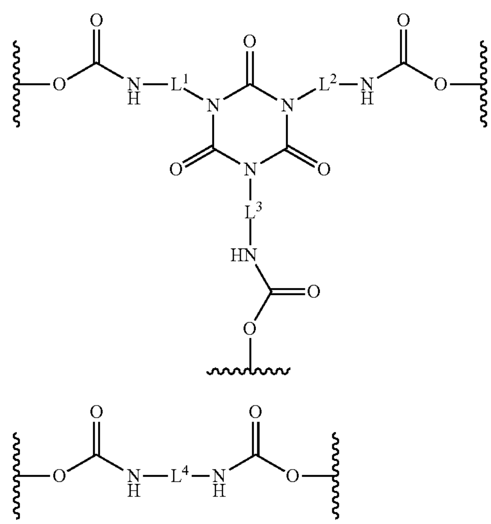

(Ac-2)

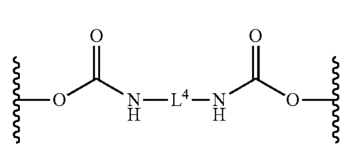

In Formula (Ac-1) and Formula (Ac-2), $L^1$ to $L^4$ each independently represent a divalent hydrocarbon group having 2 to 20 carbon atoms, and the portion of the wavy line represents a bonding position with other structures.

$L^1$ to $L^4$ preferably each independently represent an alkylene group having 2 to 20 carbon atoms, more preferably each independently represent an alkylene group having 2 to 10 carbon atoms, and even more preferably each independently represent an alkylene group having 4 to 8 carbon atoms. The alkylene group may have a branched structure or a ring structure. The alkylene group is preferably a linear alkylene group.

The portion of the wavy line in Formula (Ac-1) or Formula (Ac-2) is preferably each independently directly bonded to the portion of the wavy line in a group represented by Formula (Ae-1) or Formula (Ae-2).

(Ae-1)

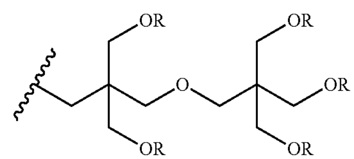

-continued (Ae-2)

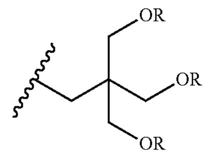

In Formula (Ae-1) and Formula (Ae-2), R each independently represent an acryloyloxy group or a methacryloyloxy group, and the portion of the wavy line represents a bonding position with the portion of the wavy line in Formula (Ac-1) and Formula (Ac-2).

As the compound having a urethane bond, a compound may also be used which is prepared by obtaining polyurethane by a reaction between a polyisocyanate compound and a polyol compound and introducing a polymerizable group into the polyurethane by a polymer reaction.

For example, the compound having a urethane bond may be obtained by reacting a polyol compound having an acid group with a polyisocyanate compound so as to obtain a polyurethane oligomer and reacting this polyurethane oligomer with a compound having an epoxy group and a polymerizable group.

The number of polymerizable groups in the compound having an ester bond, which is an example of oligomer, is preferably 3 or more, and more preferably 6 or more.

As the compound having an epoxy residue, which is an example of oligomer, a compound containing a hydroxy group is preferable.

The number of polymerizable groups in the compound having an epoxy residue is preferably 2 to 6, and more preferably 2 or 3.

The compound having an epoxy residue can be obtained, for example, by reacting a compound having an epoxy group with an acrylic acid.

Specific examples of oligomers will be shown below, but the oligomer used in the present disclosure is not limited thereto.

As the oligomer, commercially available products may also be used. Examples thereof include UA-510H, UA-306H, UA-306I, and UA-306T (manufactured by KYOEISHA CHEMICAL Co., LTD.), UV-1700B, UV-6300B, and UV7620EA (manufactured by NIHON GOSEI KAKO Co., Ltd.), U-15HA (manufactured by SHIN-NAKAMURA CHEMICAL CO, LTD.), EBECRYL450, EBECRYL657, EBECRYL885, EBECRYL800, EBECRYL3416, and EBECRYL860 (manufactured by DAICEL-ALLNEX LTD.), and the like. However, the oligomer is not limited to these.

From the viewpoint of improving chemical resistance and UV printing durability and further suppressing the residues of on-press development, the content of the oligomer with respect to the total mass of polymerizable compounds in the image-recording layer is preferably 30% by mass to 100% by mass, more preferably 50% by mass to 100% by mass, and even more preferably 80% by mass to 100% by mass.

<<Low-Molecular-Weight Polymerizable Compound>>

The polymerizable compound may further include a polymerizable compound other than the oligomer described above.

From the viewpoint of chemical resistance, the polymerizable compound other than the oligomer is preferably a low-molecular-weight polymerizable compound. The lowmolecular-weight polymerizable compound may take a chemical form such as a monomer, a dimer, a trimer, or a mixture of these.

From the viewpoint of chemical resistance, the low-molecular-weight polymerizable compound is preferably at least a polymerizable compound selected from the group consisting of a polymerizable compound having three or more ethylenically unsaturated groups and a polymerizable compound having an isocyanuric ring structure.

In the present disclosure, a low-molecular-weight polymerizable compound refers to a polymerizable compound having a molecular weight (weight-average molecular weight in a case where the compound has molecular weight distribution) of 50 or more and less than 600.

From the viewpoint of excellent chemical resistance, excellent UV printing durability, and excellently suppressing the residues of on-press development, the molecular weight of the low-molecular-weight polymerizable compound is preferably 100 or more and less than 600, more preferably 300 or more and less than 600, and even more preferably 400 or more and less than 600.

In a case where the polymerizable compound includes a low-molecular-weight polymerizable compound as the polymerizable compound other than an oligomer (total amount in a case where the polymerizable compound includes two or more kinds of low-molecular-weight polymerizable compounds), from the viewpoint of chemical resistance and UV printing durability and suppressing the residues of on-press development, the ratio of the oligomer to the low-molecular-weight polymerizable compound (oligomer/low-molecular-weight polymerizable compound) is preferably 10/1 to 1/10, more preferably 10/1 to 3/7, and even more preferably 10/1 to 7/3, based on mass.

As the low-molecular-weight polymerizable compound, the polymerizable compounds described in paragraphs "0082" to "0086" of WO2019/013268A can also be suitably used.

The details of how to use the polymerizable compound, such as the structure of the compound, whether the compound is used alone or used in combination with other compounds, and the amount of the compound to be added, can be randomly set.

Particularly, from the viewpoint of UV printing durability, the image-recording layer preferably contains two or more kinds of polymerizable compounds.

The content of the polymerizable compound (total content of polymerizable compounds in a case where the image-recording layer contains two or more kinds of polymerizable compounds) with respect to the total mass of the image-recording layer is preferably 5% by mass to 75% by mass, more preferably 10% by mass to 70% by mass, and even more preferably 15% by mass to 60% by mass.

[Polymerization Initiator]

It is preferable that the image-recording layer in the lithographic printing plate precursor according to the present disclosure contain a polymerization initiator.

From the viewpoint of sensitivity, printing durability, on-press developability, and receptivity, the polymerization initiator preferably includes an electron-accepting polymerization initiator, and more preferably includes an electron-accepting polymerization initiator and an electron-donating polymerization initiator.

—Electron-Accepting Polymerization Initiator—

It is preferable that the image-recording layer contain an electron-accepting polymerization initiator as a polymerization initiator.

The electron-accepting polymerization initiator is a compound which accepts an electron by intermolecular electron migration in a case where electrons of an infrared absorber are excited by exposure to infrared, and generates a polymerization initiation species such as radicals.

The electron-accepting polymerization initiator used in the present disclosure is a compound that generates a polymerization initiation species such as a radical or a cation by either or both of light energy and heat energy, and can be appropriately selected from known thermal polymerization initiators, compounds having a bond that requires low bond dissociation energy, photopolymerization initiators, and the like.

The electron-accepting polymerization initiator is preferably a radical polymerization initiator and more preferably an onium salt compound.

In addition, as the electron-accepting polymerization initiator, an infrared-sensitive polymerization initiator is preferable.

Examples of the electron-accepting radical polymerization initiator include (a) organic halide, (b) carbonyl compound, (c) azo compound, (d) organic peroxide, (e) metallocene compound, (f) azide compound, (g) hexaarylbiimidazole compound, (i) disulfone compound, (j) oxime ester compound, and (k) onium salt compound.

As (a) organic halide, for example, the compounds described in paragraphs "0022" and "0023" of JP2008-195018A are preferable.

As (b) carbonyl compound, for example, the compounds described in paragraph "0024" of JP2008-195018A are preferable.

As (c) azo compound, for example, the azo compounds described in JP1996-108621A (JP-H8-108621A) and the like can be used.

As (d) organic peroxide, for example, the compounds described in paragraph "0025" of JP2008-195018A are preferable.

As (e) metallocene compound, for example, the compounds described in paragraph "0026" of JP2008-195018A are preferable.

Examples of (f) azide compound include compounds such as 2,6-bis(4-azidobenzylidene)-4-methylcyclohexanone.

As (g) hexaarylbiimidazole compound, for example, the compounds described in paragraph "0027" of JP2008-195018A are preferable.

Examples of (i) disulfone compound include the compounds described in JP1986-166544A (JP-S61-166544A) and JP2002-328465A.

As (j) oxime ester compound, for example, the compounds described in paragraphs "0028" to "0030" of JP2008-195018A are preferable.

Among the above electron-accepting polymerization initiators, from the viewpoint of curing properties, an oxime ester compound and an onium salt compound are preferable. Particularly, from the viewpoint of printing durability, an iodonium salt compound, a sulfonium salt compound, or an azinium salt compound is preferable, an iodonium salt compound or a sulfonium salt compound is more preferable, and an iodonium salt compound is particularly preferable.

Specific examples of these compounds will be shown below, but the present disclosure is not limited thereto.

As the iodonium salt compound, for example, a diaryliodonium salt compound is preferable. Particularly, for example, a diphenyl iodonium salt compound substituted with an electron-donating group such as an alkyl group or an alkoxyl group is more preferable. Furthermore, an asymmetric diphenyl iodonium salt compound is preferable.

Specific examples thereof include diphenyliodonium=hexafluorophosphate, 4-methoxyphenyl-4-(2-methylpropyl) phenyliodonium=hexafluorophosphate, 4-(2-methylpropyl) phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis (4-t-butylphenyl)iodonium=hexafluorophosphate.

As the sulfonium salt compound, for example, a triarylsulfonium salt compound is preferable. Particularly, a triarylsulfonium salt compound is preferable in which at least some of electron-withdrawing groups such as groups on an aromatic ring are substituted with halogen atoms, and a triarylsulfonium salt compound is more preferable in which the total number of halogen atoms as substituents on an aromatic ring is 4 or more. Specific examples thereof include triphenylsulfonium=hexafluorophosphate, triphenylsulfonium=benzoyl formate, bis(4-chlorophenyl) phenylsulfonium=benzoyl formate, bis(4-chlorophenyl)-4-methylphenylsulfonium=tetrafluoroborate, tris(4-chlorophenyl)sulfonium=3,5-bis(methoxycarbonyl) benzenesulfonate, tris(4-chlorophenyl) sulfonium=hexafluorophosphate, and tris(2,4-dichlorophenyl)sulfonium=hexafluorophosphate.

As a counteranion of the iodonium salt compound and the sulfonium salt compound, a sulfonamide anion or a sulfonimide anion is preferable, and a sulfonimide anion is more preferable.

As the sulfonamide anion, an aryl sulfonamide anion is preferable.

As the sulfonimide anion, a bisaryl sulfonimide anion is preferable.

Specific examples of the sulfonamide anion or the sulfonimide anion will be shown below, but the present disclosure is not limited thereto. In the following specific examples, Ph represents a phenyl group, Me represents a methyl group, and Et represents an ethyl group.

I-1

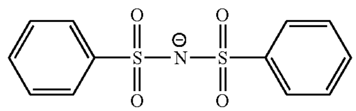

I-2

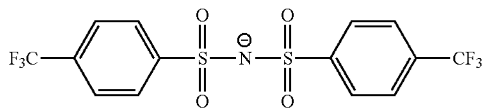

I-3

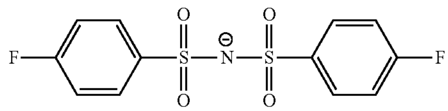

I-4

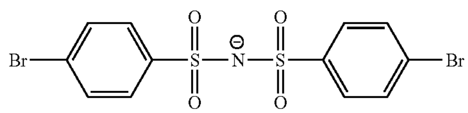

I-5

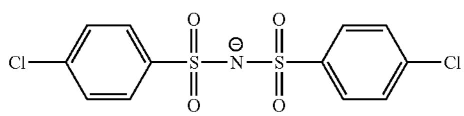

-continued

I-6

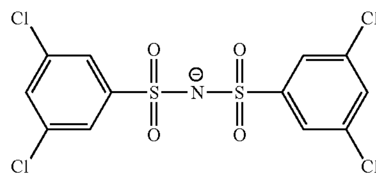

I-7

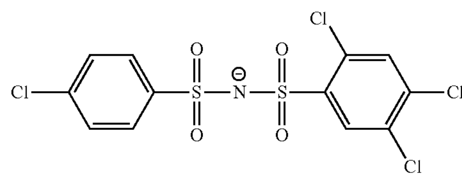

I-8

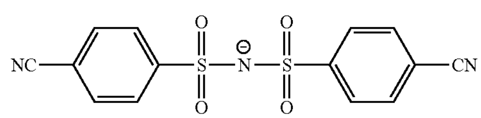

I-9

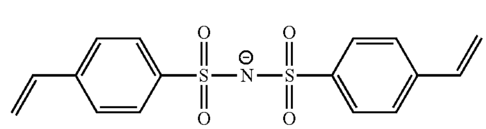

I-10

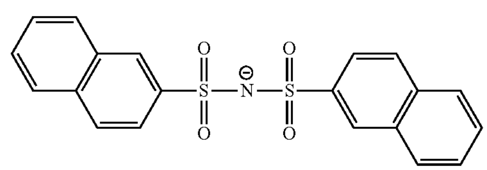

I-11

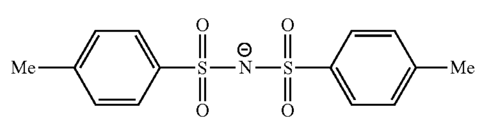

I-12

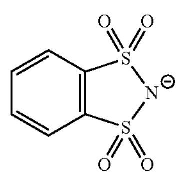

I-13

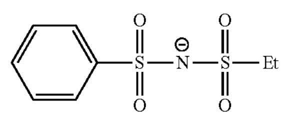

I-14

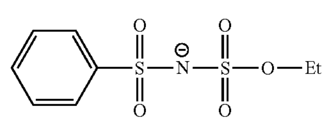

I-15

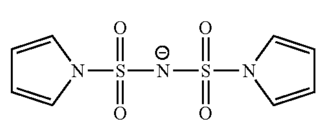

I-16

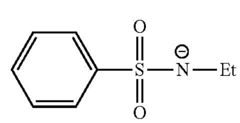

-continued

I-17

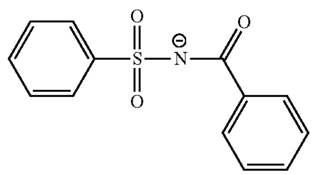

I-18

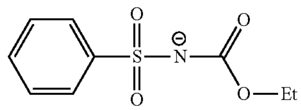

I-19

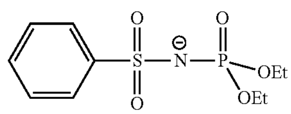

I-20

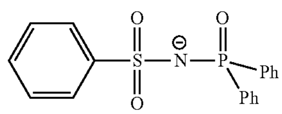

I-21

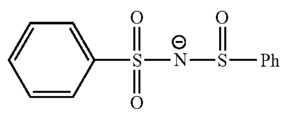

I-22

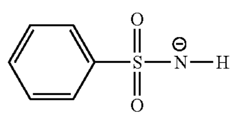

I-23

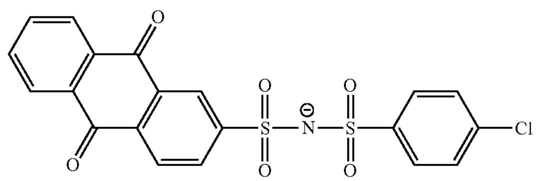

I-24

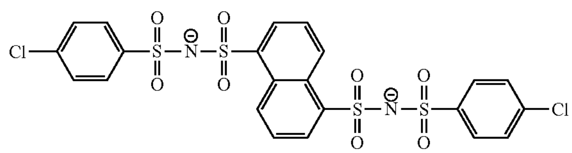

I-25

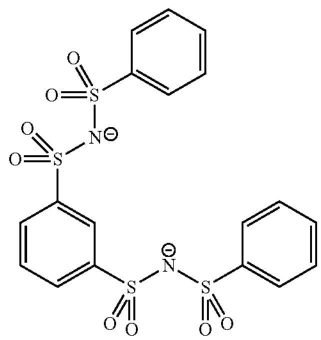

-continued

I-26

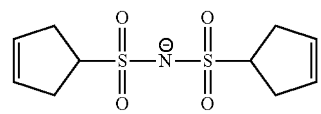

From the viewpoint of developability and UV printing durability of the lithographic printing plate to be obtained, the electron-accepting polymerization initiator may include a compound represented by Formula (II).

(II)

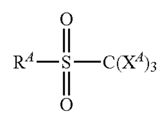

in Formula (II), $X^A$ represents a halogen atom, and $R^A$ represents an aryl group.

Specifically, examples of $X^A$ in Formula (II) include a fluorine atom, a chlorine atom, a bromine atom, and an iodine atom. Among these, a chlorine atom or a bromine atom is preferable because these have excellent sensitivity, and a bromine atom is particularly preferable.

Furthermore, from the viewpoint of excellent balance between sensitivity and storage stability, $R^A$ in Formula (II) is preferably an aryl group substituted with an amide group.

Specific examples of the electron-accepting polymerization initiator represented by Formula (II) include compounds represented by the following formulas. However, the present disclosure is not limited thereto.

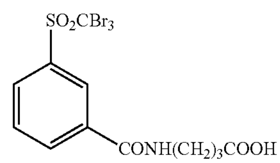

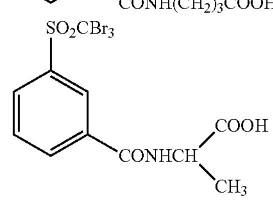

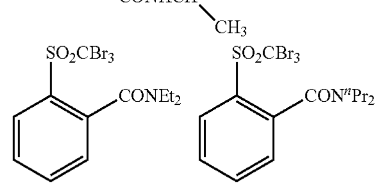

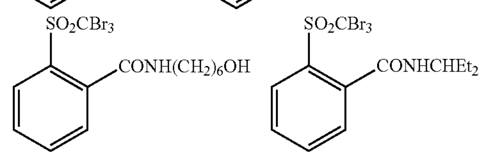

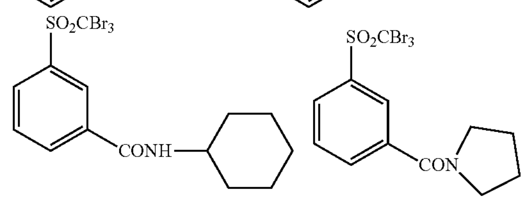

-continued
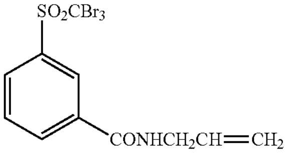
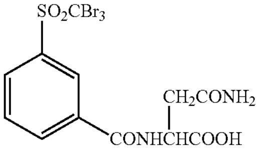
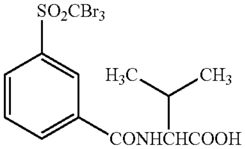
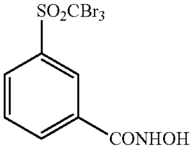
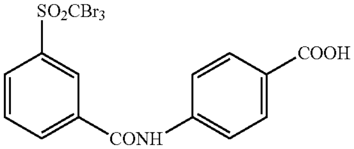
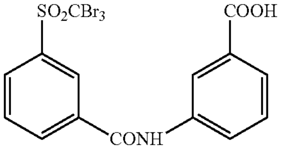
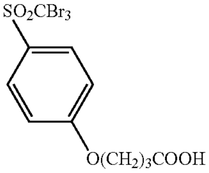
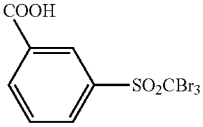
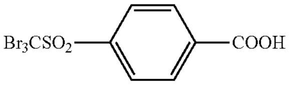
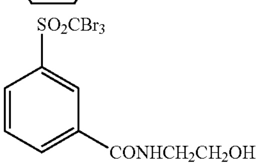
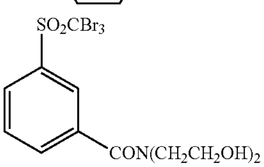
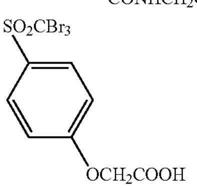
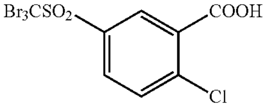
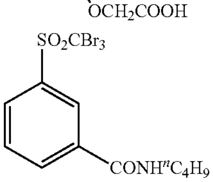
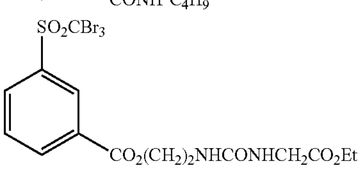
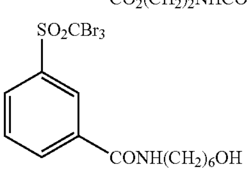
-continued
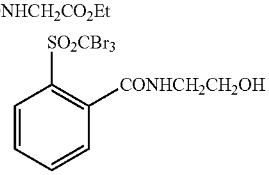
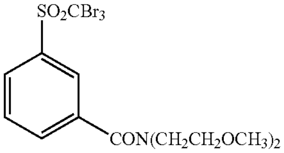
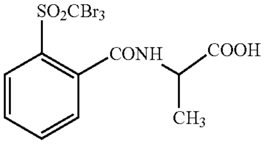
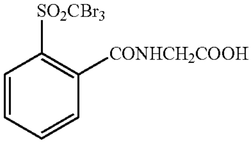
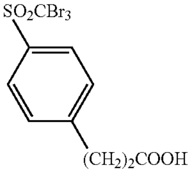
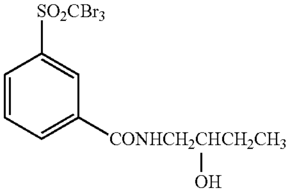
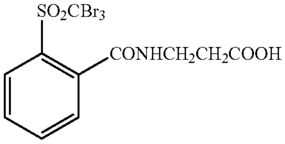
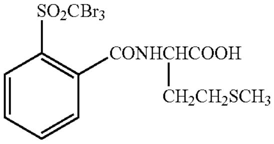
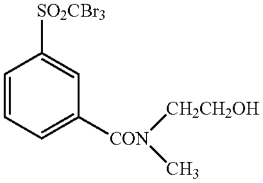
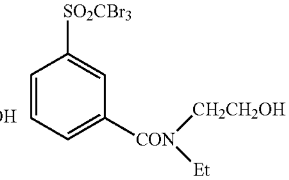
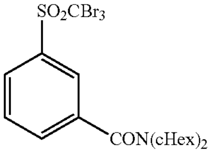
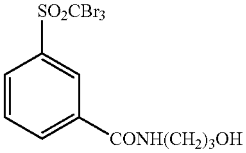
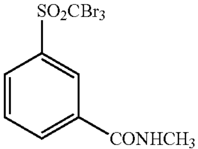
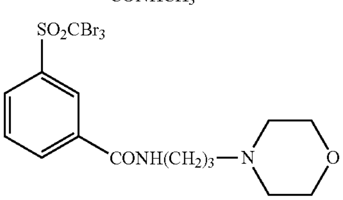

-continued
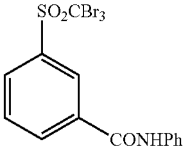
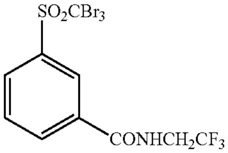
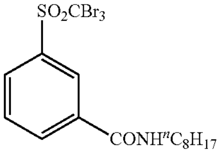
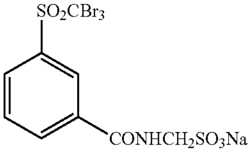
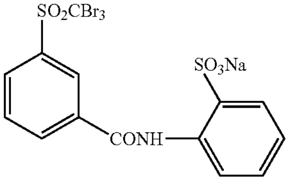
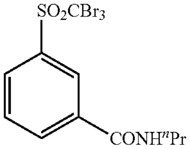
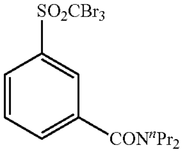
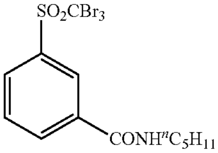
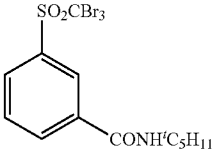
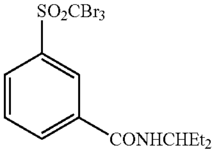
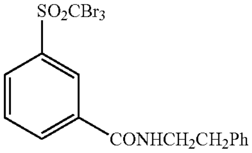
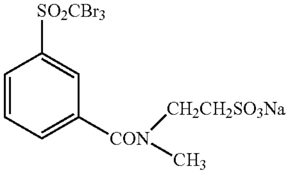
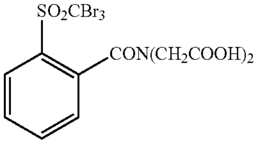
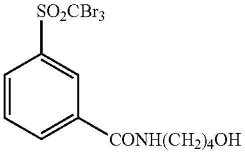
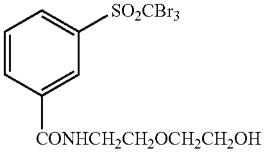
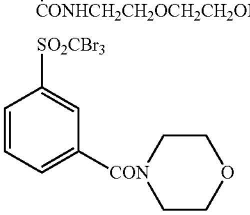
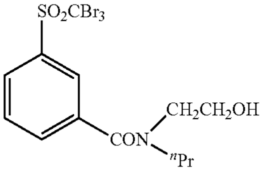
-continued
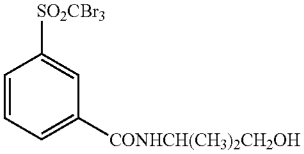
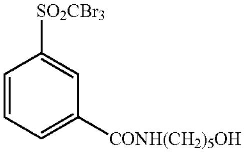
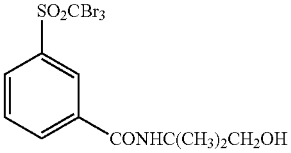
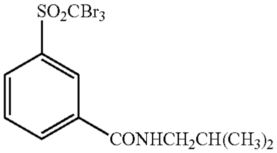
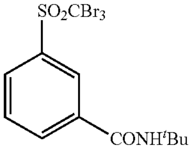
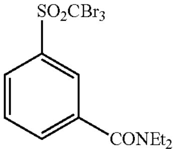
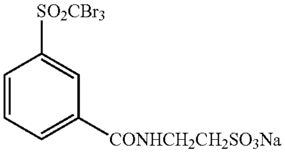
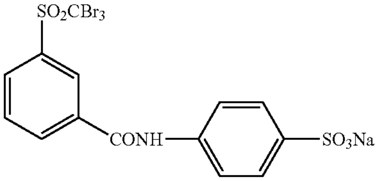
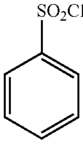
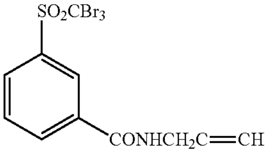
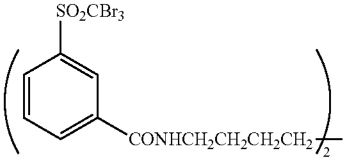
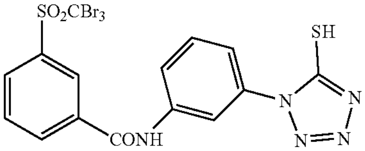
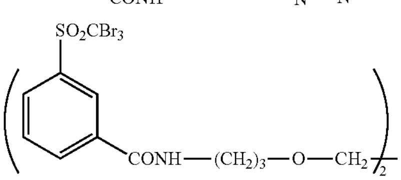

-continued
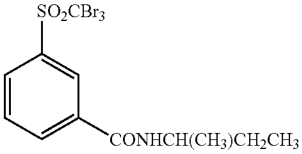
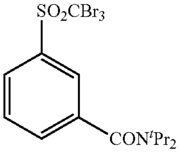
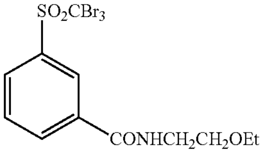
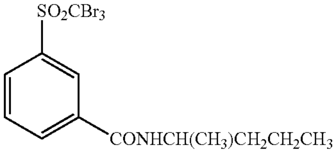
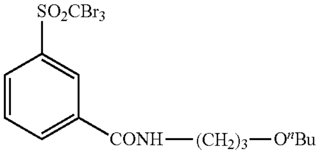
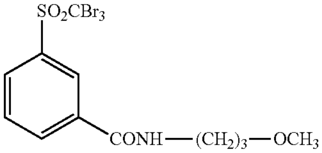
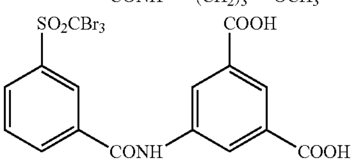
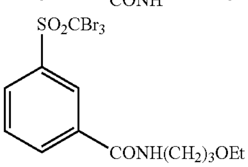
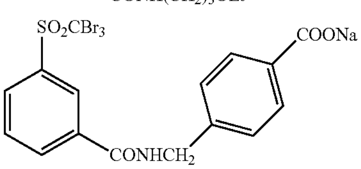
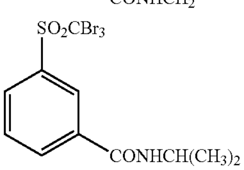
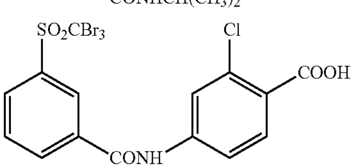
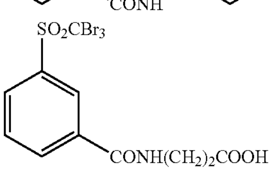
-continued
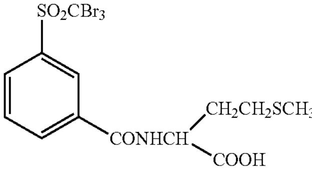
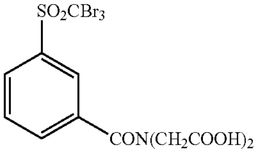
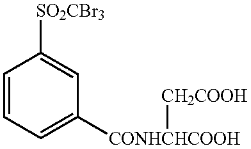
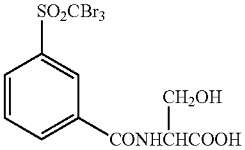
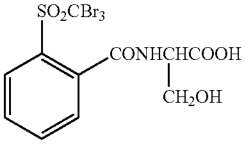
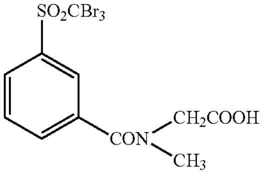
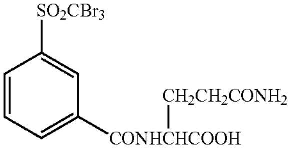
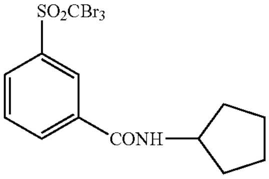
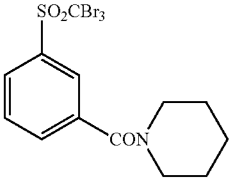
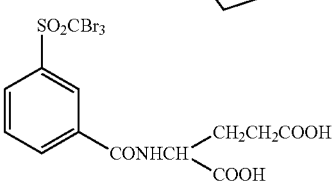
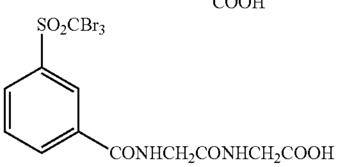
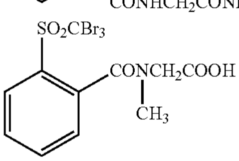
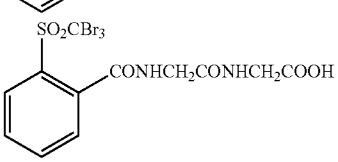
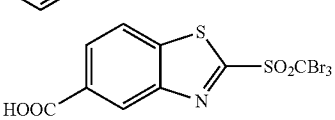

-continued
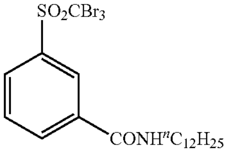
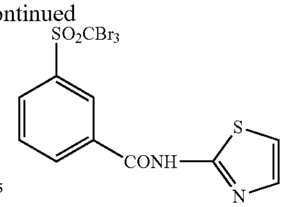
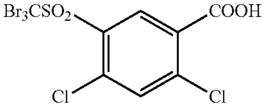
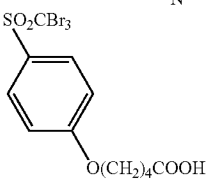
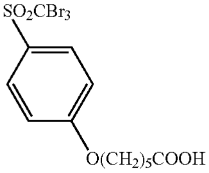
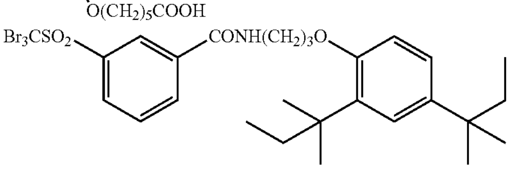
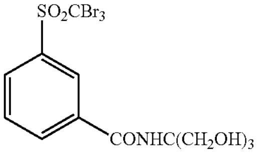
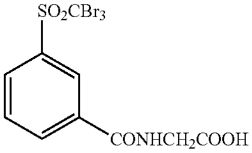
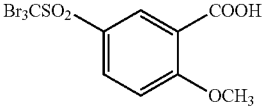
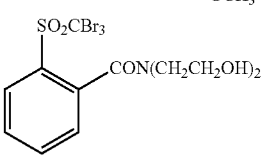
(IS-1)
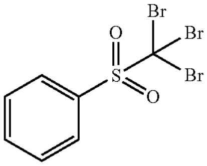
(IS-2)
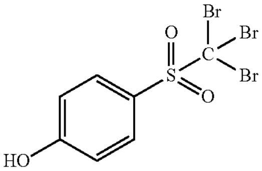
(IS-3)
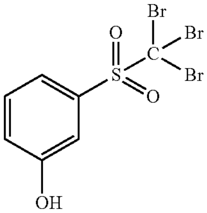
-continued
(IS-4)
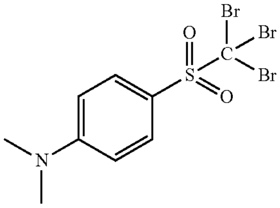
(IS-5)
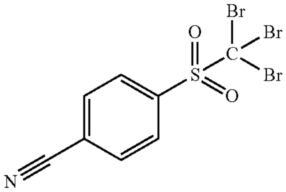
(IS-6)
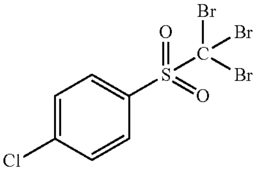
(IS-7)
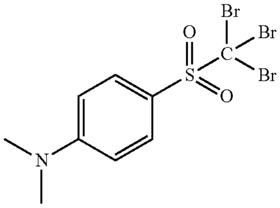
(IS-8)
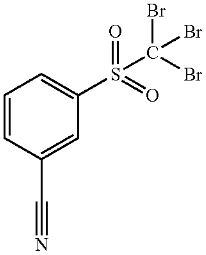
(IS-9)
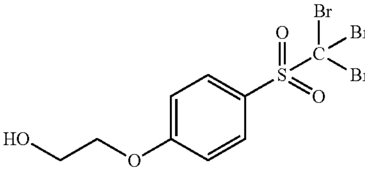
(IS-10)
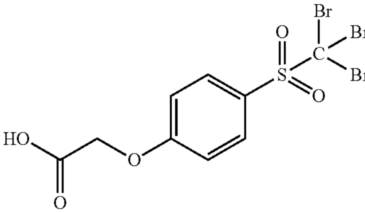

-continued (IS-11)

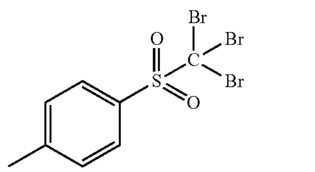

(IS-12)

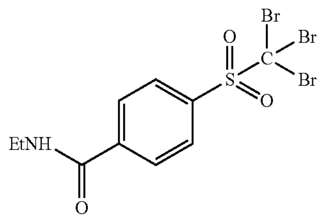

(IS-13)

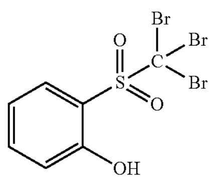

(IS-14)

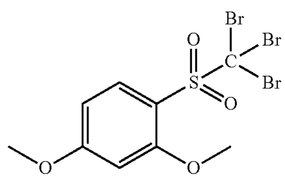

From the viewpoint of improving sensitivity and making it difficult for plate missing to occur, the lowest unoccupied molecular orbital (LUMO) of the electron-accepting polymerization initiator is preferably −3.00 eV or less, and more preferably −3.02 eV or less.

The lower limit of LUMO is preferably −3.80 eV or more, and more preferably −3.60 eV or more.

One kind of electron-accepting polymerization initiator may be used alone, or two or more kinds of electron-accepting polymerization initiators may be used in combination.

The content of the electron-accepting polymerization initiator with respect to the total mass of the image-recording layer is preferably 0.1% by mass to 50% by mass, more preferably 0.5% by mass to 30% by mass, and particularly preferably 0.8% by mass to 20% by mass.

—Electron-Donating Polymerization Initiator—

The polymerization initiator preferably further includes an electron-donating polymerization initiator, and more preferably includes both the electron-donating polymerization initiator and the electron-accepting polymerization initiator described above, because such a polymerization initiator contributes to the improvement of chemical resistance and UV printing durability of the lithographic printing plate.

Examples of the electron-donating polymerization initiator include the following five kinds of initiators.

(i) Alkyl or arylate complex: considered to generate active radicals by oxidative cleavage of carbon-hetero bond, specific examples thereof include a borate salt compound and the like.

(ii) Amino acetate compound: considered to generate active radicals by oxidation-induced cleavage of C—X bond on carbon adjacent to nitrogen, X is preferably a hydrogen atom, a carboxy group, a trimethylsilyl group, or a benzyl group. Specific examples thereof include N-phenylglycines (which may have a substituent in a phenyl group.), N-phenyl iminodiacetic acids (which may have a substituent in a phenyl group), and the like.

(iii) Sulfur-containing compound: compound obtained by substituting nitrogen atoms of the aforementioned amino acetate compound with sulfur atoms and capable of generating active radicals by the same action as that of the amino acetate compound, specific examples thereof include phenylthioacetic acids (which may have a substituent on a phenyl group) and the like.

(iv) Tin-containing compound: compound obtained by substituting nitrogen atoms of the aforementioned amino acetate compound with tin atoms and capable of generating active radicals by the same action as that of the amino acetate compound.

(v) Sulfinates: capable of generating active radicals by oxidation. Specific examples thereof include sodium aryl sulfinate and the like.

It is preferable that the image-recording layer contain the borate salt compound among the above electron-donating polymerization initiators. As the borate salt compound, a tetraaryl borate salt compound or a monoalkyltriaryl borate salt compound is preferable. From the viewpoint of compound stability, a tetraaryl borate salt compound is more preferable, and a tetraphenyl borate salt compound is particularly preferable.

A countercation that the borate salt compound has is not particularly limited, but is preferably an alkali metal ion or a tetraalkyl ammonium ion and more preferably a sodium ion, a potassium ion, or a tetrabutylammonium ion.

Specifically, preferred examples of the borate salt compound include sodium tetraphenyl borate.

From the viewpoint of chemical resistance and UV printing durability, the highest occupied molecular orbital (HOMO) of the electron-donating polymerization initiator used in the present disclosure is preferably −6.00 eV or more, more preferably −5.95 eV or more, even more preferably −5.93 eV or more, and particularly preferably more than −5.90 eV. The upper limit of HOMO is preferably −5.00 eV or less, and more preferably −5.40 eV or less.

Specifically, as the electron-donating polymerization initiator, for example, compounds B-1 to B-8 and other compounds shown below are preferable. It goes without saying that the present disclosure is not limited thereto. In the following chemical formulas, Bu represents a n-butyl group, and Z represents a countercation.

Examples of the countercation represented by $Z^+$ include $Na^+$, $K^+$, $N^+(Bu)_4$, and the like. Bu represents a n-butyl group.

As the countercation represented by $Z^+$, for example, the onium ion in the aforementioned electron-accepting polymerization initiator is also suitable.

B-1

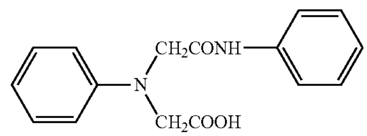

-continued
B-2
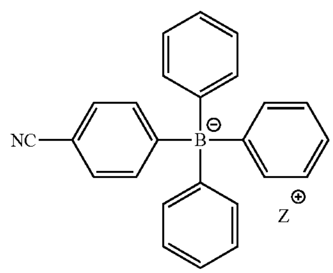
HOMO = -6.052 eV
B-3
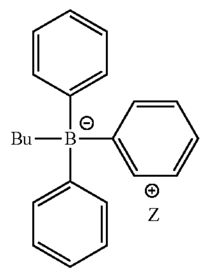
HOMO = -5.772 eV
B-4
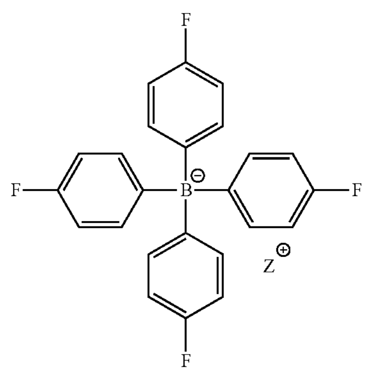
HOMO = -5.957 eV
B-5
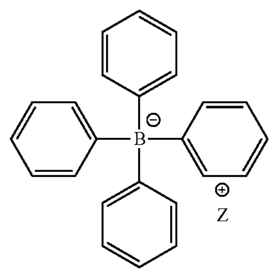
HOMO = -5.905 eV
B-6
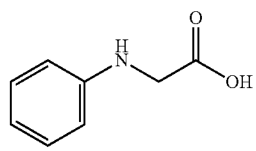
-continued
B-7
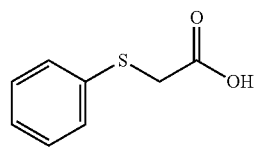
B-8
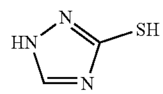
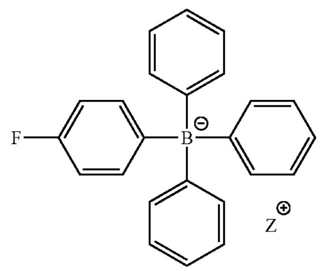
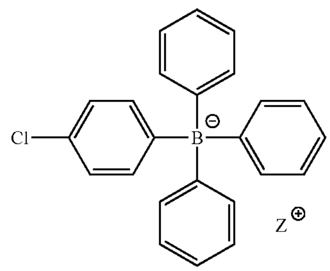
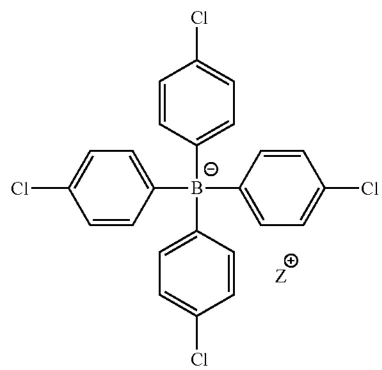
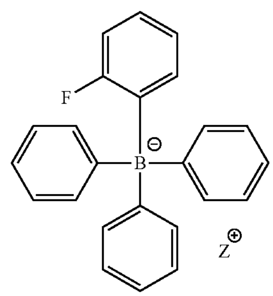

-continued
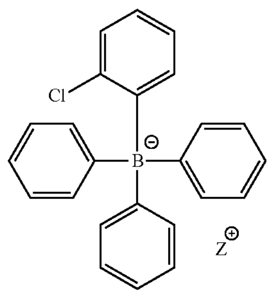
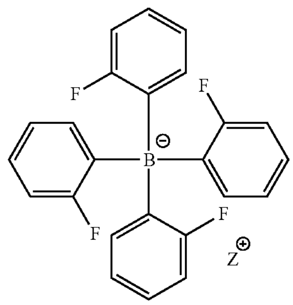
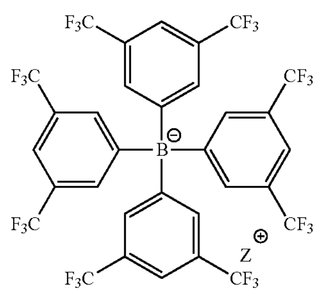
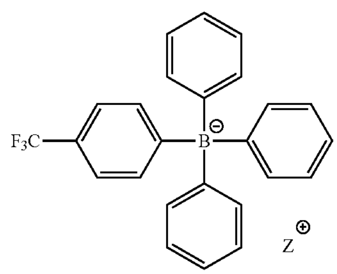
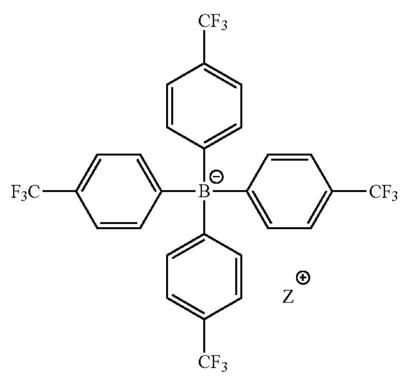
-continued
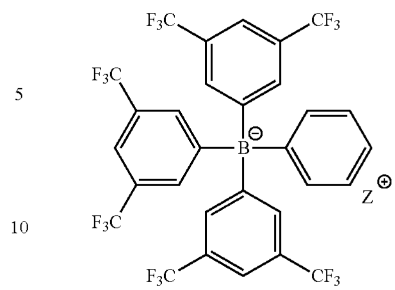
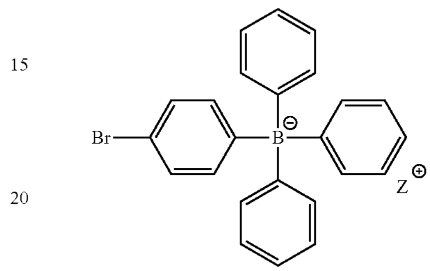
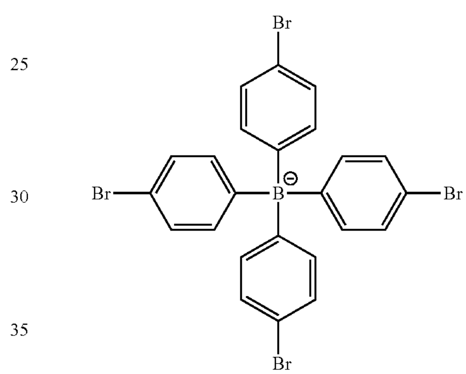
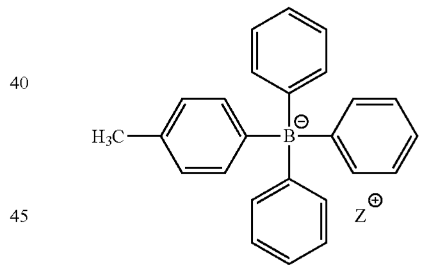
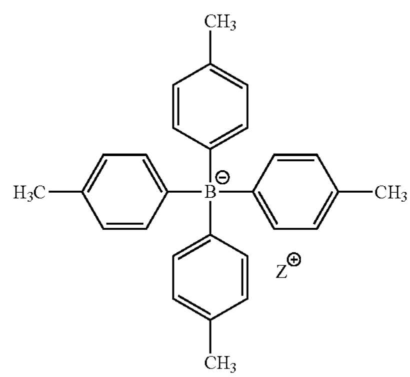

-continued

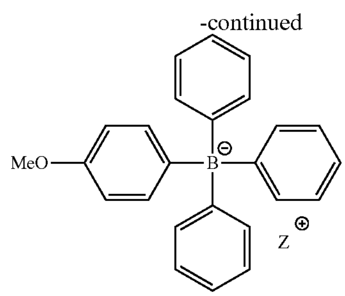

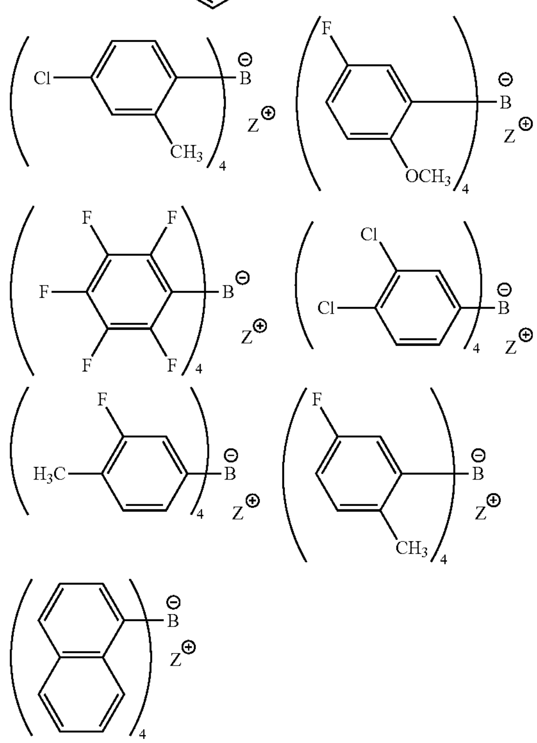

From the viewpoint of visibility, UV printing durability, and temporal stability, the image-recording layer preferably contains an onium salt compound as the electron-accepting polymerization initiator and contains at least one kind of compound selected from the group consisting of borate salt compounds as the electron-donating polymerization initiator, and more preferably contains an onium salt compound as the electron-accepting polymerization initiator and contains a borate salt compound as the electron-donating polymerization initiator.

Furthermore, the image-recording layer preferably contains a borate salt compound as the electron-donating polymerization initiator. The image-recording layer more preferably contains a borate salt compound as the electron-donating polymerization initiator, and HOMO of the infrared absorber A-HOMO of the borate salt compound is more preferably equal to or less than 0.70 eV.

HOMO described above is calculated by the method that will be described later.

Only one kind of electron-donating polymerization initiator may be added to the image-recording layer, or two or more kinds of electron-donating polymerization initiators may be used in combination.

The content of the electron-donating polymerization initiator with respect to the total mass of the image-recording layer is preferably 0.01% by mass to 30% by mass, more preferably 0.05% by mass to 25% by mass, and even more preferably 0.1% by mass to 20% by mass.

One of the preferred aspects of the present disclosure is an aspect in which the aforementioned electron-accepting polymerization initiator and the aforementioned electron-donating polymerization initiator form a salt.

Specific examples thereof include an aspect in which the aforementioned onium salt compound is a salt formed of an onium ion and an anion of the electron-donating polymerization initiator (for example, a tetraphenyl borate anion). Furthermore, for example, an iodonium borate salt compound is more preferable which is a salt formed of an iodonium cation of the aforementioned iodonium salt compound (for example, a di-p-tolyl iodonium cation) and a borate anion of the aforementioned electron-donating polymerization initiator.

Specific examples of the aspect in which the electron-accepting polymerization initiator and the electron-donating polymerization initiator form a salt will be shown below. However, the present disclosure is not limited thereto.

(IA-1)

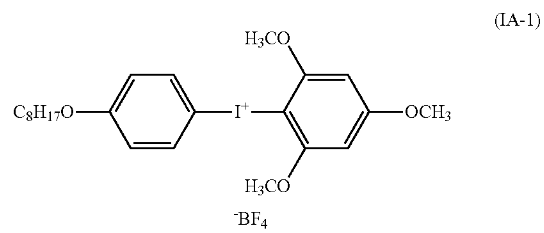

(IA-2)

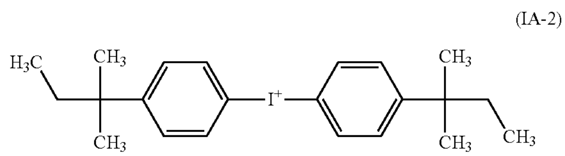

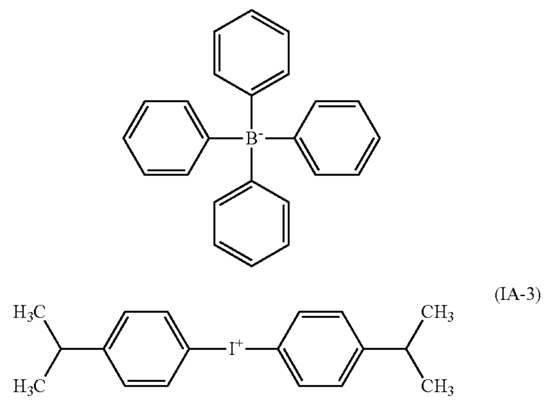

(IA-3)

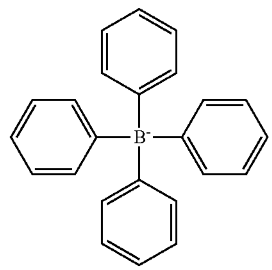

-continued (IA-4)

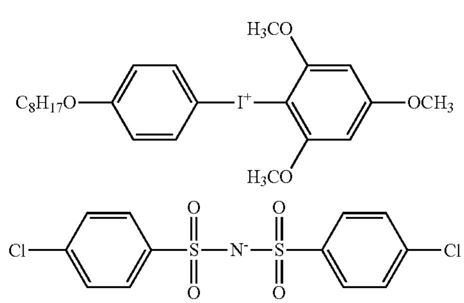

(IA-5)

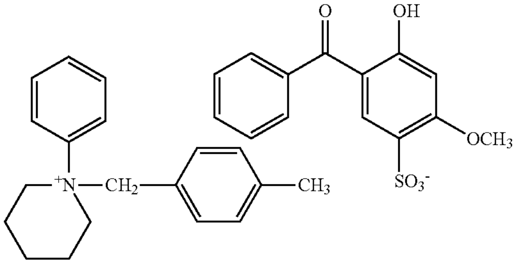

In the present disclosure, in a case where the image-recording layer contains an onium ion and an anion of the aforementioned electron-donating polymerization initiator, the image-recording layer is regarded as containing an electron-accepting polymerization initiator and the electron-donating polymerization initiator described above.

[Relationship Among Electron-Donating Polymerization Initiator, Electron-Accepting Polymerization Initiator, and Infrared Absorber]

The image-recording layer of the present disclosure preferably contains the electron-donating polymerization initiator, the electron-accepting polymerization initiator, and the infrared absorber described above. HOMO of the electron-donating polymerization initiator is preferably −6.0 eV or more, and LUMO of the electron-accepting polymerization initiator is preferably −3.0 eV or less.

More preferred aspects of HOMO of the electron-donating polymerization initiator and LUMO of the electron-accepting polymerization initiator are as described above.

Presumably, in the image-recording layer of the present disclosure, the electron-donating polymerization initiator, at least one kind of the infrared absorber (preferably the infrared absorber A), and the electron-accepting polymerization initiator may exchange energy, for example, in the manner described in the following chemical formula.

Accordingly, it is considered that in a case where HOMO of the electron-donating polymerization initiator is −6.0 eV or more and LUMO of the electron-accepting polymerization initiator is −3.0 eV or less, radicals may be more efficiently generated, and chemical resistance and UV printing durability may be therefore further improved easily.

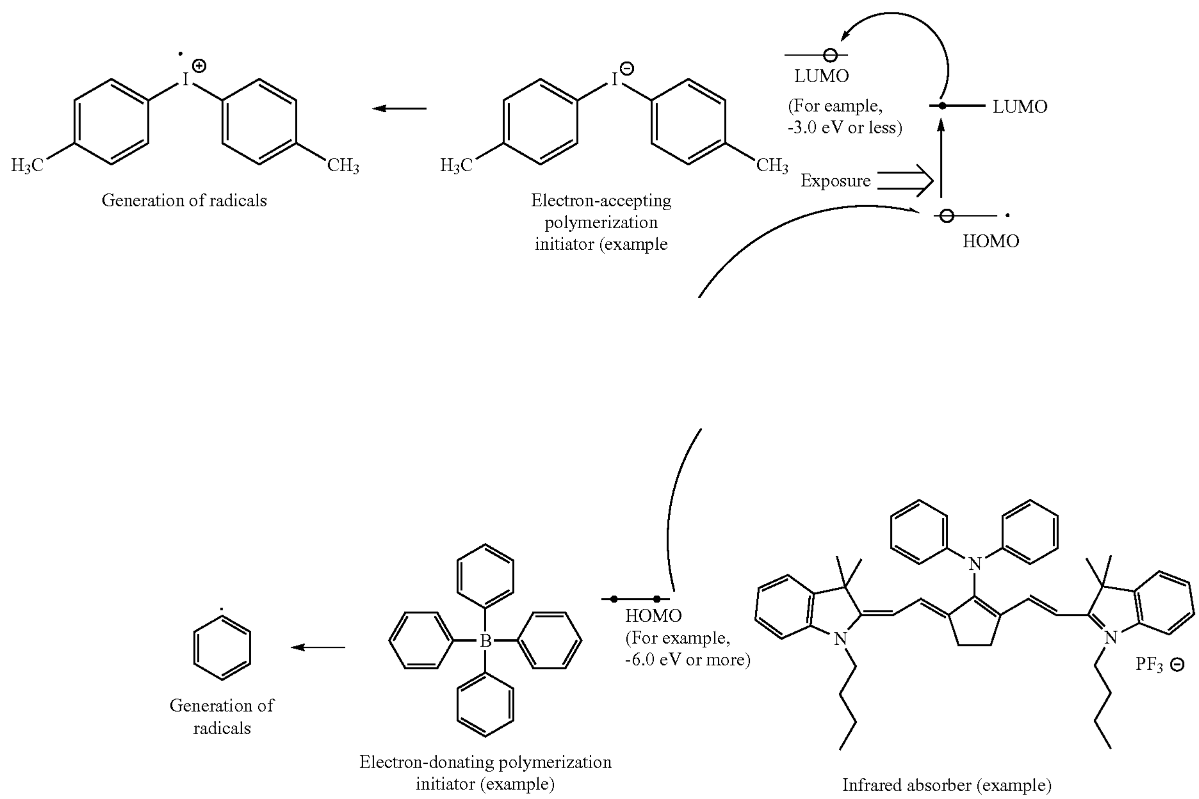

From the viewpoint of UV printing durability and chemical resistance, HOMO of at least one kind of the infrared absorber (preferably the infrared absorber A)—HOMO of the electron-donating polymerization initiator is preferably 1.0 eV or less, more preferably 0.70 eV or less, and particularly preferably 0.60 eV or less. Furthermore, from the same viewpoint, HOMO of at least one kind of the infrared absorber (preferably the infrared absorber A)—HOMO of the electron-donating polymerization initiator is preferably −0.200 eV or more, and more preferably −0.100 eV or more. The negative sign means that HOMO of the electron-donating polymerization initiator is higher than HOMO of at least one kind of the infrared absorber (preferably the infrared absorber A).

From the viewpoint of UV printing durability and chemical resistance. LUMO of the electron-accepting polymerization initiator—LUMO of at least one kind of the infrared absorber (preferably the infrared absorber A) is preferably 1.00 eV or less, and more preferably 0.700 eV or less. Furthermore, from the same viewpoint, LUMO of the electron-accepting polymerization initiator—LUMO of at least one kind of the infrared absorber (preferably the infrared absorber A) is preferably −0.200 eV or more, and—more preferably 0.100 eV or more.

In addition, from the same viewpoint, LUMO of the electron-accepting polymerization initiator—LUMO of at least one kind of the infrared absorber (preferably the infrared absorber A) is preferably −1.00 eV to −0.200 eV, and more preferably 0.700 eV to −0.100 eV. The negative sign means that LUMO of at least one kind of the infrared absorber (preferably the infrared absorber A) is higher than LUMO of the electron-accepting polymerization initiator.

—Particles—

From the viewpoint of UV printing durability, it is preferable that the image-recording layer contain particles.

The particles may be organic particles or inorganic particles. From the viewpoint of UV printing durability, the image-recording layer preferably contains organic particles, and more preferably contains polymer particles.

Known inorganic particles can be used as inorganic particles, and metal oxide particles such as silica particles and titania particles can be suitably used.

The polymer particles are preferably selected from the group consisting of thermoplastic resin particles, thermal reactive resin particles, polymer particles having a polymerizable group, microcapsules encapsulating a hydrophobic compound, and a microgel (crosslinked polymer particles). Among these, polymer particles having a polymerizable group or a microgel are preferable. In a particularly preferable embodiment, the polymer particles have at least one ethylenically unsaturated polymerizable group. The presence of such polymer particles brings about effects of improving the printing durability of an exposed portion and improving the on-press developability of a non-exposed portion.

From the viewpoint of UV printing durability and on-press developability, the polymer particles are preferably thermoplastic resin particles.

As the thermoplastic resin particles, the thermoplastic polymer particles described in Research Disclosure No. 33303 published in January 1992, JP1997-123387A (JP-H09-123387A), JP1997-131850A (JP-H9-131850A), JP1997-171249A (JP-H09-171249A), JP1997-171250A (JP-H09-171250A), EP931647B, and the like are preferable.

Specific examples of polymers constituting the thermoplastic resin particles include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures of these. For example, copolymers having polystyrene, styrene, and acrylonitrile or polymethyl methacrylate are preferable. The average particle diameter of the thermoplastic resin particle is preferably 0.01 μm to 3.0 μm.

Examples of the thermal reactive resin particles include polymer particles having a thermal reactive group. The thermal reactive polymer particles form a hydrophobilized region through crosslinking by a thermal reaction and the accompanying change in functional groups.

The thermal reactive group in the polymer particles having a thermal reactive group may be a functional group that causes any reaction as long as chemical bonds are formed. The thermal reactive group is preferably a polymerizable group. Preferred examples of the polymerizable group include an ethylenically unsaturated group that causes a radical polymerization reaction (for example, an acryloyl group, a methacryloyl group, a vinyl group, an allyl groups, and the like), a cationically polymerizable group (for example, a vinyl group, a vinyloxy group, an epoxy group, an oxetanyl group, and the like), an isocyanato group or a blocked isocyanato group that causes an addition reaction, an epoxy group, a vinyloxy group, an active hydrogen atom-containing functional group that is a reaction partner thereof (for example, an amino group, a hydroxy group, a carboxy group, and the like), a carboxy group that causes a condensation reaction, a hydroxy group or an amino group that is a reaction partner of the carboxy group, an acid anhydride that causes a ring-opening addition reaction, an amino group or a hydroxy group which is a reaction partner of the acid anhydride, and the like.

Examples of the microcapsules include microcapsules encapsulating at least some of the constituent components of the image-recording layer as described in JP2001-277740A and JP2001-277742A. The constituent components of the image-recording layer can also be incorporated into the exterior of the microcapsules. In a preferred aspect, the image-recording layer containing microcapsules is composed so that hydrophobic constituent components are encapsulated in the microcapsules and hydrophilic constituent components are incorporated into the exterior of the microcapsules.

The microgel (crosslinked polymer particles) can contain some of the constituent components of the image-recording layer, in at least one of the surface or the interior of the microgel. From the viewpoint of sensitivity of the lithographic printing plate precursor to be obtained and printing durability of the lithographic printing plate to be obtained, a reactive microgel having a radically polymerizable group on the surface thereof is particularly preferable.

In order to encapsulate the constituent components of the image-recording layer in microcapsules or microgel, known methods can be used.

As the polymer particles, from the viewpoint of printing durability, antifouling properties, and storage stability of the lithographic printing plate to be obtained, polymer particles are preferable which are obtained by a reaction between a polyvalent isocyanate compound that is an adduct of a polyhydric phenol compound having two or more hydroxy groups in a molecule and isophorone diisocyanate and a compound having active hydrogen.

As the polyhydric phenol compound, a compound having a plurality of benzene rings having a phenolic hydroxyl group is preferable.

As the compound having active hydrogen, a polyol compound or a polyamine compound is preferable, a polyol compound is more preferable, and at least one kind of compound selected from the group consisting of propylene glycol, glycerin, and trimethylolpropane is even more preferable.

Preferred examples of the resin particles obtained by the reaction between a polyvalent isocyanate compound that is an adduct of a polyhydric phenol compound having two or more hydroxy groups in a molecule and isophorone diisocyanate and a compound having active hydrogen include the polymer particles described in paragraphs "0032" to "0095" of JP2012-206495A.

Furthermore, from the viewpoint of printing durability and solvent resistance of the lithographic printing plate to be obtained, the polymer particles preferably have a hydrophobic main chain and include both i) constitutional unit having a pendant cyano group directly bonded to the hydrophobic main chain and ii) constitutional unit having a pendant group including a hydrophilic polyalkylene oxide segment.

As the hydrophobic main chain, for example, an acrylic resin chain is preferable.

As the pendant cyano group, for example, $—[CH_2CH(C≡N)]—$ or $—[CH_2C(CH_3)(C≡N)]—$ is preferable.

In addition, the constitutional unit having the pendant cyano group can be easily derived from an ethylenically unsaturated monomer, for example, acrylonitrile, or methacrylonitrile, or a combination of these.

Furthermore, as an alkylene oxide in the hydrophilic polyalkylene oxide segment, ethylene oxide or a propylene oxide is preferable, and ethylene oxide is more preferable.

The number of repeating alkylene oxide structures in the hydrophilic polyalkylene oxide segment is preferably 10 to 100, more preferably 25 to 75, and even more preferably 40 to 50.

As the resin particles having a hydrophobic main chain and including both i) constitutional unit having the pendant cyano group directly bonded to the hydrophobic main chain and ii) constitutional unit having a pendant group including the hydrophilic polyalkylene oxide segment, for example, the particles described in paragraphs "0039" to "0068" of JP2008-503365A are preferable.

From the viewpoint of UV printing durability and on-press developability, the polymer particles preferably have a hydrophilic group.

The hydrophilic group is not particularly limited as long as it has a hydrophilic structure, and examples thereof include an acid group such as a carboxy group, a hydroxy group, an amino group, a cyano group, a polyalkylene oxide structure, and the like.

Among these, from the viewpoint of on-press developability and UV printing durability, a polyalkylene oxide structure is preferable, and a polyethylene oxide structure, a polypropylene oxide structure, or a polyethylene/propylene oxide structure is more preferable.

Furthermore, from the viewpoint of on-press developability and suppressing the occurrence of development residues during on-press development, the polyalkylene oxide structure preferably has a polypropylene oxide structure, and more preferably has a polyethylene oxide structure and a polypropylene oxide structure.

From the viewpoint of printing durability, receptivity, and on-press developability, the hydrophilic group preferably has a cyano group-containing constitutional unit or a group represented by Formula Z, more preferably has a constitutional unit represented by Formula (AN) or a group represented by Formula Z, and particularly preferably has a group represented by Formula Z.

*-Q-W—Y     Formula Z

In formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and ● represents a bonding site with another structure.

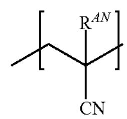

(AN)

In Formula (AN), $R^N$ represents a hydrogen atom or a methyl group.

From the viewpoint of UV printing durability, the polymer contained in the aforementioned polymer particles preferably has a constitutional unit formed of a cyano group-containing compound.

Generally, it is preferable that a cyano group be introduced as a cyano group-containing constitutional unit into a resin by using a cyano group-containing compound (monomer). Examples of the cyano group-containing compound include acrylonitrile compounds. Among these, for example, (meth)acrylonitrile is suitable.

The cyano group-containing constitutional unit is preferably a constitutional unit formed of an acrylonitrile compound, and more preferably a constitutional unit formed of (meth)acrylonitrile, that is, a constitutional unit represented by Formula (AN).

In a case where the aforementioned polymer includes a polymer having a cyano group-containing constitutional unit, from the viewpoint of UV printing durability, the content of the cyano group-containing constitutional unit which is preferably a constitutional unit represented by Formula (AN) in the polymer having the cyano group-containing constitutional unit with respect to the total mass of the polymer having the cyano group-containing constitutional unit is preferably 5% by mass to 90% by mass, more preferably 20% by mass to 80% by mass, and particularly preferably 30% by mass to 60% by mass.

Furthermore, from the viewpoint of printing durability, receptivity, and on-press developability, the polymer particles preferably include polymer particles having a group represented by Formula Z.

Q in Formula Z is preferably a divalent linking group having 1 to 20 carbon atoms, and more preferably a divalent linking group having 1 to 10 carbon atoms.

Furthermore, Q in Formula Z is preferably an alkylene group, an arylene group, an ester bond, an amide bond, or a group obtained by combining two or more of these, and more preferably a phenylene group, an ester bond, or an amide bond.

The divalent group having a hydrophilic structure represented by W in Formula Z is preferably a polyalkyleneoxy group or a group in which $—CH_2CH_2NR^W—$ is bonded to one terminal of a polyalkyleneoxy group. $R^W$ represents a hydrogen atom or an alkyl group.

The divalent group having a hydrophobic structure represented by W in Formula Z is preferably $—R^{WA}—$, —O—

$R^{WA}$—O—, —$R^{W}$N—$R^{WA}$—N$R^{W}$—, —OC(═O)—$R^{WA}$—O—, or —OC(═O)—$R^{WA}$—O—. $R^{WA}$ each independently represent a linear, branched, or cyclic alkylene group having 6 to 120 carbon atoms, a haloalkylene group having 6 to 120 carbon atoms, an arylene group having 6 to 120 carbon atoms, an alkarylene group having 6 to 120 carbon atoms (divalent group formed by removing one hydrogen atom from an alkylaryl group), or an aralkylene group having 6 to 120 carbon atoms.

The monovalent group having a hydrophilic structure represented by Y in Formula Z is preferably —OH, —C(═O)OH, a polyalkyleneoxy group having a hydrogen atom or an alkyl group on a terminal, or a group in which —$CH_2CH_2N(R^{W})$— is bonded to one terminal of a polyalkyleneoxy group having a hydrogen atom or an alkyl group on the other terminal.

The monovalent group having a hydrophobic structure represented by Y in Formula Z is preferably a linear, branched, or cyclic alkyl group having 6 to 120 carbon atoms, a haloalkyl group having 6 to 120 carbon atoms, an aryl group having 6 to 120 carbon atoms, an alkaryl group having 7 to 120 carbon atoms (alkylaryl group), an aralkyl group having 7 to 120 carbon atoms, —O$R^{WB}$, —C(═O)O$R^{WB}$, or —OC(═O)$R^{WB}$. $R^{WB}$ represents an alkyl group having 6 to 20 carbon atoms.

From the viewpoint of printing durability, receptivity, and on-press developability, in the polymer particles having a group represented by formula Z, W is more preferably a divalent group having a hydrophilic structure, Q is more preferably a phenylene group, an ester bond, or an amide bond, W is more preferably a polyalkyleneoxy group, and Y is more preferably a polyalkyleneoxy group having a hydrogen atom or an alkyl group on a terminal.

From the viewpoint of printing durability and on-press developability, the aforementioned polymer particles preferably include polymer particles having a polymerizable group, and more preferably include polymer particles having a polymerizable group on the particle surface.

Furthermore, from the viewpoint of printing durability, the polymer particles preferably include polymer particles having a hydrophilic group and a polymerizable group.

The polymerizable group may be a cationically polymerizable group or a radically polymerizable group. From the viewpoint of reactivity, the polymerizable group is preferably a radically polymerizable group.

The aforementioned polymerizable group is not particularly limited as long as it is a polymerizable group. From the viewpoint of reactivity, an ethylenically unsaturated group is preferable, a vinylphenyl group (styryl group), a (meth)acryloxy group, or a (meth)acrylamide group is more preferable, and a (meth)acryloxy group is particularly preferable.

In addition, the polymer in the polymer particles having a polymerizable group preferably has a constitutional unit having a polymerizable group.

The polymerizable group may be introduced into the surface of the polymer particles by a polymer reaction.

From the viewpoint of UV printing durability and on-press developability, the image-recording layer preferably contains, as the aforementioned polymer particles, addition polymerization-type resin particles having a dispersible group which more preferably includes a group represented by Formula Z.

Furthermore, from the viewpoint of printing durability, receptivity, on-press developability, and suppression of the occurrence of development residues during on-press development, the polymer particles preferably contain a resin having a urea bond, more preferably contain a resin having a structure obtained by reacting at least an isocyanate compound represented by Formula (Iso) with water, and particularly preferably contain a resin that has a structure obtained by reacting at least an isocyanate compound represented by Formula (Iso) with water and has a polyethylene oxide structure and a polypropylene oxide structure as polyoxyalkylene structures. Furthermore, the particles containing the resin having a urea bond are preferably a microgel.

(Iso)

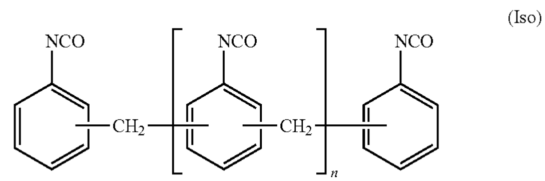

In Formula (Iso), n represents an integer of 0 to 10.

An example of the reaction between the isocyanate compound represented by Formula (Iso) and water is the reaction shown below. In the following example, a 4,4-isomer in which n=0 is used.

As shown below, in a case where the isocyanate compound represented by Formula (Iso) is reacted with water, the isocyanate group is partially hydrolyzed by water and generates an amino group. The generated amino group reacts with the isocyanate group and generates a urea bond, and a dimer is consequently formed. Furthermore, the following reaction is repeated to form a resin having a urea bond.

In the following reaction, by adding a compound (compound having active hydrogen) such as an alcohol compound or an amine compound reactive with an isocyanate group, it is possible to introduce the structure of an alcohol compound, an amine compound, or the like to the resin having a urea bond.

As the compound having active hydrogen, for example, the compounds described above regarding the microgel are preferable.

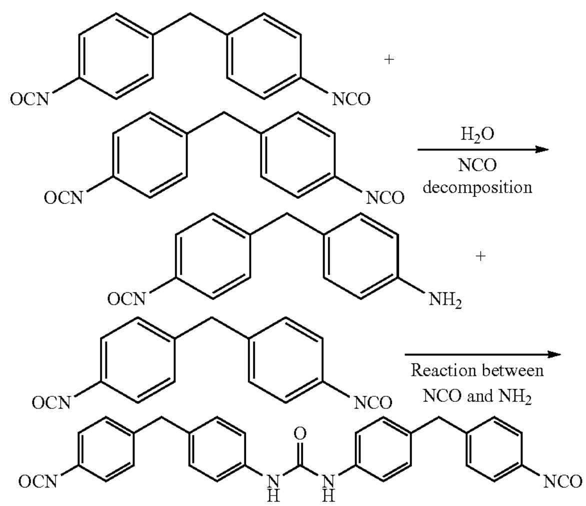

The resin having a urea bond preferably has an ethylenically unsaturated group, and more preferably has a group represented by Formula (PETA).

(PETA)

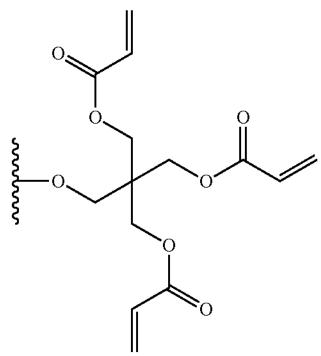

In Formula (PETA), the portion of the wavy line represents a bonding position with other structures.

From the viewpoint of UV printing durability and on-press developability, the image-recording layer preferably contains thermoplastic resin particles.

The thermoplastic resin contained in the thermoplastic resin particles is not particularly limited. Examples thereof include polyethylene, polystyrene, polyvinyl chloride, polyvinylidene chloride, polymethyl (meth)acrylate, polyethyl (meth)acrylate, polybutyl (meth)acrylate, polyacrylonitrile, polyvinyl acetate, copolymers of these, and the like. The thermoplastic resin may be in the form of latex.

The thermoplastic resin according to the present disclosure is preferably a thermoplastic resin which melts or softens by heat generated in an exposure step that will be described later and thus forms a part or the entirety of a hydrophobic film forming the recording layer.

From the viewpoint of ink receptivity and UV printing durability, the thermoplastic resin preferably includes a resin A having a constitutional unit formed of an aromatic vinyl compound and a cyano group-containing constitutional unit.

The resin A contained in the thermoplastic resin preferably has a constitutional unit formed of an aromatic vinyl compound.

The aromatic vinyl compound may have a structure composed of an aromatic ring and a vinyl group bonded thereto. Examples of the compound include a styrene compound, a vinylnaphthalene compound, and the like. Among these, a styrene compound is preferable, and styrene is more preferable.

Examples of the styrene compound include styrene, p-methylstyrene, p-methoxystyrene, β-methylstyrene, p-methyl-β-methylstyrene, α-methylstyrene, p-methoxy-β-methylstyrene, and the like. Among these, for example, styrene is preferable.

Examples of the vinylnaphthalene compound include 1-vinylnaphthalene, methyl-1-vinylnaphthalene, β-methyl-1-vinylnaphthalene, 4-methyl-1-vinylnaphthalene, 4-methoxy-1-vinylnaphthalene, and the like. Among these, for example, 1-vinylnaphthalene is preferable.

Preferred examples of the constitutional unit formed of an aromatic vinyl compound include a constitutional unit represented by Formula A1.

Formula A1

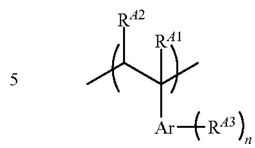

In Formula A1, $R^{A1}$ and $R^{A2}$ each independently represent a hydrogen atom or an alkyl group, Ar represents an aromatic ring group, $R^{A3}$ represents a substituent, and n represents an integer of 0 or greater and equal to or less than the maximum number of substituents of Ar.

In Formula A1, $R^{A1}$ and $R^{A2}$ preferably each independently represent a hydrogen atom or an alkyl group having 1 to 4 carbon atoms, more preferably each independently represent a hydrogen atom or a methyl group, and even more preferably both represent a hydrogen atom.

In Formula A1, Ar is preferably a benzene ring or a naphthalene ring, and more preferably a benzene ring.

In Formula A1, $R^{A3}$ is preferably an alkyl group or an alkoxy group, more preferably an alkyl group having 1 to 4 carbon atoms or an alkoxy group having 1 to 4 carbon atoms, and even more preferably a methyl group or a methoxy group.

In a case where there is a plurality of $R^{A3}$'s in Formula A1, the plurality of $R^{A3}$'s may be the same as or different from each other.

In Formula A1, n is preferably an integer of 0 to 2, more preferably 0 or 1, and even more preferably 0.

In the resin A contained in the thermoplastic resin, from the viewpoint of ink receptivity, the content of the constitutional unit formed of an aromatic vinyl compound is preferably higher than the content of the cyano group-containing constitutional unit that will be described later. The content of the constitutional unit formed of an aromatic vinyl compound with respect to the total mass of the thermoplastic resin is more preferably 15% by mass to 85% by mass, and even more preferably 30% by mass to 70% by mass.

The resin A contained in the thermoplastic resin particles preferably has a cyano group-containing constitutional unit.

Generally, it is preferable that a cyano group be introduced as a cyano group-containing constitutional unit into the resin A by using a cyano group-containing compound (monomer). Examples of the cyano group-containing compound include acrylonitrile compounds. Among these, for example, (meth)acrylonitrile is suitable.

The cyano group-containing constitutional unit is preferably a constitutional unit formed of an acrylonitrile compound, and more preferably a constitutional unit formed of (meth)acrylonitrile.

As the constitutional unit formed of a cyano group-containing compound, for example, a constitutional unit represented by Formula B1 is preferable.

Formula B1

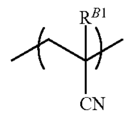

In Formula B1, $R^{B1}$ represents a hydrogen atom or an alkyl group.

In Formula B1, $R^{B1}$ is preferably a hydrogen atom or an alkyl group having 1 to 4 carbon atoms, more preferably a hydrogen atom or a methyl group, and even more preferably a hydrogen atom.

From the viewpoint of ink receptivity, the content of the cyano group-containing constitutional unit in the resin A is preferably lower than the content of the aforementioned constitutional unit formed of an aromatic vinyl compound. The content of the cyano group-containing constitutional unit with respect to the total mass of the resin A is more preferably 55% by mass to 90% by mass, and even more preferably 60% by mass to 85% by mass.

In a case where the resin A included in the thermoplastic resin has the constitutional unit formed of an aromatic vinyl compound and the cyano group-containing constitutional unit, the content ratio between the constitutional unit formed of an aromatic vinyl compound and the cyano group-containing constitutional unit (constitutional unit formed of aromatic vinyl compound:cyano group-containing constitutional unit) is preferably 5:5 to 9:1 and more preferably 6:4 to 8:2 based on mass.

From the viewpoint of UV printing durability and chemical resistance, the resin A contained in the thermoplastic resin particles preferably further has a constitutional unit formed of a N-vinyl heterocyclic compound.

Examples of the N-vinyl heterocyclic compound include N-vinylpyrrolidone, N-vinylcarbazole, N-vinylpyrrole, N-vinylphenothiazine, N-vinylsuccinic acid imide, N-vinylphthalimide, N-vinylcaprolactam, and N-vinylimidazole. Among these, N-vinylpyrrolidone is preferable.

Preferred examples of the constitutional unit formed of a N-vinyl heterocyclic compound include a constitutional unit represented by Formula C1.

Formula C1

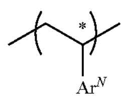

In Formula C1, $Ar^N$ represents a nitrogen atom-containing heterocyclic structure, and the nitrogen atom in $Ar^N$ is bonded to the carbon atom represented by *.

In Formula C1, the heterocyclic structure represented by $Ar^N$ is preferably a pyrrolidone ring, a carbazole ring, a pyrrole ring, a phenothiazine ring, a succinimide ring, a phthalimide ring, a caprolactam ring, or an imidazole ring, and more preferably a pyrrolidone ring.

Furthermore, the heterocyclic structure represented by $Ar^N$ may have a known substituent.

In the resin A, the content of the constitutional unit formed of a N-vinyl heterocyclic compound with respect to the total mass of the resin A is preferably 5% by mass to 50% by mass, and more preferably 10% by mass to 40% by mass.

The resin A contained in the thermoplastic resin particles may contain an acidic group-containing constitutional unit. From the viewpoint of on-press developability and ink receptivity, it is preferable that the resin A do not contain an acidic group-containing constitutional unit.

Specifically, in the thermoplastic resin, the content of the acidic group-containing constitutional unit is preferably 20% by mass or less, more preferably 10% by mass or less, and even more preferably 5% by mass or less. The lower limit of the content is not particularly limited, and may be 0% by mass.

The acid value of the thermoplastic resin is preferably 160 mg KOH/g or less, more preferably 80 mg KOH/g or less, and even more preferably 40 mg KOH/g or less. The lower limit of the acid value is not particularly limited, and may be 0 mg KOH/g.

In the present disclosure, the acid value is determined by the measurement method based on JIS K0070: 1992.

From the viewpoint of ink receptivity, the resin A contained in the thermoplastic resin particles may contain a hydrophobic group-containing constitutional unit.

Examples of the hydrophobic group include an alkyl group, an aryl group, an aralkyl group, and the like.

As the hydrophobic group-containing constitutional unit, a constitutional unit formed of an alkyl (meth)acrylate compound, an aryl (meth)acrylate compound, or an aralkyl (meth)acrylate compound is preferable, and a constitutional unit formed of an alkyl (meth)acrylate compound is more preferable.

The alkyl group in the alkyl (meth)acrylate compound preferably has 1 to 10 carbon atoms. The alkyl group may be linear or branched or may have a cyclic structure. Examples of the alkyl (meth)acrylate compound include methyl (meth) acrylate, ethyl (meth)acrylate, propyl (meth)acrylate, cyclohexyl (meth)acrylate, 2-ethylhexyl (meth)acrylate, dicyclopentanyl (meth)acrylate, and the like.

The aryl group in the aryl (meth)acrylate compound preferably has 6 to 20 carbon atoms. The aryl group is more preferably a phenyl group. The aryl group may further have a known substituent. Preferred examples of the aryl (meth) acrylate compound include phenyl (meth)acrylate.

The alkyl group in the aralkyl (meth)acrylate compound preferably has 1 to 10 carbon atoms. The alkyl group may be linear or branched or may have a cyclic structure. The aryl group in the aralkyl (meth)acrylate compound preferably has 6 to 20 carbon atoms. The aryl group is more preferably a phenyl group. Preferred examples of the aralkyl (meth) acrylate compound include benzyl (meth)acrylate.

In the resin A contained in the thermoplastic resin particles, the content of the hydrophobic group-containing constitutional unit with respect to the total mass of the resin A is preferably 5% by mass to 50% by mass, and more preferably 10% by mass to 30% by mass.

From the viewpoint of UV printing durability and on-press developability, the thermoplastic resin contained in the thermoplastic resin particles preferably has a hydrophilic group.

The hydrophilic group is not particularly limited as long as it has a hydrophilic structure, and examples thereof include an acid group such as a carboxy group, a hydroxy group, an amino group, a cyano group, a polyalkylene oxide structure, and the like.

From the viewpoint of UV printing durability and on-press developability, the hydrophilic group is preferably a group having a polyalkylene oxide structure, a group having a polyester structure, or a sulfonic acid group, more preferably a group having a polyalkylene oxide structure or a sulfonic acid group, and even more preferably a group having a polyalkylene oxide structure.

From the viewpoint of on-press developability, the polyalkylene oxide structure is preferably a polyethylene oxide structure, a polypropylene oxide structure, or a poly(ethylene oxide/propylene oxide) structure.

From the viewpoint of on-press developability, among the above hydrophilic groups, groups having a polypropylene oxide structure as a polyalkylene oxide structure are preferable, and groups having a polyethylene oxide structure and a polypropylene oxide structure are more preferable.

From the viewpoint of on-press developability, the number of alkylene oxide structures in the polyalkylene oxide structure is preferably 2 or more, more preferably 5 or more, even more preferably 5 to 200, and particularly preferably 8 to 150.

From the viewpoint of on-press developability, as the aforementioned hydrophilic group, a group represented by Formula Z is preferable.

From the viewpoint of improving UV printing durability, chemical resistance, and on-press developability, the resin A contained in the thermoplastic resin particles preferably has a hydrophilic group-containing constitutional unit.

Examples of the hydrophilic group include —OH, —CN, —$CONR^1R^2$, —$NR^2COR^1$ ($R^1$ and $R^2$ each independently represent a hydrogen atom, an alkyl group, an alkenyl group, or an aryl group, $R^1$ and $R^2$ may be bonded to each other to form a ring), —$NR^3R^4$, —$N^+R^3R^4R^5X^-$ ($R^3$ to $R^5$ each independently represent an alkyl group of 1 to 8 carbon atoms, and $X^-$ represents a counteranion), a group represented by Formula PO, a hydrophilic group that the thermoplastic resin contained in the thermoplastic resin particles preferably has, and the like.

Among these hydrophilic groups, —$CONR^1R^2$ or a group represented by Formula PO is preferable, and a group represented by Formula PO is more preferable.

Formula PO

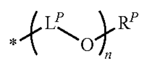

In Formula PO, $L^P$ each independently represent an alkylene group, $R^P$ represents a hydrogen atom or an alkyl group, and n represents an integer of 1 to 100.

In Formula PO, $L^P$ preferably each independently represent an ethylene group, a 1-methylethylene group, or a 2-methylethylene group, and more preferably each independently represent an ethylene group.

In Formula PO, $R^P$ is preferably a hydrogen atom or an alkyl group having 1 to 18 carbon atoms, more preferably a hydrogen atom or an alkyl group having 1 to 10 carbon atoms, even more preferably a hydrogen atom or an alkyl group having 1 to 4 carbon atoms, and particularly preferably a hydrogen atom or a methyl group.

In Formula PO, n is preferably an integer of 1 to 10, and more preferably an integer of 1 to 4.

In the resin A, the content of the hydrophilic group-containing constitutional unit with respect to the total mass of the resin A is preferably 5% by mass to 60% by mass, and more preferably 10% by mass to 30% by mass.

The resin A contained in the thermoplastic resin particles may further contain other constitutional units. The resin A can contain, as those other constitutional units, constitutional units other than the constitutional units described above without particular limitations. Examples thereof include constitutional units formed of an acrylamide compound, a vinyl ether compound, and the like.

Examples of the acrylamide compound include (meth)acrylamide, N-methyl (meth)acrylamide, N-ethyl (meth)acrylamide, N-propyl (meth)acrylamide, N-butyl (meth)acrylamide, N,N'-dimethyl (meth)acrylamide, N,N'-diethyl (meth)acrylamide, N-hydroxyethyl (meth)acrylamide, N-hydroxypropyl (meth)acrylamide, N-hydroxybutyl (meth)acrylamide, and the like.

Examples of the vinyl ether compound include methyl vinyl ether, ethyl vinyl ether, propyl vinyl ether, n-butyl vinyl ether, tert-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, phenoxypolyethylene glycol vinyl ether, and the like.

In the thermoplastic resin, the content of those other constitutional units with respect to the total mass of the thermoplastic resin is preferably 5% by mass to 50% by mass, and more preferably 10% by mass to 30% by mass.

From the viewpoint of UV printing durability and ink receptivity, the glass transition temperature (Tg) of the thermoplastic resin is preferably 60° C. to 150° C., more preferably 80° C. to 140° C., and even more preferably 90° C. to 130° C.

In a case where the thermoplastic resin particles contain two or more kinds of thermoplastic resins, the value obtained by the FOX equation that will be described later is referred to as the glass transition temperature of the thermoplastic resin.

In the present disclosure, the glass transition temperature of a resin can be measured by differential scanning calorimetry (DSC).

Specifically, the glass transition temperature is measured according to the method described in JIS K 7121 (1987) or JIS K 6240 (2011). In the present specification, an extrapolated glass transition initiation temperature (hereinafter, called Tig in some cases) is used as the glass transition temperature.

Specifically, the glass transition temperature is measured by the method described below.

In order to determine the glass transition temperature, the device is kept at a temperature approximately 50° C. lower than the expected Tg of the resin until the device stabilizes. Then, the resin is heated at a heating rate of 20° C./min to a temperature approximately 30° C. higher than the temperature at which the glass transition ends, and a differential thermal analysis (DTA) curve or a DSC curve is plotted.

The extrapolated glass transition initiation temperature (Tig), that is, the glass transition temperature Tg in the present specification is determined as a temperature at an intersection point between a straight line that is obtained by extending the baseline of a low temperature side in the DTA curve or the DSC curve to a high temperature side and a tangent line that is drawn at a point where the slope of the curve of a portion in which the glass transition stepwise changes is maximum.

In a case where the thermoplastic resin particles contain two or more kinds of thermoplastic resins, Tg of the thermoplastic resins contained in the thermoplastic resin particles is determined as follows.

In a case where Tg1 (K) represents Tg of a first thermoplastic resin, W1 represents the mass ratio of the first thermoplastic resin to the total mass of thermoplastic resin components in the thermoplastic resin particles, Tg2 (K) represents Tg of a second thermoplastic resin, and W2 represents the mass ratio of the second resin to the total mass of thermoplastic resin components in the thermoplastic resin particles, Tg0 (K) of the thermoplastic resin particles can be estimated according to the following FOX equation.

$$1/Tg0=(W1/Tg1)+(W2/Tg2) \qquad \text{FOX equation:}$$

Furthermore, in a case where the thermoplastic resin particles contain 3 kinds of resins or in a case where 3 kinds of thermoplastic resin particles containing different types of thermoplastic resins are contained in a pretreatment liquid, provided that Tgn (K) represents Tg of nth resin and Wn represents the mass ratio of the nth resin to the total mass of resin components in the thermoplastic resin particles, Tg of the thermoplastic resin particles can be estimated according to the following equation just as in the case described above.

$$1/Tg0=(W1/Tg1)+(W2/Tg2)+(W3/Tg3)+(Wn/Tgn) \qquad \text{FOX equation:}$$

In the present specification, Tg is a value measured by a differential scanning calorimeter (DSC). As the differential scanning calorimetry (DSC), for example, EXSTAR 6220 manufactured by SII NanoTechnology Inc. can be used.

From the viewpoint of UV printing durability, the arithmetic mean particle diameter of the thermoplastic resin particles is preferably 1 nm or more and 200 nm or less, more preferably 3 nm or more and less than 80 nm, and even more preferably 10 nm or more and 49 nm or less.

Unless otherwise specified, the arithmetic mean particle diameter of the thermoplastic resin particles in the present disclosure refers to a value measured by a dynamic light scattering method (DLS). The arithmetic mean particle diameter of the thermoplastic resin particles by DLS is measured using Brookhaven BI-90 (manufactured by Brookhaven Instruments) according to the manual of the instrument.

The weight-average molecular weight of the thermoplastic resin contained in the thermoplastic resin particles is preferably 3,000 to 300,000, and more preferably 5,000 to 100,000.

The manufacturing method of the thermoplastic resin contained in the thermoplastic resin particles is not particularly limited. The thermoplastic resin can be manufactured by known methods.

For example, the polymer is obtained by polymerizing a styrene compound, an acrylonitrile compound, and at least one kind of optional compound selected from the group consisting of the aforementioned N-vinyl heterocyclic compound, a compound used for forming the aforementioned ethylenically unsaturated group-containing constitutional unit, a compound used for forming the aforementioned acidic group-containing constitutional unit, a compound used for forming the aforementioned hydrophobic group-containing constitutional unit, and a compound used for forming the aforementioned other constitutional units by known methods.

Specific examples of the thermoplastic resin contained in the thermoplastic resin particles are shown in the following tables. However, the thermoplastic resin used in the present disclosure is not limited thereto.

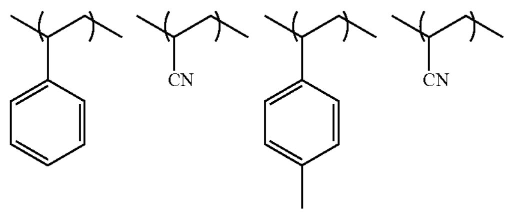

-continued

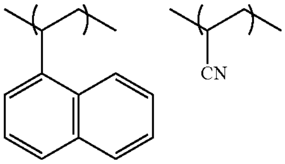

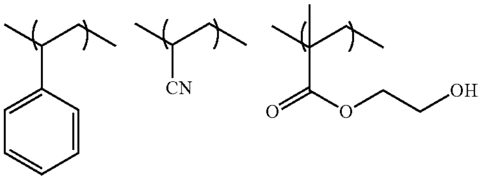

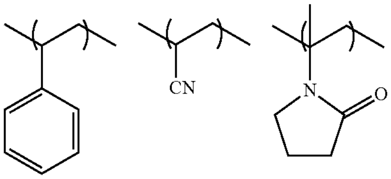

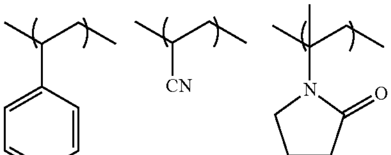

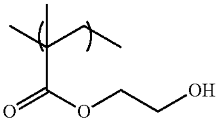

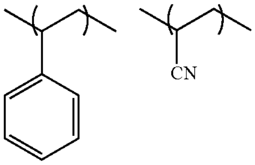

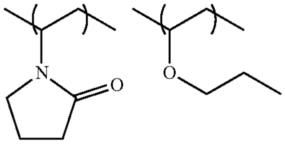

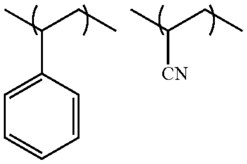

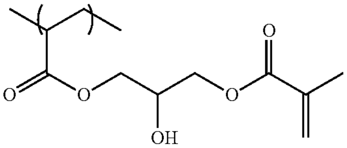

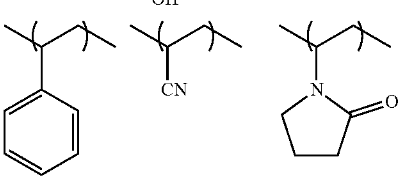

-continued

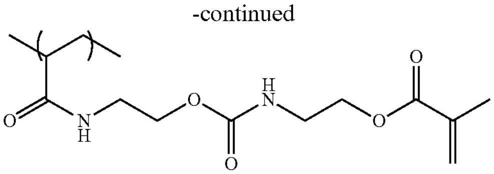

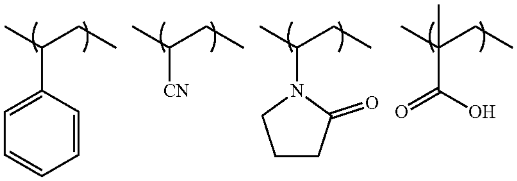

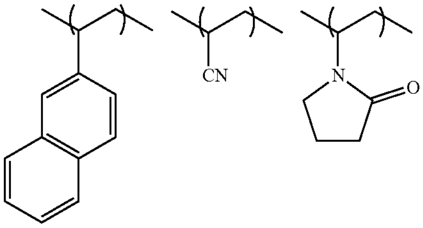

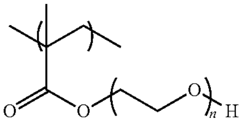

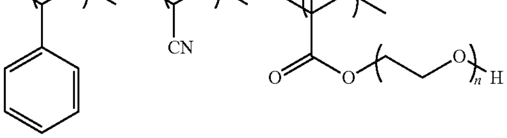

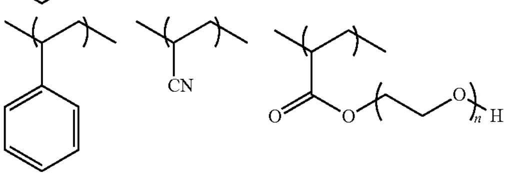

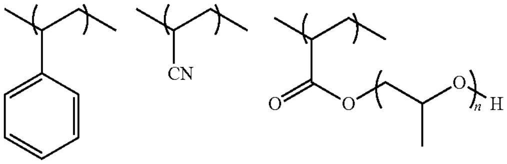

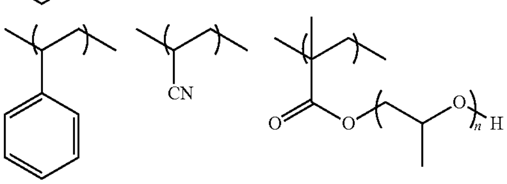

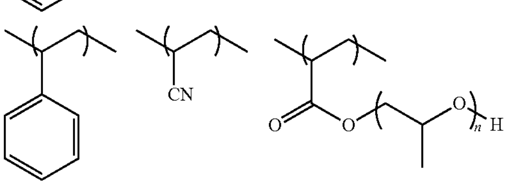

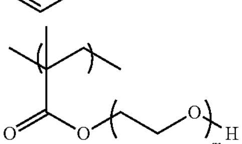

The content ratio of the constitutional units in the above specific examples can be appropriately changed according to the preferred range of the content of each of the constitutional units described above.

Furthermore, the weight-average molecular weight of each of the compounds shown in the above specific examples can be appropriately changed according to the preferred range of the weight-average molecular weight of the thermoplastic resin described above.

The average particle diameter of the aforementioned particles is preferably 0.01 μm to 3.0 μm, more preferably 0.03 μm to 2.0 μm, and even more preferably 0.10 μm to 1.0 μm. In a case where the average particle diameter is in this range, excellent resolution and temporal stability are obtained.

In the present disclosure, the average primary particle diameter of the above particles is measured using a light scattering method or by capturing an electron micrograph of the particles, measuring the particle diameter of a total of 5,000 particles in the photograph, and calculating the average thereof. For non-spherical particles, the value of particle diameter of spherical particles having the same area as the area of the particles on the photograph is adopted as the particle diameter.

Note that unless otherwise specified, the average particle diameter in the present disclosure means a volume average particle diameter.

The image-recording layer may contain only one kind of particles, particularly, one kind of polymer particles or two or more kinds of polymer particles.

From the viewpoint of on-press developability and UV printing durability, the content of particles, particularly, the content of polymer particles in the image-recording layer with respect to the total mass of the image-recording layer is preferably 5% by mass to 90% by mass, more preferably 10% by mass to 90% by mass, even more preferably 20% by mass to 90% by mass, and particularly preferably 50% by mass to 90% by mass.

Furthermore, from the viewpoint of on-press developability and UV printing durability, the content of the polymer particles in the image-recording layer with respect to the total mass of components having a molecular weight of 3,000 or more in the image-recording layer is preferably 20% by mass to 100% by mass, more preferably 35% by mass to 100% by mass, even more preferably 50% by mass to 100% by mass, and particularly preferably 80% by mass to 100% by mass.

—Binder Polymer—

The image-recording layer may contain a binder polymer.

The aforementioned thermoplastic resin particles and polymer particles do not correspond to another binder polymer described above. That is, the aforementioned another binder polymer is a polymer that is not in the form of particles.

The aforementioned another binder polymer is preferably a (meth)acrylic resin, a polyvinyl acetal resin, or a polyurethane resin.

Among these, as the binder polymer, known binder polymers that can be used in an image-recording layer in lithographic printing plate precursors can be suitably used. As an example, a binder polymer that is used for an on-press development type lithographic printing plate precursor (hereinafter, also called binder polymer for on-press development) will be specifically described.

As the binder polymer for on-press development, a binder polymer having an alkylene oxide chain is preferable. The binder polymer having an alkylene oxide chain may have a poly(alkylene oxide) moiety in a main chain or side chain. In addition, the binder polymer may be a graft polymer having poly(alkylene oxide) in a side chain or a block copolymer of a block composed of a poly(alkylene oxide)-containing repeating unit and a block composed of an (alkylene oxide)-free repeating unit.

As a binder polymer having a poly(alkylene oxide) moiety in the main chain, a polyurethane resin is preferable. In a case where the binder polymer has a poly(alkylene oxide) moiety in the side chain, examples of polymers as the main chain include a (meth)acrylic resin, a polyvinyl acetal resin, a polyurethane resin, a polyurea resin, a polyimide resin, a polyamide resin, an epoxy resin, a polystyrene resin, a novolac-type phenol resin, a polyester resin, synthetic rubber, and natural rubber. Among these, a (meth)acrylic resin is particularly preferable.

In addition, as the binder polymer, for example, a polymer compound is also preferable which has a polyfunctional thiol having functionalities of 6 or more and 10 or less as a nucleus and a polymer chain that is bonded to the nucleus by a sulfide bond and has a polymerizable group (hereinafter, this compound will be also called star-shaped polymer compound). As the star-shaped polymer compound, for example, the compounds described in JP2012-148555A can be preferably used.

Examples of the star-shaped polymer compound include the compound described in JP2008-195018A that has a polymerizable group such as an ethylenically unsaturated bond for improving the film hardness of an image area in a main chain or side chain and preferably in a side chain. The polymerizable group forms a crosslink between polymer molecules, which facilitates curing.

As the polymerizable group, an ethylenically unsaturated group such as a (meth)acryloyl group, a vinyl group, an allyl group, or a vinyl phenyl group (styryl group), an epoxy group, or the like is preferable, a (meth)acryloyl group, a vinyl group, or a vinyl phenyl group (styryl group) is more preferable from the viewpoint of polymerization reactivity, and a (meth)acryloyl group is particularly preferable. These groups can be introduced into the polymer by a polymer reaction or copolymerization. For example, it is possible to use a reaction between a polymer having a carboxy group in a side chain and glycidyl methacrylate or a reaction between a polymer having an epoxy group and an ethylenically unsaturated group-containing carboxylic acid such as methacrylic acid. These groups may be used in combination.

The molecular weight of the binder polymer that is a polystyrene-equivalent weight-average molecular weight (Mw) determined by GPC is preferably 2,000 or more, more preferably 5,000 or more, and even more preferably 10,000 to 300,000.

As necessary, a hydrophilic polymer such as polyacrylic acid or polyvinyl alcohol described in JP2008-195018A can be used in combination. In addition, a lipophilic polymer and a hydrophilic polymer can be used in combination.

From the viewpoint of UV printing durability and on-press developability, the image-recording layer preferably contains a polymer having a constitutional unit formed of an aromatic vinyl compound, and more preferably contains a polymer having a constitutional unit formed of an aromatic vinyl compound and an infrared absorber which decomposes by exposure to infrared.

For example, from the viewpoint of inhibiting on-press developability from deteriorating over time, the glass transition temperature (Tg) of the binder polymer used in the present disclosure is preferably 50° C. or higher, more preferably 70° C. or higher, even more preferably 80° C. or higher, and particularly preferably 90° C. or higher.

Furthermore, from the viewpoint of ease of permeation of water into the image-recording layer, the upper limit of the glass transition temperature of the binder polymer is preferably 200° C., and more preferably 120° C. or lower.

From the viewpoint of further inhibiting on-press developability from deteriorating over time, as the binder polymer having the above glass transition temperature, polyvinyl acetal is preferable.

Polyvinyl acetal is a resin obtained by acetalizing hydroxy groups of polyvinyl alcohol with an aldehyde.

Particularly, polyvinyl butyral is preferable which is obtained by acetalizing (that is, butyralizing) hydroxy groups of polyvinyl alcohol with butyraldehyde.

The polyvinyl acetal preferably has a constitutional unit represented by (a) which is obtained by acetalizing hydroxy groups of polyvinyl alcohol with an aldehyde.

(a)

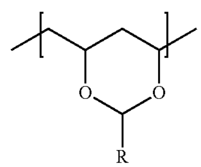

R represents a residue of aldehyde used for acetalization.

Examples of R include a hydrogen atom, an alkyl group, and an ethylenically unsaturated group which will be described later.

The content of the constitutional unit represented by (a) (also described as the amount of ethylene groups in the main chain contained in the constitutional unit represented by (a), which is also called degree of acetalization) with respect to the total content of constitutional units of the polyvinyl acetal (total amount of ethylene groups in the main chain) is preferably 50 mol % to 90 mol %, more preferably 55 mol % to 85 mol %, and even more preferably 55 mol % to 80 mol %.

The degree of acetalization is a value obtained by dividing the amount of ethylene groups to which acetal groups are bonded (amount of ethylene groups in the main chain contained in the constitutional unit represented by (a)) by the total amount of ethylene groups in the main chain and expressing the thus obtained molar fraction as a percentage.

The same shall be applied to the content of each constitutional unit of polyvinyl acetal which will be described later.

From the viewpoint of improving printing durability, the polyvinyl acetal preferably has an ethylenically unsaturated group.

The ethylenically unsaturated group that the polyvinyl acetal has is not particularly limited. From the viewpoint of reactivity, on-press developability, and printing durability, the ethylenically unsaturated group is more preferably at least one kind of group selected from the group consisting of a vinyl phenyl group (styryl group), a vinyl ester group, a vinyl ether group, an allyl group, a (meth)acryloxy group, and a (meth)acrylamide group. Among these, a vinyl group, an allyl group, a (meth)acryloxy group, and the like are preferable.

From the viewpoint of improving printing durability, the polyvinyl acetal preferably has an ethylenically unsaturated group-containing constitutional unit.

The ethylenically unsaturated group-containing constitutional unit may be the aforementioned constitutional unit having an acetal ring or a constitutional unit other than the constitutional unit having an acetal ring.

Particularly, from the viewpoint of increasing crosslink density during exposure, the polyvinyl acetal is preferably a compound in which an ethylenically unsaturated group is introduced into an acetal ring. That is, it is preferable that the constitutional unit represented by (a) have an ethylenically unsaturated group as R.

In a case where the ethylenically unsaturated group-containing constitutional unit is a constitutional unit other than the constitutional unit having an acetal ring, for example, the ethylenically unsaturated group-containing constitutional unit may be an acrylate group-containing constitutional unit, specifically, a constitutional unit represented by (*d*).

(d)

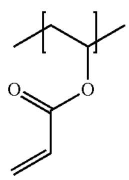

In a case where the ethylenically unsaturated group-containing constitutional unit is a constitutional unit other than the constitutional unit having an acetal ring, the content of the ethylenically unsaturated group-containing constitutional unit (also called amount of acrylate groups) with respect to the total content of constitutional units of the polyvinyl acetal is preferably 1 mol % to 15 mol %, and more preferably 1 mol % to 10 mol %.

From the viewpoint of on-press developability, the polyvinyl acetal preferably further has a hydroxy group-containing constitutional unit. That is, the polyvinyl acetal preferably contains a constitutional unit derived from vinyl alcohol.

Examples of the hydroxy group-containing constitutional unit include a constitutional unit represented by (b).

(b)

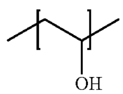

From the viewpoint of on-press developability, the content of the constitutional unit represented by (b) (also called amount of hydroxyl groups) with respect to the total content of constitutional units of the polyvinyl acetal is preferably 5 mol % to 50 mol %, more preferably 10 mol % to 40 mol %, and even more preferably 20 mol % to 40 mol %.

The polyvinyl acetal may further have other constitutional units.

Examples of those other constitutional units include an acetyl group-containing constitutional unit, specifically, a constitutional unit represented by (c).

(c)

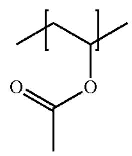

The content of the constitutional unit represented by (c) (also called amount of acetyl groups) with respect to the total content of constitutional units of the polyvinyl acetal is preferably 0.5 mol % to 10 mol %, more preferably 0.5 mol % to 8 mol %, and even more preferably 1 mol % to 3 mol %.

The degree of acetalization, the amount of acrylate groups, the amount of hydroxyl groups, and the amount of acetyl groups can be determined as follows.

That is, by $^1$H NMR spectroscopy, the content expressed as mol % is calculated from the ratio of peak surface area of protons of a methyl or methylene moiety of acetal, a methyl moiety of an acrylate group, and a methyl moiety of a hydroxyl group and an acetyl group.

The weight-average molecular weight of the polyvinyl acetal is preferably 18,000 to 150,000.

The solubility parameter (also called SP value) of the polyvinyl acetal is preferably 17.5 $MPa^{1/2}$ to 20.0 $MPa^{1/2}$, and more preferably 18.0 $MPa^{1/2}$ to 19.5 $MPa^{1/2}$.

In the present disclosure, as "solubility parameter (unit: $(MPa)^{1/2}$)", the Hansen solubility parameters are used.

The Hansen solubility parameters are obtained by dividing the solubility parameters introduced by Hildebrand into three components, a dispersion element δd, a polarity element δp, and a hydrogen bond element δh, and expressing the parameters in a three-dimensional space. In the present disclosure, the solubility parameters (hereinafter, also called SP value) are expressed as δ (unit: $(MPa)^{1/2}$), and a value calculated by the following equation is used.

$$\delta(MPa)^{1/2}=(\delta d^2+\delta p^2+\delta h^2)^{1/2}$$

The dispersion element δd, the polarity element δp, and the hydrogen bond element δh of various substances have been found by Hansen and his successors, and are described in detail in the Polymer Handbook (fourth edition), VII-698 to 711. The values of Hansen solubility parameters are also specifically described in the document "Hansen Solubility Parameters; A Users Handbook (CRC Press, 2007)" written by Charles M. Hansen.

In the present disclosure, as the Hansen solubility parameters in a partial structure of a compound, it is also possible to use the values estimated from the chemical structure by using the computer software "Hansen Solubility Parameters in Practice (HSPiP ver. 4.1.07)".

Furthermore, in the present disclosure, in a case where a compound is an addition polymerization-type polymer, a polycondensation-type polymer, or the like, the SP value of the compound is expressed as the total SP value obtained by multiplying the SP values of monomer units by molar fractions. Furthermore, in a case where a compound is a low-molecular-weight compound having no monomer unit, the SP value is expressed as the total SP value of the compound.

In the present disclosure, the SP value of a polymer may be calculated from the molecular structure of the polymer by the Hoy method described in Polymer Handbook (fourth edition).

Specific examples of the aforementioned polyvinyl acetal are shown in [P-1 to P-3]. However, the polyvinyl acetal used in the present disclosure is not limited thereto.

In the following structures, "l" is 50 mol % to 90 mol %, "m" is 0.5 mol % to 10 mol %, "n" is 5 mol % to 50 mol %, and "o" is 1 mol % to 15 mol %.

P-1

P-2

P-3

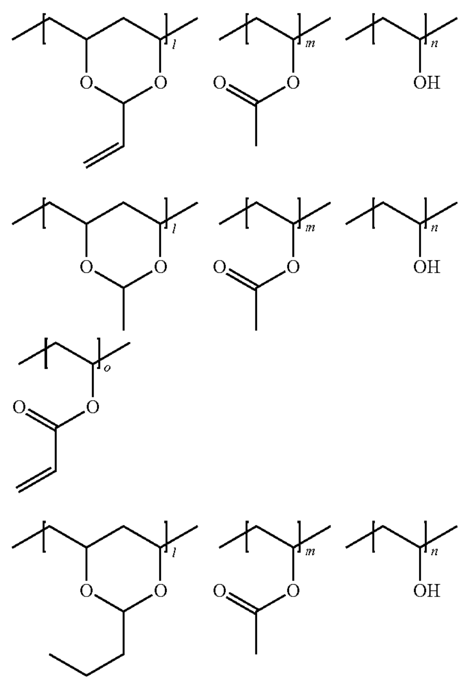

As the aforementioned polyvinyl acetal, commercially available products can be used.

Examples of the commercially available products of the polyvinyl acetal include an S-LEC series manufactured by SEKISUI CHEMICAL CO., LTD. (specifically, S-LEC BX-L, BX-1, BX-5, BL-7Z, BM-1, BM-5, BH-6, BH-3, and the like).

In the image-recording layer used in the present disclosure, one kind of binder polymer may be used alone, or two or more kinds of binder polymers may be used in combination.

The content of the binder polymer to be incorporated into the image-recording layer can be randomly set. The content of the binder polymer with respect to the total mass of the image-recording layer is preferably 1% by mass to 90% by mass, and more preferably 5% by mass to 80% by mass.

In a case where the image-recording layer of the present disclosure contains other binder polymers, the content of those other binder polymers with respect to the total mass of the aforementioned thermoplastic resin particles and those other binder polymers is preferably more than 0% by mass and 99% by mass or less, more preferably 20% by mass to 95% by mass, and even more preferably 40% by mass to 90% by mass.

[Color Developing Agent]

The image-recording layer preferably contains a color developing agent, and more preferably contains an acid color developing agent.

"Color developing agent" used in the present disclosure means a compound that develops or removes color by a stimulus such as light or acid and thus changes the color of the image-recording layer. Furthermore, "acid color developing agent" means a compound that develops or removes color by being heated in a state of accepting an electron accepting compound (for example, a proton of an acid or the like) and thus changes the color of the image-recording layer. The acid color developing agent is particularly preferably a colorless compound which has a partial skeleton such as lactone, lactam, sultone, spiropyran, an ester, or an amide and allows such a partial skeleton to rapidly open the ring or to be cleaved when coming into contact with an electron accepting compound.

Examples of such an acid color developing agent include phthalides such as 3,3-bis(4-dimethylaminophenyl)-6-dimethylaminophthalide (called "crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl) phthalide, 3-(4-dimethylaminophenyl)-3-(2-methylindole-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-6-dimethylaminophthalide, 3,3-bis(2-phenylindol-3-yl)-6-dimethylaminophthalide, 3-(4-dimethylaminophenyl)-3-(1-methylpyrrol-3-yl)-6-dimethylaminophthalide, 3,3-bis[1,1-bis(4-dimethylaminophenyl)ethylen-2-yl]-4,5,6,7-tetrachlorophthalide, 3,3-bis[1,1-bis(4-pyrrolidinophenyl)ethylen-2-yl]-4,5,6,7-tetrabromophthalide, 3,3-bis[1-(4-dimethylaminophenyl)-1-(4-methoxyphenyl)ethylen-2-yl]-4,5,6,7-tetrachlorophthalide, 3,3-bis[1-(4-pyrrolidinophenyl)-1-(4-methoxyphenyl)ethylen-2-yl]-4,5,6,7-tetrachlorophthalide, 3-[1,1-di(1-ethyl-2-methylindol-3-yl)ethylen-2-yl]-3-(4-diethylaminophenyl)phthalide, 3-[1,1-di(1-ethyl-2-methylindol-3-yl)ethylen-2-yl]-3-(4-N-ethyl-N-phenylaminophenyl)phthalide, 3-(2-ethoxy-4-diethylaminophenyl)-3-(1-n-octyl-2-methylindol-3-yl) phthalide, 3,3-bis(1-n-octyl-2-methylindol-3-yl)phthalide, and 3-(2-methyl-4-diethylaminophenyl)-3-(1-n-octyl-2-methylindol-3-yl)phthalide, 4,4-bis-dimethylaminobenzhydrinbenzyl ether, N-halophenyl-leucoauramine, N-2,4,5-trichlorophenylleucoauramine, rhodamine-B-anilinolactam, rhodamine-(4-nitroanilino)lactam, rhodamine-B-(4-chloroanilino)lactam, 3,7-bis(diethylamino)-10-benzoylphenoxazine, benzoyl leucomethylene blue, 4-nitrobenzoyl methylene blue, fluorans such as 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino) fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluoran, 3-di-n-butylamino-7-(2'-fluorophenylamino)fluoran, 3-di-n-butylamino-7-(2'-chlorophenylamino)fluoran, 3-N-isopentyl-N-ethylamino-7-(2'-chlorophenylamino)fluoran, 3-N-n-hexyl-N-ethylamino-7-(2'-chlorophenylamino) fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-piperidino-6-methyl-7-anilinofluoran, 3-morpholino-6- methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methylamino-6-methyl-7-anilinofluoran, 3-N-n-propyl-N-methylamino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-methylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-methylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-methylamino-6-methyl-7-anilinofluoran, 3-N-(3'-ethoxypropyl)-N-ethylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-ethyl-7-anilinofluoran, 3-diethylamino-6-methyl-7-(3'-methylphenylamino)fluoran, 3-diethylamino-6-methyl-7-(2',6'-dimethylphenylamino)fluoran, 3-di-n-butylamino-6-methyl-7-(2',6'-dimethylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl]propane, 3-[4'-(4-phenylaminophenyl)aminophenyl]amino-6-methyl-7-chlorofluoran, and 3-[4'-(dimethylaminophenyl)]amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-diethylaminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-diethylaminophenyl)-3-(1-ethyl-2-phenylindol-3-yl)-4 or 7-azaphthalide, 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide, 2'-anilino-6'-(N-ethyl-N-isopentyl)amino-3'-methylspiro[isobenzofuran-1(3H),9'-(9H)xanthen-3-one, 2'-anilino-6'-(N-ethyl-N-(4-methylphenyl))amino-3'-methylspiro[isobenzofuran-1(3H),9'-(9H)xanthen]-3-one, 3'-N,N-dibenzylamino-6'-N,N-diethylaminospiro[isobenzofuran-1(3H),9'-(9H)xanthen]-3-one, 2'-(N-methyl-N-phenyl)amino-6'-(N-ethyl-N-(4-methylphenyl))aminospiro[isobenzofuran-1(3H),9'-(9H)xanthen]-3-one, and the like.

Particularly, from the viewpoint of color developability, the color developing agent used in the present disclosure is preferably at least one kind of compound selected from the group consisting of a spiropyran compound, a spirooxazine compound, a spirolactone compound, and a spirolactam compound.

From the viewpoint of visibility, the hue of the colorant after color development is preferably green, blue, or black.

From the viewpoint of color developability and visibility of exposed portions, the acid color developing agent is preferably a leuco colorant.

The aforementioned leuco colorant is not particularly limited as long as it has a leuco structure. The leuco colorant preferably has a spiro structure, and more preferably has a spirolactone ring structure.

From the viewpoint of color developability and visibility of exposed portions, the leuco colorant is preferably a leuco colorant having a phthalide structure or a fluoran structure.

Furthermore, from the viewpoint of color developability and visibility of exposed portions, the leuco colorant having a phthalide structure or a fluoran structure is preferably a compound represented by any of Formula (Le-1) to Formula (Le-3), and more preferably a compound represented by Formula (Le-2).

(Le-1)

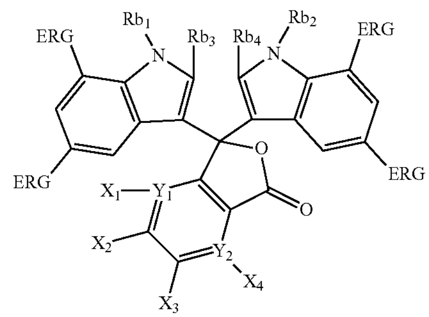

(Le-2)

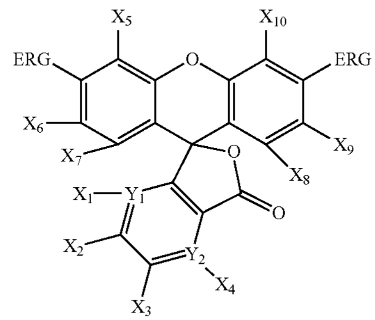

-continued (Le-3)

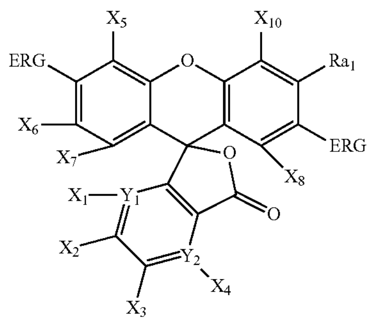

In Formula (Le-1) to Formula (Le-3), ERG each independently represent an electron-donating group, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent a hydrogen atom, an alkyl group, an aryl group, or a heteroaryl group.

From the viewpoint of color developability and visibility of exposed portions, the electron-donating group represented by ERG in Formula (Le-1) to Formula (Le-3) is preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, an aryloxy group, a heteroaryloxy group, or an alkyl group, more preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, or an aryloxy group, even more preferably a monoalkyl monoarylamino group, a diarylamino group, a diheteroarylamino group, or a monoaryl monoheteroarylamino group, and particularly preferably a monoalkyl monoarylamino group.

From the viewpoint of color developability and visibility of exposed portions, the electron-donating group represented by ERG is preferably a disubstituted amino group having an aryl group that has a substituent at at least one ortho position or a heteroaryl group that has a substituent at at least one ortho position, more preferably a disubstituted amino group having a substituent at at least one ortho position and a phenyl group having an electron-donating group at a para position, even more preferably an amino group having a substituent at at least one ortho position and a phenyl group having an electron-donating group at a para position and an aryl group or a heteroaryl group, and particularly preferably an amino group having a substituent at at least one ortho position, a phenyl group having an electron-donating group at a para position, and an aryl group having an electron-donating group or a heteroaryl group having an electron-donating group.

In the present disclosure, in a case where a bonding position of an aryl group or a heteroaryl group with other structures is defined as 1-position, the ortho position in the aryl group or heteroaryl group other than a phenyl group is called a bonding position (for example, 2-position or the like) adjacent to the 1-position.

From the viewpoint of color developability and visibility of exposed portions, the electron-donating group that the aforementioned aryl group or heteroaryl group has is preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, an aryloxy group, a heteroaryloxy group, or an alkyl group, more preferably an alkoxy group, an aryloxy group, a heteroaryloxy group, or an alkyl group, and particularly preferably an alkoxy group.

From the viewpoint of color developability and visibility of exposed portions, $X_1$ to $X_4$ in Formula (Le-1) to Formula (Le-3) preferably each independently represent a hydrogen atom or a chlorine atom, and more preferably each independently represent a hydrogen atom.

From the viewpoint of color developability and visibility of exposed portions, $X_5$ to $X_{10}$ in Formula (Le-2) or Formula (Le-3) preferably each independently represent a hydrogen atom, a halogen atom, an alkyl group, an aryl group, an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, a hydroxy group, an alkoxy group, an aryloxy group, a heteroaryloxy group, an acyl group, an alkoxycarbonyl group, an aryloxycarbonyl group, a heteroaryloxycarbonyl group, or a cyano group, more preferably each independently represent a hydrogen atom, a halogen atom, an alkyl group, an aryl group, an alkoxy group, or an aryloxy group, even more preferably each independently represent a hydrogen atom, a halogen atom, an alkyl group, or an aryl group, and particularly preferably each independently represent a hydrogen atom.

From the viewpoint of color developability and visibility of exposed portions, it is preferable that at least one of $Y_1$ or $Y_2$ in Formula (Le-1) to Formula (Le-3) be C, and it is more preferable that both of $Y_1$ and $Y_2$ be C.

From the viewpoint of color developability and visibility of exposed portions, $Ra_1$ in Formula (Le-1) to Formula (Le-3) is preferably an alkyl group or an alkoxy group, more preferably an alkoxy group, and particularly preferably a methoxy group.

From the viewpoint of color developability and visibility of exposed portions, $Rb_1$ to $Rb_4$ in Formula (Le-1) to Formula (Le-3) preferably each independently represent a hydrogen atom or an alkyl group, more preferably each independently represent an alkyl group, and particularly preferably each independently represent a methyl group.

Furthermore, from the viewpoint of color developability and visibility of exposed portions, the leuco colorant having a phthalide structure or a fluoran structure is more preferably a compound represented by any of Formula (Le-4) to Formula (Le-6), and even more preferably a compound represented by Formula (Le-5).

(Le-4)

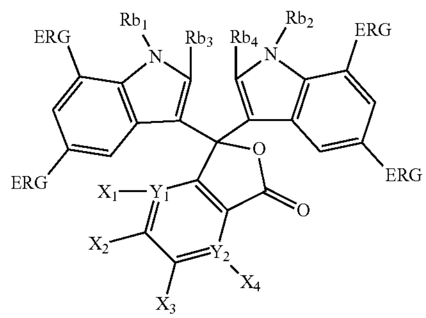

(Le-5)

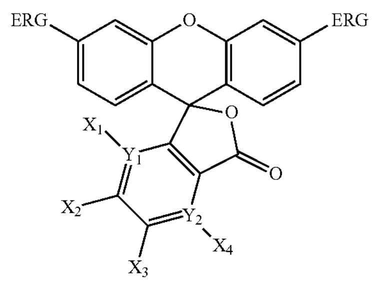

(Le-6)

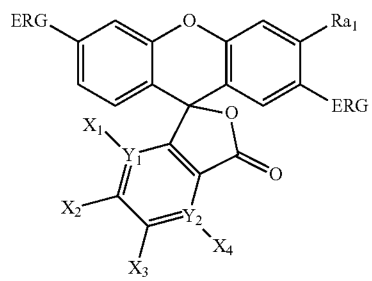

In Formula (Le-4) to Formula (Le-6), ERG each independently represent an electron-donating group, $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent a hydrogen atom, an alkyl group, an aryl group, or a heteroaryl group.

ERG, $X_1$ to $X_4$, $Y_1$, $Y_2$, $Ra_1$, and $Rb_1$ to $Rb_4$ in Formula (Le-4) to Formula (Le-6) have the same definitions as ERG, $X_1$ to $X_4$, $Y_1$, $Y_2$, $Ra_1$, and $Rb_1$ to $Rb_4$ in Formula (Le-1) to Formula (Le-3) respectively, and preferred aspects thereof are also the same.

Furthermore, from the viewpoint of color developability and visibility of exposed portions, the leuco colorant having a phthalide structure or a fluoran structure is more preferably a compound represented by any of Formula (Le-7) to Formula (Le-9), and particularly preferably a compound represented by Formula (Le-8).

(Le-7)

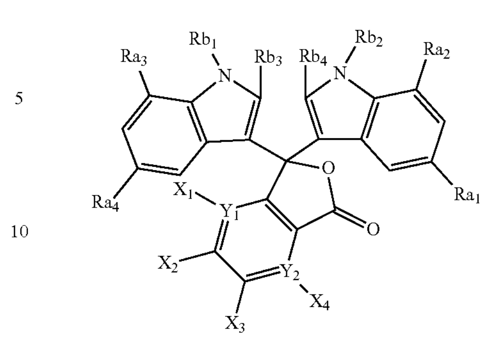

(Le-8)

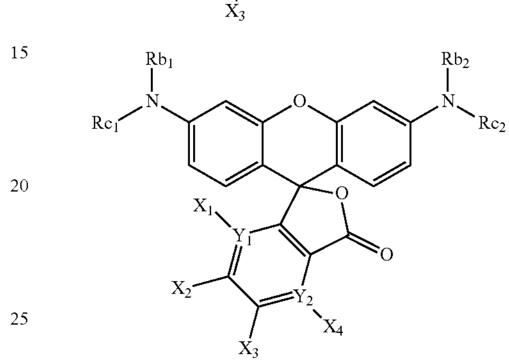

(Le-9)

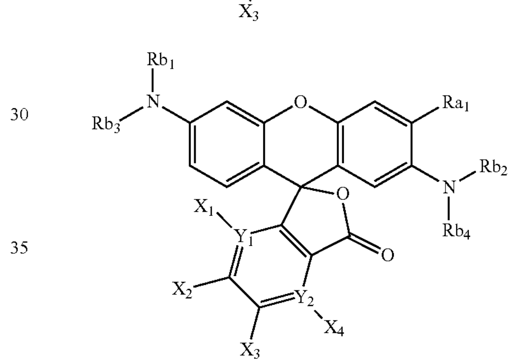

In Formula (Le-7) to Formula (Le-9), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ to $Ra_4$ each independently represent a hydrogen atom, an alkyl group, or an alkoxy group, $Rb_1$ to $Rb_4$ each independently represent a hydrogen atom, an alkyl group, an aryl group, or a heteroaryl group, and $Rc_1$ and $Rc_2$ each independently represent an aryl group or a heteroaryl group.

$X_1$ to $X_4$, $Y_1$, and $Y_2$ in Formula (Le-7) to Formula (Le-9) have the same definition as $X_1$ to $X_4$, $Y_1$, and $Y_2$ in Formula (Le-1) to Formula (Le-3) respectively, and preferred aspects thereof are also the same.

From the viewpoint of color developability and visibility of exposed portions, $Ra_1$ to $Ra_4$ in Formula (Le-7) or Formula (Le-9) preferably each independently represent an alkyl group or an alkoxy group, more preferably each independently represent an alkoxy group, and particularly preferably each independently represent a methoxy group.

From the viewpoint of color developability and visibility of exposed portions, $Rb_1$ to $Rb_4$ in Formula (Le-7) to Formula (Le-9) preferably each independently represent a hydrogen atom, an alkyl group, or an aryl group substituted with an alkoxy group, more preferably each independently represent an alkyl group, and particularly preferably each independently represent a methyl group.

From the viewpoint of color developability and visibility of exposed portions, $Rc_1$ and $Rc_2$ in Formula (Le-8) preferably each independently represent a phenyl group or an alkylphenyl group, and more preferably each independently represent a phenyl group.

From the viewpoint of color developability and visibility of exposed portions, $Rc_1$ and $Rc_2$ in Formula (Le-8) preferably each independently represent an aryl group having a substituent at at least one ortho position or a heteroaryl group having a substituent at at least one ortho position, more preferably each independently represent an aryl group having a substituent at at least one ortho position, even more preferably each independently represent a phenyl group having a substituent at at least one ortho position, and particularly preferably each independently represent a phenyl group having a substituent at at least one ortho position and having an electron-donating group at the para position. Examples of the substituent in $Rc_1$ and $Rc_2$ include substituents that will be described later.

In Formula (Le-8), from the viewpoint of color developability and visibility of exposed portions, $X_1$ to $X_4$ preferably each represent a hydrogen atom, and $Y_1$ and $Y_2$ preferably each represent C.

Furthermore, from the viewpoint of color developability and visibility of exposed portions, in Formula (Le-8), $Rb_1$ and $Rb_2$ preferably each independently represent an alkyl group or an aryl group substituted with an alkoxy group.

From the viewpoint of color developability and visibility of exposed portions, $Rb_1$ and $Rb_2$ in Formula (Le-8) preferably each independently represent an aryl group or a heteroaryl group, more preferably each independently represent an aryl group, even more preferably each independently represent an aryl group having an electron-donating group, and particularly preferably each independently represent a phenyl group having an electron-donating group at the para position.

From the viewpoint of color developability and visibility of exposed portions, the electron-donating group in $Rb_1$, $Rb_2$, $Rc_1$, and $Rc_2$ is preferably an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, an alkoxy group, an aryloxy group, a heteroaryloxy group, or an alkyl group, more preferably an alkoxy group, an aryloxy group, a heteroaryloxy group, or an alkyl group, and particularly preferably an alkoxy group.

From the viewpoint of color developability and visibility of exposed portions, the acid color developing agent preferably includes a compound represented by Formula (Le-10).

(Le-10)

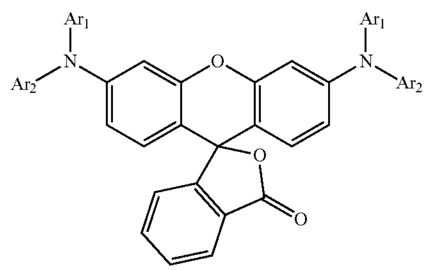

In Formula (Le-10), $Ar_1$ each independently represent an aryl group or a heteroaryl group, and $Ar_2$ each independently represent an aryl group having a substituent at at least one ortho position or a heteroaryl group having a substituent at at least one ortho position.

$Ar_1$ in Formula (Le-10) has the same definition as $Rb_1$ and $Rb_2$ in Formula (Le-7) to Formula (Le-9), and preferred aspects thereof are also the same.

$Ar_2$ in Formula (Le-10) has the same definition as $Rc_1$ and $Rc_2$ in Formula (Le-7) to Formula (Le-9), and preferred aspects thereof are also the same.

From the viewpoint of color developability and visibility of exposed portions, the acid color developing agent preferably includes a compound represented by Formula (Le-11).

(Le-11)

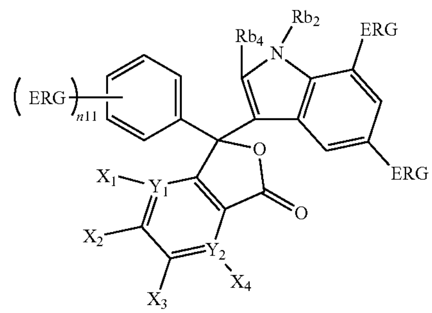

In Formula (Le-11), ERG each independently represent an electron-donating group, n11 represents an integer of 1 to 5, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_2$ and $Rb_4$ each independently represent a hydrogen atom, an alkyl group, an aryl group, or a heteroaryl group.

ERG, $X_1$ to $X_4$, $Y_1$, $Y_2$, $Ra_1$, $Rb_2$, and $Rb_4$ in Formula (Le-11) have the same definitions as ERG, $X_1$ to $X_4$, $Y_1$, $Y_2$, $Ra_1$, $Rb_2$, and $Rb_4$ in Formula (Le-1) to Formula (Le-3) respectively, and preferred aspects thereof are also the same.

n 11 in Formula (Le-11) is preferably an integer of 1 to 3, and more preferably 1 or 2.

The alkyl group in Formula (Le-1) to Formula (Le-9) or Formula (Le-11) may be linear or branched or may have a ring structure.

The number of carbon atoms in the alkyl group in Formula (Le-1) to Formula (Le-9) or Formula (Le-11) is preferably 1 to 20, more preferably 1 to 8, even more preferably 1 to 4, and particularly preferably 1 or 2.

The number of carbon atoms in the aryl group in Formula (Le-1) to Formula (Le-11) is preferably 6 to 20, more preferably 6 to 10, and particularly preferably 6 to 8.

Specific examples of the aryl group in Formula (Le-1) to Formula (Le-11) include a phenyl group, a naphthyl group, an anthracenyl group, a phenanthrenyl group, and the like which may have a substituent.

Specific examples of the heteroaryl group in Formula (Le-1) to Formula (Le-11) include a furyl group, a pyridyl group, a pyrimidyl group, a pyrazoyl group, a thiophenyl group, and the like which may have a substituent.

Each of the groups in Formula (Le-1) to Formula (Le-11), such as a monovalent organic group, an alkyl group, an aryl group, a heteroaryl group, a dialkylanilino group, an alkylamino group, and an alkoxy group, may have a substituent. Examples of the substituent include an alkyl group, an aryl group, a heteroaryl group, a halogen atom, an amino group, an alkylamino group, an arylamino group, a heteroarylamino group, a dialkylamino group, a monoalkyl monoarylamino group, a monoalkyl monoheteroarylamino group, a diarylamino group, a diheteroarylamino group, a monoaryl monoheteroarylamino group, a hydroxy group, an alkoxy group, an aryloxy group, a heteroaryloxy group, an acyl group, an alkoxycarbonyl group, an aryloxycarbonyl group, a heteroaryloxycarbonyl group, a cyano group, and the like. These substituents may be further substituted with these substituents.

Examples of the leuco colorant having the phthalide structure or the fluoran structure that are suitably used include the following compounds. Me represents a methyl group.

S-1

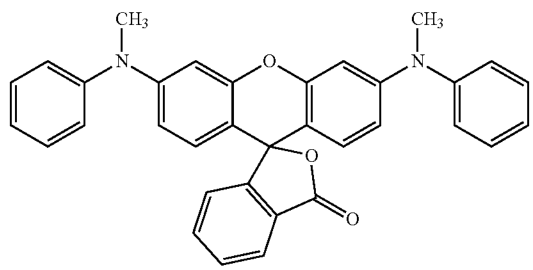

S-2

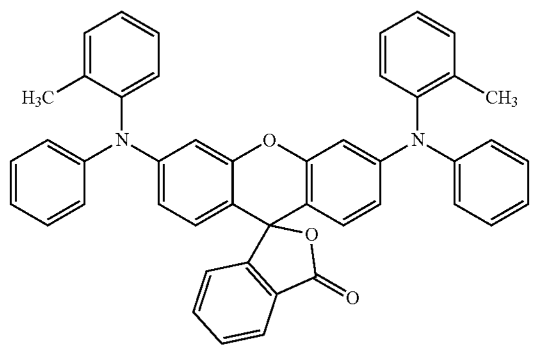

S-3

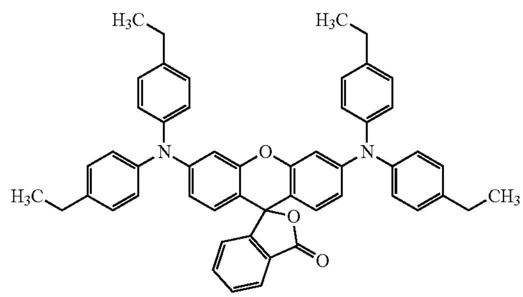

-continued

S-4

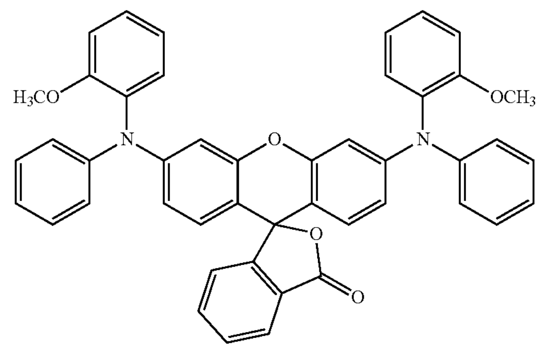

S-5

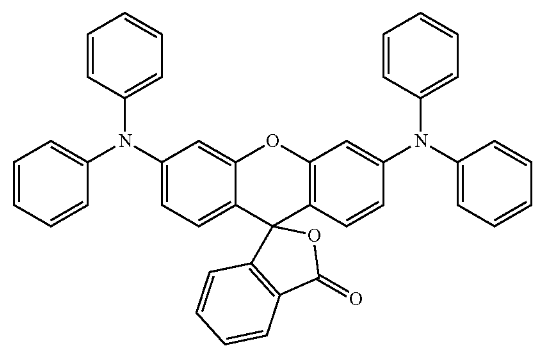

S-6

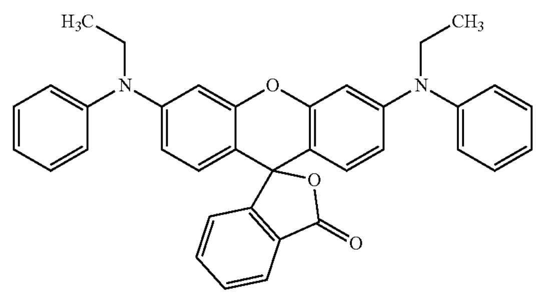

S-7

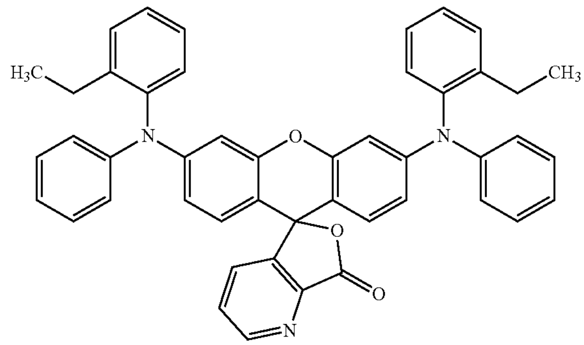

-continued
S-8
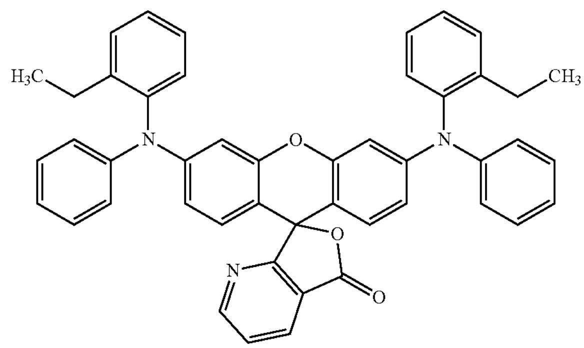
S-9
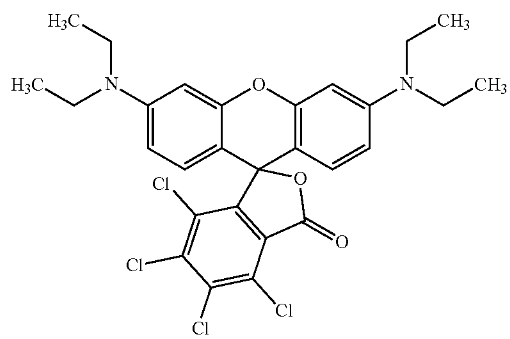
S-10
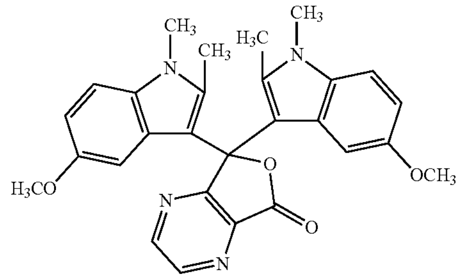
S-11
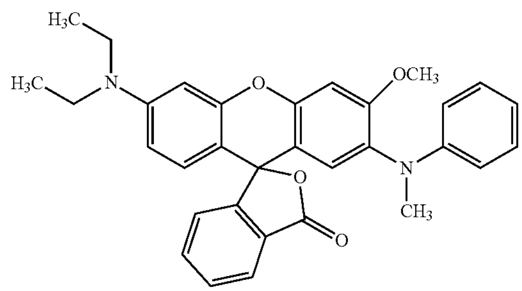
S-12
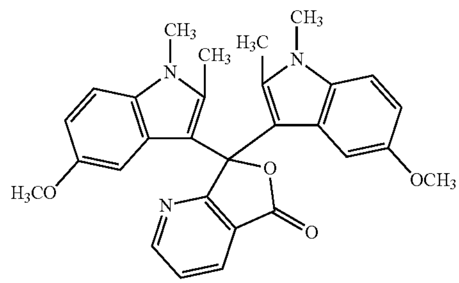
-continued
S-13
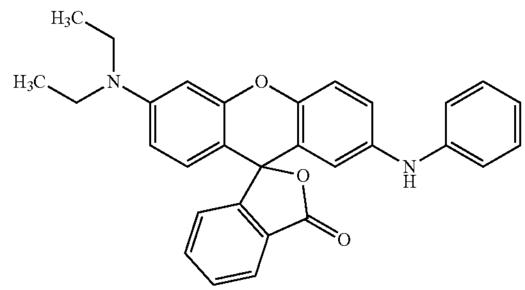
S-14
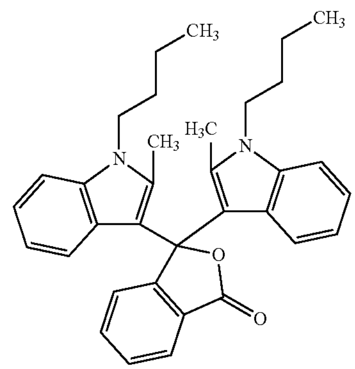
S-15
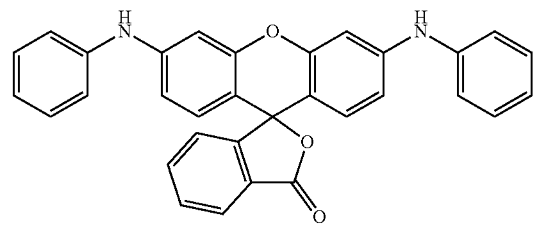
S-16
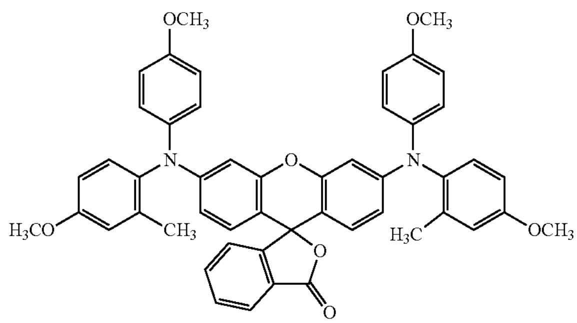
S-17
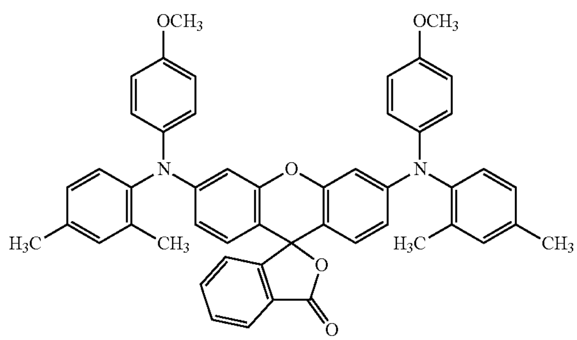

-continued

S-18

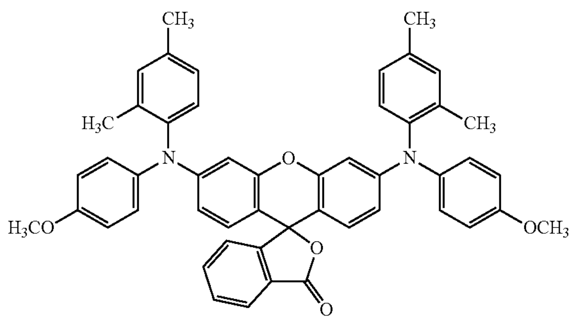

S-19

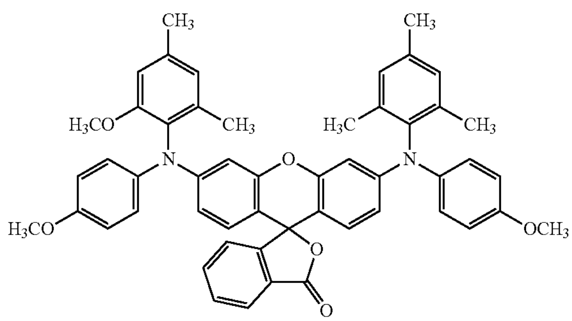

S-20

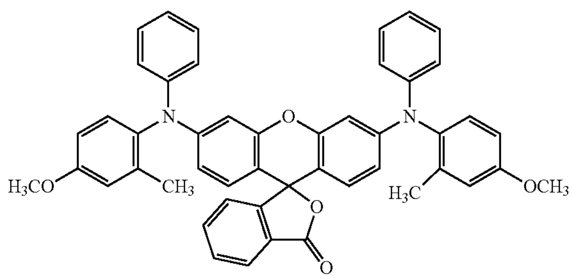

S-21

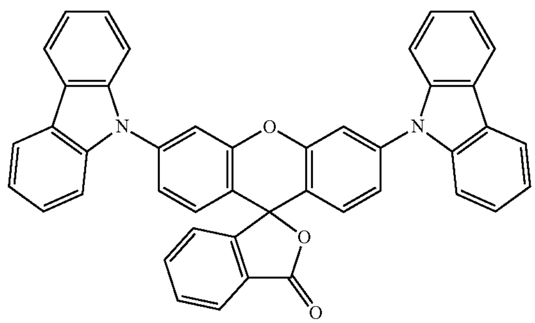

S-22

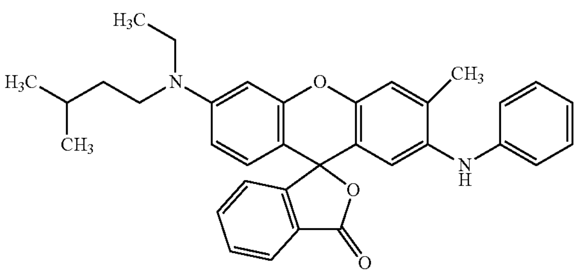

-continued

S-23

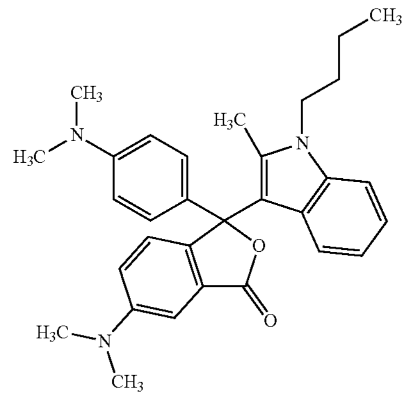

As the color developing agent, commercially available products can be used. Examples thereof include ETAC, RED500, RED520, CVL, S-205, BLACK305, BLACK400, BLACK100, BLACK500, H-7001, GREEN300, NIR-BLACK78, BLUE220, H-3035, BLUE203, ATP, H-1046, and H-2114 (all manufactured by Fukui Yamada Chemical Co., Ltd.), ORANGE-DCF, Vermilion-DCF, PINK-DCF, RED-DCF, BLMB, CVL, GREEN-DCF, and TH-107 (all manufactured by Hodogaya Chemical Co., Ltd.), ODB, ODB-2, ODB-4, ODB-250, ODB-BlackXV, Blue-63, Blue-502, GN-169, GN-2, Green-118, Red-40, and Red-8 (all manufactured by Yamamoto Chemicals, Inc.), crystal violet lactone (manufactured by Tokyo Chemical Industry Co., Ltd.), and the like. Among these commercially available products, ETAC, S-205, BLACK305, BLACK400, BLACK100, BLACK500, H-7001, GREEN300, NIR-BLACK78, H-3035, ATP, H-1046, H-2114, GREEN-DCF, Blue-63, GN-169, and crystal violet lactone are preferable because these form a film having excellent visible light absorbance.

One kind of each of these color developing agents may be used alone. Alternatively, two or more kinds of components can be used in combination. In addition, in order to improve storage stability and safelight properties, it is preferable to use a color developing agent having a polymerization inhibition ability. The polymerization prohibition ability means that any of the hydrogen atoms present in a molecule of the color developing agent has a hydrogen abstraction enthalpy less than −6.5 kcal/mol.

The content of the color developing agent with respect to the total mass of the image-recording layer is preferably 0.5% by mass to 10% by mass, and more preferably 1% by mass to 5% by mass.

In the present disclosure, the hydrogen abstraction enthalpy of all hydrogen atoms present in a molecule of the color developing agent is calculated by the following method.

Regarding a reaction with propagating radicals caused by hydrogen abstraction, the enthalpy of each of the reactant and product is calculated using Gaussian16 as a calculation program at a level of density functional theory (B3LYP/6-31+G**). The solvent effect (solvent: methanol) is examined by the SCRF method. By finding the difference in the enthalpy between the reactant and the product, a reaction enthalpy is calculated.

More specifically, the hydrogen abstraction enthalpy is calculated as follows. In the following chemical reaction formula, for each of the propagating radical, LeucoDye-H, hydrogenated propagating radical, and LeucoDye-radical, modeling is carried out using Gaussian pre/post software GaussView6. #p opt b3lyp/6-31+g (d, p) scrf=(solvent=methanol) is specified as a calculation condition, charge 0 multiplicity 2 is set for the radical, and charge 0 multiplicity 1 is set for substances other than the radical. #p is specified for detailed logging output, and may not be specified.

From the energy (unit: hartree) of the structure optimized by performing calculation, the enthalpy of formation of the reactant (sum of the energy of the propagating radical and LeucoDye-H) and the enthalpy of formation of the product (sum of the energy of the hydrogenated propagating radical and LeucoDye-radical) are calculated. The enthalpy of formation of the reactant is subtracted from the enthalpy of formation of the product, and the result is adopted as the hydrogen abstraction enthalpy. The unit is converted as 1 hartree=627.51 kcal/mol.

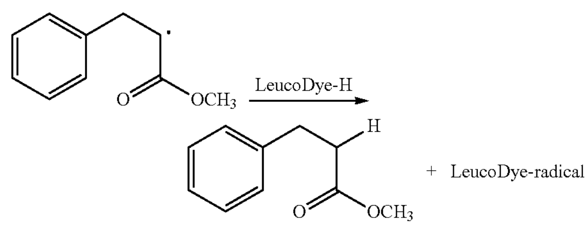

For example, the hydrogen abstraction enthalpy for each hydrogen atom of the following compound is as follows.

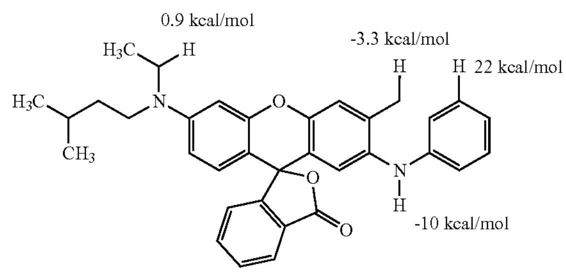 [SMILES: CCN(CCC(C)C)c1ccc2c(c1)Oc1cc(C)c(Nc3ccccc3)cc1C21OC(=O)c2ccccc21]

Hereinafter, an example of the synthesis method of the aforementioned leuco colorant will be described.

A desired colorant compound can be obtained through a plurality of synthetic routes.

Other leuco colorants can also be synthesized in the same manner.

By appropriately selecting palladium (Pd) catalysts and ligands thereof from commercially available catalysts and ligands, it is possible to obtain the target substance with excellent reactivity and yield.

Synthesis Example 1

Synthesis of Diarylamine DAA1

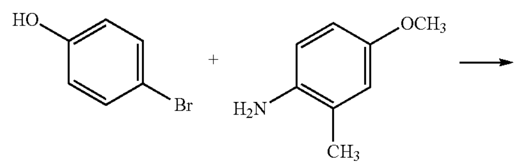

-continued

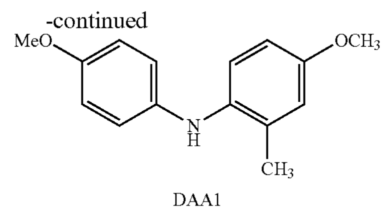

DAA1

4-Bromoanisole (5.0 g, 26.7 mmol), 4.14 g of 4-methoxy-2-methylaniline (30.2 mmol; 1.13 eq.), and 5.14 g of sodium t-butoxide (53.5 mmol; 2.0 eq.) were added to 100 mL of toluene and subjected to degassing under reduced pressure and nitrogen purge that were repeated 3 times, and 0.587 g of $PdCl_2$ (dppf) (0.802 mmol; 0.03 eq.) was added thereto, followed by stirring in an oil bath at 120° C. for 4.5 hours under a nitrogen flow. The reaction solution was purified by silica gel column chromatography (hexane-ethyl acetate), thereby obtaining 5.87 g of diallylamine DAA1 as a light brown oil. The yield was 90%.

Note that dppf represents 1,1'-bis(diphenylphosphino)ferrocene.

$^1H$ NMR ($CDCl_3$) δ=2.22 (s, 3H), 3.77 (s, 3H), 3.78 (s, 3H), 5.00 (br, 1H), 6.69 (dd, J=3.2 and 8.8 Hz, 1H), 6.76-6.82 (m, 5H), 7.02 (d, J=8.8 Hz, 1H).

Synthesis of S-16

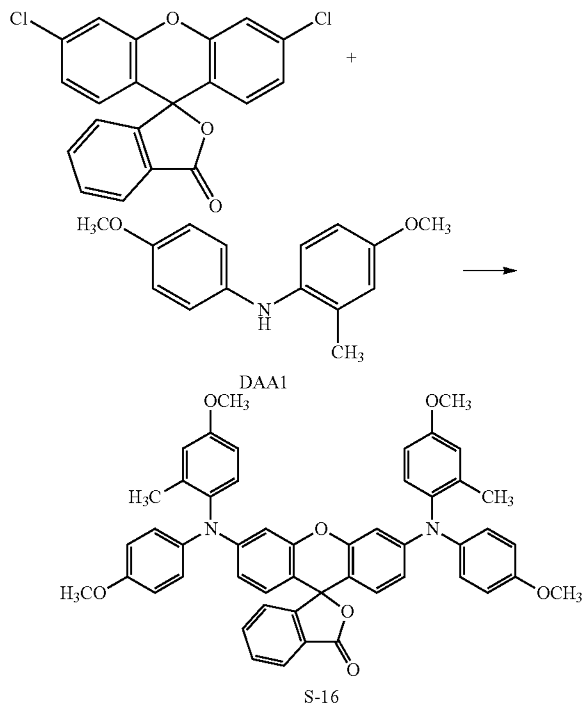

DAA1

S-16

Fluorescein chloride (1.00 g, 2.71 mmol), 1.58 g (6.50 mmol; 2.4 eq.) of diarylamine DAA1, and 1.04 g (10.8 mmol; 4.0 eq.) of sodium t-butoxide were added to 10 mL of toluene and subjected to degassing under reduced pressure and nitrogen purge that were repeated 3 times, and 21 mg (0.027 mmol; 0.01 eq.) of RuPhos Pd G2 (manufactured by Sigma-Aldrich) was added thereto, followed by stirring in an oil bath at 120° C. for 2 hours under a nitrogen flow.

The temperature was lowered to 80° C., and 50 mL of distilled water was added thereto, followed by extraction using 80 mL of ethyl acetate. The organic layer was washed with saturated saline, the solvent was distilled off from the obtained oil layer under reduced pressure by using an evaporator, followed by purification by column chromatography (hexane-ethyl acetate), thereby obtaining 1.92 g of S-16 as white powder. The yield was 90.5%.

$^{1}$H NMR (DMSO, 400 MHz): δ=7.95 (d, J=7.4 Hz, 1H), 7.77 (td, J=7.5, 1.0 Hz, 1H), 7.68 (td, J=7.5, 1.0 Hz, 1H), 7.30 (d, J=7.5 Hz, 1H), 7.08 (m, 6H), 6.89 (m, 6H), 6.82 (dd, J=8.8, 2.9 Hz, 2H), 6.47 (d, J=8.9 Hz, 2H), 6.32 (dd, J=8.8, 2.6 Hz, 2H), 6.21 (d, J=2.4 Hz, 2H), 3.75 (s, 6H), 3.72 (s, 6H), 2.04 (s, 6H), ESI (posi): calcd for $C_{50}H_{42}N_2O_7$ [M+H]+ 783.3, found, 783, Tm: 240° C.

Synthesis Example 2

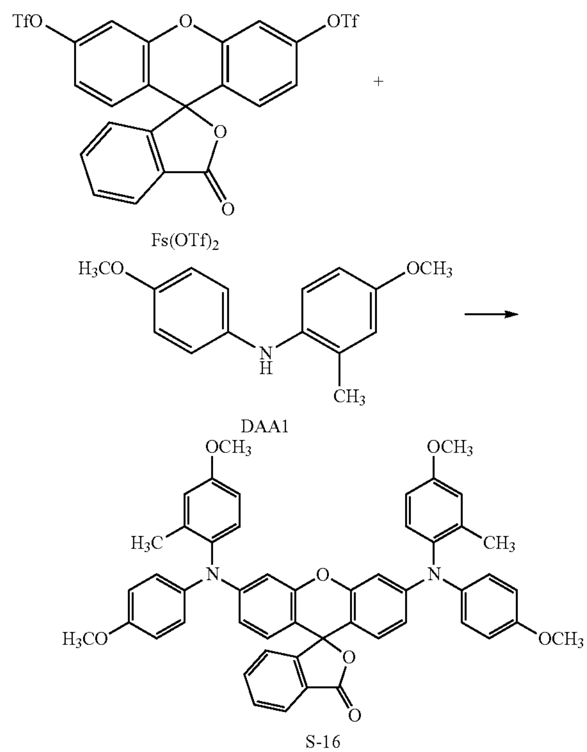

Fs(OTf)$_2$

DAA1

S-16

S-16 was obtained in the same manner as in Synthesis Example 1, except that the fluorescein chloride was changed to Fs(OTs)$_2$ (synthesized according to the synthesis method of the compound 6 described in Organic Letters, 2011, Vol. 13, pp. 6354-6357) and RuPhos Pd G2 was changed to a combination of palladium acetate and Cy-cBRIDP (manufactured by Sigma-Aldrich). The yield was 84.8%.

Synthesis Example 3

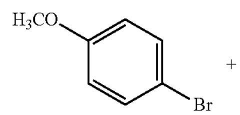

-continued

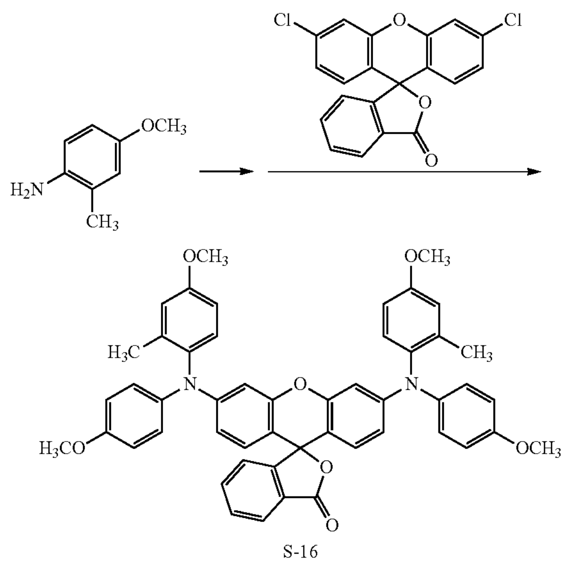

S-16

4-Bromoanisole (3.80 g, 20.3 mmol; 2.5 eq.), 2.68 g of 4-methoxy-2-methylaniline (19.5 mmol; 2.4 eq.), and 6.25 g of sodium t-butoxide (65.0 mmol; 8.0 eq.) were added to 30 mL of toluene and subjected to degassing under reduced pressure and nitrogen purge that were repeated 3 times, and 0.063 g of RuPhos Pd G2 (0.0813 mmol; 0.01 eq.) was added thereto, followed by stirring in an oil bath at 120° C. for 2 hours under a nitrogen flow. After it was confirmed that 4-methoxy-2-methylaniline had disappeared, 3.00 g (8.13 mmol) of fluorescein chloride was added thereto, followed by stirring in an oil bath at 120° C. for 2 hours under a nitrogen flow. The reaction solution was cooled to room temperature, and then the solvent was distilled off by using an evaporator. THF (60 mL) was added thereto, 120 mL of distilled water was then added thereto such that crystals were precipitated, and the generated crystals were collected by filtration and dried, thereby obtaining 6.12 g of S-16. The yield was 96.2%.

Synthesis Example 4

Synthesis of Intermediate ML-1

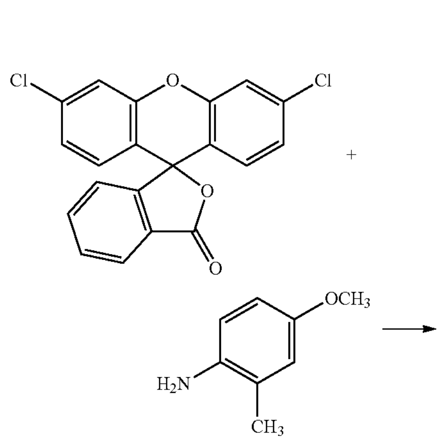

-continued

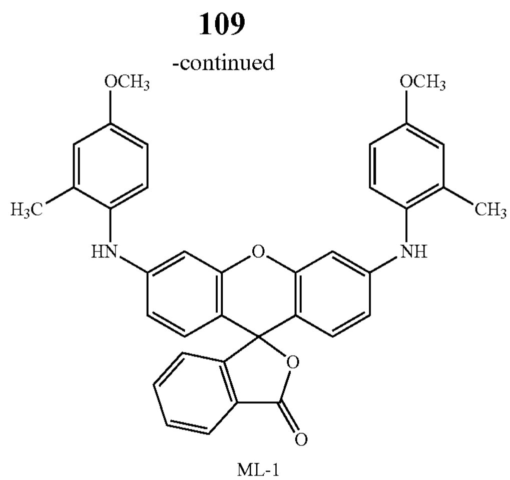

ML-1

-continued

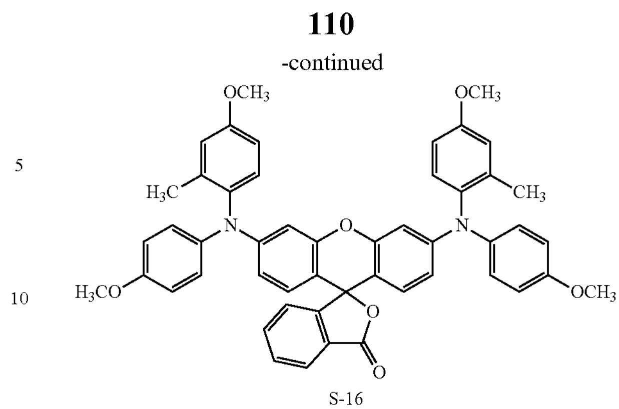

S-16

Dichlorofluorescein (70.0 g), 72.2 g of anhydrous magnesium chloride, 387.3 g of sulfolane, and 156.1 g of 4-methoxy-2-methylaniline (manufactured by Tokyo Chemical Industry Co., Ltd.) were added to a three-neck flask, and the temperature was raised to 135° C., followed by reaction for 3 hours. The temperature was lowered to 80° C., 524 g of EtOH and 1,100 g of a 1N (=1 mol/L) aqueous hydrochloric acid solution were added thereto, and the mixture was stirred at 85° C. for 1 hour and then cooled to room temperature. The reaction solution was filtered, and the filtrate was washed with 1,100 g of a 1N aqueous hydrochloric acid solution and 1,000 g of pure water. The filtrate was dried, thereby obtaining green crystals. The obtained filtrate, 24.88 g of potassium carbonate, and 594 g of MeOH were put in a three-neck flask, and the temperature was raised to 65° C. while the mixture was being stirred with a mechanical stirrer. Water (450 g) was added dropwise thereto, and the mixture was stirred for 1 hour. The temperature was lowered to room temperature, and crystals were collected by filtration and dried. In this way, 92.46 g of an intermediate ML-1 was obtained. The yield was 79.1%.

Synthesis of S-16

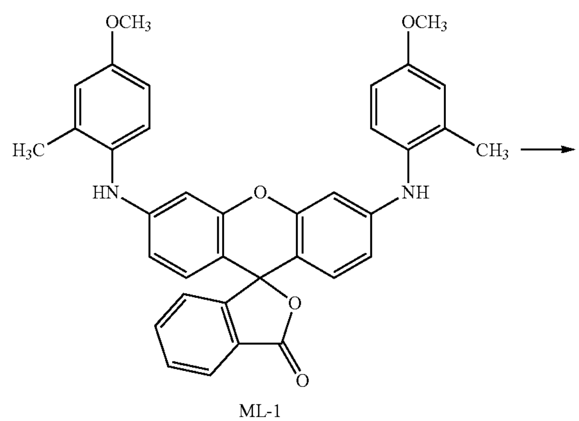

ML-1

The intermediate ML-1 (40 g), 2.23 g of Cu powder, 65.62 g of 4-iodoanisole, 105.8 g of orthodichlorobenzene (ODCB), and 38.75 g of potassium carbonate were put in a three-neck flask, and the temperature was raised to 190° C., followed by stirring for 10 hours. The temperature was lowered, and 480 ml of toluene was added thereto at 70° C. The mixture was filtered through celite, and the filtrate was washed with 200 ml of saturated saline. The organic layer was concentrated using an evaporator, 200 ml of EtOAc was added thereto, and the mixture was added dropwise to 2,500 ml of heptane such that crystals were precipitated, and the crystals were collected by filtration and dried, thereby obtaining 50.9 g of ΔΔ. The yield was 92.7%.

[Chain Transfer Agent]

The image-recording layer used in the present disclosure may contain a chain transfer agent. The chain transfer agent contributes to the improvement of UV printing durability of the lithographic printing plate.

As the chain transfer agent, a thiol compound is preferable, a thiol compound having 7 or more carbon atoms is more preferable from the viewpoint of boiling point (low volatility), and a compound having a mercapto group on an aromatic ring (aromatic thiol compound) is even more preferable. The thiol compound is preferably a monofunctional thiol compound.

Specific examples of the chain transfer agent include the following compounds.

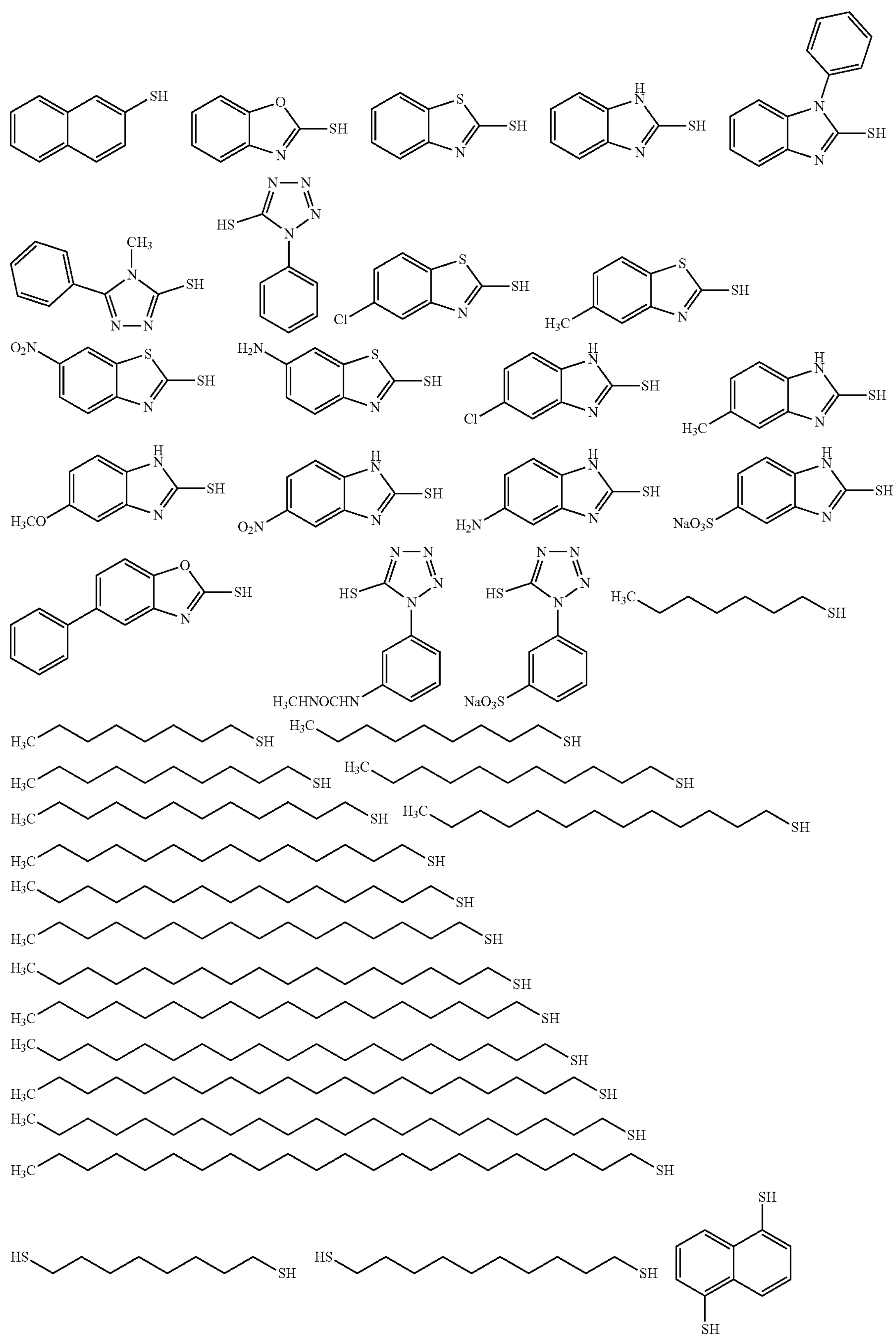

-continued

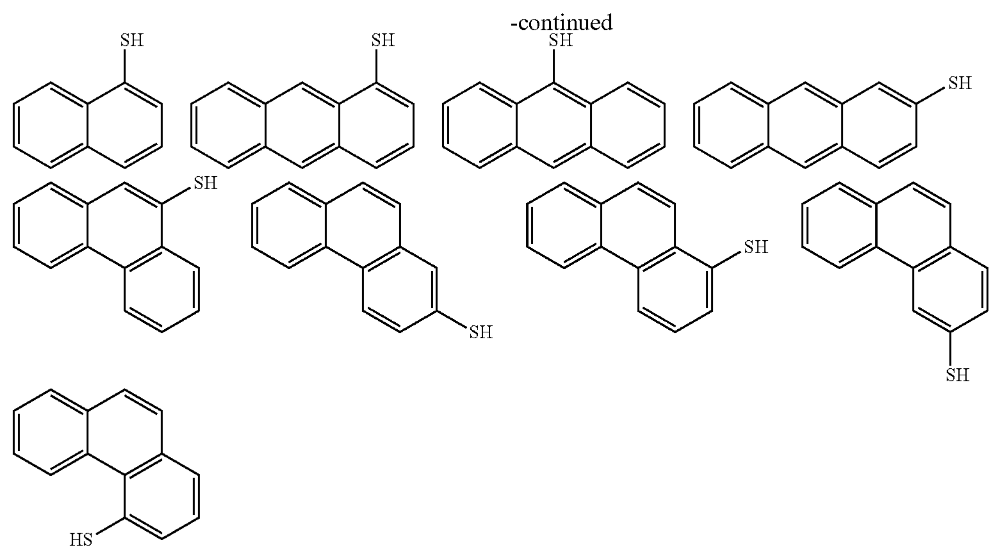

Only one kind of chain transfer agent may be added to the image-recording layer, or two or more kinds of chain transfer agents may be used in combination.

The content of the chain transfer agent with respect to the total mass of the image-recording layer is preferably 0.01% by mass to 50% by mass, more preferably 0.05% by mass to 40% by mass, and even more preferably 0.1% by mass to 30% by mass.

[Oil Sensitizing Agent]

In order to improve ink receptivity, the image-recording layer preferably further contains an oil sensitizing agent.

The SP value of the oil sensitizing agent is preferably less than 18.0, more preferably 14 or more and less than 18, even more preferably 15 to 17, and particularly preferably 16 to 16.9.

Furthermore, the oil sensitizing agent may be a compound having a molecular weight (weight-average molecular weight in a case where the compound has molecular weight distribution) of 2,000 or more, or a compound having a molecular weight less than 2,000.

In the present disclosure, as the SP value (solubility parameter, (unit: $(MPa)^{1/2}$)), the Hansen solubility parameters are used.

The Hansen solubility parameters are obtained by dividing the solubility parameters introduced by Hildebrand into three components, a dispersion element δd, a polarity element δp, and a hydrogen bond element δh, and expressing the parameters in a three-dimensional space. In the present disclosure, the SP value is expressed as δ (unit: $(MPa)^{1/2}$), and a value calculated by the following equation is used.

$$\delta(MPa)^{1/2}=(\delta d^2+\delta p^2+\delta h2)^{1/2}$$

The dispersion element δd, the polarity element δp, and the hydrogen bond element δh of various substances have been found by Hansen and his successors, and are described in detail in the Polymer Handbook (fourth edition), VII-698 to 711.

Furthermore, in the present disclosure, the SP value of a polymer is calculated from the molecular structure of the polymer by the Hoy method described in Polymer Handbook fourth edition.

Examples of the aforementioned oil sensitizing agent include an onium salt compound, a nitrogen-containing low-molecular-weight compound, an ammonium compound such as an ammonium group-containing polymer, and the like.

Particularly, in a case where an inorganic lamellar compound is incorporated into an outermost layer, these compounds function as a surface coating agent for the inorganic lamellar compound and can inhibit the receptivity deterioration caused in the middle of printing by the inorganic lamellar compound.

From the viewpoint of receptivity, the oil sensitizing agent is preferably an onium salt compound.

Examples of the onium salt compound include a phosphonium compound, an ammonium compound, a sulfonium compound, and the like. As the onium salt compound, from the viewpoint described above, at least one kind of compound selected from the group consisting of a phosphonium compound and an ammonium compound is preferable.

The onium salt compound, which will be described later, in a development accelerator or electron-accepting polymerization initiator is a compound having an SP value more than 18, and is not included in the oil sensitizing agent.

Examples of the phosphonium compound include the phosphonium compounds described in JP2006-297907A and JP2007-50660A. Specific examples thereof include 1,4-bis(triphenylphosphonio)butane=di(hexafluorophosphate), 1,7-bis(triphenylphosphonio)heptane=sulfate, and 1,9-bis (triphenylphosphonio)nonane=naphthalene-2,7-disulfonate, and the like.

Preferred examples of the ammonium compound include a nitrogen-containing low-molecular-weight compound, an ammonium group-containing polymer, and the like.

Examples of the nitrogen-containing low-molecular-weight compound include amine salts and quaternary ammonium salts. In addition, examples thereof also include imidazolinium salts, benzimidazolinium salts, pyridinium salts, and quinolinium salts.

Among these, quaternary ammonium salts and pyridinium salts are preferable.

Specific examples thereof include tetramethylammonium=hexafluorophosphate, tetrabutylammonium=hexafluorophosphate, dodecyltrimethylammonium=p-toluenesulfonate, benzyltriethylammonium=hexafluorophosphate, benzyldimethyloctylammonium=hexafluorophosphate, benzyldimethyldodecylammonium=hexafluorophosphate, the compounds described in paragraphs "0021" to "0037" of JP2008-284858A, the compounds described in paragraphs "0030" to "0057" of JP2009-90645A, and the like.

The ammonium group-containing polymer may have an ammonium group in the structure. As such a polymer, a polymer is preferable in which the content of (meth)acrylate having an ammonium group in a side chain as a copolymerization component is 5 mol % to 80 mol %. Specific examples thereof include the polymers described in paragraphs "0089" to "0105" of JP2009-208458A.

The reduced specific viscosity (unit: ml/g) of an ammonium salt-containing polymer determined according to the measurement method described in JP2009-208458A is preferably in a range of 5 to 120, more preferably in a range of 10 to 110, and particularly preferably in a range of 15 to 100. In a case where the reduced specific viscosity is converted into a weight-average molecular weight (Mw), the weight-average molecular weight is preferably 10,000 to 150,000, more preferably 17,000 to 140,000, and particularly preferably 20,000 to 130,000.

Specific examples of the ammonium group-containing polymer will be shown below.

(1) 2-(Trimethylammonio)ethylmethacrylate=p-toluenesulfonate/3,6-dioxaheptylmethacrylate copolymer (molar ratio: 10/90, Mw: 45,000)

(2) 2-(Trimethylammonio) ethylmethacrylate=hexafluorophosphate/3,6-dioxaheptylmethacrylate copolymer (molar ratio: 20/80, Mw: 60,000)

(3) 2-(Ethyldimethylammonio)ethylmethacrylate=p-toluenesulfonate/hexylmethacrylate copolymer (molar ratio: 30/70, Mw: 45,000)

(4) 2-(Trimethylammonio) ethylmethacrylate=hexafluorophosphate/2-ethylhexylmethacrylate copolymer (molar ratio: 20/80, Mw: 60,000)

(5) 2-(Trimethylammonio) ethylmethacrylate=methylsulfate/hexylmethacrylate copolymer (molar ratio: 40/60, Mw: 70,000)

(6) 2-(Butyldimethylammonio) ethylmethacrylate=hexafluorophosphate/3,6-dioxaheptylmethacrylate copolymer (molar ratio: 25/75, Mw: 65,000)

(7) 2-(Butyldimethylammonio) ethylacrylate=hexafluorophosphate/3,6-dioxaheptylmethacrylate copolymer (molar ratio: 20/80, Mw: 65,000)

(8) 2-(Butyldimethylammonio)ethylmethacrylate=13-ethyl-5,8,11-trioxa-1-heptadecanesulfonate/3,6-dioxaheptylmethacrylate copolymer (molar ratio: 20/80, Mw: 75,000)

The content of the oil sensitizing agent with respect to the total mass of the image-recording layer is preferably 1% by mass to 40.0% by mass, more preferably 2% by mass to 25.0% by mass, and even more preferably 3% by mass to 20.0% by mass.

The image-recording layer may contain only one kind of oil sensitizing agent, or two or more kinds of oil sensitizing agents may be used in combination.

One of the preferred aspects of the image-recording layer used in the present disclosure is an aspect in which the image-recording layer contains two or more kinds of compounds as an oil sensitizing agent.

Specifically, from the viewpoint of satisfying both the on-press developability and receptivity, the image-recording layer used in the present disclosure preferably uses all the phosphonium compound, the nitrogen-containing low-molecular-weight compound, and the ammonium group-containing polymer as an oil sensitizing agent, and more preferably uses all the phosphonium compound, the quaternary ammonium salts, and the ammonium group-containing polymer as an oil sensitizing agent.

[Development Accelerator]

The image-recording layer used in the present disclosure preferably further contains a development accelerator.

The value of polarity element as an SP value of the development accelerator is preferably 6.0 to 26.0, more preferably 6.2 to 24.0, even more preferably 6.3 to 23.5, and particularly preferably 6.4 to 22.0.

In the present disclosure, as the value of polarity element as an SP value (solubility parameter, unit: $(cal/cm^3)^{1/2}$), the value of polarity element δp in the Hansen solubility parameters is used. The Hansen solubility parameters are obtained by dividing the solubility parameters introduced by Hildebrand into three components, a dispersion element δd, a polarity element δp, and a hydrogen bond element δh, and expressing the parameters in a three-dimensional space. In the present disclosure, the polarity element δp is used.

δp [$cal/cm^3$] is a dipole-dipole force element in the Hansen solubility parameters, V [$cal/cm^3$] is a molar volume, and [D] is a dipole moment. As Sp, the following equation simplified by Hansen and Beerbower is generally used.

$$\delta_p = \frac{37.4\ \mu}{V^{1/2}}$$

The development accelerator is preferably a hydrophilic polymer compound or a hydrophilic low-molecular-weight compound.

In the present disclosure, "hydrophilic" means that the value of polarity element as an SP value is 6.0 to 26.0, the hydrophilic polymer compound refers to a compound having a molecular weight (weight-average molecular weight in a case where the compound has molecular weight distribution) of 3,000 or more, and the hydrophilic low-molecular-weight compound refers to a compound having a molecular weight (weight-average molecular weight in a case where the compound has molecular weight distribution) of less than 3,000.

Examples of the hydrophilic polymer compound include a cellulose compound and the like. Among these, a cellulose compound is preferable.

Examples of the cellulose compound include cellulose or a compound obtained by modifying at least a part of cellulose (modified cellulose compound). Among these, a modified cellulose compound is preferable.

Preferred examples of the modified cellulose compound include a compound which is obtained by substituting at least some of hydroxy groups of cellulose with at least one kind of group selected from the group consisting of an alkyl group and a hydroxyalkyl group.

The degree of substitution of the compound, which is obtained by substituting at least some of hydroxy groups of cellulose with at least one kind of group selected from the group consisting of an alkyl group and a hydroxyalkyl group, is preferably 0.1 to 6.0, and more preferably 1 to 4.

As the modified cellulose compound, an alkyl cellulose compound or a hydroxyalkyl cellulose compound is preferable, and a hydroxyalkyl cellulose compound is more preferable.

Preferred examples of the alkyl cellulose compound include methyl cellulose.

Preferred examples of the hydroxyalkyl cellulose compound include hydroxypropyl cellulose.

The molecular weight of the hydrophilic polymer compound (weight-average molecular weight in a case where the compound has molecular weight distribution) is preferably 3,000 to 5,000,000, and more preferably 5,000 to 200,000.

Examples of the hydrophilic low-molecular-weight compound include a glycol compound, a polyol compound, an organic amine compound, an organic sulfonic acid compound, an organic sulfamine compound, an organic sulfuric acid compound, an organic phosphonic acid compound, an organic carboxylic acid compound, a betaine compound, and the like. Among these, a polyol compound, an organic sulfonic acid compound, or a betaine compound is preferable.

Examples of the glycol compound include glycols such as ethylene glycol, diethylene glycol, triethylene glycol, propylene glycol, dipropylene glycol, and tripropylene glycol, and ether or ester derivatives of these compounds.

Examples of the polyol compound include glycerin, pentaerythritol, tris(2-hydroxyethyl) isocyanurate, and the like.

Examples of the organic amine compound include triethanolamine, diethanolamine, monoethanolamine, salts of these, and the like.

Examples of the organic sulfonic acid compound include alkyl sulfonic acid, toluene sulfonic acid, benzene sulfonic acid, salts of these, and the like. Among these, for example, alkyl sulfonic acid having an alkyl group having 1 to 10 carbon atoms is preferable. Examples of the organic sulfamine compound include alkylsulfamic acid, salts thereof, and the like.

Examples of the organic sulfuric acid compound include alkyl sulfuric acid, alkyl ether sulfuric acid, salts of these, and the like.

Examples of the organic phosphonic acid compound include phenylphosphonic acid, salts thereof, and the like.

Examples of the organic carboxylic acid compound include tartaric acid, oxalic acid, citric acid, malic acid, lactic acid, gluconic acid, salts of these, and the like.

Examples of the betaine compound include a phosphobetaine compound, a sulfobetaine compound, a carboxybetaine compound, and the like. Among these, for example, trimethylglycine is preferable.

The molecular weight of the hydrophilic low-molecular-weight compound (weight-average molecular weight in a case where the compound has molecular weight distribution) is preferably 100 or more and less than 3,000, and more preferably 300 to 2,500.

The development accelerator is preferably a compound having a cyclic structure.

The cyclic structure is not particularly limited. Examples thereof include a glucose ring in which at least some of hydroxy groups may be substituted, an isocyanuric ring, an aromatic ring which may have a heteroatom, an aliphatic ring which may have a heteroatom, and the like. Among these, for example, a glucose ring or an isocyanuric ring is preferable.

Examples of the compound having a glucose ring include the aforementioned cellulose compound.

Examples of the compound having an isocyanuric ring include the aforementioned tris(2-hydroxyethyl) isocyanurate and the like.

Examples of the compound having an aromatic ring include the toluene sulfonic acid and benzene sulfonic acid described above, and the like.

Examples of the compound having an aliphatic ring include a compound which is the aforementioned alkyl sulfate and has an alkyl group having a ring structure, and the like.

The compound having a cyclic structure preferably has a hydroxy group.

Preferred examples of the compound having a hydroxy group and a cyclic structure include the aforementioned cellulose compound and the aforementioned tris(2-hydroxyethyl) isocyanurate.

The development accelerator is preferably an onium salt compound.

Examples of the onium salt compound include an ammonium compound, a sulfonium compound, and the like. Among these, an ammonium compound is preferable.

Examples of the development accelerator which is an onium salt compound include trimethylglycine and the like.

The value of polarity element as an SP value of the onium salt compound in the electron-accepting polymerization initiator is not in a range of 6.0 to 26.0. This onium salt compound is not included in the development accelerator.

The image-recording layer may contain only one kind of development accelerator, or two or more kinds of development accelerators may be used in combination.

One of the preferred aspects of the image-recording layer used in the present disclosure is an aspect in which the image-recording layer contains two or more kinds of compounds as a development accelerator.

Specifically, from the viewpoint of on-press developability and receptivity, the image-recording layer used in the present disclosure preferably contains, as a development accelerator, the polyol compound and the betaine compound described above, the betaine compound and the organic sulfonic acid compound described above, or the polyol compound and the organic sulfonic acid compound described above.

The content of the development accelerator with respect to the total mass of the image-recording layer is preferably 0.1% by mass or more and 20% by mass or less, more preferably 0.5% by mass or more and 15% by mass or less, and even more preferably 1% by mass or more and 10% by mass or less.

[Other Components]

As other components, a surfactant, a polymerization inhibitor, a higher fatty acid derivative, a plasticizer, inorganic particles, an inorganic lamellar compound, and the like can be incorporated into the image-recording layer. Specifically, the description in paragraphs "0114" to "0159" of JP2008-284817A can be referred to.

[Formation of Image-Recording Layer]

The image-recording layer in the lithographic printing plate precursor according to the present disclosure can be formed, for example, by preparing a coating liquid by dispersing or dissolving the necessary components described above in a known solvent, coating a support with the coating liquid by a known method such as bar coating, and drying the coating liquid, as described in paragraphs "0142" and "0143" of JP2008-195018A. The coating amount (solid content) of the image-recording layer after coating and drying varies with uses, but is preferably 0.3 $g/m^2$ to 3.0 $g/m^2$. In a case where the coating amount is in this range, excellent sensitivity and excellent film characteristics of the image-recording layer are obtained.

As the solvent, known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, 7-butyrolactone, methyl lactate, ethyl lactate, and the like. One kind of solvent may be used alone, or two or more kinds of the solvents may be used in combination. The concentration of solid contents in the coating liquid is preferably 1% by mass to 50% by mass.

The coating amount (solid content) of the image-recording layer after coating and drying varies with uses. However, from the viewpoint of obtaining excellent sensitivity and excellent film characteristics of the image-recording layer, the coating amount is preferably 0.3 $g/m^2$ to 3.0 $g/m^2$.

The film thickness of the image-recording layer in the lithographic printing plate precursor according to the present disclosure is preferably 0.1 μm to 3.0 μm, and more preferably 0.3 μm to 2.0 μm.

In the present disclosure, the film thickness of each layer in the lithographic printing plate precursor is checked by preparing a slice by cutting the lithographic printing plate precursor in a direction perpendicular to the surface of the precursor and observing the cross section of the slice with a scanning electron microscope (SEM).

<Support>

The lithographic printing plate precursor according to the present disclosure has a support.

The support to be used can be appropriately selected from known supports for a lithographic printing plate precursor.

As the support, a support having a hydrophilic surface (hereinafter, also called "hydrophilic support") is preferable.

As the support in the present disclosure, an aluminum plate is preferable which has been roughened using a known method and has undergone an anodization treatment. That is, the support in the present disclosure preferably has an aluminum plate and an aluminum anodic oxide film disposed on the aluminum plate.

The aforementioned support preferably has an aluminum plate and an anodic oxide film of aluminum disposed on the aluminum plate, the anodic oxide film is preferably at a position closer to a side of the image-recording layer than the aluminum plate and preferably has micropores extending in a depth direction from the surface of the anodic oxide film on the side of the image-recording layer, and the average diameter of the micropores within the surface of the anodic oxide film is preferably more than 10 nm and 100 nm or less.

Furthermore, the micropores are preferably each composed of a large diameter portion that extends to a position at a depth of 10 nm to 1,000 nm from the surface of the anodic oxide film and a small diameter portion that is in communication with a bottom portion of the large diameter portion and extends to a position at a depth of 20 nm to 2,000 nm from a communicate position, an average diameter of the large diameter portion within the surface of the anodic oxide film is preferably 15 nm to 100 nm, and an average diameter of the small diameter portion at the communicate position is preferably 13 nm or less.

FIG. 1 is a schematic cross-sectional view of an embodiment of an aluminum support 12*a*. The aluminum support 12*a* has a laminated structure in which an aluminum plate 18 and an anodic oxide film 20*a* of aluminum (hereinafter, also simply called "anodic oxide film 20*a*") are laminated in this order. The anodic oxide film 20*a* in the aluminum support 12*a* is positioned such that the anodic oxide film 20*a* is closer to the image-recording layer side than the aluminum plate 18. That is, it is preferable that the lithographic printing plate precursor according to the present disclosure have at least an anodic oxide film, an image-recording layer, and a water-soluble resin layer in this order on an aluminum plate.

—Anodic Oxide Film—

Hereinafter, preferred aspects of the anodic oxide film 20*a* will be described.

The anodic oxide film 20*a* is a film prepared on a surface of the aluminum plate 18 by an anodization treatment. This film has uniformly distributed ultrafine micropores 22*a* approximately perpendicular to the surface of the film. The micropores 22*a* extend from a surface of the anodic oxide film 20*a* on the image-recording layer side (a surface of the anodic oxide film 20*a* opposite to the aluminum plate 18) along the thickness direction (toward the aluminum plate 18).

The average diameter (average opening diameter), at the surface of the anodic oxide film 20*a*, of the micropores 22*a* in the anodic oxide film 20*a* is preferably more than 10 nm and 100 nm or less. Particularly, from the viewpoint of balance between printing durability, antifouling properties, and image visibility, the average diameter of the micropores 22*a* is more preferably 15 nm to 60 nm, even more preferably 20 nm to 50 nm, and particularly preferably 25 nm to 40 nm. The internal diameter of the pores may be larger or smaller than the pore diameter within the surface layer.

In a case where the average diameter is more than 10 nm, printing durability and image visibility are excellent. Furthermore, in a case where the average diameter is 100 nm or less, printing durability is excellent.

The average diameter of the micropores 22*a* is a value determined by observing the surface of the anodic oxide film 20*a* with a field emission scanning electron microscope (FE-SEM) at 150,000× magnification (N=4), measuring the size (diameter) of 50 micropores existing in a range of 400 nm×600 nm in the obtained 4 images, and calculating the arithmetic mean thereof.

In a case where the shape of the micropores 22*a* is not circular, the equivalent circle diameter is used. "Equivalent circle diameter" is a diameter determined on an assumption that the opening portion is in the form of a circle having the same projected area as the projected area of the opening portion.

The shape of the micropores 22*a* is not particularly limited. In FIG. 1, the micropores 22*a* have a substantially straight tubular shape (substantially cylindrical shape). However, the micropores 22*a* may have a conical shape that tapers along the depth direction (thickness direction). The shape of the bottom portion of the micropores 22*a* is not particularly limited, and may be a curved (convex) or planar shape.

In the support, the micropores may be each composed of a large diameter portion that extends to a position at a certain depth from the surface of the anodic oxide film and a small diameter portion that is in communication with a bottom portion of the large diameter portion and extends to a position at a certain depth from the communicate position.

Figure 2:
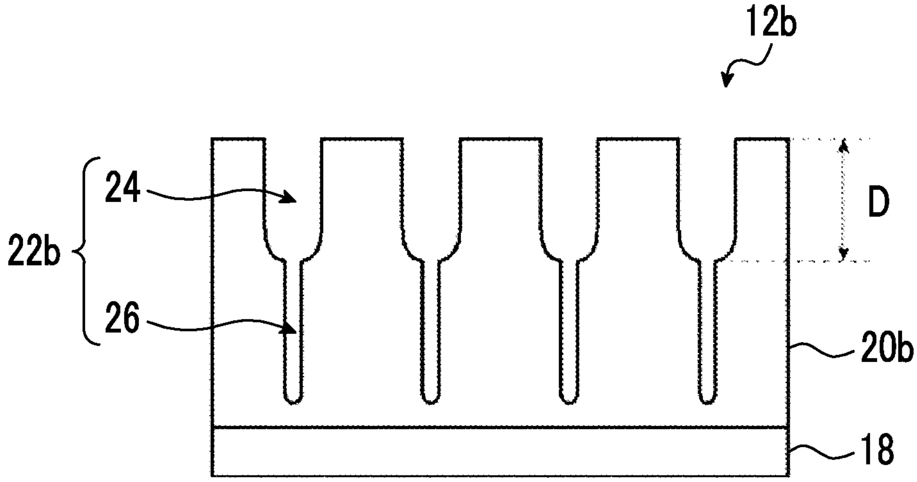
FIG. 2 is a schematic cross-sectional view of another embodiment of a support.

For example, as shown in FIG. 2, an aspect may be adopted in which an aluminum support 12*b* includes an aluminum plate 18 and an anodic oxide film 20*b* having micropores 22*b* each composed of a large diameter portion 24 and a small diameter portion 26.

For example, the micropores 22*b* in the anodic oxide film 20*b* are each composed of the large diameter portion 24 that extends to a position at a depth of 10 nm to 1,000 nm (depth D: see FIG. 2) from the surface of the anodic oxide film and the small diameter portion 26 that is in communication with the bottom portion of the large diameter portion 24 and further extends from the communicate position to a position at a depth of 20 nm to 2,000 nm. Specifically, for example, it is possible to use the aspect described in paragraphs "0107" to "0114" of JP2019-162855A.

—Manufacturing Method of Support—

As a manufacturing method of the support used in the present disclosure, for example, a manufacturing method is preferable in which the following steps are sequentially performed.

Roughening treatment step: step of performing roughening treatment on aluminum plate Anodization treatment step: step of subjecting aluminum plate having undergone roughening treatment to anodization Pore widening treatment step: step of bringing aluminum plate having anodic oxide film obtained by anodization treatment step into contact with aqueous acid solution or aqueous alkali solution such that diameter of micropores in anodic oxide film increases Hereinafter, the procedure of each step will be specifically described.

—<<Roughening Treatment Step>>

The roughening treatment step is a step of performing a roughening treatment including an electrochemical roughening treatment on the surface of the aluminum plate. This step is preferably performed before the anodization treatment step which will be described later. However, in a case where the surface of the aluminum plate already has a preferable shape, the roughening treatment step may not be performed. This step can be carried out by the method described in paragraphs "0086" to "0101" of JP2019-162855A.

<<Anodization Treatment Step>>

The procedure of the anodization treatment step is not particularly limited as long as the aforementioned micropores can be obtained. Examples thereof include known methods.

In the anodization treatment step, an aqueous solution of sulfuric acid, phosphoric acid, oxalic acid, or the like can be used as an electrolytic cell. For example, the concentration of sulfuric acid is 100 g/L to 300 g/L.

The conditions of the anodization treatment are appropriately set depending on the electrolytic solution used. For example, the liquid temperature is 5° C. to 70° C. (preferably 10° C. to 60° C.), the current density is 0.5 A/dm$^2$ to 60 A/dm$^2$ (preferably 1 A/dm$^2$ to 60 A/dm$^2$), the voltage is 1 V to 100 V (preferably 5 V to 50 V), the electrolysis time is 1 second to 100 seconds (preferably 5 seconds to 60 seconds), and the film amount is 0.1 g/m$^2$ to 5 g/m$^2$ (preferably 0.2 g/m$^2$ to 3 g/m$^2$).

<<Pore Widening Treatment>>

The pore widening treatment is a treatment of enlarging the diameter of micropores (pore diameter) present in the anodic oxide film formed by the aforementioned anodization treatment step (pore diameter enlarging treatment).

The pore widening treatment can be carried out by bringing the aluminum plate obtained by the anodization treatment step into contact with an aqueous acid solution or an aqueous alkali solution. The contact method is not particularly limited, and examples thereof include a dipping method and a spraying method.

As necessary, the support may have a backcoat layer on the side opposite to the image-recording layer, the backcoat layer containing the organic polymer compound described in JP1993-45885A (JP-H5-45885A) or the alkoxy compound of silicon described in JP1994-35174A (JP-H6-35174A).

<Undercoat Layer>

The lithographic printing plate precursor according to the present disclosure preferably has an undercoat layer (also called interlayer in some cases) between the image-recording layer and the support. The undercoat layer enhances the adhesiveness between the support and the image-recording layer in an exposed portion, and enables the image-recording layer to be easily peeled from the support in a non-exposed portion. Therefore, the undercoat layer inhibits the deterioration of printing durability and contributes to the improvement of developability. Furthermore, in the case of exposure to infrared laser, the undercoat layer functions as a heat insulating layer and thus brings about an effect of preventing sensitivity reduction resulting from the diffusion of heat generated by exposure to the support.

Examples of compounds that are used in the undercoat layer include polymers having adsorbent groups that can be adsorbed onto the surface of the support and hydrophilic groups. In order to improve adhesiveness to the image-recording layer, polymers having adsorbent groups and hydrophilic groups plus crosslinking groups are preferable. The compounds that are used in the undercoat layer may be low-molecular-weight compounds or polymers. As necessary, as the compounds that are used in the undercoat layer, two or more kinds of compounds may be used by being mixed together.

In a case where the compound used in the undercoat layer is a polymer, a copolymer of a monomer having an adsorbent group, a monomer having a hydrophilic group, and a monomer having a crosslinking group is preferable.

As the adsorbent group that can be adsorbed onto the surface of the support, a phenolic hydroxyl group, a carboxy group, $—PO_3H_2$, $—OPO_3H_2$, $—CONHSO_2—$, $—SO_2NHSO_2—$, and $—COCH_2COCH_3$ are preferable. As the hydrophilic groups, a sulfo group or salts thereof and salts of a carboxy group are preferable. As the crosslinking groups, an acryloyl group, a methacryloyl group, an acrylamide group, a methacrylamide group, an allyl group, and the like are preferable.

The polymer may have a crosslinking group introduced by the formation of a salt of a polar substituent of the polymer and a compound that has a substituent having charge opposite to that of the polar substituent and an ethylenically unsaturated bond, or may be further copolymerized with monomers other than the monomers described above and preferably with hydrophilic monomers.

Specifically, for example, silane coupling agents having addition polymerizable ethylenic double bond reactive groups described in JP1998-282679A (JP-H10-282679A) and phosphorus compounds having ethylenic double bond reactive groups described in JP1990-304441A (JP-H2-304441A) are suitable. The low-molecular-weight compounds or polymer compounds having crosslinking groups (preferably ethylenically unsaturated bonding groups), functional groups that interact with the surface of the support, and hydrophilic groups described in JP2005-238816A, JP2005-125749A, JP2006-239867A, and JP2006-215263A are also preferably used.

For example, the high-molecular-weight polymers having adsorbent groups that can be adsorbed onto the surface of the support, hydrophilic groups, and crosslinking groups described in JP2005-125749A and JP2006-188038A are more preferable.

The content of ethylenically unsaturated bonding group in the polymer used in the undercoat layer is preferably 0.1 mmol to 10.0 mmol per gram of the polymer, and more preferably 0.2 mmol to 5.5 mmol per gram of the polymer.

The weight-average molecular weight (Mw) of the polymer used in the undercoat layer is preferably 5,000 or more, and more preferably 10,000 to 300,000.

In order to prevent contamination over time, the undercoat layer may contain, in addition to the compounds for the undercoat layer described above, a chelating agent, a secondary or tertiary amine, a polymerization inhibitor, a compound having an amino group or a functional group capable of inhibiting polymerization and a group that interacts with the surface of the support (for example, 1,4-diazabicyclo [2.2.2]octane (DABCO), 2,3,5,6-tetrahydroxy-p-quinone, chloranil, sulfophthalic acid, hydroxyethyl ethylenediaminetriacetic acid, dihydroxyethyl ethylenediaminediacetic acid, hydroxyethyl iminodiacetic acid, and the like), and the like.

The undercoat layer is formed by known coating methods. The coating amount (solid content) of the undercoat layer is preferably 0.1 mg/m$^2$ to 100 mg/m$^2$, and more preferably 1 mg/m$^2$ to 30 mg/m$^2$.

<Outermost Layer>

The lithographic printing plate precursor according to the present disclosure may have an outermost layer (also called "protective layer" or "overcoat layer" in some cases) on a surface of the image-recording layer that is opposite to the support side.

It is preferable that the lithographic printing plate precursor according to the present disclosure have a support, an image-recording layer, and an outermost layer in this order.

The film thickness of the outermost layer is preferably larger than the film thickness of the image-recording layer.

The outermost layer may have a function of suppressing the reaction inhibiting image formation by blocking oxygen, a function of preventing the damage of the image-recording layer, and a function of preventing ablation during exposure to high-illuminance lasers.

The outermost layer having such characteristics is described, for example, in U.S. Pat. No. 3,458,311A and JP1980-49729B (JP-S55-49729B). As polymers with low oxygen permeability that are used in the outermost layer, any of water-soluble polymers and water-insoluble polymers can be appropriately selected. As necessary, two or more kinds of such polymers can be used by being mixed together. From the viewpoint of on-press developability, the polymers with low oxygen permeability preferably include a water-soluble polymer.

In the present disclosure, a water-soluble polymer refers to a polymer that dissolves 1 g or more in 100 g of pure water at 70° C. and is not precipitated even though a solution of 1 g of the polymer in 100 g of pure water at 70° C. is cooled to 25° C.

Examples of the water-soluble polymer used in the outermost layer include polyvinyl alcohol, modified polyvinyl alcohol, polyvinylpyrrolidone, a water-soluble cellulose derivative, polyethylene glycol, poly(meth)acrylonitrile, and the like.

As the modified polyvinyl alcohol, acid-modified polyvinyl alcohol having a carboxy group or a sulfo group is preferably used. Specific examples thereof include modified polyvinyl alcohols described in JP2005-250216A and JP2006-259137A.

Among the above water-soluble polymers to be incorporated into the outermost layer, polyvinyl alcohol is preferable, and polyvinyl alcohol having a saponification degree of 50% or more is more preferable.

The saponification degree is preferably 60% or higher, more preferably 70% or higher, and even more preferably 85% or higher. The upper limit thereof of the saponification degree is not particularly limited, and may be 100% or less.

The saponification degree is measured according to the method described in JIS K 6726: 1994.

As an aspect of the outermost layer, for example, an aspect in which the outermost layer contains polyvinyl alcohol and polyethylene glycol is also preferable.

In a case where the outermost layer in the present disclosure contains a water-soluble polymer, the content of the water-soluble polymer with respect to the total mass of the outermost layer is preferably 1% by mass to 99% by mass, more preferably 3% by mass to 97% by mass, and even more preferably 5% by mass to 95% by mass.

The outermost layer preferably contains a hydrophobic polymer.

The hydrophobic polymer refers to a polymer that dissolves less than 5 g or does not dissolve in 100 g of pure water at 125° C.

Examples of the hydrophobic polymer include polyethylene, polystyrene, polyvinyl chloride, polyvinylidene chloride, polyalkyl (meth)acrylate ester (for example, polymethyl (meth)acrylate, polyethyl (meth)acrylate, polybutyl (meth)acrylate, and the like), a copolymer obtained by combining raw material monomers of these resins, and the like.

The hydrophobic polymer preferably includes a polyvinylidene chloride resin.

Furthermore, the hydrophobic polymer preferably includes a styrene-acrylic copolymer (also called styrene acrylic resin).

In addition, from the viewpoint of on-press developability, the hydrophobic polymer is preferably hydrophobic polymer particles.

One kind of hydrophobic polymer may be used alone, or two or more kinds of hydrophobic polymers may be used in combination.

In a case where the outermost layer contains a hydrophobic polymer, the content of the hydrophobic polymer with respect to the total mass of the outermost layer is preferably 1% by mass to 70% by mass, more preferably 5% by mass to 50% by mass, and even more preferably 10% by mass to 40% by mass.

In the present disclosure, the proportion of the area of the hydrophobic polymer occupying the surface of the outermost layer is preferably 30 area % or higher, more preferably 40 area % or higher, and even more preferably 50 area % or higher.

The upper limit of the proportion of the area of the hydrophobic polymer occupying the surface of the outermost layer is, for example, 90 area %.

The proportion of the area of the hydrophobic polymer occupying the surface of the outermost layer can be measured as follows.

By using PHI nano TOFII time-of-flight secondary ion mass spectrometer (TOF-SIMS) manufactured by ULVAC-PHI, INCORPORATED, the surface of the outermost layer is irradiated with Bi ion beams (primary ions) at an acceleration voltage of 30 kV, and the peak of ions (secondary ions) corresponding to a hydrophobic portion (that is, a region formed of the hydrophobic polymer) that are emitted from the surface is measured so that the hydrophobic portion is mapped. By measuring the area of the hydrophobic portion in an area of 100 $\mu m^2$, the proportion of the area occupied by the hydrophobic portion is determined and adopted as "proportion of the area of the hydrophobic polymer occupying the surface of the outermost layer".

For example, in a case where the hydrophobic polymer is an acrylic resin, the proportion is measured using the peak of $C_6H_{13}O^-$. Furthermore, in a case where the hydrophobic polymer is polyvinylidene chloride, the proportion is measured using the peak of $C_2H_2Cl^+$.

The proportion of occupied area can be adjusted by the amount of the hydrophobic polymer added or the like.

From the viewpoint of visibility and storage stability, the outermost layer preferably contains an infrared absorber, and more preferably contains a decomposition-type infrared absorber.

The infrared absorber contained in the outermost layer may be the infrared absorber A, the infrared absorber B, or the infrared absorber C other than these. From the viewpoint of temporal visibility and storage stability, the infrared absorber contained in the outermost layer is preferably at least one kind of infrared absorber selected from the group consisting of the infrared absorber A and the infrared absorber C, and more preferably the infrared absorber C.

As the infrared absorber, for example, those described above regarding the image-recording layer are suitable.

In the outermost layer, one kind of infrared absorber may be used alone, or two or more kinds of infrared absorbers may be used in combination.

From the viewpoint of temporal visibility and storage stability, the content of the infrared absorber in the outermost layer with respect to the total mass of the outermost layer is preferably 0.10% by mass to 50% by mass, more preferably 0.50% by mass to 30% by mass, and even more preferably 1.0% by mass to 20% by mass.

From the viewpoint of improving the visibility of exposed portions, the outermost layer preferably contains a color developing agent.

As the color developing agent, for example, those described above regarding the image-recording layer are suitable.

In the outermost layer, one kind of color developing agent may be used alone, or two or more kinds of color developing agents may be used in combination.

From the viewpoint of color developability, the content of the color developing agent in the outermost layer with respect to the total mass of the outermost layer is preferably 0.10% by mass to 50% by mass, more preferably 0.50% by mass to 30% by mass, and even more preferably 1.0% by mass to 20% by mass.

In order to improve oxygen barrier properties, the outermost layer may contain an inorganic lamellar compound. The inorganic lamellar compound refers to particles in the form of a thin flat plate, and examples thereof include mica groups such as natural mica and synthetic mica, talc represented by Formula $3MgO \cdot 4SiO \cdot H_2O$, taeniolite, montmorillonite, saponite, hectorite, zirconium phosphate, and the like.

As the inorganic lamellar compound, a mica compound is preferably used. Examples of the mica compound include mica groups such as natural mica and synthetic mica represented by Formula: $A(B, C)_{2-5}D_4O_{10}(OH, F, O)_2$ [here, A represents any of K, Na, and Ca, B and C represent any of Fe (II), Fe (III), Mn, Al, Mg, and V, and D represents Si or Al.].

In the mica groups, examples of natural mica include white mica, soda mica, gold mica, black mica, and lepidolite. Examples of synthetic mica include non-swelling mica such as fluorophlogopite $KMg_3(AlSi_3O_{10})F_2$, potassium tetrasilic mica $KMg_{2.5}(Si_4O_{10})F_2$, and, Na tetrasilylic mica $NaMg_{2.5}(Si_4O_{10})F_2$, swelling mica such as Na or Li taeniolite $(Na, Li)Mg_2Li(Si_4O_{10})F_2$, montmorillonite-based Na or Li hectorite $(Na, Li)_{1/8}Mg_{2/5}Li_{1/8}(Si_4O_{10})F_2$, and the like. Furthermore, synthetic smectite is also useful.

Among the aforementioned mica compounds, fluorine-based swelling mica is particularly useful. That is, swelling synthetic mica has a laminated structure consisting of unit crystal lattice layers having a thickness in a range of approximately 10 Å to 15 Å (1 Å is equal to 0.1 nm), and metal atoms in lattices are more actively substituted than in any other clay minerals. As a result, positive charges are deficient in the lattice layers, and positive ions such as $Li^+$, $Na^+$, $Ca^{2+}$, and $Mg^{2+}$ are adsorbed between the layers in order to compensate for the deficiency. Positive ions interposed between the layers are referred to as exchangeable positive ions and are exchangeable with various positive ions. Particularly, in a case where the positive ions between the layers are $Li^+$ and $Na^+$, the ionic radii are small, and thus the bonds between lamellar crystal lattices are weak, and mica is significantly swollen by water. In a case where shear is applied in this state, mica easily cleavages and forms a stable sol in water. Swelling synthetic mica is particularly preferably used because it clearly exhibits such a tendency.

From the viewpoint of diffusion control, regarding the shapes of the mica compounds, the thickness is preferably thin, and the planar size is preferably large as long as the smoothness and actinic ray-transmitting property of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from, for example, projection views obtained from the microphotograph of the particle. The higher the aspect ratio is, the stronger the obtained effect is.

Regarding the particle diameter of the mica compound, the average long diameter thereof is preferably 0.3 μm to 20 μm, more preferably 0.5 μm to 10 μm, and particularly preferably 1 m to 5 μm. The average thickness of the particles is preferably 0.1 μm or less, more preferably 0.05 μm or less, and particularly preferably 0.01 μm or less. Specifically, for example, in the case of swelling synthetic mica which is a typical compound, an aspect is preferable in which the compound has a thickness of about 1 nm to 50 nm and a surface size (long diameter) of about 1 μm to 20 μm.

The content of the inorganic lamellar compound with respect to the total mass of the outermost layer is preferably 1% by mass to 60% by mass, and more preferably 3% by mass to 50% by mass. Even in a case where two or more kinds of inorganic lamellar compounds are used in combination, the total amount of the inorganic lamellar compounds preferable equals the content described above. In a case where the content is within the above range, the oxygen barrier properties are improved, and excellent sensitivity is obtained. In addition, the deterioration of receptivity can be prevented.

The outermost layer may contain known additives such as a plasticizer for imparting flexibility, a surfactant for improving coating properties, and inorganic particles for controlling surface sliding properties. In addition, the oil sensitizing agent described above regarding the image-recording layer may be incorporated into the outermost layer.

The outermost layer is formed by known coating methods. The coating amount of the outermost layer (solid content) is preferably 0.01 $g/m^2$ to 10 $g/m^2$, more preferably 0.02 $g/m^2$ to 3 $g/m^2$, and particularly preferably 0.02 $g/m^2$ to 1 $g/m^2$.

The film thickness of the outermost layer in the lithographic printing plate precursor according to the present disclosure is preferably 0.1 μm to 5.0 μm, and more preferably 0.3 μm to 4.0 μm.

The film thickness of the outermost layer in the lithographic printing plate precursor according to the present disclosure/film thickness of the image-recording layer is preferably 1.1/1 to 5.0/1, and more preferably 1.5/1 to 3.0/1.

The lithographic printing plate precursor according to the present disclosure may have other layers in addition to those described above.

Known layers can be adopted as those other layers without particular limitations. For example, as necessary, a backcoat layer may be provided on a surface of the support that is opposite to the image-recording layer side.

(Method of Preparing Lithographic Printing Plate and Lithographic Printing Method)

It is possible to prepare a lithographic printing plate by performing image exposure and a development treatment on the lithographic printing plate precursor according to the present disclosure.

The method of preparing a lithographic printing plate according to the present disclosure preferably includes a step of exposing the on-press development type lithographic printing plate precursor according to the present disclosure in the shape of an image (hereinafter, this step will be also called "exposure step") and a step of removing the image-recording layer in a non-image area by supplying at least one material selected from the group consisting of a printing ink and dampening water on a printer (hereinafter, this step will be also called "on-press development step").

The lithographic printing method according to the present disclosure preferably includes a step of exposing the on-press development type lithographic printing plate precursor according to the present disclosure in the shape of an image (exposure step), a step of removing the image-recording layer in a non-image area on a printer by supplying at least one material selected from the group consisting of a printing ink and dampening water such that a lithographic printing plate is prepared (on-press development step), and a step of performing printing by using the obtained lithographic printing plate (printing step).

The method of preparing a lithographic printing plate according to the present disclosure preferably includes a step of exposing an on-press development type lithographic printing plate precursor to an infrared laser in the shape of an image and a step of removing an image-recording layer in a non-image area by supplying at least one material selected from the group consisting of printing ink and dampening water on a printer, in which the on-press development type lithographic printing plate precursor preferably has a support and an image-recording layer on the support, the image-recording layer preferably contains an infrared absorber capable of donating electrons to the aforementioned initiator and a color developing substance precursor, and in a case where the image-recording layer is exposed to an infrared laser with a wavelength of 830 nm at an energy density of 110 $mJ/cm^2$, a brightness change $\Delta L$ of the image-recording layer before and after the exposure is preferably 3.0 or more.

Furthermore, the method of preparing a lithographic printing plate according to the present disclosure preferably includes a step of exposing an on-press development type lithographic printing plate precursor to an infrared laser in the shape of an image and a step of removing an image-recording layer in a non-image area by supplying at least one material selected from the group consisting of printing ink or dampening water on a printer, in which the on-press development type lithographic printing plate precursor has a support and an image-recording layer on the support, the image-recording layer preferably contains an initiator, an infrared absorber, and a color developing substance precursor, and the image-recording layer preferably satisfies Expression L.

$$2.0 \le L1 - L0 \qquad \text{Expression L}$$

In Expression L, L1 represents visibility of the image-recording layer, L0 represents the visibility of the image-recording layer from which the aforementioned color developing substance precursor has been removed.

Furthermore, regarding the lithographic printing method according to the present disclosure, for example, it is preferable that each of the above aspects include an aspect in which the lithographic printing method further includes the printing step described above.

Hereinafter, regarding the method of preparing a lithographic printing plate according to the present disclosure and the lithographic printing method according to the present disclosure, preferred aspects of each step will be described in order. Note that the lithographic printing plate precursor according to the present disclosure can also be developed using a developer.

Hereinafter, the exposure step and the on-press development step in the method of preparing a lithographic printing plate will be described. The exposure step in the method of preparing a lithographic printing plate according to the present disclosure is the same step as the exposure step in the lithographic printing method according to the present disclosure. Furthermore, the on-press development step in the method of preparing a lithographic printing plate according to the present disclosure is the same step as the on-press development step in the lithographic printing method according to the present disclosure.

<Exposure Step>

The method of preparing a lithographic printing plate according to the present disclosure preferably includes an exposure step of exposing the lithographic printing plate precursor according to the present disclosure in the shape of an image such that an exposed portion and a non-exposed portion are formed. The lithographic printing plate precursor according to the present disclosure is preferably exposed to a laser through a transparent original picture having a linear image, a halftone dot image, or the like or exposed in the shape of an image by laser light scanning according to digital data or the like.

The wavelength of a light source to be used is preferably 750 nm to 1,400 nm. As the light source having a wavelength of 750 nm to 1,400 nm, a solid-state laser or a semiconductor laser that radiates infrared is suitable. In a case where an infrared laser is used, the output is preferably 100 mW or higher, the exposure time per pixel is preferably 20 microseconds or less, and the amount of irradiation energy is preferably 10 $mJ/cm^2$ to 300 $mJ/cm^2$. In addition, in order to shorten the exposure time, a multibeam laser device is preferably used. The exposure mechanism may be any one of an in-plane drum method, an external surface drum method, a flat head method, or the like.

The image exposure can be carried out by a common method using a plate setter or the like. In the case of on-press development, the image exposure may be carried out on a printer after the lithographic printing plate precursor is mounted on the printer.

<On-Press Development Step>

The method of preparing a lithographic printing plate according to the present disclosure preferably includes an on-press development step of removing the image-recording layer in a non-image area by supplying at least one selected from the group consisting of printing ink and dampening water on a printer.

Hereinafter, the on-press development method will be described.

[On-Press Development Method]

In the on-press development method, the lithographic printing plate precursor having undergone image exposure is preferably supplied with an oil-based ink and an aqueous component on a printer, such that the image-recording layer in a non-image area is removed and a lithographic printing plate is prepared.

That is, in a case where the lithographic printing plate precursor is subjected to image exposure and then directly mounted on a printer without being subjected to any development treatment, or in a case where the lithographic printing plate precursor is mounted on a printer, then subjected to image exposure on the printer, and then supplied with an oil-based ink and an aqueous component for printing, at the initial stage in the middle of printing, in a non-image area, a non-cured image-recording layer is removed by either or both of the supplied oil-based ink and the aqueous component by means of dissolution or dispersion, and the hydrophilic surface is exposed in the non-image area. On the other hand, in an exposed portion, the image-recording layer cured by exposure forms an oil-based ink-receiving portion having a lipophilic surface. What is supplied first to the surface of the plate may be any of the oil-based ink or the aqueous component. However, in view of preventing the plate from being contaminated by the components of the image-recording layer from which aqueous components are removed, it is preferable that the oil-based ink be supplied first. In the manner described above, the lithographic printing plate precursor is subjected to on-press development on a printer and used as it is for printing a number of sheets. As the oil-based ink and the aqueous component, ordinary printing ink and ordinary dampening water for lithographic printing are suitably used.

As the laser used for performing image exposure on the lithographic printing plate precursor according to the present disclosure, a light source having a wavelength of 300 nm to 450 nm or 750 nm to 1,400 nm is preferably used. A light source of 300 nm to 450 nm is preferable for a lithographic printing plate precursor including an image-recording layer containing sensitizing dye having maximum absorption in such a wavelength range. As the light source of 750 nm to 1,400 nm, those described above are preferably used. As the light source of 300 nm to 450 nm, a semiconductor laser is suitable.

<Printing Step>

The lithographic printing method according to the present disclosure includes a printing step of printing a recording medium by supplying a printing ink to the lithographic printing plate.

The printing ink is not particularly limited, and various known inks can be used as desired. In addition, preferred examples of the printing ink include oil-based ink or ultraviolet-curable ink (UV ink).

In the printing step, as necessary, dampening water may be supplied.

Furthermore, the printing step may be successively carried out after the on-press development step without stopping the printer.

The recording medium is not particularly limited, and known recording media can be used as desired.

In the method of preparing a lithographic printing plate from the lithographic printing plate precursor according to the present disclosure and in the lithographic printing method according to the present disclosure, as necessary, the entire surface of the lithographic printing plate precursor may be heated as necessary before exposure, in the middle of exposure, or during a period of time from exposure to development. In a case where the lithographic printing plate precursor is heated as above, an image-forming reaction in the image-recording layer is accelerated, which can result in advantages such as improvement of sensitivity and printing durability, stabilization of sensitivity, and the like. Heating before development is preferably carried out under a mild condition of 150° C. or lower. In a case where this aspect is adopted, it is possible to prevent problems such as curing of a non-image area. For heating after development, it is preferable to use an extremely severe condition which is preferably in a range of 100° C. to 500° C. In a case where this aspect is adopted, a sufficient image-strengthening action is obtained, and it is possible to inhibit problems such as the deterioration of the support or the thermal decomposition of the image area.

EXAMPLES

Hereinafter, the present disclosure will be specifically described based on examples, but the present disclosure is not limited thereto. In the present examples, unless otherwise specified, "%" and "part" mean "% by mass" and "part by mass" respectively. Unless otherwise described, the molecular weight of a polymer compound is a weight-average molecular weight (Mw), and the ratio of repeating constitutional units of a polymer compound is expressed as molar percentage. The weight-average molecular weight (Mw) is a polystyrene-equivalent molecular weight measured by gel permeation chromatography (GPC).

Examples 1 to 28 and Comparative Examples 1 and 2

<Preparation of Support>

(a) Alkaline Etching Treatment

An aqueous solution of caustic soda having a caustic soda concentration of 26% by mass and an aluminum ion concentration of 6.5% by mass was sprayed onto the aluminum plate at a temperature of 70° C., thereby performing an etching treatment. Then, rinsing was performed by means of spraying. The amount of dissolved aluminum within the surface to be subjected to the electrochemical roughening treatment later was 5 $g/m^2$.

(b) Desmutting Treatment Using Aqueous Acidic Solution (First Desmutting Treatment)

Next, a desmutting treatment was performed using an aqueous acidic solution. In the desmutting treatment, a 150 g/L aqueous sulfuric acid solution was used as the aqueous acidic solution. The liquid temperature was 30° C. The desmutting treatment was performed for 3 seconds by spraying the aqueous acidic solution onto the aluminum plate. Then, a rinsing treatment was performed.

(c) Electrochemical Roughening Treatment

Next, an electrochemical roughening treatment was performed using alternating current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the alternating current was a sine wave in which positive and negative waveforms are symmetrical, the frequency was 50 Hz, the ratio of the anodic reaction time and the cathodic reaction time in one cycle of the alternating current was 1:1, and the current density was 75 $A/dm^2$ in terms of the peak current value of the alternating current waveform. In addition, the quantity of electricity was 450 $C/dm^2$ which was the total quantity of electricity used for the aluminum plate to have an anodic reaction, and the electrolysis treatment was performed 4 times by conducting electricity of 112.5 $C/dm^2$ for 4 seconds at each treatment session. A carbon electrode was used as the counter electrode of the aluminum plate. Then, a rinsing treatment was performed.

(d) Alkaline Etching Treatment

An aqueous solution of caustic soda having a caustic soda concentration of 5% by mass and an aluminum ion concentration of 0.5% by mass was sprayed onto the aluminum plate having undergone the electrochemical roughening treatment at a temperature of 45° C., thereby performing an etching treatment. The amount of dissolved aluminum within the surface having undergone the electrochemical roughening treatment was 0.2 $g/m^2$. Then, a rinsing treatment was performed.

(e) Desmutting Treatment Using Aqueous Acidic Solution

Next, a desmutting treatment was performed using an aqueous acidic solution. Specifically, the desmutting treatment was performed for 3 seconds by spraying the aqueous acidic solution onto the aluminum plate. In the desmutting treatment, an aqueous solution having a sulfuric acid concentration of 170 g/L and an aluminum ion concentration of 5 g/L was used as aqueous acidic solution. The liquid temperature was 30° C.

(f) First-Stage Anodization Treatment

Figure 3:
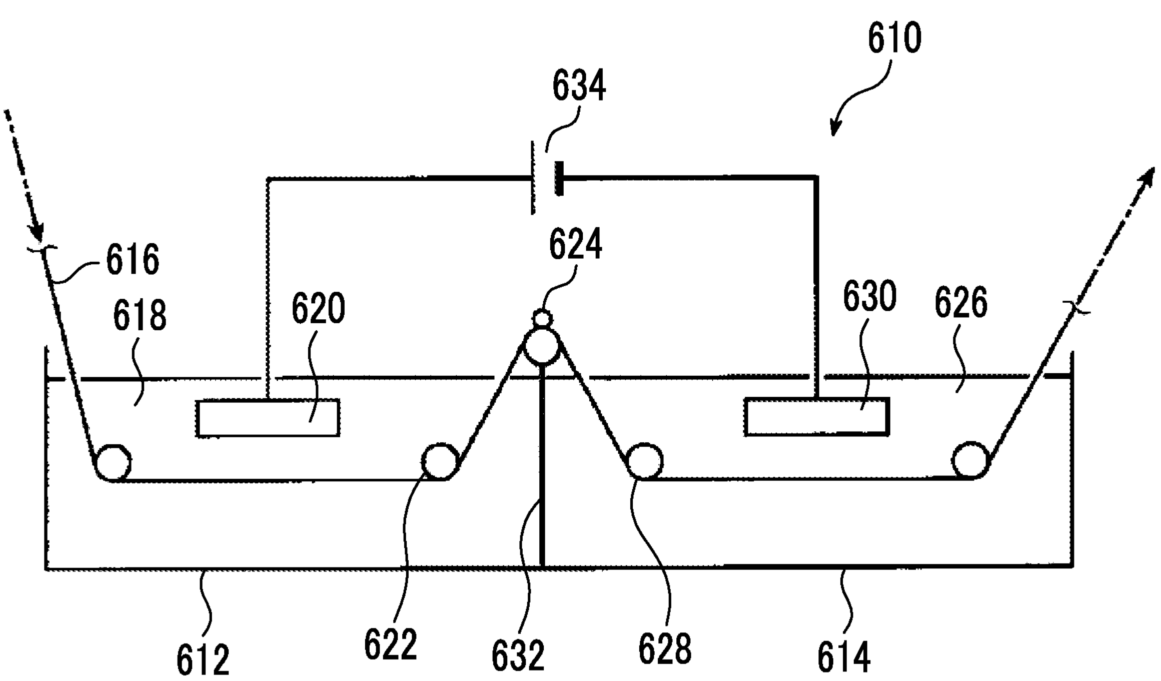
FIG. 3 is a schematic view of an anodization treatment device used for an anodization treatment in a manufacturing method of a support having an anodic oxide film.

By using an anodization treatment device 610 for direct current electrolysis having the structure shown in FIG. 3, a first-stage anodization treatment (also called first anodization treatment) was performed. Specifically, the first anodization treatment was performed under the conditions described in the column of "First anodization treatment" shown in the following Table 1, thereby forming an anodic oxide film having a predetermined film amount.

Hereinafter, the anodization treatment device 610 shown in FIG. 3 will be described.

In the anodization treatment device 610 shown in FIG. 3, an aluminum plate 616 is transported as indicated by the arrow in FIG. 3. In a power supply tank 612 containing an electrolytic solution 618, the aluminum plate 616 is positively (+) charged by a power supply electrode 620. Then, the aluminum plate 616 is transported upwards by a roller 622 in the power supply tank 612, makes a turn downwards by a nip roller 624, then transported toward an electrolytic treatment tank 614 containing an electrolytic solution 626, and makes a turn by a roller 628 to move in the horizontal direction. Subsequently, the aluminum plate 616 is negatively (−) charged by an electrolysis electrode 630. As a result, an anodic oxide film is formed on the surface of the aluminum plate 616. The aluminum plate 616 exits from the electrolytic treatment tank 614 and is then transported for the next step. In the anodization treatment device 610, the roller 622, the nip roller 624, and the roller 628 constitute a direction change unit. Furthermore, in the inter-tank portion between the power supply tank 612 and the electrolytic treatment tank 614, the aluminum plate 616 is transported in a ridge shape and an inverted U shape by the rollers 622, 624, and 628. The power supply electrode 620 and the electrolysis electrode 630 are connected to a direct current power source 634.

(g) Pore Widening Treatment

Under the conditions shown in the following Table 1, the aluminum plate having undergone the above anodization treatment was immersed in an aqueous solution of caustic soda at a temperature of 40° C. and having a caustic soda concentration of 5% by mass and an aluminum ion concentration of 0.5% by mass, thereby performing a pore widening treatment. Then, rinsing was performed by means of spraying.

(h) Second Anodization Treatment

By using the anodization treatment device 610 for direct current electrolysis having the structure shown in FIG. 3, a second-stage anodization treatment (also called second anodization treatment) was performed. Specifically, the second anodization treatment was performed under the conditions described in the column of "Second anodization treatment" shown in the following Table 1, thereby forming an anodic oxide film having a predetermined film amount.

By the above method, a support was prepared.

For the obtained support, Table 2 shows the brightness L* of the micropores within the surface of the anodic oxide film in the L*a*b* color system, the average diameter and depth of the large diameter portion of the micropores within the surface of the oxide film, the average diameter (nm) and depth of the small diameter portion of the micropores at a communicate position, the depth (nm) of the large diameter portion and the small diameter portion, the micropore density, and the thicknesses of the anodic oxide film (also called film thicknesses) from the bottom portion of the small diameter portion to the surface of the aluminum plate.

In Table 1, Film amount (AD) in the column of First anodization treatment and Film amount (AD) in the column of Second anodization treatment represent the amount of film obtained by each treatment. As electrolytic solutions, the aqueous solutions containing the components in Table 1 were used.

TABLE 1

| | First anodization treatment | | | | | | |
|---|---|---|---|---|---|---|---|
| | Liquid type | Liquid component | Liquid concentration (g/L) | Temperature (° C.) | Current density (Å/$dm^2$) | Time (s) | Film amount ($g/m^2$) |
| Support | Phosphoric acid | $H_3SO_4$ | 15 | 35 | 4.5 | 12 | 1 |

TABLE 1-continued

| Pore widening treatment | | |
|---|---|---|
| Liquid component | Temperature (° C.) | Time (s) |
| NaOH5 %/Al0.5 % | 40°C | 3s |

| Second anodization treatment | | | | | | |
|---|---|---|---|---|---|---|
| Liquid type | Liquid component | Liquid concentration (g/L) | Temperature (° C.) | Current density (Å/$dm^2$) | Time (s) | Film amount (g/$m^2$) |
| Sulfuric acid | $H_2SO_4$/A1 | 170/5 | 50 | 15 | 10.5 | 1.4 |

TABLE 2

| | Large diameter portion | | | | Small diameter portion | | | | | |
|---|---|---|---|---|---|---|---|---|---|---|
| Support | Average diameter (nm) | Average diameter of bottom portion (nm) | Shape | Depth (nm) | Average diameter at communicate position (nm) | Shape | Depth (nm) | Micropore density (number/µ$m^2$) | Film thickness (nm) | Brightness L* |
| | 35 | 35 | Straight tubular | 100 | 10 | Straight tubular | 570 | 320 | 1,000 | 80 |

<Formation of Undercoat Layer>

The obtained support was coated with the coating liquid for an undercoat layer having the following composition such that the dry coating amount was 0.1 g/$m^2$. In this way, an undercoat layer was formed.

[Coating Liquid for Undercoat Layer]

Compound for undercoat layer (U-1, 11% aqueous solution): 0.10502 parts

Sodium gluconate: 0.0700 parts

Surfactant (EMALEX (registered trademark) 710, NIHON EMULSION Co., Ltd.): 0.00159 parts Preservative (BIOHOPE L, manufactured by K•I Chemical Industry Co., LTD.): 0.00149 parts Water: 3.29000 parts (U-1)

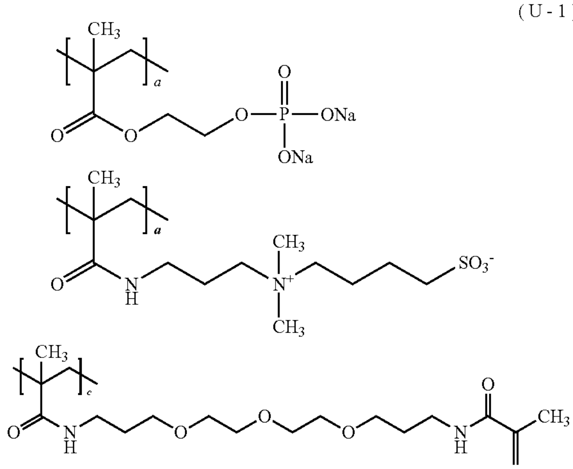

-continued

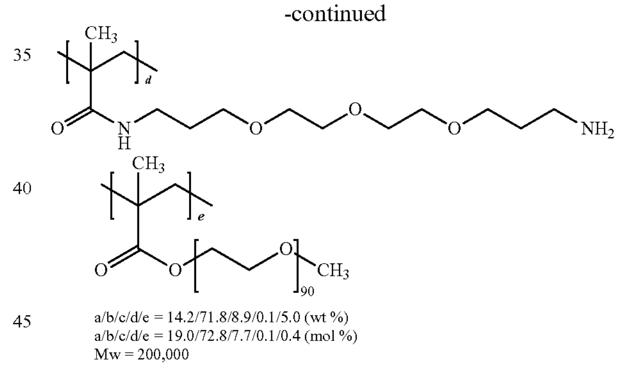

a/b/c/d/e = 14.2/71.8/8.9/0.1/5.0 (wt %)
a/b/c/d/e = 19.0/72.8/7.7/0.1/0.4 (mol %)
Mw = 200,000

<Formation of Image-Recording Layer>

The undercoat layer was bar-coated with the coating liquid for an image-recording layer, followed by drying in an oven at 120° C. for 40 seconds, thereby forming an image-recording layer having a dry coating amount of 1.0 g/$m^2$.

—Coating Liquid for Image-Recording Layer—

The following components were dissolved and dispersed in a mixed solvent of 1-methoxy-2-propanol (MFG):methyl ethyl ketone (MEK):methanol=4:4:1 (mass ratio), and the solid content was adjusted to 6% by mass, thereby preparing a coating liquid for an image-recording layer.

1 or 2 kinds of infrared absorbers listed in Table 3: amount that yields the content shown in Table 3 after drying Polymerization initiator IA-1 (the following compound, LUMO=−3.02 eV): 100 parts by mass Electron-donating polymerization initiator TPB (sodium tetraphenylborate, HOMO=−5.90 eV): 20 parts by mass Polymerizable compound M-1 (urethane (meth)acrylate oligomer, U-10HA (number of functional groups: 10), manufactured by SHIN-NAKAMURA CHEMICAL CO, LTD.): 500 parts by mass Polymerizable compound M-2 (bifunctional methacrylate compound, FST 510 manufactured by AZ Electronics (a reaction product of 1 molar equivalent of 2,2,4-trimethylhexamethylene diisocyanate and 2 molar equivalents of hydroxyethyl methacrylate, 82% by mass methyl ethyl ketone solution of compound having the following structure)): 250 parts by mass Polymerizable compound M-3 (ethoxylated bisphenol A dimethacrylate, compound having the following structure, BPE-80N manufactured by SHIN-NAKAMURA CHEMICAL CO, LTD.): 250 parts by mass Color developing agent shown in Table 3 (S-1 in Examples 1 to 20 and Comparative Examples 1 and 2, the following compound): 25 parts by mass Anionic surfactant A-1 (compound having the following structure): 25 parts by mass Fluorine-based surfactant W-1 (compound having the following structure, weight-average molecular weight: 13,000): 5 parts by mass <Formation of Outermost Layer>

In Examples 15 to 20 and 23 to 28, the image-recording layer was bar-coated with the following coating liquid for an outermost layer and dried in an oven at 120° C. for 60 seconds, thereby forming an outermost layer having a dry coating amount of 0.41 g/m$^2$.

Through the above steps, lithographic printing plate precursors of examples and comparative examples were obtained.

—Coating Liquid for Outermost Layer—

The following components were dissolved or dispersed in deionized water, the solid content was adjusted to 20% by mass, thereby preparing a coating liquid for an outermost layer.

Infrared absorber listed in Table 3: amount that yields the content shown in Table 3 after drying Water-soluble polymer (polyvinyl alcohol, Mowiol 4-88 manufactured by KURARAY CO., LTD.): 250 parts by mass Hydrophobic polymer (aqueous polyvinylidene chloride dispersion, Diofan (registered trademark) A50 manufactured by Solvin S.A.): 250 parts by mass

IA-1

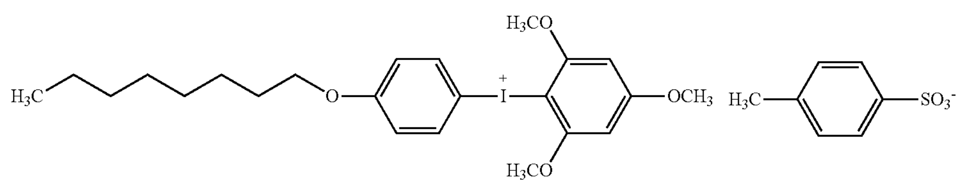

M-2

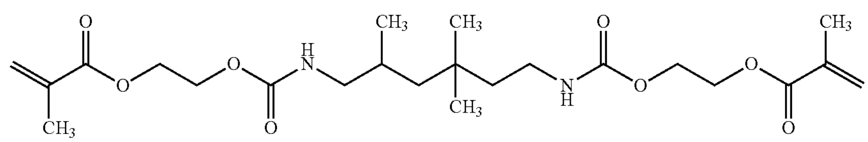

M-3

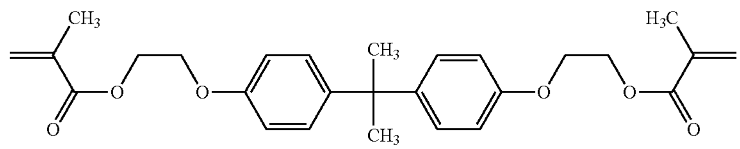

S-1

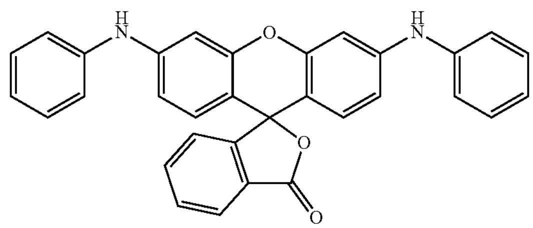

A-1

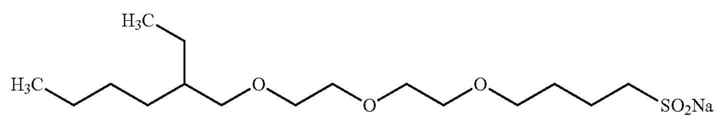

W-1

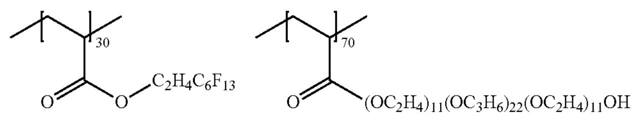

Mw = 13,000

Surfactant (nonionic surfactant, Lutensol (registered trademark) A8 manufactured by BASF SE): 10 parts by mass <Evaluation of Lithographic Printing Plate Precursor>

(1) Evaluation of Visibility

In Trendsetter 3244VX manufactured by CREO CO., LTD. that was equipped with a water cooling-type 40 W infrared semiconductor laser, each of the obtained lithographic printing plate precursors was exposed under the conditions of an output of 11.5 W, an outer drum rotation speed of 220 rpm, and a resolution of 2,400 dpi. The exposure was carried out in an environment of 25° C. and 50% RH.

For each of the lithographic printing plate precursor immediately after exposure (also called initial lithographic printing plate precursor) and the lithographic printing plate precursor stored for 24 days under the conditions of 25° C. and 70% RH after exposure (also called lithographic printing plate precursor after a lapse of time), color development was measured. The measurement was performed by the specular component excluded (SCE) method by using a spectrocolorimeter CM2600d and operation software CM-S100W manufactured by Konica Minolta, Inc. The visibility (temporal visibility) was evaluated by a difference ΔL' between an L* value of the exposed portion and an L* value of the non-exposed portion by using L* values (brightness) of the L*a*b* color system. It can be said that the higher the value of ΔL, the better the visibility. The results are shown in Table 3.

—Evaluation Standard—

3: ΔL is 5.0 or more.

2: ΔL is 3.0 or more and less than 5.0.

1: ΔL is less than 3.0.

(2) Evaluation of Storage Stability

By using Magnus 800 Quantum manufactured by Kodak Japan Ltd. that was equipped with an infrared semiconductor laser, the lithographic printing plate precursor prepared as above was exposed under the conditions of output of 27 W, an outer drum rotation speed of 450 rpm, and a resolution of 2,400 dots per inch (dpi, 1 inch is equal to 2.54 cm) (irradiation energy equivalent to 110 $mJ/cm^2$). The exposure image included a solid image and a 50% halftone dot chart of Amplitude Modulation Screen (AM screen).

The obtained exposed precursor was mounted on a Kikuban-sized cylinder of a printer SX-74 manufactured by Heidelberger Druckmaschinen AG without being developed. This printer was connected to a 100 L-capacity dampening water circulation tank having a non-woven fabric filter and a temperature control device. A circulation device was filled with dampening water (80 L) containing 2.0% dampening water S-Z1 (manufactured by FUJIFILM Corporation), and T&K UV OFS K-HS black GE-M (manufactured by T&K TOKA CO., LTD.) was used as printing ink. The dampening water and ink were supplied by a standard automatic printing start method, and then printing was performed on 200 sheets of TOKUBISHI art paper (ream weight: 76.5 kg, manufactured by MITSUBISHI PAPER MILLS LIMITED.) at a printing rate of 10,000 sheets/hour.

During the on-press development described above, the number of printing papers used until no ink was transferred to a non-image area was measured (hereinafter, also called number of sheets of on-press development). It can be said that the smaller the number of sheets of on-press development, the better the on-press developability.

The preparation of liquids and coating were performed for 2 days, the prepared precursor was stored for 3 days under the conditions of 60° C. and 60% RH, and then the number of sheets of on-press development was also measured as described above for the lithographic printing plate precursor (also called lithographic printing plate precursor after a lapse of time).

—Evaluation Standard (Evolution on 4 Levels)—

4: The number of sheets of on-press development is 20 or less.

3: The number of sheets of on-press development is more than 20 and 30 or less.

2: The number of sheets of on-press development is more than 30 and 50 or less.

1: The number of sheets of on-press development is more than 50.

(3) Evaluation of UV Printing Durability

By using Magnus 800 Quantum manufactured by Kodak Japan Ltd. that was equipped with an infrared semiconductor laser, the lithographic printing plate precursor prepared as above was exposed under the conditions of output of 27 W, an outer drum rotation speed of 450 rpm, and a resolution of 2,400 dpi (irradiation energy equivalent to 110 $mJ/cm^2$). The exposure image included a solid image and a 10% halftone dot chart of an AM screen.

The obtained exposed precursor was mounted on a Kikuban-sized cylinder of a printer SX-74 manufactured by Heidelberger Druckmaschinen AG without being developed. This printer was connected to a 100 L-capacity dampening water circulation tank having a non-woven fabric filter and a temperature control device. A circulation device was filled with dampening water (80 L) containing 2.0% dampening water S-Z1 (manufactured by FUJIFILM Corporation), and T&K UV OFS K-HS black GE-M (manufactured by T&K TOKA CO., LTD.) was used as printing ink. The dampening water and ink were supplied by a standard automatic printing start method, and then printing was performed on 500 sheets of TOKUBISHI art paper (ream weight: 76.5 kg, manufactured by MITSUBISHI PAPER MILLS LIMITED.) at a printing rate of 10,000 sheets/hour.

Then, printing was performed further. As the number of printing sheets increased, the image area gradually wore out, and thus the ink density on the printed matter decreased. The area ratio of the 10% halftone dot AM screen in the printed matter was measured using a Gretag density meter (manufactured by GretagMacbeth). The number of printing sheets at a point in time when the measured area ratio was 3% lower than the area ratio measured after 500 sheets were printed was adopted as the number of sheets of completed printing and used for evaluation of printing durability.

UV printing durability was evaluated according to the following standard, based on relative printing durability to 100 which represents the printing durability of a lithographic printing plate precursor capable of printing 50,000 sheets. The higher the numerical value, the better the printing durability. The evaluation results are described in Table 3.

Relative printing durability=(number of printing sheets obtained from subject lithographic printing plate precursor)/50,000×100

—Evaluation Standard—

3: The value of relative printing durability is more than 90.

2: The value of relative printing durability is more than 80 and 90 or less.

1: The value of relative printing durability is 80 or less.

TABLE 3

| | Image-recording layer | | | | | Outermost layer | | | Evaluation result | | |
|---|---|---|---|---|---|---|---|---|---|---|---|
| | Infrared absorber | | | | Color | Presence | Infrared absorber | | | | |
| | Type | Added amount ($mg/m^2$) | Type | Added amount ($mg/m^2$) | developing agent Type | or absence of outermost layer | Type | Added amount ($mg/m^2$) | Temporal visibility | Storage stability | UV printing durability |
| Example 1 | IR dye-4 | 20 | IR dye-5 | 20 | S-1 | Absent | — | — | 3 | 3 | 3 |
| Example 2 | IR dye-7 | 20 | IR dye-5 | 20 | S-1 | Absent | — | — | 3 | 3 | 3 |
| Example 3 | IR dye-8 | 20 | IR dye-5 | 20 | S-1 | Absent | — | — | 2 | 3 | 3 |
| Example 4 | IR dye-9 | 20 | IR dye-5 | 20 | S-1 | Absent | — | — | 2 | 3 | 3 |
| Example 5 | IR dye-10 | 20 | IR dye-5 | 20 | S-1 | Absent | — | — | 2 | 3 | 3 |
| Example 6 | IR dye-3 | 20 | IR dye-5 | 20 | S-1 | Absent | — | — | 2 | 3 | 3 |
| Example 7 | IR dye-6 | 20 | IR dye-5 | 20 | S-1 | Absent | — | — | 2 | 3 | 3 |
| Example 8 | IR dye-3 | 20 | IR dye-6 | 20 | S-1 | Absent | — | — | 2 | 2 | 3 |
| Example 9 | IR dye-3 | 6 | IR dye-5 | 20 | S-1 | Absent | — | — | 2 | 3 | 2 |
| Example 10 | IR dye-3 | 6 | IR dye-5 | 20 | S-1 | Present | — | — | 2 | 2 | 3 |
| Example 11 | IR dye-3 | 6 | IR dye-5 | 20 | S-16 | Absent | — | — | 2 | 3 | 2 |
| Example 12 | IR dye-3 | 6 | IR dye-5 | 20 | S-17 | Absent | — | — | 2 | 3 | 2 |
| Example 13 | IR dye-3 | 6 | IR dye-5 | 20 | S-16 | Present | — | — | 2 | 2 | 3 |
| Example 14 | IR dye-3 | 6 | IR dye-5 | 20 | S-17 | Present | — | — | 2 | 2 | 3 |
| Comparative Example 1 | IR dye-3 | 20 | — | — | — | Absent | — | — | 1 | 3 | 2 |
| Comparative Example 2 | IR dye-3 | 40 | — | — | — | Absent | — | — | 2 | 1 | 2 |
| Example 15 | IR dye-2 | 20 | IR dye-5 | 5 | s-1 | Present | IR dye-1 | 15 | 3 | 4 | 2 |
| Example 16 | IR dye-2 | 20 | IR dye-7 | 5 | s-1 | Present | IR dye-1 | 15 | 3 | 4 | 2 |
| Example 17 | IR dye-4 | 20 | IR dye-5 | 5 | s-1 | Present | IR dye-1 | 15 | 3 | 4 | 3 |
| Example 18 | IR dye-7 | 20 | — | — | S-1 | Present | IR dye-1 | 20 | 3 | 4 | 2 |
| Example 19 | IR dye-7 | 20 | IR dye-5 | 5 | s-1 | Present | IR dye-1 | 15 | 3 | 4 | 2 |
| Example 20 | IR dye-8 | 20 | IR dye-5 | 5 | S-1 | Present | IR dye-1 | 15 | 3 | 4 | 2 |
| Example 21 | IR dye-2 | 20 | IR dye-5 | 20 | S-1 | Absent | — | — | 3 | 3 | 3 |

TABLE 3-continued

| | Image-recording layer | | | | | Outermost layer | | | Evaluation result | | |
|---|---|---|---|---|---|---|---|---|---|---|---|
| | Infrared absorber | | | | Color | Presence | Infrared absorber | | | | |
| | Type | Added amount ($mg/m^2$) | Type | Added amount ($mg/m^2$) | developing agent Type | or absence of outermost layer | Type | Added amount ($mg/m^2$) | Temporal visibility | Storage stability | UV printing durability |
| Example 22 | IR dye-2 | 20 | IR dye-7 | 20 | S-1 | Absent | — | — | 3 | 3 | 3 |
| Example 23 | IR dye-11 | 20 | — | — | S-1 | Present | IR dye-1 | 20 | 3 | 4 | 2 |
| Example 24 | IR dye-11 | 20 | IR dye-5 | 5 | S-1 | Present | IR dye-1 | 15 | 3 | 4 | 2 |
| Example 25 | IR dye-2 | 20 | IR dye-5 | 5 | S-16 | Present | IR dye-1 | 15 | 3 | 4 | 2 |
| Example 26 | IR dye-2 | 20 | IR dye-5 | 5 | S-17 | Present | IR dye-1 | 15 | 3 | 4 | 2 |
| Example 27 | IR dye-7 | 20 | — | — | S-16 | Present | IR dye-1 | 20 | 3 | 4 | 2 |
| Example 28 | IR dye-7 | 20 | — | — | S-17 | Present | IR dye-1 | 20 | 3 | 4 | 2 |

Details of each component used in Table 3 are as follows.

<Infrared Absorber>

IR dye-1: decomposition and color development-type infrared absorber, compound having the following structure, λmax=770 nm IR dye-2: decomposition and color development-type infrared absorber, compound having the following structure, λmax=830 nm IR dye-3: non-decomposition-type infrared absorber, compound having the following structure, λmax=794 nm IR dye-4: decomposition and color development-type infrared absorber, compound having the following structure, λmax=800 nm IR dye-5: non-decomposition-type infrared absorber, compound having the following structure, λmax=844 nm IR dye-6: non-decomposition-type infrared absorber, compound having the following structure, λmax=812 nm IR dye-7: decomposition and color development-type infrared absorber, compound having the following structure, λmax=830 nm IR dye-8: non-decomposition-type infrared absorber, compound having the following structure, λmax=819 nm IR dye-9: non-decomposition-type infrared absorber, compound having the following structure, λmax=805 nm IR dye-10: non-decomposition-type infrared absorber, compound having the following structure, λmax=803 nm IR dye-11: non-decomposition-type infrared absorber, compound having the following structure, λmax=791 nm IR dye-1

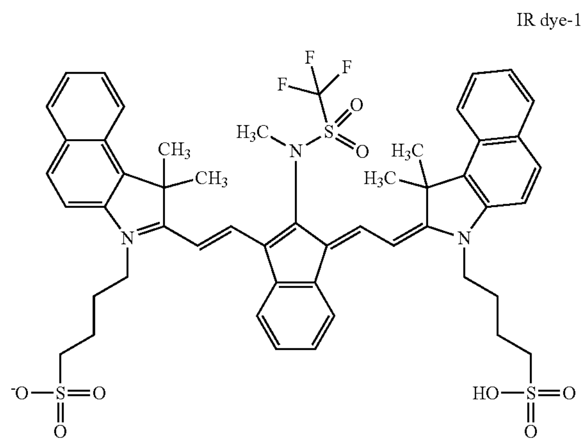

IR dye-2

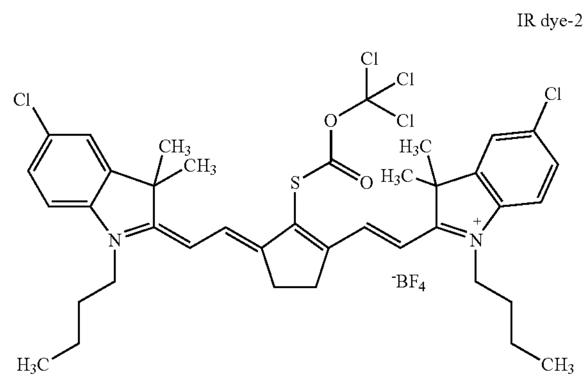

-continued
IR dye-3
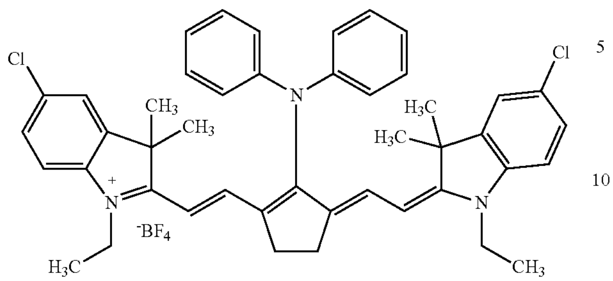
IR dye-4
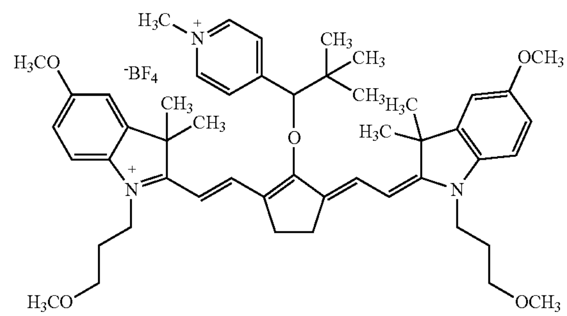
IR dye-5
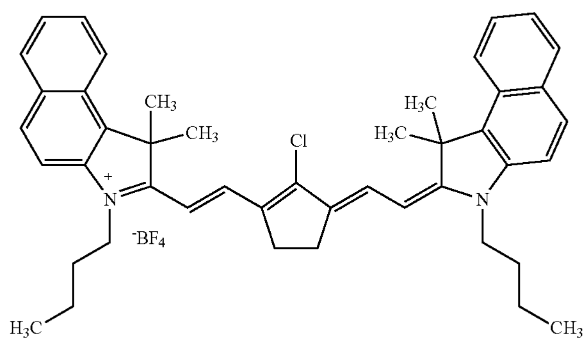
IR dye-6
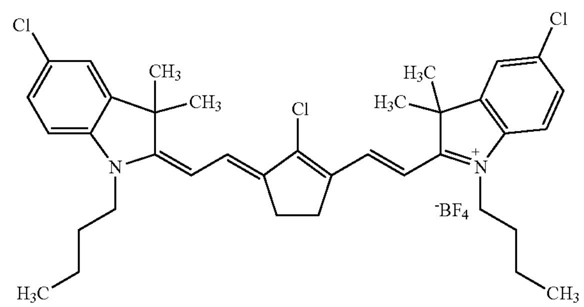
-continued
IR dye-7
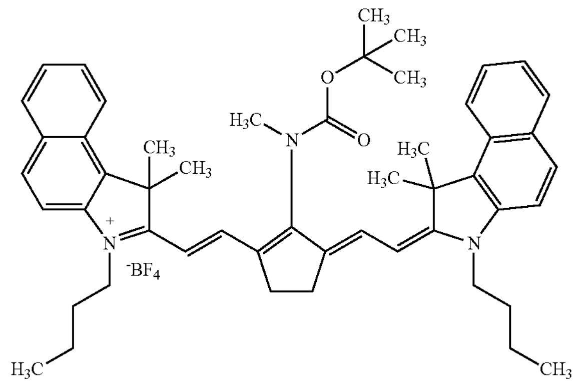
IR dye-8
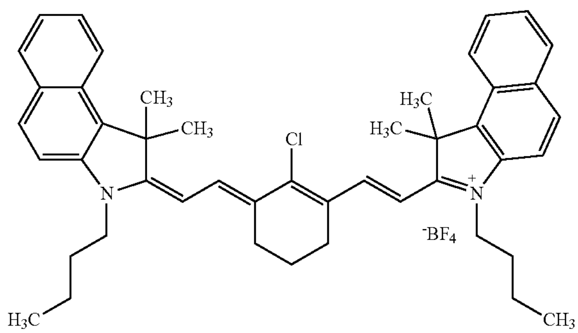
IR dye-9
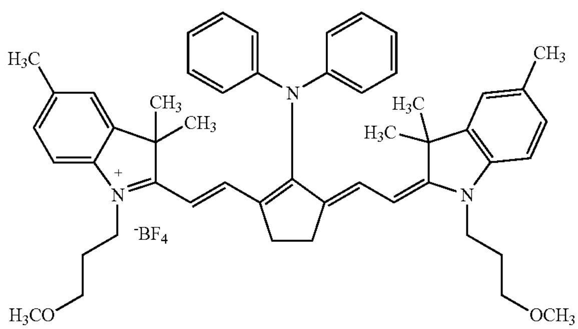
IR dye-10
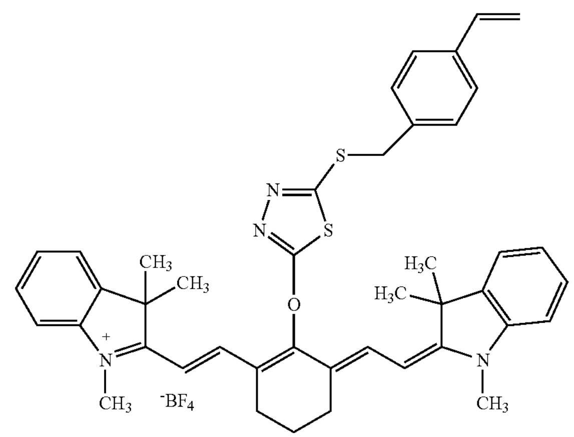

-continued

IR dye-11

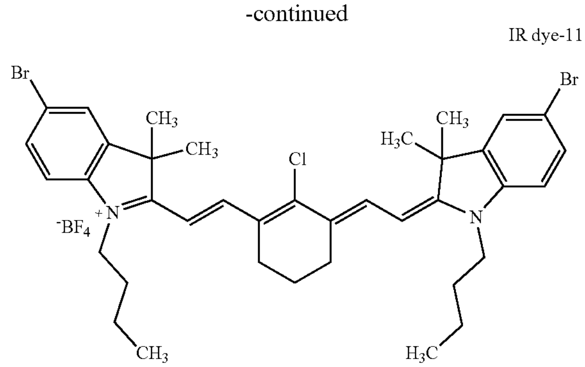

S-16: S-16 described above

S-17: S-17 described above

As is evident from Table 3, compared to the lithographic printing plates obtained from the lithographic printing plate precursors according to comparative examples, the lithographic printing plates obtained from the lithographic printing plate precursors according to examples are better in visibility of exposed portions after a lapse of time and in storage stability.

Furthermore, it has been revealed that the lithographic printing plates obtained from the lithographic printing plate precursors according to examples are also excellent in UV printing durability.

<Preparation of Coating Liquid for Undercoat Layer 1>

The following components were mixed together, thereby preparing a coating liquid 1 for an undercoat layer.

- Compound for undercoat layer (the above U-1, 11% aqueous solution): 0.0788 parts
- Hydroxyethyl diiminodiacetic acid: 0.0280 parts
- Sodium ethylenediaminetetraacetate tetrahydrate: 0.0499 parts
- Surfactant (EMALEX (registered trademark) 710, NIHON EMULSION Co., Ltd.): 0.0016 parts
- Preservative (BIOHOPE L, manufactured by K•I Chemical Industry Co., LTD.): 0.0015 parts
- Water: 2.8701 parts <Preparation of Coating Liquid 2 for Undercoat Layer>

The following components were mixed together, thereby preparing a coating liquid 2 for an undercoat layer.

- Compound for undercoat layer (the above U-1, 11% aqueous solution): 0.0788 parts
- Sodium gluconate: 0.0700 parts
- Surfactant (EMALEX (registered trademark) 710, NIHON EMULSION Co., Ltd.): 0.0016 parts
- Preservative (BIOHOPE L, manufactured by K•I Chemical Industry Co., LTD.): 0.0015 parts
- Water: 2.8780 parts <Preparation of Coating Liquid 1 for Image-Recording Layer>

The following components were mixed together, thereby preparing a coating liquid 1 for an image-recording layer.

- Two kinds of infrared absorbers shown in Table 4: amount that yields the content shown in Table 4 after drying
- Color developing agent (S-22): 0.0120 parts
- Color developing agent (S-16): 0.0300 parts
- Electron-accepting polymerization initiator (IA-1): 0.0981 parts
- Electron-donating polymerization initiator (TPB): 0.0270 parts
- Polymerizable compound (M-4): 0.3536 parts
- Tricresyl phosphate: 0.0450 parts

- Anionic surfactant (A-1): 0.0162 parts
- Fluorine-based surfactant (W-1): 0.0042 parts
- 2-Butanone: 5.3155 parts
- 1-Methoxy-2-propanol: 2.8825 parts
- Methanol: 2.3391 parts
- Microgel liquid 1: 2.8779 parts IR dye-12: non-decomposition-type infrared absorber, compound having the following structure, λmax=819 nm IR dye - 12

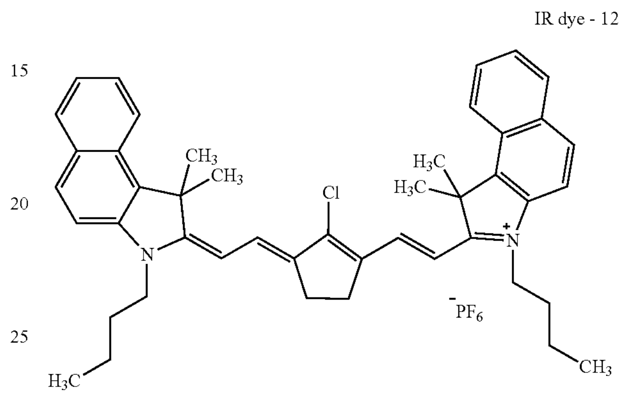

[Synthesis Method of Polymerizable Compound (M-4)]

A mixed solution of TAKENATE D-160N (polyisocyanate trimethylolpropane adduct, manufactured by Mitsui Chemicals, Inc., 4.7 parts), ARONIX M-403 (manufactured by TOAGOSEI CO., LTD., amount yielding the ratio of NCO value of TAKENATE D-160N:hydroxyl number of ARONIX M-403=1:1), t-butylbenzoquinone (0.02 parts), and methyl ethyl ketone (11.5 parts) was heated at 65° C. NEOSTANN U-600 (bismuth-based polycondensation catalyst, manufactured by NITTO KASEI CO., LTD., 0.11 parts) was added to the reaction solution, and the reaction solution was heated at 65° C. for 4 hours. The reaction solution was cooled to room temperature (25° C.), and methyl ethyl ketone was added thereto, thereby synthesizing a urethane acrylate (M-4) solution having a solid content of 50% by mass. By using recycling GPC (instrument: LC908-C60, column: JAIGEL-1H-40 and 2H-40 (manufactured by Japan Analytical Industry Co., Ltd.)) and tetrahydrofuran (THF) as an eluent, molecular weight fractionation of the urethane acrylate solution was performed. The weight-average molecular weight was 20,000.

[Synthesis Method of Microgel Liquid 1]

—Preparation of Oil-Phase Component—

A polyfunctional isocyanate compound (PM-200: manufactured by Wanhua Chemical Group Co., Ltd.: 6.66 g, a 50% by mass ethyl acetate solution of "TAKENATE (registered trademark) D-116N (adduct of trimethylolpropane (TMP), m-xylylene diisocyanate (XDI), and polyethylene glycol monomethyl ether (E090) (following structure)" manufactured by Mitsui Chemicals, Inc.: 5.46 g, a 65% by mass ethyl acetate solution of dipentaerythritol pentaacrylate (SR-399, manufactured by Sartomer Company Inc.): 11.24 g, ethyl acetate: 14.47 g, and PIONIN (registered trademark) A-41-C manufactured by TAKEMOTO OIL & FAT Co., Ltd.: 0.45 g were mixed together and stirred at room temperature (25° C.) for 15 minutes, thereby obtaining an oil-phase component.

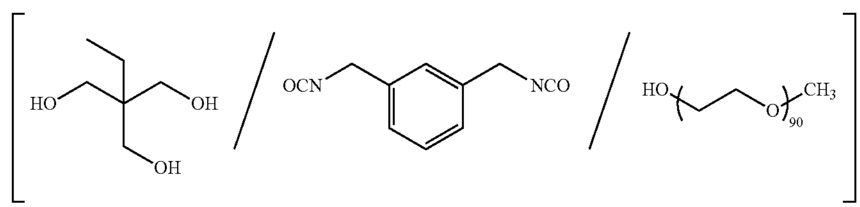

D-116N

—Preparation of Water-Phase Component—

As a water-phase component, 47.2 g of distilled water was prepared.

—Microcapsule Forming Step—

The oil-phase component and the water-phase component were mixed together, and the obtained mixture was emulsified at 12,000 rpm for 16 minutes by using a homogenizer, thereby obtaining an emulsion.

Distilled water (16.8 g) was added to the obtained emulsion, and the obtained liquid was stirred at room temperature for 10 minutes.

After stirring, the liquid was heated at 45° C., and stirred for 4 hours in a state of being kept at 45° C. such that ethyl acetate was distilled away from the liquid. Then, a 10% by mass aqueous solution of 5.12 g of 1,8-diazabicyclo[5.4.0]undec-7-ene-octylate (U-CAT SA102, manufactured by San-Apro Ltd.) was added thereto, and the solution was stirred at room temperature for 30 minutes and left to stand at 45° C. for 24 hours. Distilled water was added thereto such that the concentration of solid contents was adjusted to 20% by mass, thereby obtaining an aqueous dispersion of a microgel 1. The microgel 1 had a volume average particle diameter of 165 nm that was measured using a laser diffraction/scattering-type particle diameter distribution analyzer LA-920 (manufactured by HORIBA, Ltd.).

<Preparation of Coating Liquid 2 for Image-Recording Layer>

The following components were mixed together, thereby preparing a coating liquid 2 for an image-recording layer.

- Two kinds of infrared absorbers shown in Table 4: amount that yields the content shown in Table 4 after drying
- Color developing agent (S-22 (S-22 described above)): 0.0120 parts
- Color developing agent (S-16 (S-16 described above)): 0.0300 parts
- Electron-accepting polymerization initiator (IA-1): 0.0981 parts
- Electron-donating polymerization initiator (TPB): 0.0270 parts
- Polymerizable compound (M-4): 0.3536 parts
- Tricresyl phosphate: 0.0125 parts
- Anionic surfactant (A-1): 0.0162 parts
- Pionin A-41-C (manufactured by TAKEMOTO OIL & FAT Co., Ltd., 70% methanol solution): 0.0081 parts
- Fluorine-based surfactant (W-1): 0.0042 parts
- 2-Butanone: 5.3155 parts
- 1-Methoxy-2-propanol: 2.8825 parts
- Methanol: 2.3391 parts
- Microgel liquid 1: 2.8779 parts <Preparation of Coating Liquid 1 for Outermost Layer>

The following components were mixed together, thereby preparing a coating liquid 1 for an outermost layer.

- Water: 1.0161 parts
- METOLOSE SMO4 (methyl cellulose, manufactured by Shin-Etsu Chemical Co., Ltd., methoxy substitution degree=1.8): 0.0600 parts
- FS-102 (styrene-acrylic resin, manufactured by Nippon-paint Industrial Coatings Co., LTD., Tg=103° C., 17% aqueous dispersion liquid): 0.1177 parts
- RAPISOL A-80 (anionic surfactant, manufactured by NOF CORPORATION, 80% aqueous solution): 0.0063 parts

Example 29

A lithographic printing plate precursor was prepared and evaluated in the same manner as in Example 15, except that the coating liquid 1 for an undercoat layer was used instead of the coating liquid for an undercoat layer, the coating liquid 1 for an image-recording layer was used instead of the coating liquid for an image-recording layer, and the coating liquid 1 for an outermost layer was used instead of the coating liquid for an outermost layer. The evaluation results are shown in Table 4.

Example 30

A lithographic printing plate precursor was prepared and evaluated in the same manner as in Example 15, except that the coating liquid 2 for an undercoat layer was used instead of the coating liquid for an undercoat layer, the coating liquid 1 for an image-recording layer was used instead of the coating liquid for an image-recording layer, and the coating liquid 1 for an outermost layer was used instead of the coating liquid for an outermost layer. The evaluation results are shown in Table 4.

Example 31

A lithographic printing plate precursor was prepared and evaluated in the same manner as in Example 15, except that the coating liquid 1 for an undercoat layer was used instead of the coating liquid for an undercoat layer, the coating liquid 2 for an image-recording layer was used instead of the coating liquid for an image-recording layer, and the coating liquid 1 for an outermost layer was used instead of the coating liquid for an outermost layer. The evaluation results are shown in Table 4.

TABLE 4

| | Image-recording layer | | | | | Outermost layer | | | Evaluation result | | |
|---|---|---|---|---|---|---|---|---|---|---|---|
| | Infrared absorber | | | | Color developing agent | Presence or absence of outermost layer | Infrared absorber | | | | |
| | Type | Added amount (mg/m²) | Type | Added amount (mg/m²) | Type | | Type | Added amount (mg/m²) | Temporal visibility | Storage stability | UV printing durability |
| Example 29 | IR dye-3 | 20.2 | IR dye-12 | 6.8 | S-22, S-16 | Present | — | — | 2 | 3 | 3 |
| Example 30 | IR dye-3 | 20.2 | IR dye-12 | 6.8 | S-22, S-16 | Present | — | — | 2 | 3 | 3 |
| Example 31 | IR dye-3 | 20.2 | IR dye-12 | 6.8 | S-22, S-16 | Present | — | — | 2 | 3 | 3 |

As is evident from Table 4, the lithographic printing plates obtained from the lithographic printing plate precursors according to examples are excellent in visibility of exposed portions after a lapse of time and in storage stability.

Furthermore, it has been revealed that the lithographic printing plates obtained from the lithographic printing plate precursors according to examples are also excellent in UV printing durability.

Example 32

A lithographic printing plate precursor was prepared and evaluated in the same manner as in Example 15, except that the coating liquid 1 for an undercoat layer was used instead of the coating liquid for an undercoat layer, the coating liquid 1 for an image-recording layer was used instead of the coating liquid for an image-recording layer, the type of color developing agent was changed to S-23 (S-23 described above), and the coating liquid 1 for an outermost layer was used instead of the coating liquid for an outermost layer.

Table 5 shows the evaluation results.

Example 33

A lithographic printing plate precursor was prepared and evaluated in the same manner as in Example 15, except that the coating liquid 1 for an undercoat layer was used instead of the coating liquid for an undercoat layer, the coating liquid 1 for an image-recording layer was used instead of the coating liquid for an image-recording layer, the type of color developing agent was changed to S-23, and coating for forming an outermost layer was not performed.

Table 5 shows the evaluation results.

Example 34

A lithographic printing plate precursor was prepared and evaluated in the same manner as in Example 15, except that the coating liquid 1 for an undercoat layer was used instead of the coating liquid for an undercoat layer, the coating liquid 1 for an image-recording layer was used instead of the coating liquid for an image-recording layer, the type of color developing agent was changed to S-23.

Table 5 shows the evaluation results.

Example 35

A lithographic printing plate precursor was prepared and evaluated in the same manner as in Example 15, except that the coating liquid 1 for an undercoat layer was used instead of the coating liquid for an undercoat layer, the coating liquid 1 for an image-recording layer was used instead of the coating liquid for an image-recording layer, the type of polymerization initiator was changed to IA-6, and the type of color developing agent was changed to S-23.

Table 5 shows the evaluation results.

IA - 6

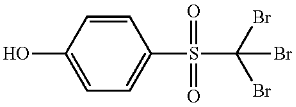

Example 36

A lithographic printing plate precursor was prepared and evaluated in the same manner as in Example 15, except that the coating liquid 1 for an undercoat layer was used instead of the coating liquid for an undercoat layer, the coating liquid 1 for an image-recording layer was used instead of the coating liquid for an image-recording layer, the type of polymerization initiator was changed to the above IA-6, and the type of color developing agent was changed to S-23.

Table 5 shows the evaluation results.

TABLE 5

| | Image-recording layer | | | | | Outermost layer | | | | | |
|---|---|---|---|---|---|---|---|---|---|---|---|
| | Infrared absorber | | | | Color | Presence or absence | Infrared absorber | | Evaluation result | | |
| | Type | Added amount ($mg/m^2$) | Type | Added amount ($mg/m^2$) | developing agent Type | of outermost layer | Type | Added amount ($mg/m^2$) | Temporal visibility | Storage stability | UV printing durability |
| Example 32 | IR dye-3 | 20.2 | IR dye-12 | 6.8 | S-23 | Present | — | — | 2 | 3 | 3 |
| Example 33 | IR dye-3 | 20.2 | IR dye-12 | 6.8 | S-23 | Absent | — | — | 2 | 4 | 2 |
| Example 34 | IR dye-3 | 20.2 | IR dye-12 | 6.8 | S-23 | Present | IR dye-1 | 15 | 3 | 4 | 3 |
| Example 35 | IR dye-3 | 20.2 | IR dye-12 | 6.8 | S-23 | Present | IR dye-1 | 15 | 3 | 4 | 3 |
| Example 36 | IR dye-3 | 20.2 | IR dye-12 | 6.8 | S-14 | Present | IR dye-1 | 15 | 3 | 4 | 4 |

As is evident from Table 5, the lithographic printing plates obtained from the lithographic printing plate precursors according to examples are excellent in visibility of exposed portions after a lapse of time and in storage stability.

Furthermore, it has been revealed that the lithographic printing plates obtained from the lithographic printing plate precursors according to examples are also excellent in UV printing durability.

<Preparation of Coating Liquid 3 for Image-Recording Layer>

The following components were mixed together, thereby preparing a coating liquid 1 for an image-recording layer.

Two kinds of infrared absorbers shown in Table 6: amount that yields the content shown in Table 6 after drying Color developing agent (S-22 (S-22 described above)): 0.0600 parts Color developing agent (S-16 (S-16 described above)): 0.0300 parts Electron-accepting polymerization initiator (IA-1): 0.0981 parts Electron-donating polymerization initiator (TPB): 0.0270 parts Polymerizable compound (M-4): 0.3536 parts Tricresyl phosphate: 0.0450 parts Anionic surfactant (A-1): 0.0162 parts Fluorine-based surfactant (W-1): 0.0042 parts 2-Butanone: 5.3155 parts 1-Methoxy-2-propanol: 2.8825 parts Methanol: 2.3391 parts Microgel liquid 1: 2.8779 parts

Example 37

A lithographic printing plate precursor was prepared and evaluated in the same manner as in Example 15, except that the coating liquid 1 for an undercoat layer was used instead of the coating liquid for an undercoat layer, the coating liquid 3 for an image-recording layer was used instead of the coating liquid for an image-recording layer.

Table 6 shows the evaluation results.

Example 38

A lithographic printing plate precursor was prepared and evaluated in the same manner as in Example 15, except that the coating liquid 1 for an undercoat layer was used instead of the coating liquid for an undercoat layer, the coating liquid 3 for an image-recording layer was used instead of the coating liquid for an image-recording layer, and an infrared absorber was not added to the coating liquid for an outermost layer.

Table 6 shows the evaluation results.

Example 39

A lithographic printing plate precursor was prepared and evaluated in the same manner as in Example 15, except that the coating liquid 1 for an undercoat layer was used instead of the coating liquid for an undercoat layer, the coating liquid 3 for an image-recording layer was used instead of the coating liquid for an image-recording layer, and coating for forming an outermost layer was not performed.

Table 6 shows the evaluation results.

Example 40

A lithographic printing plate precursor was prepared and evaluated in the same manner as in Example 15, except that the coating liquid 1 for an undercoat layer was used instead of the coating liquid for an undercoat layer, the coating liquid 3 for an image-recording layer was used instead of the coating liquid for an image-recording layer.

Table 6 shows the evaluation results.

Example 41

A lithographic printing plate precursor was prepared and evaluated in the same manner as in Example 15, except that the coating liquid 1 for an undercoat layer was used instead of the coating liquid for an undercoat layer, a coating liquid 3 for an image-recording layer was used instead of the coating liquid for an image-recording layer, and the color developing agent S-16 was changed to S-23. Table 6 shows the evaluation results.

TABLE 6

| | Image-recording layer | | | | | Outermost layer | | | Evaluation result | | |
|---|---|---|---|---|---|---|---|---|---|---|---|
| | Infrared absorber | | | | Color developing agent | Presence or absence of outermost layer | Infrared absorber | | | | |
| | Type | Added amount ($mg/m^2$) | Type | Added amount ($mg/m^2$) | Type | | Type | Added amount ($mg/m^2$) | Temporal visibility | Storage stability | UV printing durability |
| Example 37 | IR dye-2 | 20 | IR dye-5 | 5 | S-22, S-16 | Present | IR dye-1 | 15 | 3 | 4 | 2 |
| Example 38 | IR dye-3 | 20.2 | IR dye-12 | 6.8 | S-22, S-16 | Present | — | — | 2 | 3 | 3 |
| Example 39 | IR dye-3 | 20.2 | IR dye-12 | 6.8 | S-22, S-16 | Absent | — | — | 2 | 4 | 2 |
| Example 40 | IR dye-3 | 20.2 | IR dye-12 | 6.8 | S-22, S-16 | Present | IR dye-1 | 15 | 3 | 4 | 3 |
| Example 41 | IR dye-3 | 20.2 | IR dye-12 | 6.8 | S-22, S-23 | Present | IR dye-1 | 15 | 3 | 4 | 3 |

As is evident from Table 6, the lithographic printing plates obtained from the lithographic printing plate precursors according to examples are excellent in visibility of exposed portions after a lapse of time and in storage stability.

Furthermore, it has been revealed that the lithographic printing plates obtained from the lithographic printing plate precursors according to examples are also excellent in UV printing durability.

The entirety of the disclosure of Japanese Patent Application No. 2020-124466 filed on Jul. 21, 2020, disclosure of Japanese Patent Application No. 2021-002134 filed on Jan. 8, 2021, and disclosure of Japanese Patent Application No. 2021-061163 filed on Mar. 31, 2021 is incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

EXPLANATION OF REFERENCES

12*a*, 12*b*: aluminum support
14: undercoat layer
16: image-recording layer
18: aluminum plate
20*a*, 20*b*: anodic oxide film
22*a*, 22*b*: micropores
24: large diameter portion
26: small diameter portion
D: depth of large diameter portion
610: anodization treatment device
612: power supply tank
614: electrolytic treatment tank
616: aluminum plate
618, 26: electrolytic solution
620: power supply electrode
622, 628: roller
624: nip roller
630: electrolysis electrode
632: cell wall
634: direct current power source

What is claimed is:

1. An on-press development type lithographic printing plate precursor comprising:

an image-recording layer on a support, said image-recording layer containing an infrared absorber A; and an infrared absorber B, wherein a maximum absorption wavelength of the infrared absorber A is different from a maximum absorption wavelength of the infrared absorber B, and in a case where the on-press development type lithographic printing plate precursor is subjected to exposure to infrared having a wavelength of 830 nm at an energy density of 110 $mJ/cm^2$, in a portion subjected to the exposure, a brightness change $\Delta L$ before the exposure and after storage subsequent to the exposure for 24 hours under conditions of 25° C. and 70% RH is 3.0 or more.

2. The on-press development type lithographic printing plate precursor according to claim 1, wherein the maximum absorption wavelength of the infrared absorber A is more than 830 nm.

3. The on-press development type lithographic printing plate precursor according to claim 1, wherein the maximum absorption wavelength of the infrared absorber B is 830 nm or less.

4. The on-press development type lithographic printing plate precursor according to claim 1, wherein a difference between the maximum absorption wavelength of the infrared absorber A and the maximum absorption wavelength of the infrared absorber B is 5 nm to 50 nm.

5. The on-press development type lithographic printing plate precursor according to claim 1, wherein the infrared absorber B is a decomposition-type infrared absorber that decomposes due to exposure to infrared.

6. The on-press development type lithographic printing plate precursor according to claim 5, wherein the decomposition-type infrared absorber is a compound represented by Formula 1-1, Formula 1 - 1

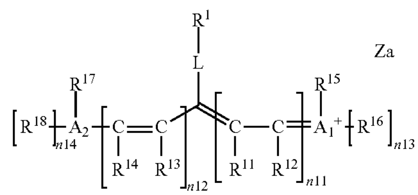

in Formula 1-1, $R^1$ represents a group that is represented by any of Formula 2-1 to Formula 4-1, $R^{11}$ to $R^{18}$ each independently represent a hydrogen atom, a halogen atom, —$R^a$, —$OR^b$, —$SR^c$, or —$NR^dR^e$, $R^d$ to $R^e$ each independently represent a hydrocarbon group, $A_1$, $A_2$, and a plurality of $R^{11}$ to $R^{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, a sum of $n_{11}$ and $n_{12}$ is 2 or more, $n_{13}$ and $n_{14}$ each independently represent 0 or 1, L represents an oxygen atom, a sulfur atom, or —$N(R^{10})$—, $R^{10}$ represents a hydrogen atom, an alkyl group, or an aryl group, and Za represents a counterion that neutralizes charge, Formula 2-1

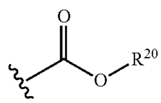

Formula 3-1

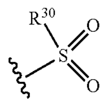

Formula 4-1

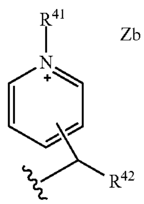

in Formula 2-1 to Formula 4-1, $R^{20}$, $R^{30}$, $R^{41}$, and $R^{42}$ each independently represent an alkyl group or an aryl group, Zb represents a counterion that neutralizes charge, and a wavy line represents a bonding site with a group represented by L in Formula 1-1.

7. The on-press development type lithographic printing plate precursor according to claim 6, wherein the decomposition-type infrared absorber is a compound represented by Formula 1-2, Formula 1-2

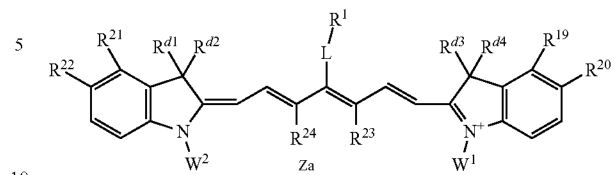

in Formula 1-2, $R^1$ represents a group that is represented by any of Formula 2-1 to Formula 4-1 as defined in claim 6, $R^{19}$ to $R^{22}$ each independently represent a hydrogen atom, a halogen atom, —$R^a$, —$OR^b$, —CN, —$SR^c$, or —$NR^dR^e$, $R^{23}$ and $R^{24}$ each independently represent —$R^a$, $R^a$ to $R^e$ each independently represent a hydrocarbon group, $R^{19}$ and $R^{20}$, $R^{21}$ and $R^{22}$, or $R^{23}$ and $R^{24}$ may be linked to each other to form a monocyclic or polycyclic ring, L represents an oxygen atom, a sulfur atom, or —$N(R^{10})$—, $R^{10}$ represents a hydrogen atom, an alkyl group, or an aryl group, $R^{d1}$ to $R^{44}$, $W^1$, and $W^2$ each independently represent an alkyl group which may have a substituent, and Za represents a counterion that neutralizes charge.

8. The on-press development type lithographic printing plate precursor according to claim 6, wherein the decomposition-type infrared absorber is a compound represented by any of Formula 1-3 to Formula 1-7, Formula 1-3

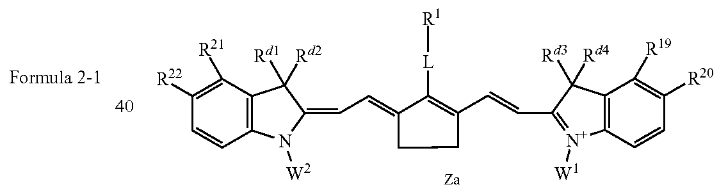

Formula 1-4

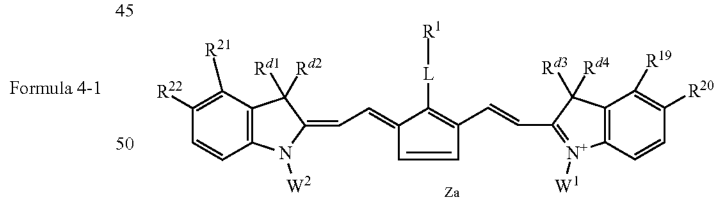

Formula 1-5

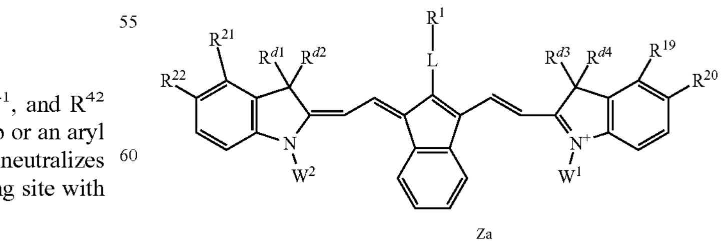

-continued

Formula 1-6

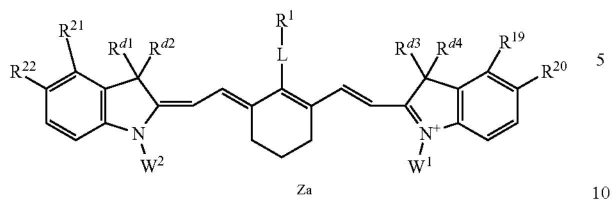

Formula 1-7

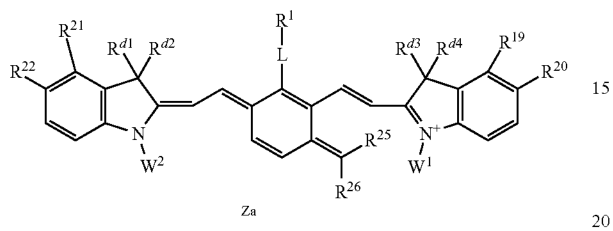

in Formula 1-3 to Formula 1-7, $R^1$ represents a group that is represented by any of Formula 2-1 to Formula 4-1 as defined in claims 6, $R^{19}$ to $R^{22}$ each independently represent a hydrogen atom, a halogen atom, —$R^a$, —$OR^b$, —CN, —$SR^c$, or —$NR^dR^e$, $R^{25}$ and $R^{26}$ each independently represent a hydrogen atom, a halogen atom, or —$R^a$, $R^a$ to $R^e$ each independently represent a hydrocarbon group, $R^{19}$ and $R^{20}$, $R^{21}$ and $R^{22}$, or $R^{25}$ and $R^{26}$ may be linked to each other to form a monocyclic or polycyclic ring, L represents an oxygen atom, a sulfur atom, or —$N(R^{10})$—, $R^{10}$ represents a hydrogen atom, an alkyl group, or an aryl group, $R^{d1}$ to $R^{d4}$, $W^1$, and $W^2$ each independently represent an alkyl group which may have a substituent, and Za represents a counterion that neutralizes charge.

9. The on-press development type lithographic printing plate precursor according to claim 1, wherein the image-recording layer contains an electron-donating polymerization initiator.

10. The on-press development type lithographic printing plate precursor according to claim 9, wherein HOMO of the infrared absorber A-HOMO of the electron-donating polymerization initiator is 0.60 eV or less.

11. The on-press development type lithographic printing plate precursor according to claim 1, wherein HOMO of the infrared absorber A is-5.30 eV or less.

12. The on-press development type lithographic printing plate precursor according to claim 1, wherein the infrared absorber A includes a compound represented by Formula 1, Formula 1

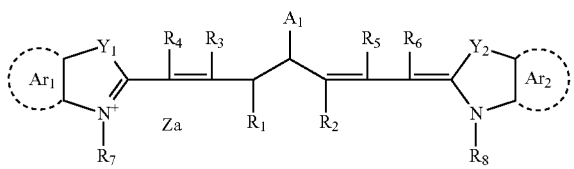

in Formula 1, $R^1$ and $R^2$ each independently represent a hydrogen atom or an alkyl group, $R^1$ and $R^2$ may be linked to each other to form a ring, $R^3$ to $R^6$ each independently represent a hydrogen atom or an alkyl group, $R^7$ and $R^8$ each independently represent an alkyl group or an aryl group, $Y_1$ and $Y_2$ each independently represent an oxygen atom, a sulfur atom, —$NR_0$—, or a dialkylmethylene group, $R_0$ represents a hydrogen atom, an alkyl group, or an aryl group, $Ar_1$ and $Ar_2$ each independently represent a group forming a benzene ring or a naphthalene ring which may have a group represented by Formula 2 that will be described later, $A_1$ represents —$NR_9R_{10}$, —$X_1$-$L_1$, or a group represented by Formula 2 that will be described later, $R_9$ and $R_{10}$ each independently represent an alkyl group, an aryl group, an alkoxycarbonyl group, or an arylsulfonyl group, $X_1$ represents an oxygen atom or a sulfur atom, Li represents a hydrocarbon group, a heteroaryl group, or a group that undergoes bond cleavage from $X_1$ by heat or exposure to infrared, Za represents a counterion that neutralizes charge, and at least one of $Ar_1$ or $Ar_2$ has a group represented by Formula 2, $$—X \qquad \text{Formula 2}$$

in Formula 2, X represents a halogen atom, —C(═O)—$X_2$—$R^{11}$, —C(═O)—$NR_{12}R_{13}$, —O—C(═O)—$R_{14}$, —CN, —$SO_2NR_{15}R_{16}$, or a perfluoroalkyl group, $X_2$ represents a single bond or an oxygen atom, $R_{11}$ and $R_{14}$ each independently represent an alkyl group or an aryl group, and $R_{12}$, $R_{13}$, $R_{15}$, and $R_{16}$ each independently represent a hydrogen atom, an alkyl group, or an aryl group.

13. The on-press development type lithographic printing plate precursor according to claim 12, wherein X in Formula 2 is a fluorine atom, a chlorine atom, a bromine atom, or —C(═O)$OR^{17}$ where $R_{17}$ represents an alkyl group or an aryl group.

14. The on-press development type lithographic printing plate precursor according to claim 1, wherein the image-recording layer contains an electron-accepting polymerization initiator, and the electron-accepting polymerization initiator includes a compound represented by Formula (II), (II)

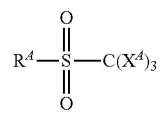

in Formula (II), $X^A$ represents a halogen atom, and $R^A$ represents an aryl group.

15. The on-press development type lithographic printing plate precursor according to claim 1, wherein the image-recording layer contains an acid color developing agent.

16. The on-press development type lithographic printing plate precursor according to claim 15, wherein the acid color developing agent includes a compound represented by Formula (Le-8), (Le-8)

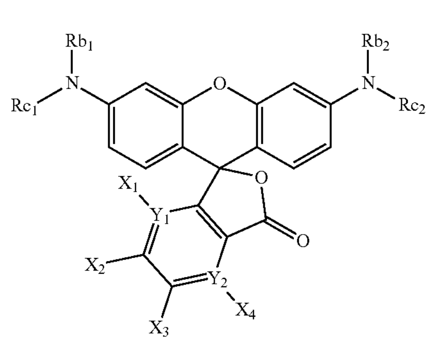

in Formula (Le-8), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Rb_1$ and $Rb_2$ each independently represent a hydrogen atom, an alkyl group, an aryl group, or a heteroaryl group, and $Rc_1$ and $Rc_2$ each independently represent an aryl group or a heteroaryl group.

17. The on-press development type lithographic printing plate precursor according to claim 15, wherein the acid color developing agent includes a compound represented by Formula (Le-11), (Le-11)

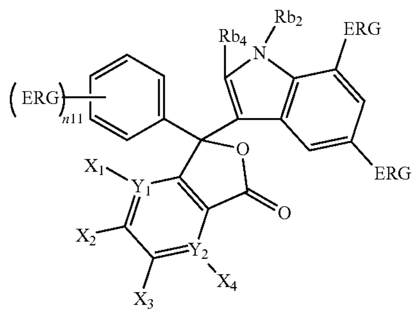

in Formula (Le-11), ERG each independently represent an electron-donating group, n11 represents an integer of 1 to 5, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_2$ and $Rb_4$ each independently represent a hydrogen atom, an alkyl group, an aryl group, or a heteroaryl group.

18. The on-press development type lithographic printing plate precursor according to claim 1, wherein the image-recording layer contains an acid color developing agent represented by Formula (Le-8) or compound S-23:

(Le-8)

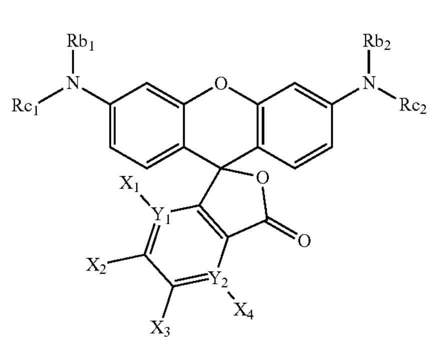

S-23

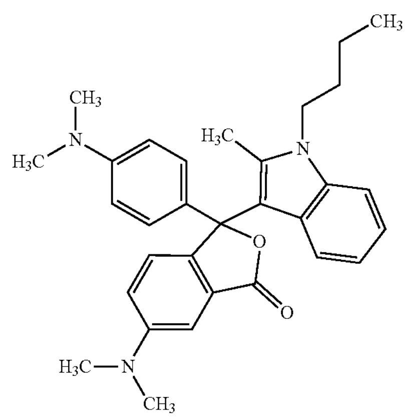

wherein, in Formula (Le-8), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $R_{b1}$ and $R_{b2}$ each independently represent a hydrogen atom, an alkyl group, an aryl group, or a heteroaryl group, and $R_{c1}$ and $R_{c2}$ each independently represent an aryl group or a heteroaryl group.

19. An on-press development type lithographic printing plate precursor comprising, in the following order:

a support;

an image-recording layer; and an outermost layer, wherein the image-recording layer contains an infrared absorber A, the outermost layer contains an infrared absorber B, a maximum absorption wavelength of the infrared absorber A is different from a maximum absorption wavelength of the infrared absorber B, and in a case where the on-press development type lithographic printing plate precursor is subjected to exposure to infrared having a wavelength of 830 nm at an energy density of 110 $mJ/cm^2$, in a portion subjected to the exposure, a brightness change $\Delta L$ before the exposure and after storage subsequent to the exposure for 24 hours under conditions of 25° C. and 70% RH is 3.0 or more.

20. The on-press development type lithographic printing plate precursor according to claim 19, wherein the image-recording layer further contains an infrared absorber C, and the maximum absorption wavelength of the infrared absorber A, the maximum absorption wavelength of the infrared absorber B, and a maximum absorption wavelength of the infrared absorber C are different from each other.

21. The on-press development type lithographic printing plate precursor according to claim 19, wherein the outermost layer contains a hydrophobic polymer.

22. A method of preparing a lithographic printing plate, comprising:

a step of exposing the on-press development type lithographic printing plate precursor according to claim 1 in a shape of an image; and a step of supplying at least one material selected from the group consisting of a printing ink and dampening water on a printer to remove an image-recording layer in a non-image area.

23. A lithographic printing method comprising:

a step of exposing the on-press development type lithographic printing plate precursor according to claim 1 in a shape of an image;

a step of supplying at least one material selected from the group consisting of a printing ink and dampening water on a printer to remove an image-recording layer in a non-image area and to prepare a lithographic printing plate; and a step of performing printing by using the obtained lithographic printing plate.

* * * * *